US008145469B2

(12) United States Patent
Birguer

(10) Patent No.: US 8,145,469 B2
(45) Date of Patent: Mar. 27, 2012

(54) SYSTEM AND METHOD FOR PROVIDING COMPACT MAPPING BETWEEN DISSIMILAR MEMORY SYSTEMS

(75) Inventor: Alexandre Birguer, Santa Clara, CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 425 days.

(21) Appl. No.: 12/426,164

(22) Filed: Apr. 17, 2009

(65) Prior Publication Data

US 2009/0292523 A1 Nov. 26, 2009

Related U.S. Application Data

(63) Continuation-in-part of application No. 11/278,794, filed on Apr. 5, 2006, now Pat. No. 7,577,558.

(60) Provisional application No. 60/668,863, filed on Apr. 6, 2005.

(30) Foreign Application Priority Data

Apr. 6, 2006 (EP) .................................... 06007305
Apr. 6, 2006 (JP) ................................ 2006/105573

(51) Int. Cl.
*G06F 9/455* (2006.01)

(52) U.S. Cl. ................ 703/23; 703/13; 703/24; 703/27; 703/28; 716/1

(58) Field of Classification Search .................... 703/13, 703/23, 24, 27, 28; 716/1
See application file for complete search history.

(56) References Cited

U.S. PATENT DOCUMENTS 5,036,473 A 7/1991 Butts et al.
5,109,353 A 4/1992 Sample et al.
5,475,830 A 12/1995 Chen et al.
5,551,013 A 8/1996 Beausoleil et al.
5,819,065 A 10/1998 Chilton et al.
5,960,191 A 9/1999 Sample et al.
(Continued)

FOREIGN PATENT DOCUMENTS

JP 10-55288 A 3/1989

OTHER PUBLICATIONS

Notice of Allowance of U.S. Appl. No. 11/278,794, filed May 29, 2009.

(Continued)

*Primary Examiner* — VanThu Nguyen
(74) *Attorney, Agent, or Firm* — Dickstein Shapiro LLP

(57) ABSTRACT

A memory mapping system for compactly mapping dissimilar memory systems and methods for manufacturing and using same. The mapping system maps a source memory system into a destination memory system by partitioning the source memory system and disposing memory contents within the partitioned source memory system into the destination memory system. In one embodiment, the mapping system factorizes a source data width of the source memory system in terms of a destination data width of the destination memory system to form at least one data sub-width. A source memory sub-region is defined for each data sub-width. The memory contents associated with each source memory sub-region are disposed within the destination memory system in a side-by-side manner across selected destination memory registers of the destination memory system. The mapping system thereby can compactly map the memory contents into the destination memory system without a loss of valuable memory space.

8 Claims, 118 Drawing Sheets

U.S. PATENT DOCUMENTS

| | | | | |
|---|---|---|---|---|
| 6,035,117 | A | 3/2000 | Beausoleil et al. | |
| 6,051,030 | A | 4/2000 | Beausoleil et al. | |
| 6,871,328 | B1 * | 3/2005 | Fung et al. | 716/116 |
| 7,370,291 | B2 | 5/2008 | Fung et al. | |
| 7,852,705 | B1 * | 12/2010 | Le | 365/231 |
| 2009/0144045 | A1 * | 6/2009 | Kanade | 703/21 |

OTHER PUBLICATIONS

Office Action of U.S. Appl. No. 11/278,794, May 13, 2008.

Office Action of U.S. Appl. No. 11/278,794, Dec. 18, 2008.

EP Search Report and Office Action, Aug. 22, 2006.

Ho, William K.C., et al; Logical-to-Physical Memory Mapping for FPGAs with Dual-Port Embedded Arrays FPL 99 LNCS 1673, 1999, pp. 111-123.

Silberschatz, et al; Operating System Concepts, Feb. 1994, Addison-Wesley pp. 268-271.

Krachmer, D., et al Definition and Solution of the Memory Packing Problem for Field-Programmable System IEEE/ACM International Conference on Computer-Aided Design Digest of Technical Papers (ICCAD) San Jose Nov. 6-10, 1994, Los Alamitos, IEEE Comp. Soc. Press US Nov. 6, 1994, pp. 20-26.

Zhou, H., et al., “ILP Method for Memory Mapping in High-Level Synthesis”, Microelectronics Reliability, vol. 43, Issue 7, Jul. 2003, pp. 1163-1167.

Ouaiss, I., et al., “Hierarchical Memory Mapping During Synthesis in FPGA_Based Reconfigurable Computers,” Proceedings of the Conference on Design, Automation, and Test in Europe, 2001, pp. 650-657.

* cited by examiner

FIG. 4B
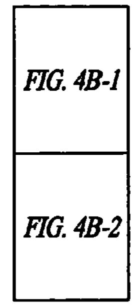
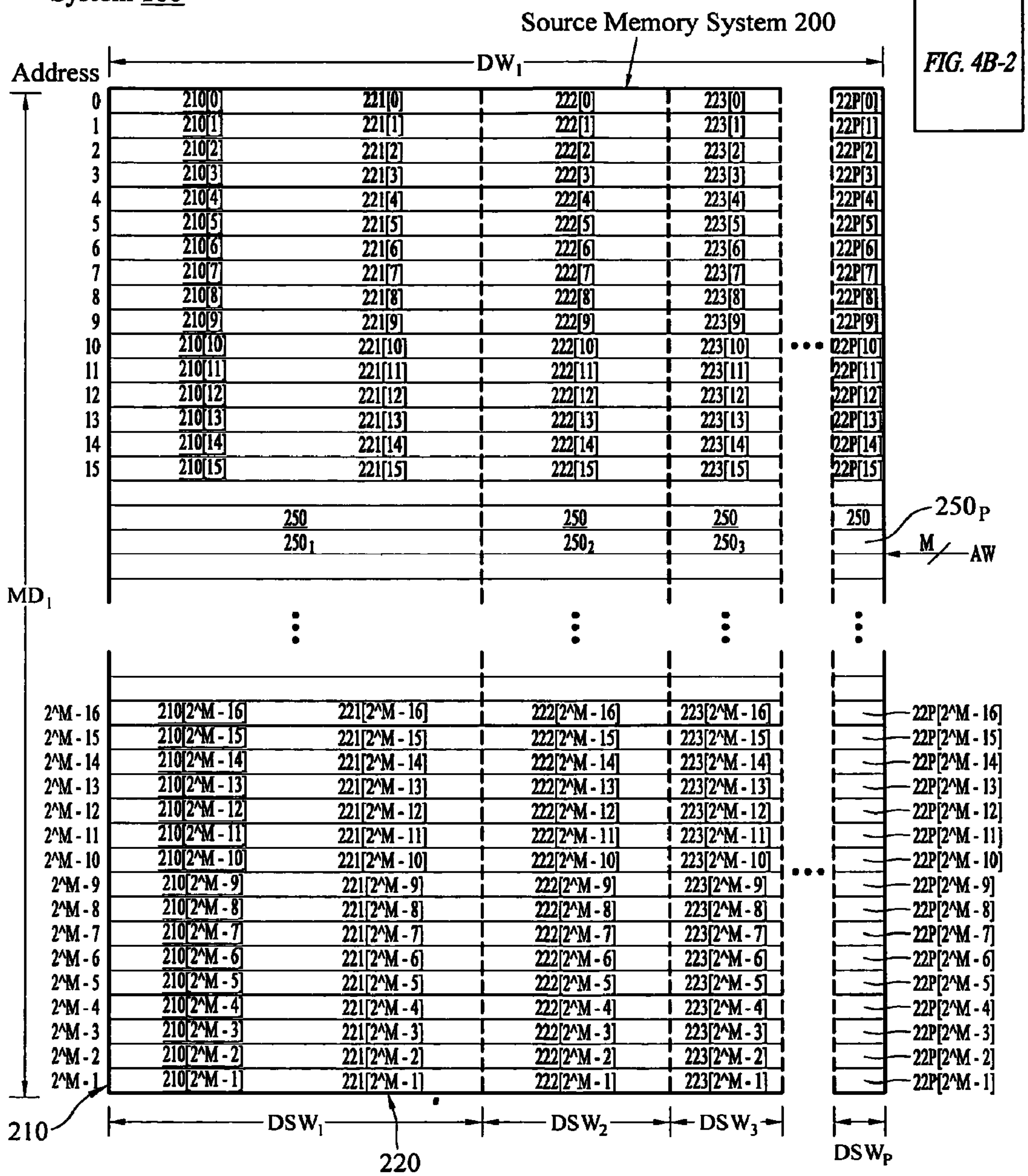
FIG. 4B−1

FIG. 4E−1

FIG. 5A
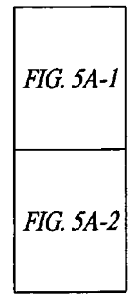
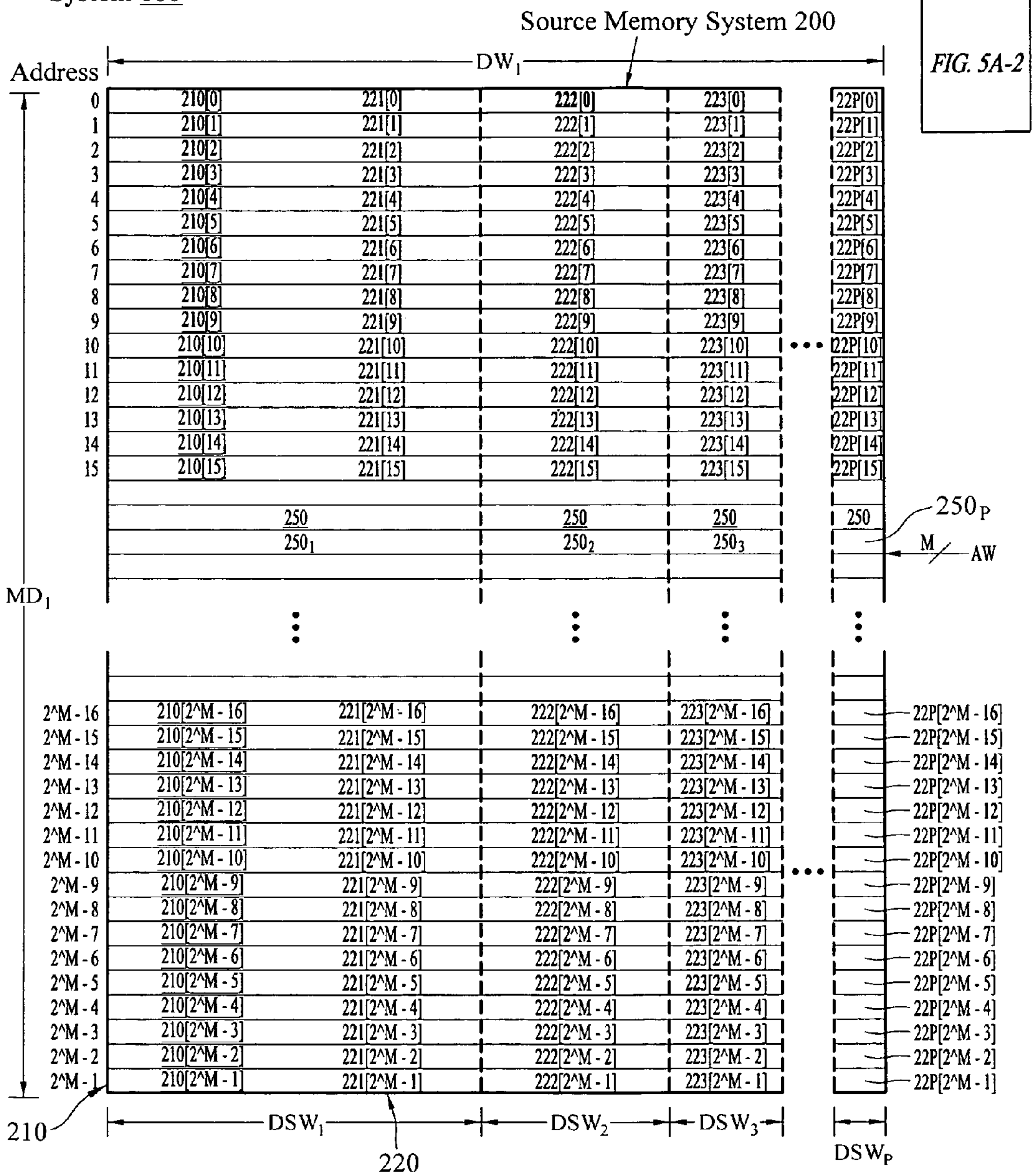
FIG. 5A-1

*FIG. 5B*
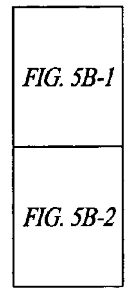
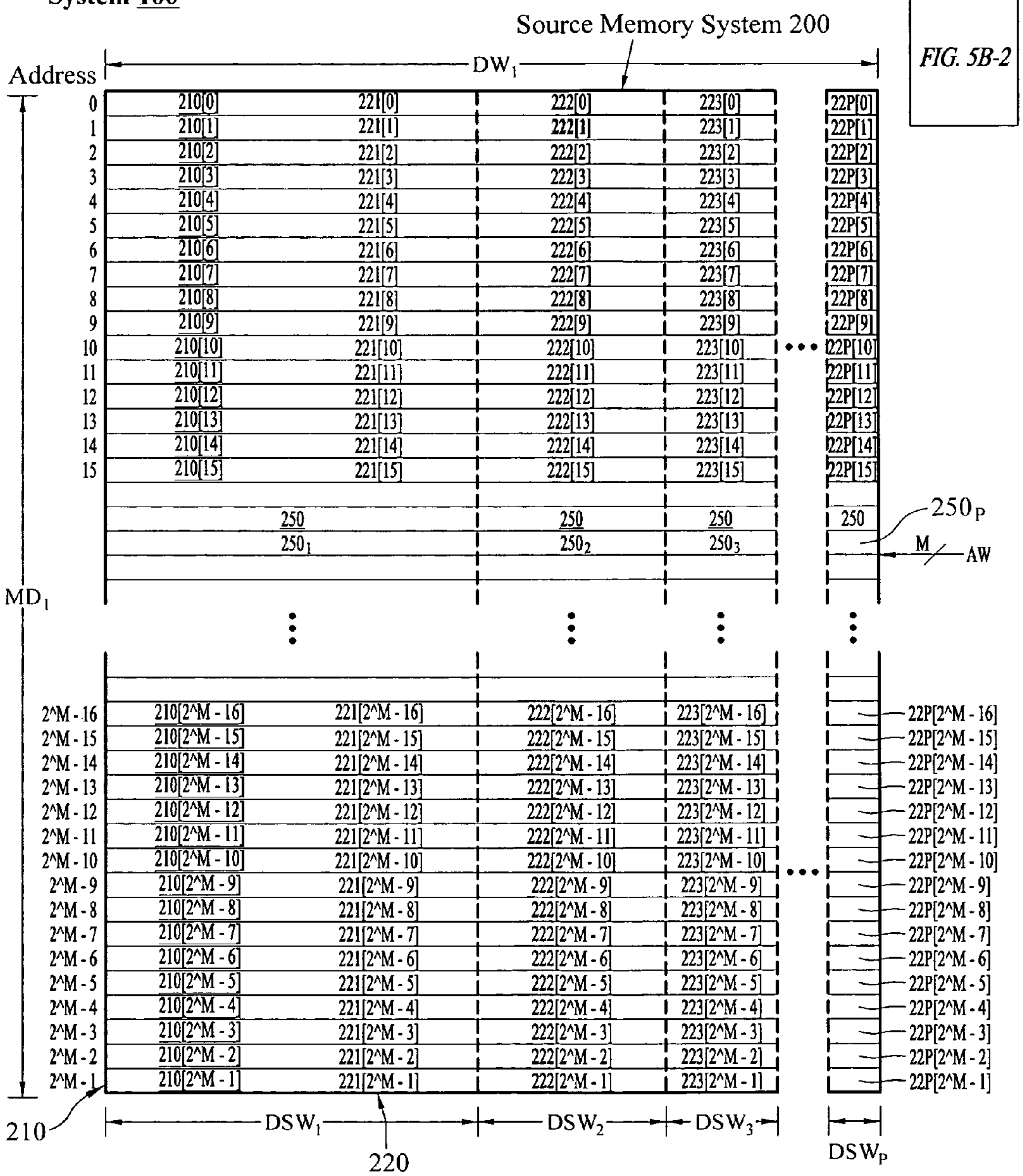
*FIG. 5B-1*

FIG. 7A−1
Memory Mapping System 100
Source Memory System 200
Address
DW1
MD1
M
AW
DSW1
DSW2
DSW3
DSWP
210
220
250
250₁
250₂
250₃
250P
0
1
2
3
2^P-4
2^P-3
2^P-2
2^P-1
2^M - 2^P
2^M - (2^P - 1)
2^M - (2^P - 2)
2^M - (2^P - 3)
2^M - 4
2^M - 3
2^M - 2
2^M - 1
210[0]
210[1]
210[2]
210[3]
221[0]
221[1]
221[2]
221[3]
222[0]
222[1]
222[2]
222[3]
223[0]
223[1]
223[2]
223[3]
22P[0]
22P[1]
22P[2]
22P[3]

FIG. 9A

| FIG. 9A-1 |
|---|
| FIG. 9A-2 |

FIG. 9A-1

Memory Mapping System <u>100</u>

Source Memory System 200

DW1 — 220 — 210 — MD1

| Address | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

FIG. 9B

| FIG. 9B-1 |
|---|
| FIG. 9B-2 |

FIG. 9B−1

Memory Mapping System 100

Source Memory System 200

221[0] 221[1] DW$_1$

| Address | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

224 223 222 220 210 221

$250_1$ $250_2$ $250_3$ $250_4$

DSW$_1$ DSW$_2$ DSW$_3$ DSW$_4$

FIG. 9C

| FIG. 9C-1 |
|---|
| FIG. 9C-2 |

FIG. 9C-1

Memory Mapping System 100

Source Memory System 200

$DW_1$

| Address | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 221[2] 2 | **1** | **1** | **1** | **1** | **1** | **1** | **1** | **1** | 1 | 1 | 1 | 1 | 1 | 1 | 1 |
| 221[3] 3 | **1** | **0** | **1** | **1** | **0** | **1** | **0** | **0** | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 (220) |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

210

$250_1$ $DSW_1$ (bits 14–7) | $DSW_2$ (bits 6–3) | $DSW_3$ (bits 2–1) | $DSW_4$ (bit 0)

FIG. 9D

| FIG. 9D-1 |
|---|
| FIG. 9D-2 |

*FIG. 9D-1*

Memory Mapping System 100

Source Memory System 200

DW1

| Address | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

221[4]
221[5]
221[30]
221[31]
220
210
$250_1$

DSW1 (bits 14–7) | DSW2 (bits 6–3) | DSW3 (bits 2–1) | DSW4 (bit 0)

Destination Memory System 300

$DW_2$

220

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 1 | 1 | 0 | 1 | 0 | 0 | 1 | 0 | 0 | 0 | 0 | 0 | 0 |
| 1 | 1 | 1 | 1 | 1 | 1 | 1 | 1 | 1 | 1 | 0 | 1 | 1 | 0 | 1 | 0 | 0 |
| 2 | 0 | 0 | 0 | 0 | 1 | 0 | 0 | 0 | 0 | 0 | 0 | 0 | 0 | 1 | 0 | 0 |
| 3 | 0 | 0 | 0 | 0 | 0 | 0 | 1 | 0 | 0 | 0 | 0 | 0 | 0 | 0 | 0 | 1 |
| 4 | 1 | 0 | 0 | 0 | 0 | 0 | 0 | 0 | 0 | 1 | 0 | 0 | 0 | 0 | 0 | 0 |
| 5 | 0 | 0 | 1 | 0 | 0 | 0 | 0 | 0 | 0 | 0 | 0 | 1 | 0 | 0 | 0 | 0 |
| 6 | 0 | 0 | 0 | 0 | 1 | 0 | 0 | 0 | 0 | 0 | 0 | 0 | 0 | 1 | 0 | 0 |
| 7 | 0 | 0 | 0 | 0 | 0 | 0 | 1 | 0 | 0 | 0 | 0 | 0 | 0 | 0 | 0 | 1 |
| 8 | 1 | 1 | 1 | 0 | 0 | 1 | 0 | 1 | 0 | 0 | 1 | 0 | 1 | 0 | 1 | 0 |
| 9 | 0 | 1 | 0 | 0 | 1 | 1 | 0 | 0 | 1 | 0 | 0 | 1 | 1 | 1 | 0 | 0 |
| 10 | 0 | 0 | 1 | 0 | 0 | 0 | 1 | 0 | 0 | 1 | 0 | 0 | 0 | 0 | 0 | 1 |
| 11 | 0 | 0 | 0 | 0 | 0 | 0 | 0 | 0 | 0 | 1 | 1 | 0 | 0 | 0 | 0 | 0 |
| 12 | 0 | 0 | 0 | 1 | 0 | 0 | 0 | 0 | 0 | 0 | 0 | 0 | 0 | 0 | 0 | 0 |
| 13 | 1 | 0 | 0 | 1 | 0 | 0 | 1 | 0 | 1 | 0 | 1 | 0 | 0 | 0 | 0 | 0 |
| 14 | 1 | 1 | 0 | 0 | 1 | 0 | 0 | 0 | 1 | 0 | 1 | 0 | 0 | 1 | 0 | 0 |
| 15 | 1 | 1 | 0 | 0 | 0 | 0 | 1 | 0 | 1 | 0 | 0 | 0 | 0 | 0 | 0 | 0 |
| 16 | | | | | | | | | | | | | | | | |
| 17 | | | | | | | | | | | | | | | | |
| 18 | | | | | | | | | | | | | | | | |
| 19 | | | | | | | | | | | | | | | | |
| 20 | | | | | | | | | | | | | | | | |
| 21 | | | | | | | | | | | | | | | | |
| 22 | | | | | | | | | | | | | | | | |
| 23 | | | | | | | | | | | | | | | | |
| 24 | | | | | | | | | | | | | | | | |
| 25 | | | | | | | | | | | | | | | | |
| 26 | | | | | | | | | | | | | | | | |
| 27 | $350_0$ | | | | | | | | $350_1$ | | | | | | | |
| 28 | | | | | | | | | | | | | | | | |
| 29 | | | | | | | | | | | | | | | | |

221[4] 221[5]

221[30] 221[31]

310

Eight Data Bits — Eight Data Bits

Memory Mapping System 100

Source Memory System 200

DW$_1$

| Address | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 1 | 1 | 0 | 1 | 1 | 0 | 1 | 0 | **1** | **1** | **0** | **0** | 0 | 1 | 1 |
| 1 | 0 | 1 | 0 | 0 | 0 | 0 | 0 | 0 | **0** | **0** | **0** | **0** | 0 | 0 | 0 |
| 2 | 1 | 1 | 1 | 1 | 1 | 1 | 1 | 1 | **1** | **1** | **1** | **1** | 1 | 1 | 1 |
| 3 | 1 | 0 | 1 | 1 | 0 | 1 | 0 | 0 | **1** | **0** | **1** | **0** | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

222[0]
222[1]
222[2]
222[3]
222
220
210
$250_2$

DSW$_1$ DSW$_2$ DSW$_3$ DSW$_4$

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 1 | 1 | 0 | 1 | 0 | 0 | 1 | 0 | 0 | 0 | 0 | 0 | 0 |
| 1 | 1 | 1 | 1 | 1 | 1 | 1 | 1 | 1 | 1 | 0 | 1 | 1 | 0 | 1 | 0 | 0 |
| 2 | 0 | 0 | 0 | 0 | 1 | 0 | 0 | 0 | 0 | 0 | 0 | 0 | 0 | 1 | 0 | 0 |
| 3 | 0 | 0 | 0 | 0 | 0 | 0 | 1 | 0 | 0 | 0 | 0 | 0 | 0 | 0 | 0 | 1 |
| 4 | 1 | 0 | 0 | 0 | 0 | 0 | 0 | 0 | 0 | 1 | 0 | 0 | 0 | 0 | 0 | 0 |
| 5 | 0 | 0 | 1 | 0 | 0 | 0 | 0 | 0 | 0 | 0 | 0 | 1 | 0 | 0 | 0 | 0 |
| 6 | 0 | 0 | 0 | 0 | 1 | 0 | 0 | 0 | 0 | 0 | 0 | 0 | 0 | 1 | 0 | 0 |
| 7 | 0 | 0 | 0 | 0 | 0 | 0 | 1 | 0 | 0 | 0 | 0 | 0 | 0 | 0 | 0 | 1 |
| 8 | 1 | 1 | 1 | 0 | 0 | 1 | 0 | 1 | 0 | 0 | 1 | 0 | 1 | 0 | 1 | 0 |
| 9 | 0 | 1 | 0 | 0 | 1 | 1 | 0 | 0 | 1 | 0 | 0 | 1 | 1 | 1 | 0 | 0 |
| 10 | 0 | 0 | 1 | 0 | 0 | 0 | 1 | 0 | 0 | 1 | 0 | 0 | 0 | 0 | 0 | 1 |
| 11 | 0 | 0 | 0 | 0 | 0 | 0 | 0 | 0 | 0 | 1 | 1 | 0 | 0 | 0 | 0 | 0 |
| 12 | 0 | 0 | 0 | 1 | 0 | 0 | 0 | 0 | 0 | 0 | 0 | 0 | 0 | 0 | 0 | 0 |
| 13 | 1 | 0 | 0 | 1 | 0 | 0 | 1 | 0 | 1 | 0 | 1 | 0 | 0 | 0 | 0 | 0 |
| 14 | 1 | 1 | 0 | 0 | 1 | 0 | 0 | 0 | 1 | 0 | 1 | 0 | 0 | 1 | 0 | 0 |
| 15 | 1 | 1 | 0 | 0 | 0 | 0 | 1 | 0 | 1 | 0 | 0 | 0 | 0 | 0 | 0 | 0 |
| 16 | **1** | **1** | **0** | **0** | **0** | **0** | **0** | **0** | **1** | **1** | **1** | **1** | **1** | **0** | **1** | **0** |
| 17 | | | | | | | | | | | | | | | | |
| 18 | | | | | | | | | | | | | | | | |
| 19 | | | | | | | | | | | | | | | | |
| 20 | | | | | | | | | | | | | | | | |
| 21 | | | | | | | | | | | | | | | | |
| 22 | | | | | | | | | | | | | | | | |
| 23 | | | | | | | | | | | | | | | | |
| 24 | | | | | | | | | | | | | | | | |
| 25 | | | | | | | | | | | | | | | | |
| 26 | | | | | | | | | | | | | | | | |
| 27 | | | | | | | | | | | | | | | | |
| 28 | | | | | | | | | | | | | | | | |
| 29 | | | | | | | | | | | | | | | | |

FIG. 9F

| FIG. 9F-1 |
|---|
| FIG. 9F-2 |

FIG. 9F–1

Memory Mapping System 100

Source Memory System 200

DW$_1$

| Address | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | **0** | **0** | **0** | **1** | 1 | 0 | 1 |
| 5 | 0 | 0 | 0 | 0 | 0 | 1 | 0 | 0 | **0** | **0** | **1** | **0** | 1 | 1 | 1 |
| 6 | 0 | 0 | 0 | 0 | 0 | 0 | 1 | 0 | **0** | **1** | **0** | **0** | 0 | 1 | 0 |
| 7 | 0 | 0 | 0 | 0 | 0 | 0 | 0 | 1 | **1** | **1** | **0** | **0** | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

222[4]
222[5]
222[6]
222[7]
222
220
210
$250_2$

DSW$_1$ (bits 14–7) DSW$_2$ (bits 6–3) DSW$_3$ (bits 2–1) DSW$_4$ (bit 0)

*FIG. 9G*

| *FIG. 9G-1* |
| --- |
| *FIG. 9G-2* |

Memory Mapping System 100

Source Memory System 200

$DW_1$

| Address | 14 | 13 | 12 | 11 | 10 | 9 | 8 | 7 | 6 | 5 | 4 | 3 | 2 | 1 | 0 |
| --- | --- | --- | --- | --- | --- | --- | --- | --- | --- | --- | --- | --- | --- | --- | --- |
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

222[8] 222[9] 222[10] 222[11] 222 220 210 222[28] 222[29] 222[30] 222[31]

$250_2$ $DSW_1$ $DSW_2$ $DSW_3$ $DSW_4$

*FIG. 9G-1*

Destination Memory System 300

$DW_2$

220

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 1 | 1 | 0 | 1 | 0 | 0 | 1 | 0 | 0 | 0 | 0 | 0 | 0 |
| 1 | 1 | 1 | 1 | 1 | 1 | 1 | 1 | 1 | 1 | 0 | 1 | 1 | 0 | 1 | 0 | 0 |
| 2 | 0 | 0 | 0 | 0 | 1 | 0 | 0 | 0 | 0 | 0 | 0 | 0 | 0 | 1 | 0 | 0 |
| 3 | 0 | 0 | 0 | 0 | 0 | 0 | 1 | 0 | 0 | 0 | 0 | 0 | 0 | 0 | 0 | 1 |
| 4 | 1 | 0 | 0 | 0 | 0 | 0 | 0 | 0 | 0 | 1 | 0 | 0 | 0 | 0 | 0 | 0 |
| 5 | 0 | 0 | 1 | 0 | 0 | 0 | 0 | 0 | 0 | 0 | 0 | 1 | 0 | 0 | 0 | 0 |
| 6 | 0 | 0 | 0 | 0 | 1 | 0 | 0 | 0 | 0 | 0 | 0 | 0 | 0 | 1 | 0 | 0 |
| 7 | 0 | 0 | 0 | 0 | 0 | 0 | 1 | 0 | 0 | 0 | 0 | 0 | 0 | 0 | 0 | 1 |
| 8 | 1 | 1 | 1 | 0 | 0 | 1 | 0 | 1 | 0 | 0 | 1 | 0 | 1 | 0 | 1 | 0 |
| 9 | 0 | 1 | 0 | 0 | 1 | 1 | 0 | 0 | 1 | 0 | 0 | 1 | 1 | 1 | 0 | 0 |
| 10 | 0 | 0 | 1 | 0 | 0 | 0 | 1 | 0 | 0 | 1 | 0 | 0 | 0 | 0 | 0 | 1 |
| 11 | 0 | 0 | 0 | 0 | 0 | 0 | 0 | 0 | 0 | 1 | 1 | 0 | 0 | 0 | 0 | 0 |
| 12 | 0 | 0 | 0 | 1 | 0 | 0 | 0 | 0 | 0 | 0 | 0 | 0 | 0 | 0 | 0 | 0 |
| 13 | 1 | 0 | 0 | 1 | 0 | 0 | 1 | 0 | 1 | 0 | 1 | 0 | 0 | 0 | 0 | 0 |
| 14 | 1 | 1 | 0 | 0 | 1 | 0 | 0 | 0 | 1 | 0 | 1 | 0 | 0 | 1 | 0 | 0 |
| 15 | 1 | 1 | 0 | 0 | 0 | 0 | 1 | 0 | 1 | 0 | 0 | 0 | 0 | 0 | 0 | 0 |
| 16 | 1 | 1 | 0 | 0 | 0 | 0 | 0 | 0 | 1 | 1 | 1 | 1 | 1 | 0 | 1 | 0 |
| 17 | 0 | 0 | 0 | 1 | 0 | 0 | 1 | 0 | 0 | 1 | 0 | 0 | 1 | 1 | 0 | 0 |
| 18 | **0** | **0** | **0** | **0** | **1** | **1** | **0** | **0** | **0** | **1** | **0** | **0** | **0** | **1** | **0** | **0** |
| 19 | **0** | **0** | **1** | **1** | **0** | **0** | **1** | **1** | **0** | **1** | **0** | **0** | **1** | **0** | **0** | **0** |
| 20 | **0** | **0** | **0** | **0** | **1** | **0** | **0** | **0** | **1** | **1** | **0** | **0** | **0** | **1** | **1** | **0** |
| 21 | **0** | **0** | **1** | **0** | **1** | **0** | **1** | **1** | **0** | **0** | **0** | **1** | **0** | **1** | **1** | **1** |
| 22 | **0** | **0** | **0** | **0** | **0** | **0** | **0** | **0** | **0** | **0** | **0** | **0** | **0** | **0** | **0** | **0** |
| 23 | **0** | **0** | **0** | **0** | **0** | **0** | **0** | **0** | **0** | **0** | **0** | **0** | **0** | **0** | **0** | **0** |
| 24 | | | | | | | | | | | | | | | | |
| 25 | | | | | | | | | | | | | | | | |
| 26 | | | | | | | | | | | | | | | | |
| 27 | | $350_0$ | | | | $350_1$ | | | | $350_2$ | | | | $350_3$ | | |
| 28 | | | | | | | | | | | | | | | | |
| 29 | | | | | | | | | | | | | | | | |

222[11]
222[10]
222[31]
222[30]
222[29]
222[8] 222[28] 222[9]
310

Eight Data Bits — Eight Data Bits

Four Data Bits

| FIG. 9H-1 |
| --- |
| FIG. 9H-2 |

Memory Mapping System 100

Source Memory System 200

DW1

| Address | 14 | 13 | 12 | 11 | 10 | 9 | 8 | 7 | 6 | 5 | 4 | 3 | 2 | 1 | 0 |
| --- | --- | --- | --- | --- | --- | --- | --- | --- | --- | --- | --- | --- | --- | --- | --- |
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

223[0]
223[1]
223[2]
223[3]
223[4]
223[5]
223[6]
223[7]
223
220
210
$250_3$ $DSW_1$ (bits 14–7) $DSW_2$ (bits 6–3) $DSW_3$ (bits 2–1) $DSW_4$ (bit 0)

FIG. 9H-1

Destination Memory System 300

DW$_2$

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 1 | 1 | 0 | 1 | 0 | 0 | 1 | 0 | 0 | 0 | 0 | 0 | 0 |
| 1 | 1 | 1 | 1 | 1 | 1 | 1 | 1 | 1 | 1 | 0 | 1 | 1 | 0 | 1 | 0 | 0 |
| 2 | 0 | 0 | 0 | 0 | 1 | 0 | 0 | 0 | 0 | 0 | 0 | 0 | 0 | 1 | 0 | 0 |
| 3 | 0 | 0 | 0 | 0 | 0 | 0 | 1 | 0 | 0 | 0 | 0 | 0 | 0 | 0 | 0 | 1 |
| 4 | 1 | 0 | 0 | 0 | 0 | 0 | 0 | 0 | 0 | 1 | 0 | 0 | 0 | 0 | 0 | 0 |
| 5 | 0 | 0 | 1 | 0 | 0 | 0 | 0 | 0 | 0 | 0 | 0 | 1 | 0 | 0 | 0 | 0 |
| 6 | 0 | 0 | 0 | 0 | 1 | 0 | 0 | 0 | 0 | 0 | 0 | 0 | 0 | 1 | 0 | 0 |
| 7 | 0 | 0 | 0 | 0 | 0 | 0 | 1 | 0 | 0 | 0 | 0 | 0 | 0 | 0 | 0 | 1 |
| 8 | 1 | 1 | 1 | 0 | 0 | 1 | 0 | 1 | 0 | 0 | 1 | 0 | 1 | 0 | 1 | 0 |
| 9 | 0 | 1 | 0 | 0 | 1 | 1 | 0 | 0 | 1 | 0 | 0 | 1 | 1 | 1 | 0 | 0 |
| 10 | 0 | 0 | 1 | 0 | 0 | 0 | 1 | 0 | 0 | 1 | 0 | 0 | 0 | 0 | 0 | 1 |
| 11 | 0 | 0 | 0 | 0 | 0 | 0 | 0 | 0 | 0 | 1 | 1 | 0 | 0 | 0 | 0 | 0 |
| 12 | 0 | 0 | 0 | 1 | 0 | 0 | 0 | 0 | 0 | 0 | 0 | 0 | 0 | 0 | 0 | 0 |
| 13 | 1 | 0 | 0 | 1 | 0 | 0 | 1 | 0 | 1 | 0 | 1 | 0 | 0 | 0 | 0 | 0 |
| 14 | 1 | 1 | 0 | 0 | 1 | 0 | 0 | 0 | 1 | 0 | 1 | 0 | 0 | 1 | 0 | 0 |
| 15 | 1 | 1 | 0 | 0 | 0 | 0 | 1 | 0 | 1 | 0 | 0 | 0 | 0 | 0 | 0 | 0 |
| 16 | 1 | 1 | 0 | 0 | 0 | 0 | 0 | 0 | 1 | 1 | 1 | 1 | 1 | 0 | 1 | 0 |
| 17 | 0 | 0 | 0 | 1 | 0 | 0 | 1 | 0 | 0 | 1 | 0 | 0 | 1 | 1 | 0 | 0 |
| 18 | 0 | 0 | 0 | 0 | 1 | 1 | 0 | 0 | 0 | 1 | 0 | 0 | 0 | 1 | 0 | 0 |
| 19 | 0 | 0 | 1 | 1 | 0 | 0 | 1 | 1 | 0 | 1 | 0 | 0 | 1 | 0 | 0 | 0 |
| 20 | 0 | 0 | 0 | 0 | 1 | 0 | 0 | 0 | 1 | 1 | 0 | 0 | 0 | 1 | 1 | 0 |
| 21 | 0 | 0 | 1 | 0 | 1 | 0 | 1 | 1 | 0 | 0 | 0 | 1 | 0 | 1 | 1 | 1 |
| 22 | 0 | 0 | 0 | 0 | 0 | 0 | 0 | 0 | 0 | 0 | 0 | 0 | 0 | 0 | 0 | 0 |
| 23 | 0 | 0 | 0 | 0 | 0 | 0 | 0 | 0 | 0 | 0 | 0 | 0 | 0 | 0 | 0 | 0 |
| 24 | **0** | **1** | **0** | **0** | **1** | **1** | **1** | **0** | **1** | **0** | **1** | **1** | **0** | **1** | **1** | **0** |
| 25 | | | | | | | | | | | | | | | | |
| 26 | | | | | | | | | | | | | | | | |
| 27 | $350_0$ | | $350_1$ | | $350_2$ | | $350_3$ | | $350_4$ | | $350_5$ | | $350_6$ | | $350_7$ | |
| 28 | | | | | | | | | | | | | | | | |
| 29 | | | | | | | | | | | | | | | | |

220

223[7]

223[6]

223[0] 223[1] 223[2] 223[3] 223[4] 223[5]

310

Eight Data Bits — Eight Data Bits

Four Data Bits

Two Data Bits

Memory Mapping System 100

Source Memory System 200

DW$_1$

| Address | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

223[8]
223[9]
223[10]
223[11]
223[12]
223[13]
223[14]
223[15]
223
220
210
$250_3$

DSW$_1$ DSW$_2$ DSW$_3$ DSW$_4$

*FIG. 9I–1*

Destination Memory System 300

$DW_2$

220

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 1 | 1 | 0 | 1 | 0 | 0 | 1 | 0 | 0 | 0 | 0 | 0 | 0 |
| 1 | 1 | 1 | 1 | 1 | 1 | 1 | 1 | 1 | 1 | 0 | 1 | 1 | 0 | 1 | 0 | 0 |
| 2 | 0 | 0 | 0 | 0 | 1 | 0 | 0 | 0 | 0 | 0 | 0 | 0 | 0 | 1 | 0 | 0 |
| 3 | 0 | 0 | 0 | 0 | 0 | 0 | 1 | 0 | 0 | 0 | 0 | 0 | 0 | 0 | 0 | 1 |
| 4 | 1 | 0 | 0 | 0 | 0 | 0 | 0 | 0 | 0 | 1 | 0 | 0 | 0 | 0 | 0 | 0 |
| 5 | 0 | 0 | 1 | 0 | 0 | 0 | 0 | 0 | 0 | 0 | 0 | 1 | 0 | 0 | 0 | 0 |
| 6 | 0 | 0 | 0 | 0 | 1 | 0 | 0 | 0 | 0 | 0 | 0 | 0 | 0 | 1 | 0 | 0 |
| 7 | 0 | 0 | 0 | 0 | 0 | 0 | 1 | 0 | 0 | 0 | 0 | 0 | 0 | 0 | 0 | 1 |
| 8 | 1 | 1 | 1 | 0 | 0 | 1 | 0 | 1 | 0 | 0 | 1 | 0 | 1 | 0 | 1 | 0 |
| 9 | 0 | 1 | 0 | 0 | 1 | 1 | 0 | 0 | 1 | 0 | 0 | 1 | 1 | 1 | 0 | 0 |
| 10 | 0 | 0 | 1 | 0 | 0 | 0 | 1 | 0 | 0 | 1 | 0 | 0 | 0 | 0 | 0 | 1 |
| 11 | 0 | 0 | 0 | 0 | 0 | 0 | 0 | 0 | 0 | 1 | 1 | 0 | 0 | 0 | 0 | 0 |
| 12 | 0 | 0 | 0 | 1 | 0 | 0 | 0 | 0 | 0 | 0 | 0 | 0 | 0 | 0 | 0 | 0 |
| 13 | 1 | 0 | 0 | 1 | 0 | 0 | 1 | 0 | 1 | 0 | 1 | 0 | 0 | 0 | 0 | 0 |
| 14 | 1 | 1 | 0 | 0 | 1 | 0 | 0 | 0 | 1 | 0 | 1 | 0 | 0 | 1 | 0 | 0 |
| 15 | 1 | 1 | 0 | 0 | 0 | 0 | 1 | 0 | 1 | 0 | 0 | 0 | 0 | 0 | 0 | 0 |
| 16 | 1 | 1 | 0 | 0 | 0 | 0 | 0 | 0 | 1 | 1 | 1 | 1 | 1 | 0 | 1 | 0 |
| 17 | 0 | 0 | 0 | 1 | 0 | 0 | 1 | 0 | 0 | 1 | 0 | 0 | 1 | 1 | 0 | 0 |
| 18 | 0 | 0 | 0 | 0 | 1 | 1 | 0 | 0 | 0 | 1 | 0 | 0 | 0 | 1 | 0 | 0 |
| 19 | 0 | 0 | 1 | 1 | 0 | 0 | 1 | 1 | 0 | 1 | 0 | 0 | 1 | 0 | 0 | 0 |
| 20 | 0 | 0 | 0 | 0 | 1 | 0 | 0 | 0 | 1 | 1 | 0 | 0 | 0 | 1 | 1 | 0 |
| 21 | 0 | 0 | 1 | 0 | 1 | 0 | 1 | 1 | 0 | 0 | 0 | 1 | 0 | 1 | 1 | 1 |
| 22 | 0 | 0 | 0 | 0 | 0 | 0 | 0 | 0 | 0 | 0 | 0 | 0 | 0 | 0 | 0 | 0 |
| 23 | 0 | 0 | 0 | 0 | 0 | 0 | 0 | 0 | 0 | 0 | 0 | 0 | 0 | 0 | 0 | 0 |
| 24 | 0 | 1 | 0 | 0 | 1 | 1 | 1 | 0 | 1 | 0 | 1 | 1 | 0 | 1 | 1 | 0 |
| 25 | 1 | 0 | 0 | 0 | 1 | 1 | 1 | 1 | 1 | 0 | 1 | 1 | 0 | 1 | 1 | 1 |
| 26 | | | | | | | | | | | | | | | | |
| 27 | $350_0$ | | $350_1$ | | $350_2$ | | $350_3$ | | $350_4$ | | $350_5$ | | $350_6$ | | $350_7$ | |
| 28 | | | | | | | | | | | | | | | | |
| 29 | | | | | | | | | | | | | | | | |

223[15]

223[14]

223[8] 223[9] 223[10] 223[11] 223[12] 223[13] 310

Eight Data Bits — Eight Data Bits

Four Data Bits

Two Data Bits

| FIG. 9J-1 |
| --- |
| FIG. 9J-2 |

Memory Mapping System 100

Source Memory System 200

DW$_1$

| Address | 14 | 13 | 12 | 11 | 10 | 9 | 8 | 7 | 6 | 5 | 4 | 3 | 2 | 1 | 0 |
| --- | --- | --- | --- | --- | --- | --- | --- | --- | --- | --- | --- | --- | --- | --- | --- |
| 0 | 1 | 1 | 0 | 1 | 1 | 0 | 1 | 0 | 1 | 1 | 0 | 0 | 0 | 1 | 1 |
| 1 | 0 | 1 | 0 | 0 | 0 | 0 | 0 | 0 | 0 | 0 | 0 | 0 | 0 | 0 | 0 |
| 2 | 1 | 1 | 1 | 1 | 1 | 1 | 1 | 1 | 1 | 1 | 1 | 1 | 1 | 1 | 1 |
| 3 | 1 | 0 | 1 | 1 | 0 | 1 | 0 | 0 | 1 | 0 | 1 | 0 | 1 | 0 | 0 |
| 4 | 0 | 0 | 0 | 0 | 1 | 0 | 0 | 0 | 0 | 0 | 0 | 1 | 1 | 0 | 1 |
| 5 | 0 | 0 | 0 | 0 | 0 | 1 | 0 | 0 | 0 | 0 | 1 | 0 | 1 | 1 | 1 |
| 6 | 0 | 0 | 0 | 0 | 0 | 0 | 1 | 0 | 0 | 1 | 0 | 0 | 0 | 1 | 0 |
| 7 | 0 | 0 | 0 | 0 | 0 | 0 | 0 | 1 | 1 | 1 | 0 | 0 | 1 | 0 | 0 |
| 8 | 1 | 0 | 0 | 0 | 0 | 0 | 0 | 0 | 0 | 0 | 0 | 0 | 1 | 0 | 1 |
| 9 | 0 | 1 | 0 | 0 | 0 | 0 | 0 | 0 | 1 | 1 | 0 | 0 | 0 | 0 | 0 |
| 10 | 0 | 0 | 1 | 0 | 0 | 0 | 0 | 0 | 0 | 1 | 0 | 0 | 1 | 1 | 1 |
| 11 | 0 | 0 | 0 | 1 | 0 | 0 | 0 | 0 | 0 | 1 | 0 | 0 | 1 | 1 | 1 |
| 12 | 0 | 0 | 0 | 0 | 1 | 0 | 0 | 0 | 0 | 0 | 1 | 1 | 1 | 0 | 0 |
| 13 | 0 | 0 | 0 | 0 | 0 | 1 | 0 | 0 | 0 | 0 | 1 | 1 | 1 | 1 | 1 |
| 14 | 0 | 0 | 0 | 0 | 0 | 0 | 1 | 0 | 0 | 1 | 0 | 0 | 0 | 1 | 1 |
| 15 | 0 | 0 | 0 | 0 | 0 | 0 | 0 | 1 | 1 | 0 | 0 | 0 | 1 | 1 | 0 |
| 16 | 1 | 1 | 1 | 0 | 0 | 1 | 0 | 1 | 0 | 0 | 0 | 0 | 1 | 0 | 1 |
| 17 | 0 | 0 | 1 | 0 | 1 | 0 | 1 | 0 | 1 | 0 | 0 | 0 | 0 | 1 | 1 |
| 18 | 0 | 1 | 0 | 0 | 1 | 1 | 0 | 0 | 1 | 1 | 0 | 0 | 0 | 1 | 0 |
| 19 | 1 | 0 | 0 | 1 | 1 | 1 | 0 | 0 | 0 | 1 | 1 | 0 | 1 | 0 | 1 |
| 20 | 0 | 0 | 1 | 0 | 0 | 0 | 1 | 0 | 0 | 0 | 1 | 0 | 1 | 0 | 1 |
| 21 | 0 | 1 | 0 | 0 | 0 | 0 | 0 | 1 | 1 | 0 | 1 | 1 | 1 | 0 | 0 |
| 22 | 0 | 0 | 0 | 0 | 0 | 0 | 0 | 0 | 0 | 0 | 0 | 1 | 1 | 0 | 1 |
| 23 | 0 | 1 | 1 | 0 | 0 | 0 | 0 | 0 | 0 | 1 | 1 | 1 | 1 | 0 | 1 |
| 24 | 0 | 0 | 0 | 1 | 0 | 0 | 0 | 0 | 0 | 0 | 0 | 0 | 1 | 0 | 0 |
| 25 | 0 | 0 | 0 | 0 | 0 | 0 | 0 | 0 | 0 | 0 | 0 | 0 | 0 | 1 | 0 |
| 26 | 1 | 0 | 0 | 1 | 0 | 0 | 1 | 0 | 0 | 0 | 0 | 0 | 0 | 1 | 1 |
| 27 | 1 | 0 | 1 | 0 | 0 | 0 | 0 | 0 | 0 | 0 | 0 | 0 | 1 | 0 | 0 |
| 28 | 1 | 1 | 0 | 0 | 1 | 0 | 0 | 0 | 0 | 0 | 0 | 0 | 1 | 0 | 1 |
| 29 | 1 | 0 | 1 | 0 | 0 | 1 | 0 | 0 | 0 | 0 | 0 | 0 | 0 | 1 | 0 |
| 30 | 1 | 1 | 0 | 0 | 0 | 0 | 1 | 0 | 0 | 0 | 0 | 0 | 1 | 0 | 1 |
| 31 | 1 | 0 | 0 | 0 | 0 | 0 | 0 | 0 | 0 | 0 | 0 | 0 | 0 | 1 | 1 |

220

210

223

223[16] 223[17] 223[18] 223[19] 223[20] 223[21] 223[22] 223[23] 223[24] 223[25] 223[26] 223[27] 223[28] 223[29] 223[30] 223[31]

$250_3$

DSW$_1$ DSW$_2$ DSW$_3$ DSW$_4$

| FIG. 9K-1 |
| --- |
| FIG. 9K-2 |

Memory Mapping System 100

Source Memory System 200

DW$_1$

| Address | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 | 224[0] |
| 1 | 0 | 1 | 0 | 0 | 0 | 0 | 0 | 0 | 0 | 0 | 0 | 0 | 0 | 0 | 0 | 224[1] |
| 2 | 1 | 1 | 1 | 1 | 1 | 1 | 1 | 1 | 1 | 1 | 1 | 1 | 1 | 1 | 1 | 224[2] |
| 3 | 1 | 0 | 1 | 1 | 0 | 1 | 0 | 0 | 1 | 0 | 1 | 0 | 1 | 0 | 0 | 224[3] |
| 4 | 0 | 0 | 0 | 0 | 1 | 0 | 0 | 0 | 0 | 0 | 0 | 1 | 1 | 0 | 1 | 224[4] |
| 5 | 0 | 0 | 0 | 0 | 0 | 1 | 0 | 0 | 0 | 0 | 1 | 0 | 1 | 1 | 1 | 224[5] |
| 6 | 0 | 0 | 0 | 0 | 0 | 0 | 1 | 0 | 0 | 1 | 0 | 0 | 0 | 1 | 0 | 224[6] |
| 7 | 0 | 0 | 0 | 0 | 0 | 0 | 0 | 1 | 1 | 1 | 0 | 0 | 1 | 0 | 0 | 224[7] |
| 8 | 1 | 0 | 0 | 0 | 0 | 0 | 0 | 0 | 0 | 0 | 0 | 0 | 1 | 0 | 1 | 224[8] |
| 9 | 0 | 1 | 0 | 0 | 0 | 0 | 0 | 0 | 1 | 1 | 0 | 0 | 0 | 0 | 0 | 224[9] |
| 10 | 0 | 0 | 1 | 0 | 0 | 0 | 0 | 0 | 0 | 1 | 0 | 0 | 1 | 1 | 1 | 224[10] |
| 11 | 0 | 0 | 0 | 1 | 0 | 0 | 0 | 0 | 0 | 1 | 0 | 0 | 1 | 1 | 1 | 224[11] |
| 12 | 0 | 0 | 0 | 0 | 1 | 0 | 0 | 0 | 0 | 0 | 1 | 1 | 1 | 0 | 0 | 224[12] |
| 13 | 0 | 0 | 0 | 0 | 0 | 1 | 0 | 0 | 0 | 0 | 1 | 1 | 1 | 1 | 1 | 224[13] |
| 14 | 0 | 0 | 0 | 0 | 0 | 0 | 1 | 0 | 0 | 1 | 0 | 0 | 0 | 1 | 1 | 224[14] |
| 15 | 0 | 0 | 0 | 0 | 0 | 0 | 0 | 1 | 1 | 0 | 0 | 0 | 1 | 1 | 0 | 224[15] |
| 16 | 1 | 1 | 1 | 0 | 0 | 1 | 0 | 1 | 0 | 0 | 0 | 0 | 1 | 0 | 1 | |
| 17 | 0 | 0 | 1 | 0 | 1 | 0 | 1 | 0 | 1 | 0 | 0 | 0 | 0 | 1 | 1 | |
| 18 | 0 | 1 | 0 | 0 | 1 | 1 | 0 | 0 | 1 | 1 | 0 | 0 | 0 | 1 | 0 | |
| 19 | 1 | 0 | 0 | 1 | 1 | 1 | 0 | 0 | 0 | 1 | 1 | 0 | 1 | 0 | 1 | |
| 20 | 0 | 0 | 1 | 0 | 0 | 0 | 1 | 0 | 0 | 0 | 1 | 0 | 1 | 0 | 1 | 224 |
| 21 | 0 | 1 | 0 | 0 | 0 | 0 | 0 | 1 | 1 | 0 | 1 | 1 | 1 | 0 | 0 | |
| 22 | 0 | 0 | 0 | 0 | 0 | 0 | 0 | 0 | 0 | 0 | 0 | 1 | 1 | 0 | 1 | |
| 23 | 0 | 1 | 1 | 0 | 0 | 0 | 0 | 0 | 0 | 1 | 1 | 1 | 1 | 0 | 1 | |
| 24 | 0 | 0 | 0 | 1 | 0 | 0 | 0 | 0 | 0 | 0 | 0 | 0 | 1 | 0 | 0 | 220 |
| 25 | 0 | 0 | 0 | 0 | 0 | 0 | 0 | 0 | 0 | 0 | 0 | 0 | 0 | 1 | 0 | |
| 26 | 1 | 0 | 0 | 1 | 0 | 0 | 1 | 0 | 0 | 0 | 0 | 0 | 0 | 1 | 1 | |
| 27 | 1 | 0 | 1 | 0 | 0 | 0 | 0 | 0 | 0 | 0 | 0 | 0 | 1 | 0 | 0 | |
| 28 | 1 | 1 | 0 | 0 | 1 | 0 | 0 | 0 | 0 | 0 | 0 | 0 | 1 | 0 | 1 | 210 |
| 29 | 1 | 0 | 1 | 0 | 0 | 1 | 0 | 0 | 0 | 0 | 0 | 0 | 0 | 1 | 0 | |
| 30 | 1 | 1 | 0 | 0 | 0 | 0 | 1 | 0 | 0 | 0 | 0 | 0 | 1 | 0 | 1 | |
| 31 | 1 | 0 | 0 | 0 | 0 | 0 | 0 | 0 | 0 | 0 | 0 | 0 | 0 | 1 | 1 | |

$250_4$

DSW$_1$ (bits 14–7) | DSW$_2$ (bits 6–3) | DSW$_3$ (bits 2–1) | DSW$_4$ (bit 0)

FIG. 9K-1

Destination Memory System 300

DW$_2$

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 1 | 1 | 0 | 1 | 0 | 0 | 1 | 0 | 0 | 0 | 0 | 0 | 0 |
| 1 | 1 | 1 | 1 | 1 | 1 | 1 | 1 | 1 | 1 | 0 | 1 | 1 | 0 | 1 | 0 | 0 |
| 2 | 0 | 0 | 0 | 0 | 1 | 0 | 0 | 0 | 0 | 0 | 0 | 0 | 0 | 1 | 0 | 0 |
| 3 | 0 | 0 | 0 | 0 | 0 | 0 | 1 | 0 | 0 | 0 | 0 | 0 | 0 | 0 | 0 | 1 |
| 4 | 1 | 0 | 0 | 0 | 0 | 0 | 0 | 0 | 0 | 1 | 0 | 0 | 0 | 0 | 0 | 0 |
| 5 | 0 | 0 | 1 | 0 | 0 | 0 | 0 | 0 | 0 | 0 | 0 | 1 | 0 | 0 | 0 | 0 |
| 6 | 0 | 0 | 0 | 0 | 1 | 0 | 0 | 0 | 0 | 0 | 0 | 0 | 0 | 1 | 0 | 0 |
| 7 | 0 | 0 | 0 | 0 | 0 | 0 | 1 | 0 | 0 | 0 | 0 | 0 | 0 | 0 | 0 | 1 |
| 8 | 1 | 1 | 1 | 0 | 0 | 1 | 0 | 1 | 0 | 0 | 1 | 0 | 1 | 0 | 1 | 0 |
| 9 | 0 | 1 | 0 | 0 | 1 | 1 | 0 | 0 | 1 | 0 | 0 | 1 | 1 | 1 | 0 | 0 |
| 10 | 0 | 0 | 1 | 0 | 0 | 0 | 1 | 0 | 0 | 1 | 0 | 0 | 0 | 0 | 0 | 1 |
| 11 | 0 | 0 | 0 | 0 | 0 | 0 | 0 | 0 | 0 | 1 | 1 | 0 | 0 | 0 | 0 | 0 |
| 12 | 0 | 0 | 0 | 1 | 0 | 0 | 0 | 0 | 0 | 0 | 0 | 0 | 0 | 0 | 0 | 0 |
| 13 | 1 | 0 | 0 | 1 | 0 | 0 | 1 | 0 | 1 | 0 | 1 | 0 | 0 | 0 | 0 | 0 |
| 14 | 1 | 1 | 0 | 0 | 1 | 0 | 0 | 0 | 1 | 0 | 1 | 0 | 0 | 1 | 0 | 0 |
| 15 | 1 | 1 | 0 | 0 | 0 | 0 | 1 | 0 | 1 | 0 | 0 | 0 | 0 | 0 | 0 | 0 |
| 16 | 1 | 1 | 0 | 0 | 0 | 0 | 0 | 0 | 1 | 1 | 1 | 1 | 1 | 0 | 1 | 0 |
| 17 | 0 | 0 | 0 | 1 | 0 | 0 | 1 | 0 | 0 | 1 | 0 | 0 | 1 | 1 | 0 | 0 |
| 18 | 0 | 0 | 0 | 0 | 1 | 1 | 0 | 0 | 0 | 1 | 0 | 0 | 0 | 1 | 0 | 0 |
| 19 | 0 | 0 | 1 | 1 | 0 | 0 | 1 | 1 | 0 | 1 | 0 | 0 | 1 | 0 | 0 | 0 |
| 20 | 0 | 0 | 0 | 0 | 1 | 0 | 0 | 0 | 1 | 1 | 0 | 0 | 0 | 1 | 1 | 0 |
| 21 | 0 | 0 | 1 | 0 | 1 | 0 | 1 | 1 | 0 | 0 | 0 | 1 | 0 | 1 | 1 | 1 |
| 22 | 0 | 0 | 0 | 0 | 0 | 0 | 0 | 0 | 0 | 0 | 0 | 0 | 0 | 0 | 0 | 0 |
| 23 | 0 | 0 | 0 | 0 | 0 | 0 | 0 | 0 | 0 | 0 | 0 | 0 | 0 | 0 | 0 | 0 |
| 24 | 0 | 1 | 0 | 0 | 1 | 1 | 1 | 0 | 1 | 0 | 1 | 1 | 0 | 1 | 1 | 0 |
| 25 | 1 | 0 | 0 | 0 | 1 | 1 | 1 | 1 | 1 | 0 | 1 | 1 | 0 | 1 | 1 | 1 |
| 26 | 1 | 0 | 0 | 1 | 0 | 1 | 1 | 0 | 1 | 0 | 1 | 0 | 1 | 0 | 1 | 0 |
| 27 | 1 | 0 | 0 | 1 | 0 | 1 | 1 | 0 | 1 | 0 | 0 | 1 | 1 | 0 | 0 | 1 |
| 28 | 1 | 0 | 1 | 0 | 1 | 1 | 0 | 0 | 1 | 0 | 1 | 1 | 0 | 1 | 1 | 0 |
| 29 | 350$_0$ | 350$_1$ | 350$_2$ | 350$_3$ | 350$_4$ | 350$_5$ | 350$_6$ | 350$_7$ | 350$_8$ | 350$_9$ | 350$_{10}$ | 350$_{11}$ | 350$_{12}$ | 350$_{13}$ | 350$_{14}$ | 350$_{15}$ |

220

310

224[0] 224[1] 224[2] 224[3] 224[4] 224[5] 224[6] 224[7] 224[8] 224[9] 224[10] 224[11] 224[12] 224[13] 224[14] 224[15]

Eight Data Bits | Eight Data Bits

Four Data Bits

One Data Bit

Two Data Bits

| *FIG. 9L-1* |
|---|
| *FIG. 9L-2* |

Memory Mapping System 100

Source Memory System 200

DW$_1$

| Address | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|
| 0 | 1 | 1 | 0 | 1 | 1 | 0 | 1 | 0 | 1 | 1 | 0 | 0 | 0 | 1 | 1 | |
| 1 | 0 | 1 | 0 | 0 | 0 | 0 | 0 | 0 | 0 | 0 | 0 | 0 | 0 | 0 | 0 | 220 |
| 2 | 1 | 1 | 1 | 1 | 1 | 1 | 1 | 1 | 1 | 1 | 1 | 1 | 1 | 1 | 1 | |
| 3 | 1 | 0 | 1 | 1 | 0 | 1 | 0 | 0 | 1 | 0 | 1 | 0 | 1 | 0 | 0 | |
| 4 | 0 | 0 | 0 | 0 | 1 | 0 | 0 | 0 | 0 | 0 | 0 | 1 | 1 | 0 | 1 | 210 |
| 5 | 0 | 0 | 0 | 0 | 0 | 1 | 0 | 0 | 0 | 0 | 1 | 0 | 1 | 1 | 1 | |
| 6 | 0 | 0 | 0 | 0 | 0 | 0 | 1 | 0 | 0 | 1 | 0 | 0 | 0 | 1 | 0 | |
| 7 | 0 | 0 | 0 | 0 | 0 | 0 | 0 | 1 | 1 | 1 | 0 | 0 | 1 | 0 | 0 | |
| 8 | 1 | 0 | 0 | 0 | 0 | 0 | 0 | 0 | 0 | 0 | 0 | 0 | 1 | 0 | 1 | |
| 9 | 0 | 1 | 0 | 0 | 0 | 0 | 0 | 0 | 1 | 1 | 0 | 0 | 0 | 0 | 0 | |
| 10 | 0 | 0 | 1 | 0 | 0 | 0 | 0 | 0 | 0 | 1 | 0 | 0 | 1 | 1 | 1 | 224 |
| 11 | 0 | 0 | 0 | 1 | 0 | 0 | 0 | 0 | 0 | 1 | 0 | 0 | 1 | 1 | 1 | |
| 12 | 0 | 0 | 0 | 0 | 1 | 0 | 0 | 0 | 0 | 0 | 1 | 1 | 1 | 0 | 0 | |
| 13 | 0 | 0 | 0 | 0 | 0 | 1 | 0 | 0 | 0 | 0 | 1 | 1 | 1 | 1 | 1 | |
| 14 | 0 | 0 | 0 | 0 | 0 | 0 | 1 | 0 | 0 | 1 | 0 | 0 | 0 | 1 | 1 | |
| 15 | 0 | 0 | 0 | 0 | 0 | 0 | 0 | 1 | 1 | 0 | 0 | 0 | 1 | 1 | 0 | |
| 16 | 1 | 1 | 1 | 0 | 0 | 1 | 0 | 1 | 0 | 0 | 0 | 0 | 1 | 0 | **1** | 224[16] |
| 17 | 0 | 0 | 1 | 0 | 1 | 0 | 1 | 0 | 1 | 0 | 0 | 0 | 0 | 1 | **1** | 224[17] |
| 18 | 0 | 1 | 0 | 0 | 1 | 1 | 0 | 0 | 1 | 1 | 0 | 0 | 0 | 1 | **0** | 224[18] |
| 19 | 1 | 0 | 0 | 1 | 1 | 1 | 0 | 0 | 0 | 1 | 1 | 0 | 1 | 0 | **1** | 224[19] |
| 20 | 0 | 0 | 1 | 0 | 0 | 0 | 1 | 0 | 0 | 0 | 1 | 0 | 1 | 0 | **1** | 224[20] |
| 21 | 0 | 1 | 0 | 0 | 0 | 0 | 0 | 1 | 1 | 0 | 1 | 1 | 1 | 0 | **0** | 224[21] |
| 22 | 0 | 0 | 0 | 0 | 0 | 0 | 0 | 0 | 0 | 0 | 0 | 1 | 1 | 0 | **1** | 224[22] |
| 23 | 0 | 1 | 1 | 0 | 0 | 0 | 0 | 0 | 0 | 1 | 1 | 1 | 1 | 0 | **1** | 224[23] |
| 24 | 0 | 0 | 0 | 1 | 0 | 0 | 0 | 0 | 0 | 0 | 0 | 0 | 1 | 0 | **0** | 224[24] |
| 25 | 0 | 0 | 0 | 0 | 0 | 0 | 0 | 0 | 0 | 0 | 0 | 0 | 0 | 1 | **0** | 224[25] |
| 26 | 1 | 0 | 0 | 1 | 0 | 0 | 1 | 0 | 0 | 0 | 0 | 0 | 0 | 1 | **1** | 224[26] |
| 27 | 1 | 0 | 1 | 0 | 0 | 0 | 0 | 0 | 0 | 0 | 0 | 0 | 1 | 0 | **0** | 224[27] |
| 28 | 1 | 1 | 0 | 0 | 1 | 0 | 0 | 0 | 0 | 0 | 0 | 0 | 1 | 0 | **1** | 224[28] |
| 29 | 1 | 0 | 1 | 0 | 0 | 1 | 0 | 0 | 0 | 0 | 0 | 0 | 0 | 1 | **0** | 224[29] |
| 30 | 1 | 1 | 0 | 0 | 0 | 0 | 1 | 0 | 0 | 0 | 0 | 0 | 1 | 0 | **1** | 224[30] |
| 31 | 1 | 0 | 0 | 0 | 0 | 0 | 0 | 0 | 0 | 0 | 0 | 0 | 0 | 1 | **1** | 224[31] |

$250_4$

DSW$_1$ (bits 14–7) DSW$_2$ (bits 6–3) DSW$_3$ (bits 2–1) DSW$_4$ (bit 0)

*FIG. 9L-1*

Destination Memory System 300

DW₂ → $DW_2$

220

310

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 1 | 1 | 0 | 1 | 0 | 0 | 1 | 0 | 0 | 0 | 0 | 0 | 0 |
| 1 | 1 | 1 | 1 | 1 | 1 | 1 | 1 | 1 | 1 | 0 | 1 | 1 | 0 | 1 | 0 | 0 |
| 2 | 0 | 0 | 0 | 0 | 1 | 0 | 0 | 0 | 0 | 0 | 0 | 0 | 0 | 1 | 0 | 0 |
| 3 | 0 | 0 | 0 | 0 | 0 | 0 | 1 | 0 | 0 | 0 | 0 | 0 | 0 | 0 | 0 | 1 |
| 4 | 1 | 0 | 0 | 0 | 0 | 0 | 0 | 0 | 0 | 1 | 0 | 0 | 0 | 0 | 0 | 0 |
| 5 | 0 | 0 | 1 | 0 | 0 | 0 | 0 | 0 | 0 | 0 | 0 | 1 | 0 | 0 | 0 | 0 |
| 6 | 0 | 0 | 0 | 0 | 1 | 0 | 0 | 0 | 0 | 0 | 0 | 0 | 0 | 1 | 0 | 0 |
| 7 | 0 | 0 | 0 | 0 | 0 | 0 | 1 | 0 | 0 | 0 | 0 | 0 | 0 | 0 | 0 | 1 |
| 8 | 1 | 1 | 1 | 0 | 0 | 1 | 0 | 1 | 0 | 0 | 1 | 0 | 1 | 0 | 1 | 0 |
| 9 | 0 | 1 | 0 | 0 | 1 | 1 | 0 | 0 | 1 | 0 | 0 | 1 | 1 | 1 | 0 | 0 |
| 10 | 0 | 0 | 1 | 0 | 0 | 0 | 1 | 0 | 0 | 1 | 0 | 0 | 0 | 0 | 0 | 1 |
| 11 | 0 | 0 | 0 | 0 | 0 | 0 | 0 | 0 | 0 | 1 | 1 | 0 | 0 | 0 | 0 | 0 |
| 12 | 0 | 0 | 0 | 1 | 0 | 0 | 0 | 0 | 0 | 0 | 0 | 0 | 0 | 0 | 0 | 0 |
| 13 | 1 | 0 | 0 | 1 | 0 | 0 | 1 | 0 | 1 | 0 | 1 | 0 | 0 | 0 | 0 | 0 |
| 14 | 1 | 1 | 0 | 0 | 1 | 0 | 0 | 0 | 1 | 0 | 1 | 0 | 0 | 1 | 0 | 0 |
| 15 | 1 | 1 | 0 | 0 | 0 | 0 | 1 | 0 | 1 | 0 | 0 | 0 | 0 | 0 | 0 | 0 |
| 16 | 1 | 1 | 0 | 0 | 0 | 0 | 0 | 0 | 1 | 1 | 1 | 1 | 1 | 0 | 1 | 0 |
| 17 | 0 | 0 | 0 | 1 | 0 | 0 | 1 | 0 | 0 | 1 | 0 | 0 | 1 | 1 | 0 | 0 |
| 18 | 0 | 0 | 0 | 0 | 1 | 1 | 0 | 0 | 0 | 1 | 0 | 0 | 0 | 1 | 0 | 0 |
| 19 | 0 | 0 | 1 | 1 | 0 | 0 | 1 | 1 | 0 | 1 | 0 | 0 | 1 | 0 | 0 | 0 |
| 20 | 0 | 0 | 0 | 0 | 1 | 0 | 0 | 0 | 1 | 1 | 0 | 0 | 0 | 1 | 1 | 0 |
| 21 | 0 | 0 | 1 | 0 | 1 | 0 | 1 | 1 | 0 | 0 | 0 | 1 | 0 | 1 | 1 | 1 |
| 22 | 0 | 0 | 0 | 0 | 0 | 0 | 0 | 0 | 0 | 0 | 0 | 0 | 0 | 0 | 0 | 0 |
| 23 | 0 | 0 | 0 | 0 | 0 | 0 | 0 | 0 | 0 | 0 | 0 | 0 | 0 | 0 | 0 | 0 |
| 24 | 0 | 1 | 0 | 0 | 1 | 1 | 1 | 0 | 1 | 0 | 1 | 1 | 0 | 1 | 1 | 0 |
| 25 | 1 | 0 | 0 | 0 | 1 | 1 | 1 | 1 | 1 | 0 | 1 | 1 | 0 | 1 | 1 | 1 |
| 26 | 1 | 0 | 0 | 1 | 0 | 1 | 1 | 0 | 1 | 0 | 1 | 0 | 1 | 0 | 1 | 0 |
| 27 | 1 | 0 | 0 | 1 | 0 | 1 | 1 | 0 | 1 | 0 | 0 | 1 | 1 | 0 | 0 | 1 |
| 28 | 1 | 0 | 1 | 0 | 1 | 1 | 0 | 0 | 1 | 0 | 1 | 1 | 0 | 1 | 1 | 0 |
| 29 | 1 | 1 | 0 | 1 | 1 | 0 | 1 | 1 | 0 | 0 | 1 | 0 | 1 | 0 | 1 | 1 |

$350_0$ $350_1$ $350_2$ $350_3$ $350_4$ $350_5$ $350_6$ $350_7$ $350_8$ $350_9$ $350_{10}$ $350_{11}$ $350_{12}$ $350_{13}$ $350_{14}$ $350_{15}$

224[17] 224[19] 224[21] 224[23] 224[25] 224[27] 224[29] 224[31]

224[16] 224[18] 224[20] 224[22] 224[24] 224[26] 224[28] 224[30]

Eight Data Bits — Eight Data Bits

Four Data Bits

One Data Bit

Two Data Bits

Memory Mapping System 100

$DW_1$ · $MD_1$ · Source Memory System 200 · 220 · 210

| Address | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 | 1 | 0 | 1 | 0 | 1 | 0 | 1 | 0 | 0 | 1 | 1 |
| 1 | 0 | 0 | 1 | 1 | 0 | 0 | 0 | 0 | 0 | 0 | 0 | 1 | 0 | 0 | 1 | 0 | 0 | 1 | 0 | 1 | 0 | 1 | 0 | 1 | 1 | 0 | 1 |
| 2 | 0 | 1 | 0 | 0 | 0 | 0 | 0 | 0 | 0 | 0 | 1 | 0 | 0 | 0 | 1 | 0 | 1 | 0 | 1 | 0 | 1 | 0 | 1 | 0 | 1 | 1 | 0 |
| 3 | 0 | 1 | 0 | 0 | 0 | 0 | 0 | 0 | 0 | 1 | 0 | 0 | 0 | 0 | 1 | 0 | 0 | 1 | 0 | 1 | 0 | 1 | 0 | 1 | 1 | 1 | 1 |
| 4 | 0 | 0 | 0 | 1 | 0 | 0 | 0 | 0 | 1 | 0 | 0 | 0 | 0 | 0 | 1 | 0 | 1 | 0 | 1 | 0 | 1 | 0 | 1 | 0 | 1 | 1 | 0 |
| 5 | 0 | 0 | 1 | 0 | 1 | 0 | 0 | 0 | 1 | 0 | 0 | 0 | 0 | 0 | 1 | 0 | 0 | 1 | 0 | 1 | 0 | 1 | 0 | 1 | 1 | 0 | 1 |
| 6 | 0 | 0 | 0 | 1 | 1 | 0 | 0 | 1 | 0 | 0 | 0 | 0 | 0 | 1 | 0 | 0 | 1 | 0 | 1 | 0 | 1 | 0 | 1 | 0 | 1 | 1 | 0 |
| 7 | 0 | 0 | 0 | 1 | 0 | 0 | 0 | 1 | 0 | 0 | 0 | 0 | 1 | 0 | 0 | 0 | 0 | 1 | 0 | 1 | 0 | 1 | 0 | 1 | 0 | 1 | 1 |
| 8 | 0 | 0 | 1 | 1 | 0 | 0 | 1 | 0 | 0 | 0 | 0 | 1 | 0 | 0 | 0 | 0 | 1 | 0 | 1 | 0 | 1 | 0 | 1 | 0 | 0 | 1 | 1 |
| 9 | 0 | 1 | 1 | 0 | 0 | 0 | 1 | 0 | 0 | 0 | 1 | 0 | 1 | 0 | 0 | 0 | 1 | 0 | 1 | 0 | 1 | 0 | 1 | 0 | 0 | 1 | 0 |
| 10 | 0 | 1 | 0 | 0 | 0 | 1 | 1 | 0 | 0 | 1 | 0 | 0 | 0 | 1 | 0 | 0 | 1 | 0 | 1 | 0 | 1 | 0 | 1 | 0 | 1 | 1 | 1 |
| 11 | 1 | 1 | 0 | 0 | 0 | 1 | 0 | 0 | 0 | 1 | 0 | 0 | 0 | 0 | 1 | 0 | 1 | 0 | 1 | 0 | 1 | 0 | 1 | 0 | 1 | 0 | 0 |
| 12 | 1 | 0 | 0 | 0 | 0 | 1 | 0 | 0 | 0 | 0 | 1 | 0 | 0 | 0 | 1 | 0 | 0 | 1 | 0 | 1 | 0 | 1 | 0 | 1 | 1 | 1 | 0 |
| 13 | 0 | 0 | 0 | 0 | 0 | 1 | 0 | 0 | 0 | 0 | 0 | 1 | 0 | 0 | 1 | 0 | 0 | 1 | 0 | 1 | 0 | 1 | 0 | 1 | 0 | 1 | 0 |
| 14 | 1 | 1 | 0 | 0 | 1 | 0 | 0 | 0 | 0 | 0 | 0 | 0 | 1 | 1 | 0 | 0 | 0 | 1 | 0 | 1 | 0 | 1 | 0 | 1 | 1 | 1 | 0 |
| 15 | 0 | 1 | 0 | 1 | 0 | 0 | 0 | 0 | 0 | 0 | 0 | 0 | 0 | 1 | 0 | 0 | 0 | 1 | 0 | 1 | 0 | 1 | 0 | 1 | 1 | 0 | 1 |
| 16 | 1 | 0 | 1 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 0 |
| 17 | 1 | 1 | 0 | 0 | 0 | 0 | 0 | 0 | 0 | 0 | 0 | 1 | 0 | 0 | 0 | 0 | 1 | 1 | 1 | 1 | 0 | 0 | 0 | 0 | 0 | 1 | 1 |
| 18 | 0 | 1 | 1 | 0 | 0 | 0 | 0 | 0 | 1 | 1 | 0 | 0 | 1 | 0 | 0 | 0 | 0 | 0 | 0 | 0 | 1 | 1 | 1 | 1 | 1 | 1 | 0 |
| 19 | 0 | 0 | 1 | 0 | 0 | 0 | 1 | 0 | 0 | 0 | 0 | 0 | 0 | 1 | 0 | 0 | 1 | 1 | 1 | 1 | 0 | 0 | 0 | 0 | 1 | 0 | 1 |
| 20 | 0 | 0 | 1 | 0 | 0 | 1 | 0 | 0 | 0 | 0 | 1 | 0 | 0 | 0 | 1 | 0 | 0 | 0 | 0 | 0 | 1 | 1 | 1 | 1 | 1 | 0 | 1 |
| 21 | 0 | 0 | 1 | 0 | 1 | 0 | 0 | 0 | 0 | 0 | 1 | 0 | 0 | 0 | 0 | 1 | 1 | 1 | 1 | 1 | 0 | 0 | 0 | 0 | 0 | 1 | 1 |
| 22 | 0 | 0 | 0 | 1 | 0 | 0 | 0 | 1 | 1 | 1 | 0 | 0 | 0 | 0 | 0 | 1 | 0 | 0 | 0 | 0 | 1 | 1 | 1 | 1 | 1 | 1 | 0 |
| 23 | 0 | 0 | 1 | 0 | 0 | 0 | 1 | 0 | 0 | 0 | 0 | 0 | 0 | 1 | 0 | 0 | 1 | 1 | 1 | 1 | 0 | 0 | 0 | 0 | 1 | 1 | 0 |
| 24 | 0 | 1 | 0 | 0 | 0 | 0 | 0 | 1 | 0 | 0 | 0 | 0 | 1 | 0 | 0 | 0 | 1 | 0 | 0 | 1 | 0 | 0 | 0 | 0 | 1 | 0 | 1 |
| 25 | 1 | 0 | 0 | 0 | 0 | 0 | 1 | 1 | 0 | 0 | 0 | 1 | 0 | 0 | 0 | 0 | 1 | 0 | 0 | 1 | 1 | 1 | 1 | 1 | 0 | 1 | 1 |
| 26 | 0 | 1 | 0 | 0 | 0 | 0 | 0 | 0 | 1 | 0 | 1 | 0 | 0 | 0 | 0 | 0 | 1 | 1 | 0 | 0 | 0 | 0 | 0 | 0 | 0 | 1 | 0 |
| 27 | 0 | 1 | 0 | 0 | 0 | 0 | 1 | 0 | 0 | 1 | 0 | 0 | 0 | 0 | 0 | 0 | 1 | 1 | 0 | 0 | 1 | 1 | 1 | 1 | 1 | 0 | 0 |
| 28 | 0 | 1 | 0 | 0 | 1 | 0 | 0 | 0 | 0 | 0 | 0 | 0 | 0 | 0 | 0 | 0 | 0 | 1 | 1 | 0 | 0 | 0 | 0 | 0 | 1 | 1 | 1 |
| 29 | 1 | 0 | 0 | 1 | 0 | 0 | 0 | 0 | 0 | 0 | 0 | 0 | 0 | 0 | 0 | 0 | 0 | 1 | 1 | 0 | 1 | 1 | 1 | 1 | 0 | 1 | 1 |
| 30 | 0 | 0 | 1 | 0 | 0 | 0 | 0 | 0 | 0 | 0 | 0 | 0 | 0 | 0 | 0 | 0 | 0 | 0 | 1 | 1 | 0 | 0 | 0 | 0 | 1 | 1 | 0 |
| 31 | 1 | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 0 | 1 | 0 |

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 |
| 1 | 0 | 0 | 1 | 1 | 0 | 0 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 1 | 0 |
| 3 | 0 | 1 | 0 | 0 | 0 | 0 | 0 | 0 | 0 | 1 | 0 | 0 | 0 | 0 | 1 | 0 |
| 4 | 0 | 0 | 0 | 1 | 0 | 0 | 0 | 0 | 1 | 0 | 0 | 0 | 0 | 0 | 1 | 0 |
| 5 | 0 | 0 | 1 | 0 | 1 | 0 | 0 | 0 | 1 | 0 | 0 | 0 | 0 | 0 | 1 | 0 |
| 6 | 0 | 0 | 0 | 1 | 1 | 0 | 0 | 1 | 0 | 0 | 0 | 0 | 0 | 1 | 0 | 0 |
| 7 | 0 | 0 | 0 | 1 | 0 | 0 | 0 | 1 | 0 | 0 | 0 | 0 | 1 | 0 | 0 | 0 |
| 8 | 0 | 0 | 1 | 1 | 0 | 0 | 1 | 0 | 0 | 0 | 0 | 1 | 0 | 0 | 0 | 0 |
| 9 | 0 | 1 | 1 | 0 | 0 | 0 | 1 | 0 | 0 | 0 | 1 | 0 | 1 | 0 | 0 | 0 |
| 10 | 0 | 1 | 0 | 0 | 0 | 1 | 1 | 0 | 0 | 1 | 0 | 0 | 0 | 1 | 0 | 0 |
| 11 | 1 | 1 | 0 | 0 | 0 | 1 | 0 | 0 | 0 | 1 | 0 | 0 | 0 | 0 | 1 | 0 |
| 12 | 1 | 0 | 0 | 0 | 0 | 1 | 0 | 0 | 0 | 0 | 1 | 0 | 0 | 0 | 1 | 0 |
| 13 | 0 | 0 | 0 | 0 | 0 | 1 | 0 | 0 | 0 | 0 | 0 | 1 | 0 | 0 | 1 | 0 |
| 14 | 1 | 1 | 0 | 0 | 1 | 0 | 0 | 0 | 0 | 0 | 0 | 0 | 1 | 1 | 0 | 0 |
| 15 | 0 | 1 | 0 | 1 | 0 | 0 | 0 | 0 | 0 | 0 | 0 | 0 | 0 | 1 | 0 | 0 |
| 16 | 1 | 0 | 1 | 0 | 1 | 1 | 1 | 1 | 1 | 1 | 1 | 1 | 0 | 0 | 0 | 0 |
| 17 | 1 | 1 | 0 | 0 | 0 | 0 | 0 | 0 | 0 | 0 | 0 | 1 | 0 | 0 | 0 | 0 |
| 18 | 0 | 1 | 1 | 0 | 0 | 0 | 0 | 0 | 1 | 1 | 0 | 0 | 1 | 0 | 0 | 0 |
| 19 | 0 | 0 | 1 | 0 | 0 | 0 | 1 | 0 | 0 | 0 | 0 | 0 | 0 | 1 | 0 | 0 |
| 20 | 0 | 0 | 1 | 0 | 0 | 1 | 0 | 0 | 0 | 0 | 1 | 0 | 0 | 0 | 1 | 0 |
| 21 | 0 | 0 | 1 | 0 | 1 | 0 | 0 | 0 | 0 | 0 | 1 | 0 | 0 | 0 | 0 | 1 |
| 22 | 0 | 0 | 0 | 1 | 0 | 0 | 0 | 1 | 1 | 1 | 0 | 0 | 0 | 0 | 0 | 1 |
| 23 | 0 | 0 | 1 | 0 | 0 | 0 | 1 | 0 | 0 | 0 | 0 | 0 | 0 | 1 | 0 | 0 |
| 24 | 0 | 1 | 0 | 0 | 0 | 0 | 0 | 1 | 0 | 0 | 0 | 0 | 1 | 0 | 0 | 0 |
| 25 | 1 | 0 | 0 | 0 | 0 | 0 | 1 | 1 | 0 | 0 | 0 | 1 | 0 | 0 | 0 | 0 |
| 26 | 0 | 1 | 0 | 0 | 0 | 0 | 0 | 0 | 1 | 0 | 1 | 0 | 0 | 0 | 0 | 0 |
| 27 | 0 | 1 | 0 | 0 | 0 | 0 | 1 | 0 | 0 | 1 | 0 | 0 | 0 | 0 | 0 | 0 |
| 28 | 0 | 1 | 0 | 0 | 1 | 0 | 0 | 0 | 0 | 0 | 0 | 0 | 0 | 0 | 0 | 0 |
| 29 | 1 | 0 | 0 | 1 | 0 | 0 | 0 | 0 | 0 | 0 | 0 | 0 | 0 | 0 | 0 | 0 |
| 30 | 0 | 0 | 1 | 0 | 0 | 0 | 0 | 0 | 0 | 0 | 0 | 0 | 0 | 0 | 0 | 0 |
| 31 | 1 | 1 | 0 | 0 | 0 | 0 | 0 | 0 | 0 | 0 | 0 | 0 | 0 | 0 | 0 | 0 |
| 32 | | | | | | | | | | | | | | | | |
| 33 | | | | | | | | | | | | | | | | |
| 34 | | | | | | | | | | | | | | | | |
| 35 | | | | | | | | | | | | | | | | |
| 36 | | | | | | | | | | | | | | | | |
| 37 | | | | | | | | | | | | | | | | |
| 38 | | | | | | | | | | | | | | | | |
| 39 | | | | | | | | | | | | | | | | |
| 40 | | | | | | | | | | | | | | | | |
| 41 | | | | | | | | | | | | | | | | |
| 42 | | | | | | | | | | | | | | | | |
| 43 | | | | | | | | | | | | | | | | |
| 44 | | | | | | | | | | | | | | | | |
| 45 | | | | | | | | | | | | | | | | |
| 46 | | | | | | | | | | | | | | | | |
| 47 | | | | | | | | | | | | | | | | |
| 48 | | | | | | | | | | | | | | | | |
| 49 | | | | | | | | | | | | | | | | |
| 50 | | | | | | | | | | | | | | | | |
| 51 | | | | | | | | | | | | | | | | |
| 52 | | | | | | | | | | | | | | | | |
| 53 | | | | | | | | | | | | | | | | |

Sixteen Data Bits

22E[2]
22E[3]
22E[4]
22E[31]
220
Destination Memory System 300
310

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 |
| 1 | 0 | 0 | 1 | 1 | 0 | 0 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 1 | 0 |
| 3 | 0 | 1 | 0 | 0 | 0 | 0 | 0 | 0 | 0 | 1 | 0 | 0 | 0 | 0 | 1 | 0 |
| 4 | 0 | 0 | 0 | 1 | 0 | 0 | 0 | 0 | 1 | 0 | 0 | 0 | 0 | 0 | 1 | 0 |
| 5 | 0 | 0 | 1 | 0 | 1 | 0 | 0 | 0 | 1 | 0 | 0 | 0 | 0 | 0 | 1 | 0 |
| 6 | 0 | 0 | 0 | 1 | 1 | 0 | 0 | 1 | 0 | 0 | 0 | 0 | 0 | 1 | 0 | 0 |
| 7 | 0 | 0 | 0 | 1 | 0 | 0 | 0 | 1 | 0 | 0 | 0 | 0 | 1 | 0 | 0 | 0 |
| 8 | 0 | 0 | 1 | 1 | 0 | 0 | 1 | 0 | 0 | 0 | 0 | 1 | 0 | 0 | 0 | 0 |
| 9 | 0 | 1 | 1 | 0 | 0 | 0 | 1 | 0 | 0 | 0 | 1 | 0 | 1 | 0 | 0 | 0 |
| 10 | 0 | 1 | 0 | 0 | 0 | 1 | 1 | 0 | 0 | 1 | 0 | 0 | 0 | 1 | 0 | 0 |
| 11 | 1 | 1 | 0 | 0 | 0 | 1 | 0 | 0 | 0 | 1 | 0 | 0 | 0 | 0 | 1 | 0 |
| 12 | 1 | 0 | 0 | 0 | 0 | 1 | 0 | 0 | 0 | 0 | 1 | 0 | 0 | 0 | 1 | 0 |
| 13 | 0 | 0 | 0 | 0 | 0 | 1 | 0 | 0 | 0 | 0 | 0 | 1 | 0 | 0 | 1 | 0 |
| 14 | 1 | 1 | 0 | 0 | 1 | 0 | 0 | 0 | 0 | 0 | 0 | 0 | 1 | 1 | 0 | 0 |
| 15 | 0 | 1 | 0 | 1 | 0 | 0 | 0 | 0 | 0 | 0 | 0 | 0 | 0 | 1 | 0 | 0 |
| 16 | 1 | 0 | 1 | 0 | 1 | 1 | 1 | 1 | 1 | 1 | 1 | 1 | 0 | 0 | 0 | 0 |
| 17 | 1 | 1 | 0 | 0 | 0 | 0 | 0 | 0 | 0 | 0 | 0 | 1 | 0 | 0 | 0 | 0 |
| 18 | 0 | 1 | 1 | 0 | 0 | 0 | 0 | 0 | 1 | 1 | 0 | 0 | 1 | 0 | 0 | 0 |
| 19 | 0 | 0 | 1 | 0 | 0 | 0 | 1 | 0 | 0 | 0 | 0 | 0 | 0 | 1 | 0 | 0 |
| 20 | 0 | 0 | 1 | 0 | 0 | 1 | 0 | 0 | 0 | 0 | 1 | 0 | 0 | 0 | 1 | 0 |
| 21 | 0 | 0 | 1 | 0 | 1 | 0 | 0 | 0 | 0 | 0 | 1 | 0 | 0 | 0 | 0 | 1 |
| 22 | 0 | 0 | 0 | 1 | 0 | 0 | 0 | 1 | 1 | 1 | 0 | 0 | 0 | 0 | 0 | 1 |
| 23 | 0 | 0 | 1 | 0 | 0 | 0 | 1 | 0 | 0 | 0 | 0 | 0 | 0 | 1 | 0 | 0 |
| 24 | 0 | 1 | 0 | 0 | 0 | 0 | 0 | 1 | 0 | 0 | 0 | 0 | 1 | 0 | 0 | 0 |
| 25 | 1 | 0 | 0 | 0 | 0 | 0 | 1 | 1 | 0 | 0 | 0 | 1 | 0 | 0 | 0 | 0 |
| 26 | 0 | 1 | 0 | 0 | 0 | 0 | 0 | 0 | 1 | 0 | 1 | 0 | 0 | 0 | 0 | 0 |
| 27 | 0 | 1 | 0 | 0 | 0 | 0 | 1 | 0 | 0 | 1 | 0 | 0 | 0 | 0 | 0 | 0 |
| 28 | 0 | 1 | 0 | 0 | 1 | 0 | 0 | 0 | 0 | 0 | 0 | 0 | 0 | 0 | 0 | 0 |
| 29 | 1 | 0 | 0 | 1 | 0 | 0 | 0 | 0 | 0 | 0 | 0 | 0 | 0 | 0 | 0 | 0 |
| 30 | 0 | 0 | 1 | 0 | 0 | 0 | 0 | 0 | 0 | 0 | 0 | 0 | 0 | 0 | 0 | 0 |
| 31 | 1 | 1 | 0 | 0 | 0 | 0 | 0 | 0 | 0 | 0 | 0 | 0 | 0 | 0 | 0 | 0 |
| 32 | 1 | 0 | 1 | 0 | 1 | 0 | 1 | 0 | 0 | 1 | 0 | 1 | 0 | 1 | 0 | 1 |

| Address | Eight Data Bits | Eight Data Bits |
|---|---|---|
| 33 | | |
| 34 | | |
| 35 | | |
| 36 | | |
| 37 | | |
| 38 | | |
| 39 | | |
| 40 | | |
| 41 | | |
| 42 | | |
| 43 | | |
| 44 | | |
| 45 | | |
| 46 | | |
| 47 | | |
| 48 | | |
| 49 | | |
| 50 | | |
| 51 | | |
| 52 | $350_0$ | $350_1$ |
| 53 | | |

220

Destination Memory System 300

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 |
| 1 | 0 | 0 | 1 | 1 | 0 | 0 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 1 | 0 |
| 3 | 0 | 1 | 0 | 0 | 0 | 0 | 0 | 0 | 0 | 1 | 0 | 0 | 0 | 0 | 1 | 0 |
| 4 | 0 | 0 | 0 | 1 | 0 | 0 | 0 | 0 | 1 | 0 | 0 | 0 | 0 | 0 | 1 | 0 |
| 5 | 0 | 0 | 1 | 0 | 1 | 0 | 0 | 0 | 1 | 0 | 0 | 0 | 0 | 0 | 1 | 0 |
| 6 | 0 | 0 | 0 | 1 | 1 | 0 | 0 | 1 | 0 | 0 | 0 | 0 | 0 | 1 | 0 | 0 |
| 7 | 0 | 0 | 0 | 1 | 0 | 0 | 0 | 1 | 0 | 0 | 0 | 0 | 1 | 0 | 0 | 0 |
| 8 | 0 | 0 | 1 | 1 | 0 | 0 | 1 | 0 | 0 | 0 | 0 | 1 | 0 | 0 | 0 | 0 |
| 9 | 0 | 1 | 1 | 0 | 0 | 0 | 1 | 0 | 0 | 0 | 1 | 0 | 1 | 0 | 0 | 0 |
| 10 | 0 | 1 | 0 | 0 | 0 | 1 | 1 | 0 | 0 | 1 | 0 | 0 | 0 | 1 | 0 | 0 |
| 11 | 1 | 1 | 0 | 0 | 0 | 1 | 0 | 0 | 0 | 1 | 0 | 0 | 0 | 0 | 1 | 0 |
| 12 | 1 | 0 | 0 | 0 | 0 | 1 | 0 | 0 | 0 | 0 | 1 | 0 | 0 | 0 | 1 | 0 |
| 13 | 0 | 0 | 0 | 0 | 0 | 1 | 0 | 0 | 0 | 0 | 0 | 1 | 0 | 0 | 1 | 0 |
| 14 | 1 | 1 | 0 | 0 | 1 | 0 | 0 | 0 | 0 | 0 | 0 | 0 | 1 | 1 | 0 | 0 |
| 15 | 0 | 1 | 0 | 1 | 0 | 0 | 0 | 0 | 0 | 0 | 0 | 0 | 0 | 1 | 0 | 0 |
| 16 | 1 | 0 | 1 | 0 | 1 | 1 | 1 | 1 | 1 | 1 | 1 | 1 | 0 | 0 | 0 | 0 |
| 17 | 1 | 1 | 0 | 0 | 0 | 0 | 0 | 0 | 0 | 0 | 0 | 1 | 0 | 0 | 0 | 0 |
| 18 | 0 | 1 | 1 | 0 | 0 | 0 | 0 | 0 | 1 | 1 | 0 | 0 | 1 | 0 | 0 | 0 |
| 19 | 0 | 0 | 1 | 0 | 0 | 0 | 1 | 0 | 0 | 0 | 0 | 0 | 0 | 1 | 0 | 0 |
| 20 | 0 | 0 | 1 | 0 | 0 | 1 | 0 | 0 | 0 | 0 | 1 | 0 | 0 | 0 | 1 | 0 |
| 21 | 0 | 0 | 1 | 0 | 1 | 0 | 0 | 0 | 0 | 0 | 1 | 0 | 0 | 0 | 0 | 1 |
| 22 | 0 | 0 | 0 | 1 | 0 | 0 | 0 | 1 | 1 | 1 | 0 | 0 | 0 | 0 | 0 | 1 |
| 23 | 0 | 0 | 1 | 0 | 0 | 0 | 1 | 0 | 0 | 0 | 0 | 0 | 0 | 1 | 0 | 0 |
| 24 | 0 | 1 | 0 | 0 | 0 | 0 | 0 | 1 | 0 | 0 | 0 | 0 | 1 | 0 | 0 | 0 |
| 25 | 1 | 0 | 0 | 0 | 0 | 0 | 1 | 1 | 0 | 0 | 0 | 1 | 0 | 0 | 0 | 0 |
| 26 | 0 | 1 | 0 | 0 | 0 | 0 | 0 | 0 | 1 | 0 | 1 | 0 | 0 | 0 | 0 | 0 |
| 27 | 0 | 1 | 0 | 0 | 0 | 0 | 1 | 0 | 0 | 1 | 0 | 0 | 0 | 0 | 0 | 0 |
| 28 | 0 | 1 | 0 | 0 | 1 | 0 | 0 | 0 | 0 | 0 | 0 | 0 | 0 | 0 | 0 | 0 |
| 29 | 1 | 0 | 0 | 1 | 0 | 0 | 0 | 0 | 0 | 0 | 0 | 0 | 0 | 0 | 0 | 0 |
| 30 | 0 | 0 | 1 | 0 | 0 | 0 | 0 | 0 | 0 | 0 | 0 | 0 | 0 | 0 | 0 | 0 |
| 31 | 1 | 1 | 0 | 0 | 0 | 0 | 0 | 0 | 0 | 0 | 0 | 0 | 0 | 0 | 0 | 0 |
| 32 | 1 | 0 | 1 | 0 | 1 | 0 | 1 | 0 | 0 | 1 | 0 | 1 | 0 | 1 | 0 | 1 |
| 33 | 1 | 0 | 1 | 0 | 1 | 0 | 1 | 0 | 0 | 1 | 0 | 1 | 0 | 1 | 0 | 1 |
| 34 | 1 | 0 | 1 | 0 | 1 | 0 | 1 | 0 | 0 | 1 | 0 | 1 | 0 | 1 | 0 | 1 |
| 35 | 1 | 0 | 1 | 0 | 1 | 0 | 1 | 0 | 0 | 1 | 0 | 1 | 0 | 1 | 0 | 1 |
| 36 | 1 | 0 | 1 | 0 | 1 | 0 | 1 | 0 | 1 | 0 | 1 | 0 | 1 | 0 | 1 | 0 |
| 37 | 1 | 0 | 1 | 0 | 1 | 0 | 1 | 0 | 1 | 0 | 1 | 0 | 1 | 0 | 1 | 0 |
| 38 | 0 | 1 | 0 | 1 | 0 | 1 | 0 | 1 | 0 | 1 | 0 | 1 | 0 | 1 | 0 | 1 |
| 39 | 0 | 1 | 0 | 1 | 0 | 1 | 0 | 1 | 0 | 1 | 0 | 1 | 0 | 1 | 0 | 1 |
| 40 | 0 | 0 | 0 | 0 | 1 | 1 | 1 | 1 | 1 | 1 | 1 | 1 | 0 | 0 | 0 | 0 |
| 41 | 0 | 0 | 0 | 0 | 1 | 1 | 1 | 1 | 1 | 1 | 1 | 1 | 0 | 0 | 0 | 0 |
| 42 | 0 | 0 | 0 | 0 | 1 | 1 | 1 | 1 | 1 | 1 | 1 | 1 | 0 | 0 | 0 | 0 |
| 43 | 0 | 0 | 0 | 0 | 1 | 1 | 1 | 1 | 1 | 1 | 1 | 1 | 0 | 0 | 0 | 0 |
| 44 | 1 | 0 | 0 | 1 | 0 | 0 | 0 | 0 | 1 | 0 | 0 | 1 | 1 | 1 | 1 | 1 |
| 45 | 1 | 1 | 0 | 0 | 0 | 0 | 0 | 0 | 1 | 1 | 0 | 0 | 1 | 1 | 1 | 1 |
| 46 | 0 | 1 | 1 | 0 | 0 | 0 | 0 | 0 | 0 | 1 | 1 | 0 | 1 | 1 | 1 | 1 |
| 47 | 0 | 0 | 1 | 1 | 0 | 0 | 0 | 0 | 0 | 0 | 1 | 1 | 1 | 1 | 1 | 1 |
| 48 | | | | | | | | | | | | | | | | |
| 49 | | | | | | | | | | | | | | | | |
| 50 | | | | | | | | | | | | | | | | |
| 51 | | | | | | | | | | | | | | | | |
| 52 | $350_0$ | | | | | | | | $350_1$ | | | | | | | |
| 53 | | | | | | | | | | | | | | | | |

Eight Data Bits | Eight Data Bits

220

Destination Memory System 300

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 |
| 1 | 0 | 0 | 1 | 1 | 0 | 0 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 1 | 0 |
| 3 | 0 | 1 | 0 | 0 | 0 | 0 | 0 | 0 | 0 | 1 | 0 | 0 | 0 | 0 | 1 | 0 |
| 4 | 0 | 0 | 0 | 1 | 0 | 0 | 0 | 0 | 1 | 0 | 0 | 0 | 0 | 0 | 1 | 0 |
| 5 | 0 | 0 | 1 | 0 | 1 | 0 | 0 | 0 | 1 | 0 | 0 | 0 | 0 | 0 | 1 | 0 |
| 6 | 0 | 0 | 0 | 1 | 1 | 0 | 0 | 1 | 0 | 0 | 0 | 0 | 0 | 1 | 0 | 0 |
| 7 | 0 | 0 | 0 | 1 | 0 | 0 | 0 | 1 | 0 | 0 | 0 | 0 | 1 | 0 | 0 | 0 |
| 8 | 0 | 0 | 1 | 1 | 0 | 0 | 1 | 0 | 0 | 0 | 0 | 1 | 0 | 0 | 0 | 0 |
| 9 | 0 | 1 | 1 | 0 | 0 | 0 | 1 | 0 | 0 | 0 | 1 | 0 | 1 | 0 | 0 | 0 |
| 10 | 0 | 1 | 0 | 0 | 0 | 1 | 1 | 0 | 0 | 1 | 0 | 0 | 0 | 1 | 0 | 0 |
| 11 | 1 | 1 | 0 | 0 | 0 | 1 | 0 | 0 | 0 | 1 | 0 | 0 | 0 | 0 | 1 | 0 |
| 12 | 1 | 0 | 0 | 0 | 0 | 1 | 0 | 0 | 0 | 0 | 1 | 0 | 0 | 0 | 1 | 0 |
| 13 | 0 | 0 | 0 | 0 | 0 | 1 | 0 | 0 | 0 | 0 | 0 | 1 | 0 | 0 | 1 | 0 |
| 14 | 1 | 1 | 0 | 0 | 1 | 0 | 0 | 0 | 0 | 0 | 0 | 0 | 1 | 1 | 0 | 0 |
| 15 | 0 | 1 | 0 | 1 | 0 | 0 | 0 | 0 | 0 | 0 | 0 | 0 | 0 | 1 | 0 | 0 |
| 16 | 1 | 0 | 1 | 0 | 1 | 1 | 1 | 1 | 1 | 1 | 1 | 1 | 0 | 0 | 0 | 0 |
| 17 | 1 | 1 | 0 | 0 | 0 | 0 | 0 | 0 | 0 | 0 | 0 | 1 | 0 | 0 | 0 | 0 |
| 18 | 0 | 1 | 1 | 0 | 0 | 0 | 0 | 0 | 1 | 1 | 0 | 0 | 1 | 0 | 0 | 0 |
| 19 | 0 | 0 | 1 | 0 | 0 | 0 | 1 | 0 | 0 | 0 | 0 | 0 | 0 | 1 | 0 | 0 |
| 20 | 0 | 0 | 1 | 0 | 0 | 1 | 0 | 0 | 0 | 0 | 1 | 0 | 0 | 0 | 1 | 0 |
| 21 | 0 | 0 | 1 | 0 | 1 | 0 | 0 | 0 | 0 | 0 | 1 | 0 | 0 | 0 | 0 | 1 |
| 22 | 0 | 0 | 0 | 1 | 0 | 0 | 0 | 1 | 1 | 1 | 0 | 0 | 0 | 0 | 0 | 1 |
| 23 | 0 | 0 | 1 | 0 | 0 | 0 | 1 | 0 | 0 | 0 | 0 | 0 | 0 | 1 | 0 | 0 |
| 24 | 0 | 1 | 0 | 0 | 0 | 0 | 0 | 1 | 0 | 0 | 0 | 0 | 1 | 0 | 0 | 0 |
| 25 | 1 | 0 | 0 | 0 | 0 | 0 | 1 | 1 | 0 | 0 | 0 | 1 | 0 | 0 | 0 | 0 |
| 26 | 0 | 1 | 0 | 0 | 0 | 0 | 0 | 0 | 1 | 0 | 1 | 0 | 0 | 0 | 0 | 0 |
| 27 | 0 | 1 | 0 | 0 | 0 | 0 | 1 | 0 | 0 | 1 | 0 | 0 | 0 | 0 | 0 | 0 |
| 28 | 0 | 1 | 0 | 0 | 1 | 0 | 0 | 0 | 0 | 0 | 0 | 0 | 0 | 0 | 0 | 0 |
| 29 | 1 | 0 | 0 | 1 | 0 | 0 | 0 | 0 | 0 | 0 | 0 | 0 | 0 | 0 | 0 | 0 |
| 30 | 0 | 0 | 1 | 0 | 0 | 0 | 0 | 0 | 0 | 0 | 0 | 0 | 0 | 0 | 0 | 0 |
| 31 | 1 | 1 | 0 | 0 | 0 | 0 | 0 | 0 | 0 | 0 | 0 | 0 | 0 | 0 | 0 | 0 |
| 32 | 1 | 0 | 1 | 0 | 1 | 0 | 1 | 0 | 0 | 1 | 0 | 1 | 0 | 1 | 0 | 1 |
| 33 | 1 | 0 | 1 | 0 | 1 | 0 | 1 | 0 | 0 | 1 | 0 | 1 | 0 | 1 | 0 | 1 |
| 34 | 1 | 0 | 1 | 0 | 1 | 0 | 1 | 0 | 0 | 1 | 0 | 1 | 0 | 1 | 0 | 1 |
| 35 | 1 | 0 | 1 | 0 | 1 | 0 | 1 | 0 | 0 | 1 | 0 | 1 | 0 | 1 | 0 | 1 |
| 36 | 1 | 0 | 1 | 0 | 1 | 0 | 1 | 0 | 1 | 0 | 1 | 0 | 1 | 0 | 1 | 0 |
| 37 | 1 | 0 | 1 | 0 | 1 | 0 | 1 | 0 | 1 | 0 | 1 | 0 | 1 | 0 | 1 | 0 |
| 38 | 0 | 1 | 0 | 1 | 0 | 1 | 0 | 1 | 0 | 1 | 0 | 1 | 0 | 1 | 0 | 1 |
| 39 | 0 | 1 | 0 | 1 | 0 | 1 | 0 | 1 | 0 | 1 | 0 | 1 | 0 | 1 | 0 | 1 |
| 40 | 0 | 0 | 0 | 0 | 1 | 1 | 1 | 1 | 1 | 1 | 1 | 1 | 0 | 0 | 0 | 0 |
| 41 | 0 | 0 | 0 | 0 | 1 | 1 | 1 | 1 | 1 | 1 | 1 | 1 | 0 | 0 | 0 | 0 |
| 42 | 0 | 0 | 0 | 0 | 1 | 1 | 1 | 1 | 1 | 1 | 1 | 1 | 0 | 0 | 0 | 0 |
| 43 | 0 | 0 | 0 | 0 | 1 | 1 | 1 | 1 | 1 | 1 | 1 | 1 | 0 | 0 | 0 | 0 |
| 44 | 1 | 0 | 0 | 1 | 0 | 0 | 0 | 0 | 1 | 0 | 0 | 1 | 1 | 1 | 1 | 1 |
| 45 | 1 | 1 | 0 | 0 | 0 | 0 | 0 | 0 | 1 | 1 | 0 | 0 | 1 | 1 | 1 | 1 |
| 46 | 0 | 1 | 1 | 0 | 0 | 0 | 0 | 0 | 0 | 1 | 1 | 0 | 1 | 1 | 1 | 1 |
| 47 | 0 | 0 | 1 | 1 | 0 | 0 | 0 | 0 | 0 | 0 | 1 | 1 | 1 | 1 | 1 | 1 |
| 48 | 0 | 1 | 1 | 0 | 1 | 1 | 1 | 1 | 1 | 1 | 1 | 0 | 1 | 1 | 0 | 1 |
| 49 | | | | | | | | | | | | | | | | |
| 50 | | | | | | | | | | | | | | | | |
| 51 | | | | | | | | | | | | | | | | |
| 52 | $350_0$ | | $350_1$ | | $350_2$ | | $350_3$ | | $350_4$ | | $350_5$ | | $350_6$ | | $350_7$ | |
| 53 | | | | | | | | | | | | | | | | |

Eight Data Bits — Eight Data Bits — Two Data Bits

220

Destination Memory System 300

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 |
| 1 | 0 | 0 | 1 | 1 | 0 | 0 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 1 | 0 |
| 3 | 0 | 1 | 0 | 0 | 0 | 0 | 0 | 0 | 0 | 1 | 0 | 0 | 0 | 0 | 1 | 0 |
| 4 | 0 | 0 | 0 | 1 | 0 | 0 | 0 | 0 | 1 | 0 | 0 | 0 | 0 | 0 | 1 | 0 |
| 5 | 0 | 0 | 1 | 0 | 1 | 0 | 0 | 0 | 1 | 0 | 0 | 0 | 0 | 0 | 1 | 0 |
| 6 | 0 | 0 | 0 | 1 | 1 | 0 | 0 | 1 | 0 | 0 | 0 | 0 | 0 | 1 | 0 | 0 |
| 7 | 0 | 0 | 0 | 1 | 0 | 0 | 0 | 1 | 0 | 0 | 0 | 0 | 1 | 0 | 0 | 0 |
| 8 | 0 | 0 | 1 | 1 | 0 | 0 | 1 | 0 | 0 | 0 | 0 | 1 | 0 | 0 | 0 | 0 |
| 9 | 0 | 1 | 1 | 0 | 0 | 0 | 1 | 0 | 0 | 0 | 1 | 0 | 1 | 0 | 0 | 0 |
| 10 | 0 | 1 | 0 | 0 | 0 | 1 | 1 | 0 | 0 | 1 | 0 | 0 | 0 | 1 | 0 | 0 |
| 11 | 1 | 1 | 0 | 0 | 0 | 1 | 0 | 0 | 0 | 1 | 0 | 0 | 0 | 0 | 1 | 0 |
| 12 | 1 | 0 | 0 | 0 | 0 | 1 | 0 | 0 | 0 | 0 | 1 | 0 | 0 | 0 | 1 | 0 |
| 13 | 0 | 0 | 0 | 0 | 0 | 1 | 0 | 0 | 0 | 0 | 0 | 1 | 0 | 0 | 1 | 0 |
| 14 | 1 | 1 | 0 | 0 | 1 | 0 | 0 | 0 | 0 | 0 | 0 | 0 | 1 | 1 | 0 | 0 |
| 15 | 0 | 1 | 0 | 1 | 0 | 0 | 0 | 0 | 0 | 0 | 0 | 0 | 0 | 1 | 0 | 0 |
| 16 | 1 | 0 | 1 | 0 | 1 | 1 | 1 | 1 | 1 | 1 | 1 | 1 | 0 | 0 | 0 | 0 |
| 17 | 1 | 1 | 0 | 0 | 0 | 0 | 0 | 0 | 0 | 0 | 0 | 1 | 0 | 0 | 0 | 0 |
| 18 | 0 | 1 | 1 | 0 | 0 | 0 | 0 | 0 | 1 | 1 | 0 | 0 | 1 | 0 | 0 | 0 |
| 19 | 0 | 0 | 1 | 0 | 0 | 0 | 1 | 0 | 0 | 0 | 0 | 0 | 0 | 1 | 0 | 0 |
| 20 | 0 | 0 | 1 | 0 | 0 | 1 | 0 | 0 | 0 | 0 | 1 | 0 | 0 | 0 | 1 | 0 |
| 21 | 0 | 0 | 1 | 0 | 1 | 0 | 0 | 0 | 0 | 0 | 1 | 0 | 0 | 0 | 0 | 1 |
| 22 | 0 | 0 | 0 | 1 | 0 | 0 | 0 | 1 | 1 | 1 | 0 | 0 | 0 | 0 | 0 | 1 |
| 23 | 0 | 0 | 1 | 0 | 0 | 0 | 1 | 0 | 0 | 0 | 0 | 0 | 0 | 1 | 0 | 0 |
| 24 | 0 | 1 | 0 | 0 | 0 | 0 | 0 | 1 | 0 | 0 | 0 | 0 | 1 | 0 | 0 | 0 |
| 25 | 1 | 0 | 0 | 0 | 0 | 0 | 1 | 1 | 0 | 0 | 0 | 1 | 0 | 0 | 0 | 0 |
| 26 | 0 | 1 | 0 | 0 | 0 | 0 | 0 | 0 | 1 | 0 | 1 | 0 | 0 | 0 | 0 | 0 |
| 27 | 0 | 1 | 0 | 0 | 0 | 0 | 1 | 0 | 0 | 1 | 0 | 0 | 0 | 0 | 0 | 0 |
| 28 | 0 | 1 | 0 | 0 | 1 | 0 | 0 | 0 | 0 | 0 | 0 | 0 | 0 | 0 | 0 | 0 |
| 29 | 1 | 0 | 0 | 1 | 0 | 0 | 0 | 0 | 0 | 0 | 0 | 0 | 0 | 0 | 0 | 0 |
| 30 | 0 | 0 | 1 | 0 | 0 | 0 | 0 | 0 | 0 | 0 | 0 | 0 | 0 | 0 | 0 | 0 |
| 31 | 1 | 1 | 0 | 0 | 0 | 0 | 0 | 0 | 0 | 0 | 0 | 0 | 0 | 0 | 0 | 0 |
| 32 | 1 | 0 | 1 | 0 | 1 | 0 | 1 | 0 | 0 | 1 | 0 | 1 | 0 | 1 | 0 | 1 |
| 33 | 1 | 0 | 1 | 0 | 1 | 0 | 1 | 0 | 0 | 1 | 0 | 1 | 0 | 1 | 0 | 1 |
| 34 | 1 | 0 | 1 | 0 | 1 | 0 | 1 | 0 | 0 | 1 | 0 | 1 | 0 | 1 | 0 | 1 |
| 35 | 1 | 0 | 1 | 0 | 1 | 0 | 1 | 0 | 0 | 1 | 0 | 1 | 0 | 1 | 0 | 1 |
| 36 | 1 | 0 | 1 | 0 | 1 | 0 | 1 | 0 | 1 | 0 | 1 | 0 | 1 | 0 | 1 | 0 |
| 37 | 1 | 0 | 1 | 0 | 1 | 0 | 1 | 0 | 1 | 0 | 1 | 0 | 1 | 0 | 1 | 0 |
| 38 | 0 | 1 | 0 | 1 | 0 | 1 | 0 | 1 | 0 | 1 | 0 | 1 | 0 | 1 | 0 | 1 |
| 39 | 0 | 1 | 0 | 1 | 0 | 1 | 0 | 1 | 0 | 1 | 0 | 1 | 0 | 1 | 0 | 1 |
| 40 | 0 | 0 | 0 | 0 | 1 | 1 | 1 | 1 | 1 | 1 | 1 | 1 | 0 | 0 | 0 | 0 |
| 41 | 0 | 0 | 0 | 0 | 1 | 1 | 1 | 1 | 1 | 1 | 1 | 1 | 0 | 0 | 0 | 0 |
| 42 | 0 | 0 | 0 | 0 | 1 | 1 | 1 | 1 | 1 | 1 | 1 | 1 | 0 | 0 | 0 | 0 |
| 43 | 0 | 0 | 0 | 0 | 1 | 1 | 1 | 1 | 1 | 1 | 1 | 1 | 0 | 0 | 0 | 0 |
| 44 | 1 | 0 | 0 | 1 | 0 | 0 | 0 | 0 | 1 | 0 | 0 | 1 | 1 | 1 | 1 | 1 |
| 45 | 1 | 1 | 0 | 0 | 0 | 0 | 0 | 0 | 1 | 1 | 0 | 0 | 1 | 1 | 1 | 1 |
| 46 | 0 | 1 | 1 | 0 | 0 | 0 | 0 | 0 | 0 | 1 | 1 | 0 | 1 | 1 | 1 | 1 |
| 47 | 0 | 0 | 1 | 1 | 0 | 0 | 0 | 0 | 0 | 0 | 1 | 1 | 1 | 1 | 1 | 1 |
| 48 | 0 | 1 | 1 | 0 | 1 | 1 | 1 | 1 | 1 | 1 | 1 | 0 | 1 | 1 | 0 | 1 |
| 49 | 0 | 1 | 0 | 1 | 1 | 1 | 1 | 0 | 1 | 1 | 0 | 1 | 1 | 1 | 1 | 0 |
| 50 | 1 | 1 | 0 | 1 | 1 | 1 | 1 | 0 | 1 | 0 | 0 | 1 | 1 | 1 | 1 | 1 |
| 51 | 1 | 0 | 0 | 1 | 0 | 1 | 1 | 0 | 1 | 1 | 0 | 1 | 1 | 1 | 0 | 1 |
| 52 | | | | | | | | | | | | | | | | |
| 53 | $350_0$ | | $350_1$ | | $350_2$ | | $350_3$ | | $350_4$ | | $350_5$ | | $350_6$ | | $350_7$ | |

DW$_2$

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 |
| 1 | 0 | 0 | 1 | 1 | 0 | 0 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 1 | 0 |
| 3 | 0 | 1 | 0 | 0 | 0 | 0 | 0 | 0 | 0 | 1 | 0 | 0 | 0 | 0 | 1 | 0 |
| 4 | 0 | 0 | 0 | 1 | 0 | 0 | 0 | 0 | 1 | 0 | 0 | 0 | 0 | 0 | 1 | 0 |
| 5 | 0 | 0 | 1 | 0 | 1 | 0 | 0 | 0 | 1 | 0 | 0 | 0 | 0 | 0 | 1 | 0 |
| 6 | 0 | 0 | 0 | 1 | 1 | 0 | 0 | 1 | 0 | 0 | 0 | 0 | 0 | 1 | 0 | 0 |
| 7 | 0 | 0 | 0 | 1 | 0 | 0 | 0 | 1 | 0 | 0 | 0 | 0 | 1 | 0 | 0 | 0 |
| 8 | 0 | 0 | 1 | 1 | 0 | 0 | 1 | 0 | 0 | 0 | 0 | 1 | 0 | 0 | 0 | 0 |
| 9 | 0 | 1 | 1 | 0 | 0 | 0 | 1 | 0 | 0 | 0 | 1 | 0 | 1 | 0 | 0 | 0 |
| 10 | 0 | 1 | 0 | 0 | 0 | 1 | 1 | 0 | 0 | 1 | 0 | 0 | 0 | 1 | 0 | 0 |
| 11 | 1 | 1 | 0 | 0 | 0 | 1 | 0 | 0 | 0 | 1 | 0 | 0 | 0 | 0 | 1 | 0 |
| 12 | 1 | 0 | 0 | 0 | 0 | 1 | 0 | 0 | 0 | 0 | 1 | 0 | 0 | 0 | 1 | 0 |
| 13 | 0 | 0 | 0 | 0 | 0 | 1 | 0 | 0 | 0 | 0 | 0 | 1 | 0 | 0 | 1 | 0 |
| 14 | 1 | 1 | 0 | 0 | 1 | 0 | 0 | 0 | 0 | 0 | 0 | 0 | 1 | 1 | 0 | 0 |
| 15 | 0 | 1 | 0 | 1 | 0 | 0 | 0 | 0 | 0 | 0 | 0 | 0 | 0 | 1 | 0 | 0 |
| 16 | 1 | 0 | 1 | 0 | 1 | 1 | 1 | 1 | 1 | 1 | 1 | 1 | 0 | 0 | 0 | 0 |
| 17 | 1 | 1 | 0 | 0 | 0 | 0 | 0 | 0 | 0 | 0 | 0 | 1 | 0 | 0 | 0 | 0 |
| 18 | 0 | 1 | 1 | 0 | 0 | 0 | 0 | 0 | 1 | 1 | 0 | 0 | 1 | 0 | 0 | 0 |
| 19 | 0 | 0 | 1 | 0 | 0 | 0 | 1 | 0 | 0 | 0 | 0 | 0 | 0 | 1 | 0 | 0 |
| 20 | 0 | 0 | 1 | 0 | 0 | 1 | 0 | 0 | 0 | 0 | 1 | 0 | 0 | 0 | 1 | 0 |
| 21 | 0 | 0 | 1 | 0 | 1 | 0 | 0 | 0 | 0 | 0 | 1 | 0 | 0 | 0 | 0 | 1 |
| 22 | 0 | 0 | 0 | 1 | 0 | 0 | 0 | 1 | 1 | 1 | 0 | 0 | 0 | 0 | 0 | 1 |
| 23 | 0 | 0 | 1 | 0 | 0 | 0 | 1 | 0 | 0 | 0 | 0 | 0 | 0 | 1 | 0 | 0 |
| 24 | 0 | 1 | 0 | 0 | 0 | 0 | 0 | 1 | 0 | 0 | 0 | 0 | 1 | 0 | 0 | 0 |
| 25 | 1 | 0 | 0 | 0 | 0 | 0 | 1 | 1 | 0 | 0 | 0 | 1 | 0 | 0 | 0 | 0 |
| 26 | 0 | 1 | 0 | 0 | 0 | 0 | 0 | 0 | 1 | 0 | 1 | 0 | 0 | 0 | 0 | 0 |
| 27 | 0 | 1 | 0 | 0 | 0 | 0 | 1 | 0 | 0 | 1 | 0 | 0 | 0 | 0 | 0 | 0 |
| 28 | 0 | 1 | 0 | 0 | 1 | 0 | 0 | 0 | 0 | 0 | 0 | 0 | 0 | 0 | 0 | 0 |
| 29 | 1 | 0 | 0 | 1 | 0 | 0 | 0 | 0 | 0 | 0 | 0 | 0 | 0 | 0 | 0 | 0 |
| 30 | 0 | 0 | 1 | 0 | 0 | 0 | 0 | 0 | 0 | 0 | 0 | 0 | 0 | 0 | 0 | 0 |
| 31 | 1 | 1 | 0 | 0 | 0 | 0 | 0 | 0 | 0 | 0 | 0 | 0 | 0 | 0 | 0 | 0 |
| 32 | 1 | 0 | 1 | 0 | 1 | 0 | 1 | 0 | 0 | 1 | 0 | 1 | 0 | 1 | 0 | 1 |
| 33 | 1 | 0 | 1 | 0 | 1 | 0 | 1 | 0 | 0 | 1 | 0 | 1 | 0 | 1 | 0 | 1 |
| 34 | 1 | 0 | 1 | 0 | 1 | 0 | 1 | 0 | 0 | 1 | 0 | 1 | 0 | 1 | 0 | 1 |
| 35 | 1 | 0 | 1 | 0 | 1 | 0 | 1 | 0 | 0 | 1 | 0 | 1 | 0 | 1 | 0 | 1 |
| 36 | 1 | 0 | 1 | 0 | 1 | 0 | 1 | 0 | 1 | 0 | 1 | 0 | 1 | 0 | 1 | 0 |
| 37 | 1 | 0 | 1 | 0 | 1 | 0 | 1 | 0 | 1 | 0 | 1 | 0 | 1 | 0 | 1 | 0 |
| 38 | 0 | 1 | 0 | 1 | 0 | 1 | 0 | 1 | 0 | 1 | 0 | 1 | 0 | 1 | 0 | 1 |
| 39 | 0 | 1 | 0 | 1 | 0 | 1 | 0 | 1 | 0 | 1 | 0 | 1 | 0 | 1 | 0 | 1 |
| 40 | 0 | 0 | 0 | 0 | 1 | 1 | 1 | 1 | 1 | 1 | 1 | 1 | 0 | 0 | 0 | 0 |
| 41 | 0 | 0 | 0 | 0 | 1 | 1 | 1 | 1 | 1 | 1 | 1 | 1 | 0 | 0 | 0 | 0 |
| 42 | 0 | 0 | 0 | 0 | 1 | 1 | 1 | 1 | 1 | 1 | 1 | 1 | 0 | 0 | 0 | 0 |
| 43 | 0 | 0 | 0 | 0 | 1 | 1 | 1 | 1 | 1 | 1 | 1 | 1 | 0 | 0 | 0 | 0 |
| 44 | 1 | 0 | 0 | 1 | 0 | 0 | 0 | 0 | 1 | 0 | 0 | 1 | 1 | 1 | 1 | 1 |
| 45 | 1 | 1 | 0 | 0 | 0 | 0 | 0 | 0 | 1 | 1 | 0 | 0 | 1 | 1 | 1 | 1 |
| 46 | 0 | 1 | 1 | 0 | 0 | 0 | 0 | 0 | 0 | 1 | 1 | 0 | 1 | 1 | 1 | 1 |
| 47 | 0 | 0 | 1 | 1 | 0 | 0 | 0 | 0 | 0 | 0 | 1 | 1 | 1 | 1 | 1 | 1 |
| 48 | 0 | 1 | 1 | 0 | 1 | 1 | 1 | 1 | 1 | 1 | 1 | 0 | 1 | 1 | 0 | 1 |
| 49 | 0 | 1 | 0 | 1 | 1 | 1 | 1 | 0 | 1 | 1 | 0 | 1 | 1 | 1 | 1 | 0 |
| 50 | 1 | 1 | 0 | 1 | 1 | 1 | 1 | 0 | 1 | 0 | 0 | 1 | 1 | 1 | 1 | 1 |
| 51 | 1 | 0 | 0 | 1 | 0 | 1 | 1 | 0 | 1 | 1 | 0 | 1 | 1 | 1 | 0 | 1 |
| 52 | 1 | 1 | 0 | 1 | 0 | 1 | 0 | 1 | 1 | 0 | 1 | 0 | 0 | 0 | 0 | 1 |
| 53 | 350$_0$ | 350$_1$ | 350$_2$ | 350$_3$ | 350$_4$ | 350$_5$ | 350$_6$ | 350$_7$ | 350$_8$ | 350$_9$ | 350$_{10}$ | 350$_{11}$ | 350$_{12}$ | 350$_{13}$ | 350$_{14}$ | 350$_{15}$ |

Eight Data Bits | Eight Data Bits

One Data Bit

Two Data Bits

220

Destination Memory System 300

| Address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 0 | 1 | 1 | 0 | 0 | 1 | 0 | 1 | 0 | 0 | 1 | 0 | 0 | 1 | 0 | 1 | 0 |
| 1 | 0 | 0 | 1 | 1 | 0 | 0 | 0 | 0 | 0 | 0 | 0 | 1 | 0 | 0 | 1 | 0 |
| 2 | 0 | 1 | 0 | 0 | 0 | 0 | 0 | 0 | 0 | 0 | 1 | 0 | 0 | 0 | 1 | 0 |
| 3 | 0 | 1 | 0 | 0 | 0 | 0 | 0 | 0 | 0 | 1 | 0 | 0 | 0 | 0 | 1 | 0 |
| 4 | 0 | 0 | 0 | 1 | 0 | 0 | 0 | 0 | 1 | 0 | 0 | 0 | 0 | 0 | 1 | 0 |
| 5 | 0 | 0 | 1 | 0 | 1 | 0 | 0 | 0 | 1 | 0 | 0 | 0 | 0 | 0 | 1 | 0 |
| 6 | 0 | 0 | 0 | 1 | 1 | 0 | 0 | 1 | 0 | 0 | 0 | 0 | 0 | 1 | 0 | 0 |
| 7 | 0 | 0 | 0 | 1 | 0 | 0 | 0 | 1 | 0 | 0 | 0 | 0 | 1 | 0 | 0 | 0 |
| 8 | 0 | 0 | 1 | 1 | 0 | 0 | 1 | 0 | 0 | 0 | 0 | 1 | 0 | 0 | 0 | 0 |
| 9 | 0 | 1 | 1 | 0 | 0 | 0 | 1 | 0 | 0 | 0 | 1 | 0 | 1 | 0 | 0 | 0 |
| 10 | 0 | 1 | 0 | 0 | 0 | 1 | 1 | 0 | 0 | 1 | 0 | 0 | 0 | 1 | 0 | 0 |
| 11 | 1 | 1 | 0 | 0 | 0 | 1 | 0 | 0 | 0 | 1 | 0 | 0 | 0 | 0 | 1 | 0 |
| 12 | 1 | 0 | 0 | 0 | 0 | 1 | 0 | 0 | 0 | 0 | 1 | 0 | 0 | 0 | 1 | 0 |
| 13 | 0 | 0 | 0 | 0 | 0 | 1 | 0 | 0 | 0 | 0 | 0 | 1 | 0 | 0 | 1 | 0 |
| 14 | 1 | 1 | 0 | 0 | 1 | 0 | 0 | 0 | 0 | 0 | 0 | 0 | 1 | 1 | 0 | 0 |
| 15 | 0 | 1 | 0 | 1 | 0 | 0 | 0 | 0 | 0 | 0 | 0 | 0 | 0 | 1 | 0 | 0 |
| 16 | 1 | 0 | 1 | 0 | 1 | 1 | 1 | 1 | 1 | 1 | 1 | 1 | 0 | 0 | 0 | 0 |
| 17 | 1 | 1 | 0 | 0 | 0 | 0 | 0 | 0 | 0 | 0 | 0 | 1 | 0 | 0 | 0 | 0 |
| 18 | 0 | 1 | 1 | 0 | 0 | 0 | 0 | 0 | 1 | 1 | 0 | 0 | 1 | 0 | 0 | 0 |
| 19 | 0 | 0 | 1 | 0 | 0 | 0 | 1 | 0 | 0 | 0 | 0 | 0 | 0 | 1 | 0 | 0 |
| 20 | 0 | 0 | 1 | 0 | 0 | 1 | 0 | 0 | 0 | 0 | 1 | 0 | 0 | 0 | 1 | 0 |
| 21 | 0 | 0 | 1 | 0 | 1 | 0 | 0 | 0 | 0 | 0 | 1 | 0 | 0 | 0 | 0 | 1 |
| 22 | 0 | 0 | 0 | 1 | 0 | 0 | 0 | 1 | 1 | 1 | 0 | 0 | 0 | 0 | 0 | 1 |
| 23 | 0 | 0 | 1 | 0 | 0 | 0 | 1 | 0 | 0 | 0 | 0 | 0 | 0 | 1 | 0 | 0 |
| 24 | 0 | 1 | 0 | 0 | 0 | 0 | 0 | 1 | 0 | 0 | 0 | 0 | 1 | 0 | 0 | 0 |
| 25 | 1 | 0 | 0 | 0 | 0 | 0 | 1 | 1 | 0 | 0 | 0 | 1 | 0 | 0 | 0 | 0 |
| 26 | 0 | 1 | 0 | 0 | 0 | 0 | 0 | 0 | 1 | 0 | 1 | 0 | 0 | 0 | 0 | 0 |
| 27 | 0 | 1 | 0 | 0 | 0 | 0 | 1 | 0 | 0 | 1 | 0 | 0 | 0 | 0 | 0 | 0 |
| 28 | 0 | 1 | 0 | 0 | 1 | 0 | 0 | 0 | 0 | 0 | 0 | 0 | 0 | 0 | 0 | 0 |
| 29 | 1 | 0 | 0 | 1 | 0 | 0 | 0 | 0 | 0 | 0 | 0 | 0 | 0 | 0 | 0 | 0 |
| 30 | 0 | 0 | 1 | 0 | 0 | 0 | 0 | 0 | 0 | 0 | 0 | 0 | 0 | 0 | 0 | 0 |
| 31 | 1 | 1 | 0 | 0 | 0 | 0 | 0 | 0 | 0 | 0 | 0 | 0 | 0 | 0 | 0 | 0 |
| 32 | 1 | 0 | 1 | 0 | 1 | 0 | 1 | 0 | 0 | 1 | 0 | 1 | 0 | 1 | 0 | 1 |
| 33 | 1 | 0 | 1 | 0 | 1 | 0 | 1 | 0 | 0 | 1 | 0 | 1 | 0 | 1 | 0 | 1 |
| 34 | 1 | 0 | 1 | 0 | 1 | 0 | 1 | 0 | 0 | 1 | 0 | 1 | 0 | 1 | 0 | 1 |
| 35 | 1 | 0 | 1 | 0 | 1 | 0 | 1 | 0 | 0 | 1 | 0 | 1 | 0 | 1 | 0 | 1 |
| 36 | 1 | 0 | 1 | 0 | 1 | 0 | 1 | 0 | 1 | 0 | 1 | 0 | 1 | 0 | 1 | 0 |
| 37 | 1 | 0 | 1 | 0 | 1 | 0 | 1 | 0 | 1 | 0 | 1 | 0 | 1 | 0 | 1 | 0 |
| 38 | 0 | 1 | 0 | 1 | 0 | 1 | 0 | 1 | 0 | 1 | 0 | 1 | 0 | 1 | 0 | 1 |
| 39 | 0 | 1 | 0 | 1 | 0 | 1 | 0 | 1 | 0 | 1 | 0 | 1 | 0 | 1 | 0 | 1 |
| 40 | 0 | 0 | 0 | 0 | 1 | 1 | 1 | 1 | 1 | 1 | 1 | 1 | 0 | 0 | 0 | 0 |
| 41 | 0 | 0 | 0 | 0 | 1 | 1 | 1 | 1 | 1 | 1 | 1 | 1 | 0 | 0 | 0 | 0 |
| 42 | 0 | 0 | 0 | 0 | 1 | 1 | 1 | 1 | 1 | 1 | 1 | 1 | 0 | 0 | 0 | 0 |
| 43 | 0 | 0 | 0 | 0 | 1 | 1 | 1 | 1 | 1 | 1 | 1 | 1 | 0 | 0 | 0 | 0 |
| 44 | 1 | 0 | 0 | 1 | 0 | 0 | 0 | 0 | 1 | 0 | 0 | 1 | 1 | 1 | 1 | 1 |
| 45 | 1 | 1 | 0 | 0 | 0 | 0 | 0 | 0 | 1 | 1 | 0 | 0 | 1 | 1 | 1 | 1 |
| 46 | 0 | 1 | 1 | 0 | 0 | 0 | 0 | 0 | 0 | 1 | 1 | 0 | 1 | 1 | 1 | 1 |
| 47 | 0 | 0 | 1 | 1 | 0 | 0 | 0 | 0 | 0 | 0 | 1 | 1 | 1 | 1 | 1 | 1 |
| 48 | 0 | 1 | 1 | 0 | 1 | 1 | 1 | 1 | 1 | 1 | 1 | 0 | 1 | 1 | 0 | 1 |
| 49 | 0 | 1 | 0 | 1 | 1 | 1 | 1 | 0 | 1 | 1 | 0 | 1 | 1 | 1 | 1 | 0 |
| 50 | 1 | 1 | 0 | 1 | 1 | 1 | 1 | 0 | 1 | 0 | 0 | 1 | 1 | 1 | 1 | 1 |
| 51 | 1 | 0 | 0 | 1 | 0 | 1 | 1 | 0 | 1 | 1 | 0 | 1 | 1 | 1 | 0 | 1 |
| 52 | 1 | 1 | 0 | 1 | 0 | 1 | 0 | 1 | 1 | 0 | 1 | 0 | 0 | 0 | 0 | 1 |
| 53 | 0 | 1 | 0 | 1 | 1 | 1 | 0 | 0 | 1 | 1 | 0 | 0 | 1 | 1 | 0 | 0 |

Eight Data Bits — Eight Data Bits

One Data Bit — Two Data Bits $350_0$ $350_1$ $350_2$ $350_{15}$

220

Destination Memory System 300

Representaion of 2K x 16 Read Port

Representaion of 2K x 16 Write Port

SYSTEM AND METHOD FOR PROVIDING COMPACT MAPPING BETWEEN DISSIMILAR MEMORY SYSTEMS

CROSS-REFERENCE TO RELATED APPLICATIONS

This application is a continuation-in-part application of application Ser. No. 11/278,794, filed on Apr. 5, 2006 now U.S. Pat. No. 7,577,558, which claims the benefit of U.S. Provisional Application Ser. No. 60/668,863, filed on Apr. 6, 2005. Priority to each of the prior applications is expressly claimed, and the disclosures of the applications are hereby incorporated herein by reference in their entireties.

FIELD

The present invention relates generally to memory mapping systems and more particularly, but not exclusively, to compiler systems for mapping between user design memory systems and physical memory systems within hardware emulation systems.

BACKGROUND

Hardware logic emulation (or acceleration) systems can be applied to implement a user design via one or more programmable integrated circuits. Such hardware logic emulation systems are commercially available from various vendors, such as Cadence Design Systems, Inc., headquartered in San Jose, Calif.

Typical hardware emulation systems utilize programmable logic devices (or integrated circuit chips) and/or processing devices (or integrated circuit chips) that are programmably interconnected. In programmable logic device-based emulation systems, for example, the logic comprising the user design can be programmed into at least one programmable logic device, such as field programmable gate array (FPGA). The logic embodied in the user design thereby can be implemented, taking an actual operating form, in the programmable logic device. Examples of conventional hardware logic emulation systems using programmable logic devices are disclosed in U.S. Pat. Nos. 5,109,353, 5,036,473, 5,475,830 and 5,960,191, the respective disclosures of which are hereby incorporated herein by reference in their entireties.

Similarly, the user design can be processed in a processor-based emulation system so that its functionality appears to be created in the processing devices by calculating the outputs of the user design. The logic embodied in the user design thereby is not itself implemented in processor-based emulation systems. In other words, the logic embodied in the user design does not take an actual operating form in the processing systems. Illustrative conventional hardware logic emulation systems that use processing devices are disclosed in U.S. Pat. Nos. 5,551,013, 6,035,117 and 6,051,030, the respective disclosures of which are hereby incorporated herein by reference in their entireties.

One primary use for hardware logic emulation systems is debugging user designs. Thereby, any functional errors present in the user designs can be identified and resolved prior to fabrication of the user designs in actual silicon. Circuit designers have used hardware emulation systems for many years to perform such debugging because the alternatives, such as simulation, typically are much slower than emulation. Simulation is a software based approach; whereas, for emulation, the user design is compiled with a testbench to form a machine-executable model. Typically, the testbench is represented as a target system (or board) that can directly interact with the user design. The machine-executable model, once compiled, can be executed via a workstation or personal computer.

To facilitate compiling the machine-executable model, the user design usually is provided in the form of a netlist description. The netlist description describes the components of the user design and the electrical interconnections among the components. The components include each circuit element for implementing the user design. Exemplary conventional circuit elements are combinational logic circuit elements (or gates), sequential logic circuit elements, such as flip-flops and latches, and memory elements, such as static random access memory (SRAM) and dynamic random access memory (DRAM). Memory elements that are incorporated into the user design often are referred to as being "design memory systems." The netlist description can be derived from any conventional source, such as a hardware description language, and is compiled to place the netlist description in a form that can be used by the emulation system.

Each design memory system of the user design is mapped onto a physical emulator memory system of the hardware emulation system during compilation. The emulator memory system typically has a fixed data width. For example, Cadence Design Systems, Inc., of San Jose, Calif., provides a Palladium II accelerator/emulation system with an emulator memory system that includes static random access memory (SRAM) and dynamic random access memory (DRAM). The static random access memory (SRAM) has a fixed data width of 32 data bits; whereas, the data width of the dynamic random access memory (DRAM) is 64 data bits.

For many memory-rich user designs, the emulator memory system therefore can quickly become a critical system resource. Each design memory system typically is mapped onto the emulator memory system without regard to the data width of the individual design memory systems. Therefore, even design memory systems with very small data widths, such as data widths of 1, 2, or 3 data bits, are mapped onto the fixed data width of the emulator memory system. As a result, a significant portion of many memory words in the emulator memory system can be "lost," remaining unused during subsequent emulation. Such inefficient mapping from the design memory systems to the emulator memory system thereby results in a wasteful use of the critical system resource.

Prior attempts to provide more compact mapping between design memory systems and emulator memory systems have provided to be unsatisfactory. In one approach, different design memory systems are mapped onto the same address area of the emulation memory system. This approach, however, is difficult to implement and is not consistently effective. Others have suggested the use of manual methods for mapping the design memory systems onto the emulator memory system. In addition to being extremely difficult to apply to practical user designs, these manual methods have proven to be time consuming and prone to error.

In view of the foregoing, a need exists for an improved system and method for mapping between dissimilar memory systems that overcomes the aforementioned obstacles and deficiencies of currently-available memory mapping systems.

BRIEF DESCRIPTION OF THE DRAWINGS

FIGS. 9A-L is a detail drawing illustrating an embodiment of the memory mapping method of FIG. 2B, wherein the memory mapping method maps an exemplary 32×15 source memory system within a 30×16 destination memory system.

Figure 1:
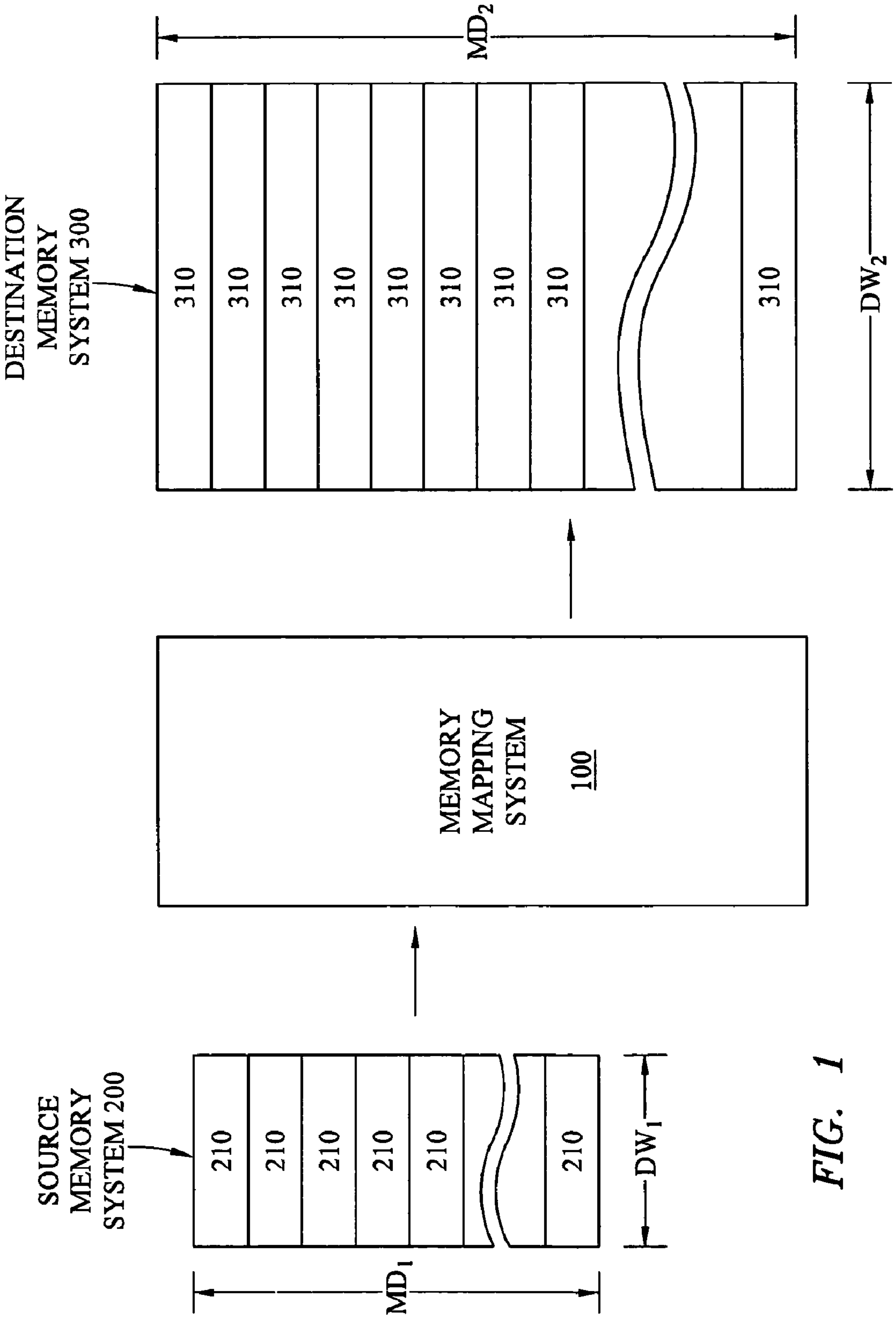
FIG. 1 is an exemplary top-level block diagram illustrating an embodiment of a memory mapping system for providing a compact mapping between two dissimilar memory systems.

It should be noted that the figures are not drawn to scale and that elements of similar structures or functions are generally represented by like reference numerals for illustrative purposes throughout the figures. It also should be noted that the figures are only intended to facilitate the description of the preferred embodiments of the present invention. The figures do not describe every aspect of the present invention and do not limit the scope of the invention.

DETAILED DESCRIPTION OF THE PREFERRED EMBODIMENTS

Since currently-available memory mapping systems inefficiently map dissimilar memory systems, a memory mapping system (and/or method) that considers the unique data width of a selected source (or design) memory system and that compactly maps the source memory system into a destination (or emulation) memory system having a predetermined data width can prove desirable and provide a basis for a wide range of system applications, such as hardware emulator memory systems. This result can be achieved, according to one embodiment disclosed herein, by employing a memory mapping system 100 as illustrated in FIG. 1.

The memory mapping system 100 can compactly map one or more source memory systems 200 into at least one destination memory system 300 without a loss of valuable memory space in the destination memory system 300. Advantageously, the memory mapping system 100 does not require any search operations to be conducted on the source and/or destination memory systems 200, 300 to perform the compact memory mapping. The source memory system 200 preferably comprises a conventional memory system, such as a static random access memory (SRAM) system and/or a dynamic random access memory (DRAM) system, that performs conventional memory operations. Exemplary conventional memory operations can include writing memory contents 220 to the source memory system 200, (at least temporarily) storing memory contents 220 within the source memory system 200, and/or reading memory contents 220 from the source memory system 200 without limitation. As desired, the source memory system 200 can be provided as a physical memory system, such as a semiconductor integrated circuit device, and/or as a virtual memory system, such as a memory primitive. Comprising a plurality of addressable source memory registers 210 for storing the memory contents 220, the source memory system 200 has a source memory depth $MD_1$ that comprises a predetermined number of the source memory registers 210 and a source data width $DW_1$ that includes a preselected quantity of data bits that can be stored in each of the source memory registers 210.

The destination memory system 300 likewise can be provided as a conventional memory system for performing conventional memory operations in the manner discussed in more detail above with reference to the source memory system 200. As illustrated in FIG. 1, for example, the destination memory system 300 can include a plurality of addressable destination memory registers 310 for storing memory contents (not shown), such as the memory contents 220 associated with the source memory system 200. The destination memory system 300 preferably has a destination memory depth $MD_2$ that comprises a predetermined number of the destination memory registers 310 and a destination data width $DW_2$ that includes a preselected quantity of data bits that can be stored in each of the destination memory registers 310.

To accommodate the source memory system 200, the destination memory depth $MD_2$ of the destination memory system 300 preferably is equal to at least a product of the source memory depth $MD_1$ and a quotient of the source data width $DW_1$ and the destination data width $DW_2$ as illustrated in Equation 1 below. In other words, the source memory system 200, when mapped into the destination memory system 300, typically will occupy a destination memory depth $MD_2$ within the destination memory system 300 in accordance with Equation 1. The memory mapping system 100 advantageously can compactly map the source memory system 200, in whole and/or in part, into the destination memory system 300 without a loss of memory space within the destination memory system 300.

$$MD_2 \geqq MD_1 * (DW_1/DW_2) \quad \text{(Equation 1)}$$

The memory mapping system 100 can be provided in any conventional manner and preferably includes at least one processing system (not shown) for mapping the source memory system 200 into the destination memory system 300. The processing system, for example, can comprise any appropriate number and type of conventional processing systems, such as one or more microprocessors (μPs), central processing units (CPUs), digital signal processors (DSPs), application specific integrated circuits (ASICs), and/or memory controllers. As desired, the memory mapping system 100 can be included as part of a hardware emulation system, such as the Palladium acceleration/emulation system produced by Cadence Design Systems, Inc., of San Jose, Calif.

Figure 2A:
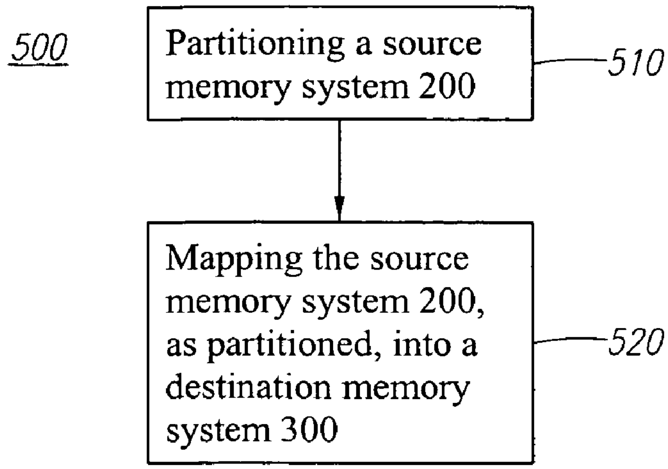
FIG. 2A is an exemplary top-level block diagram illustrating an embodiment of a memory mapping method for providing a compact mapping between two dissimilar memory systems.

FIG. 2A illustrates an exemplary method 500 by which the memory mapping system 100 can map the source memory system 200 into the destination memory system 300. As shown in FIG. 2A, the method 500 includes, at 510, partitioning (and/or dividing) the source memory system 200. The partitioned source memory system 200 can be mapped, at 520, into the destination memory system 300. In other words, each partition (or division) of the source memory system 200 can be systematically mapped into the destination memory system 300. As desired, the memory mapping system 100 likewise can perform a reverse (or inverse) of the method 500 on the destination memory system 300 to recover (or restore) the source memory system 200.

Figure 2B:
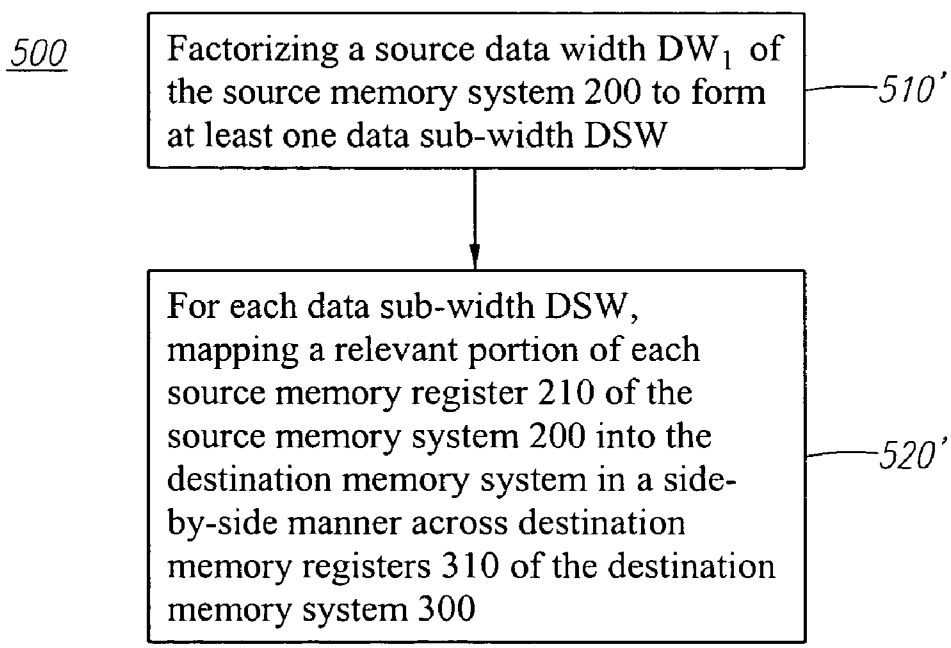
FIG. 2B is a detail drawing illustrating an embodiment of the memory mapping method of FIG. 2A, wherein the memory mapping system partitions a source memory system to facilitate mapping of the source memory system into a destination memory system.

An alternative (or additional) embodiment of the exemplary method 500 by which the memory mapping system 100 can map the source memory system 200 into the destination memory system 300 is shown in FIG. 2B. Turning to FIG. 2B, the exemplary method 500 can partition the exemplary source memory system 200 by factorizing, at 510', a source data width $DW_1$ of the source memory system 200 to form one or more data sub-widths DSW. The data sub-widths DSW can be formed in any conventional manner and with any suitable dimensions (and/or size). As desired, the data sub-widths DSW can be formed with a plurality of uniform and/or non-uniform dimensions.

Figure 3A:
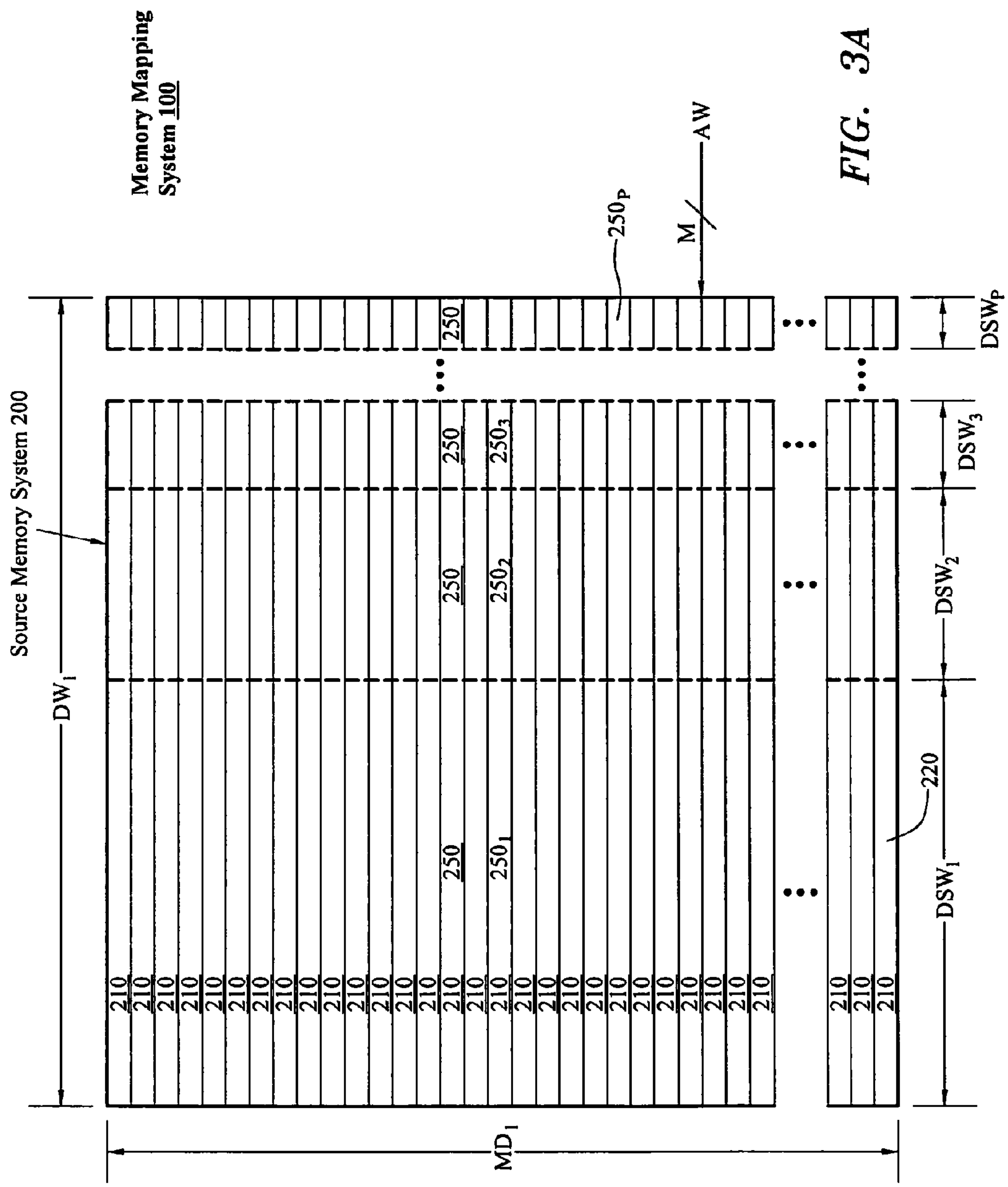
FIG. 3A is a detail drawing illustrating an embodiment of the memory mapping method of FIG. 2B, wherein the memory mapping method factorizes a source data width of the source memory system to form one or more source memory sub-regions.

As illustrated in FIG. 3A, the source memory registers 210 of the source memory system 200 that are selected for mapping into the destination memory system 300 can be addressed via a predetermined number M of address lines AW, wherein the number M has a positive integer value. Stated somewhat differently, a power-of-two (or base-2) number, such as two raised to the power of M ($2^M$), of the source memory registers 210 can be addressed via the M address lines AW and can be mapped into the destination memory system 300. The source memory registers 210 that are addressable via the M address lines AW can comprise all, or a selected portion, of the source memory registers 210 of the source memory system 200. The M address lines AW, in other words, can represent all and/or a portion of the total address lines AW associated with the source memory system 200. Although shown and described as comprising contiguous memory registers for purposes of illustration only, the source memory registers 210 that are selected for mapping can comprise any predetermined source memory registers 210 within the source memory system 200.

The memory mapping system 100 of FIG. 3A is shown as partitioning the exemplary source memory system 200 to form the one or more source memory sub-regions 250. The source memory sub-regions 250 preferably are formed in accordance with the Equation 2, wherein the destination data width $DW_2$ (shown in FIG. 4B) of the destination memory system 300 (shown in FIG. 4B) comprises a predetermined data width with a power-of-two (or base-2) value, such as two raised to the power of N ($2^N$).

$$DW_1 = \sum_{i=0}^{N} f_i * (DW_2 / 2^i) \qquad \text{(Equation 2)}$$

In Equation 2, for a mapping index i that is equal to zero (i=0), the factor $f_0$ can be associated with any non-negative integer value; whereas, the factor $f_i$ can be associated with either a binary value of zero ("0") or a binary value of one ("1") for each value of the mapping index i that is greater than zero (i>0). Equation 2 advantageously enables any predetermined source data width $DW_1$ of the source memory system 200 to be readily factored into one or more selected data sub-widths DSW. Equation 2 thereby permits the source data width $DW_1$ to be factorized into at least one data sub-width $DSW_1$, $DSW_2$, $DSW_3$, . . . $DSW_P$, wherein the $i^{th}$ data sub-width DSW, $DSW_i$, has a value equal to the destination data width $DW_2$ divided by an $i^{th}$ power of two (or $2^i$). More specifically, Equation 2 permits the source data width $DW_1$ of the source memory system 200 to be factorized into a summation of a suitable combination of power-of-two (or base-2) data sub-width DSW values based at least in part upon the predetermined destination data width $DW_2$ of the destination memory system 300.

As illustrated in FIG. 3A, the data sub-widths $DSW_i$ span the source data width $DW_1$ of the source memory system 200 and have values that are equal to the destination data width $DW_2$ divided by a relevant power of two (or $2^i$). For example, if the destination data width $DW_2$ comprises thirty-two (or $2^5$) data bits, the value N as set forth in Equation 2 is equal to five, and Equation 2 can be simplified in the manner illustrated in Equation 3 below.

$$DW_1 = f_0*32 + f_1*16 + f_2*8 + f_3*4 + f_4*2 + f_5*1 \qquad \text{(Equation 3)}$$

Equation 3 thereby permits the source data width $DW_1$ to be factorized into a summation of a plurality of data sub-widths DSW with respective values of thirty-two data bits, sixteen data bits, eight data bits, four data bits, two data bits, and/or one data bit. If the source data width $DW_1$ comprises seventy-five data bits, for instance, the factor $f_0$ in Equation 3 is equal to the non-negative integer value of two ("2"); whereas, the factors $f_1$ and $f_3$ are equal to the binary value of zero ("0"), and the factors $f_2$, $f_4$, and $f_5$ are equal to the binary value of one ("1"). In other words, Equation 3 factorizes the source data width $DW_1$ of seventy-five data bits into a summation of data sub-widths DSW with values of thirty-two data bits, eight data bits, two data bits, and one data bit.

When the source data width $DW_1$ of the source memory system 200 is less than the destination data width $DW_2$ of the destination memory system 300, Equation 2 likewise can be used to factorize the source data width $DW_1$. As desired, Equation 2 can be simplified if the source data width $DW_1$ is less than the destination data width $DW_2$ as illustrated by Equation 4.

$$DW_1 = \sum_{i=1}^{N} f_i * (DW_2 / 2^i) \qquad \text{(Equation 4)}$$

Equation 4 eliminates the $f_0*DW_2$ element from Equation 2 such that, for each value of mapping index i, the factor $f_i$ can be associated with either a binary value of zero ("0") or a binary value of one ("1"). For example, if the destination data width $DW_2$ comprises sixty-four (or $2^6$) data bits and the source data width $DW_1$ has fifty-three data bits, the value N as set forth in Equation 4 is equal to six, and Equation 4 can be applied to factorize the source data width $DW_1$ because the source data width $DW_1$ is less than the destination data width $DW_2$. Equation 4 thereby can be simplified in the manner illustrated in Equation 5 below.

$$DW_1 = f_1*32 + f_2*16 + f_3*8 + f_4*4 + f_5*2 + f_6*1 \qquad \text{(Equation 5)}$$

Equation 5 thereby omits the sixty-four data-bit element, $f_0*64$, of Equation 2 and permits the source data width $DW_1$ to be factorized into a summation of a plurality of data sub-widths DSW with values of thirty-two data bits, sixteen data bits, eight data bits, four data bits, two data bits, and/or one data bit. Further, since the source data width $DW_1$ of the exemplary source memory system 200 has fifty-three data bits, the factors $f_3$ and $f_5$ in Equation 5 are equal to the binary value of zero ("0"), and the factors $f_1$, $f_2$, $f_4$, and $f_6$ are equal to the binary value of one ("1"). The source data width $DW_1$ thereby is factorized into a summation of one or more power-of-two (or base-2) data sub-width DSW values based upon the predetermined destination data width $DW_2$ of the destination memory system 300. More specifically, Equation 5 factorizes the source data width $DW_1$ of fifty-three data bits into a summation of data sub-widths DSW with values of thirty-two data bits, sixteen data bits, four data bits, and one data bit.

By factorizing the source data width $DW_1$, the source memory system 200 can be partitioned into a plurality of source memory sub-regions 250. As illustrated in FIG. 3A, each source memory sub-region $\mathbf{250}_i$ within the source memory system 200 can have a sub-region depth that is equal to the source memory depth $MD_1$ and a sub-region data width that is equal to the associated data sub-width $DSW_i$. Memory sub-region $\mathbf{250}_1$, for example, is shown as having a sub-region depth that is equal to the source memory depth $MD_1$ and a sub-region data width that is equal to the data sub-width $DSW_1$. Similarly, the sub-region data widths of the sub-regions $\mathbf{250}_2$, $\mathbf{250}_3$, . . . , $\mathbf{250}_P$ are respectively equal to the equal to the data sub-widths $DSW_2$, $DSW_3$, . . . , $DSW_P$.

If the data sub-widths $DSW_1$, $DSW_2$, $DSW_3$, . . . , $DSW_P$ shown in FIG. 3A are respectively associated with a mapping index i with a value of one ("1"), two ("2"), three ("3"), . . . , and P, for instance, the data sub-width $DSW_1$ can comprise the $DW_2/2$ most significant data bits of the source memory registers 210. The data sub-width $DSW_2$, being associated with the mapping index i with a value of two ("2"), can include the $DW_2/4$ most significant remaining data bits of the source memory registers 210. In other words, the data sub-width $DSW_2$ can comprise the $DW_2/4$ most significant data bits remaining within the source memory registers 210 when the $DW_2/2$ data bits associated with the data sub-width $DSW_1$ are not considered (and/or when the $DW_2/2$ data bits associated with the data sub-width $DSW_1$ are ignored).

Similarly, the data sub-width $DSW_3$ is associated with the mapping index i with a value of three ("3") and can comprise the $DW_2/8$ most significant remaining data bits of the source memory registers 210 when the $DW_2/2$ data bits associated with the data sub-width $DSW_1$ and the $DW_2/4$ data bits associated with the data sub-width $DSW_2$ are not considered (and/or are ignored). Each of the other data sub-widths $DSW_i$ likewise can comprise the $DW_2/2^i$ most significant remaining data bits of the source memory registers 210 until the one or more data bits associated with the final (and/or last) $P^{th}$ data sub-width $DSW_P$ are identified. Shown as comprising the least significant $2^P$ data bit(s) of the source memory registers 210, the $2^P$ data bit(s) associated with the $P^{th}$ data sub-width $DSW_P$ include the $2^P$ data bits of the source memory registers 210 that remain after the data bits associated with each of the other data sub-widths $DSW_i$(i=0, 1, 2, . . . , P−1) have been identified.

Figure 3B:
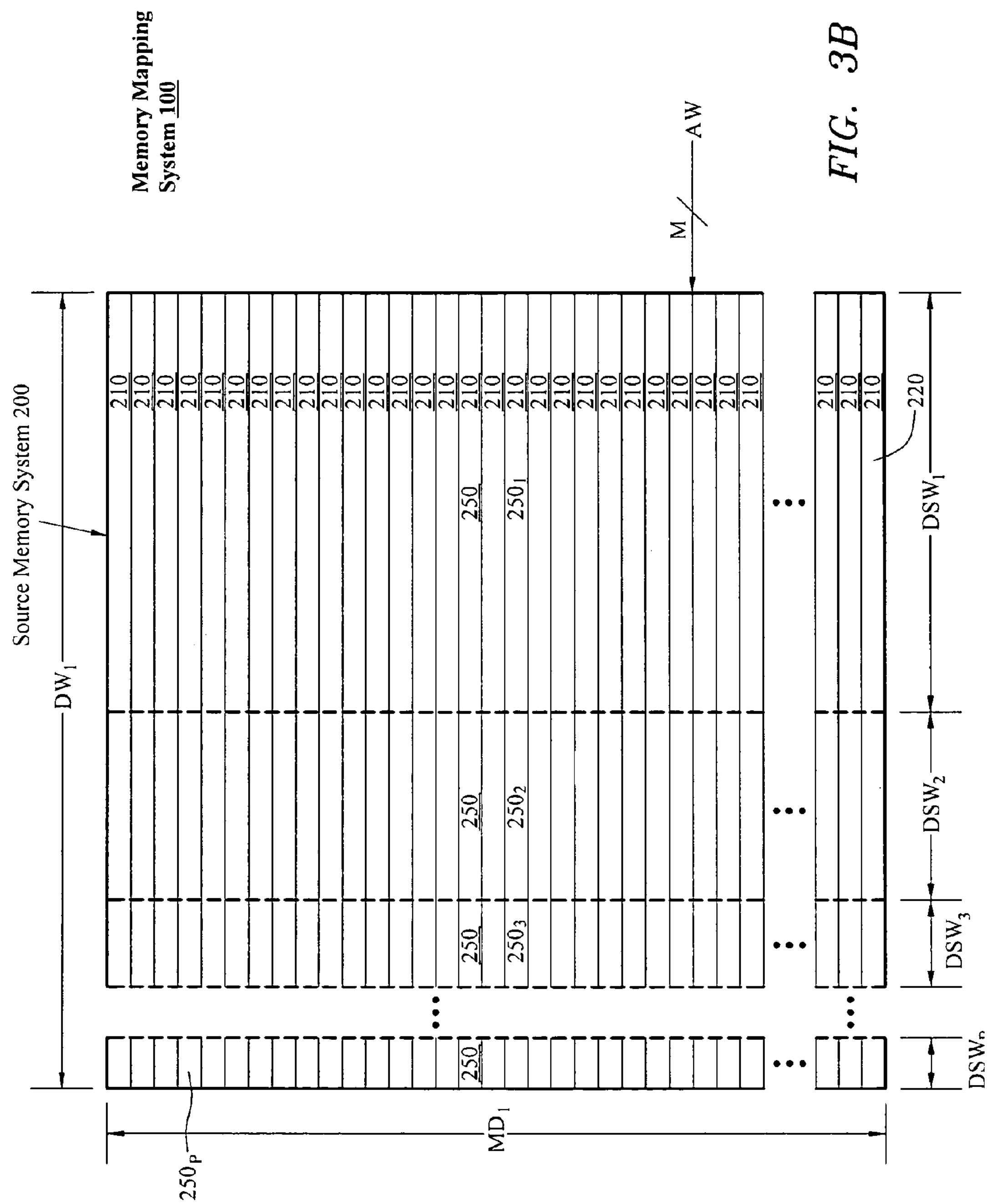
FIG. 3B is a detail drawing illustrating an alternative embodiment of the memory mapping method of FIG. 3A.
Figure 3C:
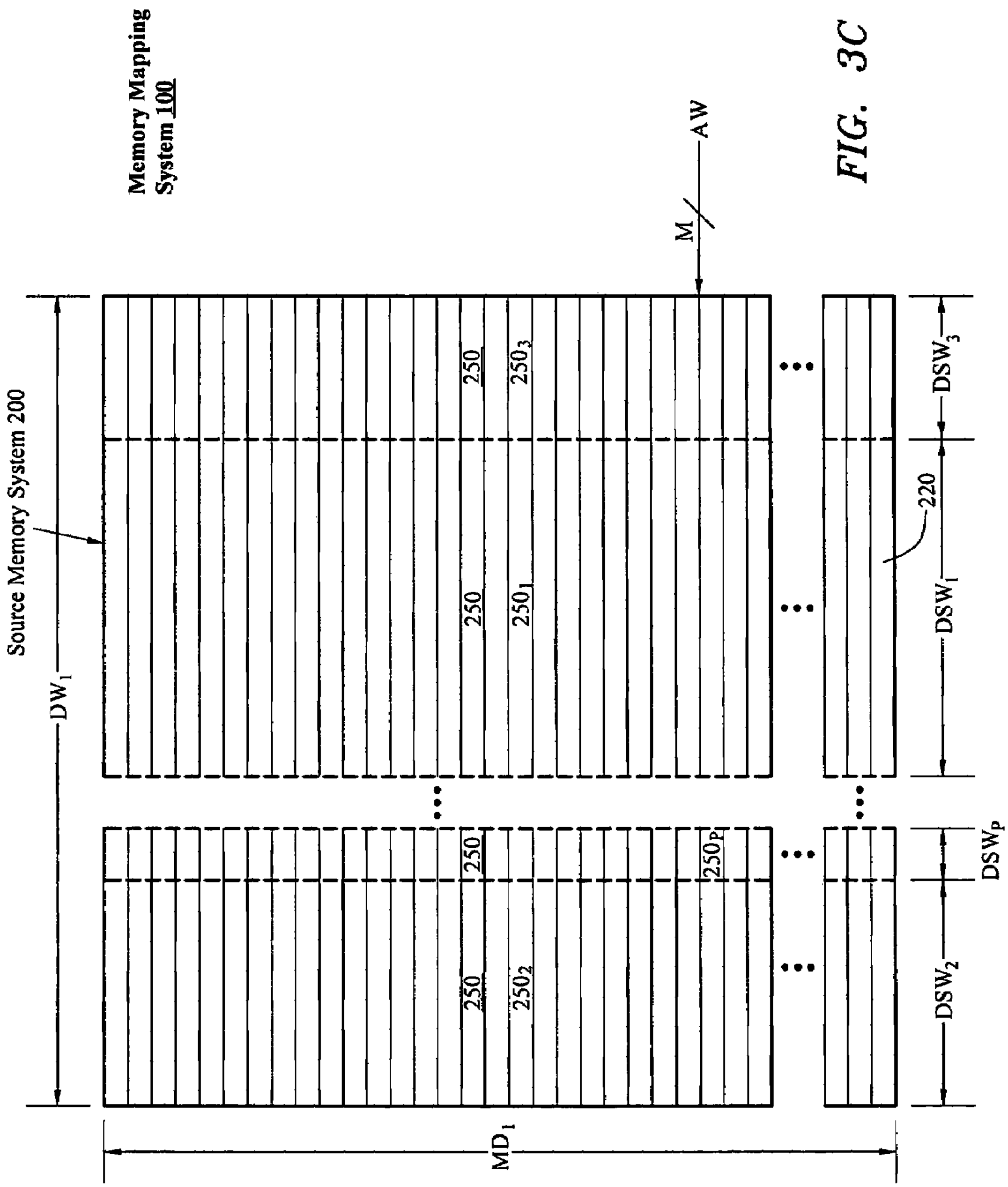
FIG. 3C is a detail drawing illustrating another alternative embodiment of the memory mapping method of FIG. 3A.

Although the source memory system 200 is shown and described with reference to FIG. 3A as being partitioned into an exemplary arrangement of memory sub-regions 250 for purposes of illustration only, the memory mapping system 100 can partition (and/or divide) the source memory system 200 into any suitable arrangement of the memory sub-regions 250. Exemplary alternative arrangements of the memory sub-regions 250 are illustrated in FIGS. 3B and 3C. Turning to FIG. 3B, for instance, the data sub-width $DSW_1$ can comprise the $DW_2/2$ least significant data bits of the source memory registers 210 if the data sub-widths $DSW_1$, $DSW_2$, $DSW_3$, . . . , $DSW_P$ are associated with a mapping index i with a value of one ("1"), two ("2"), three ("3"), . . . , and P, respectively, in the manner set forth above with reference to FIG. 3A. The data sub-width $DSW_2$ of FIG. 3B likewise can include the $DW_2/4$ least significant remaining data bits of the source memory registers 210. In other words, the data sub-width $DSW_2$ can comprise the $DW_2/4$ least significant data bits remaining within the source memory registers 210 when the $DW_2/2$ data bits associated with the data sub-width $DSW_1$ are not considered (and/or when the $DW_2/2$ data bits associated with the data sub-width $DSW_1$ are ignored).

Similarly, the data sub-width $DSW_3$ can comprise the $DW_2/8$ least significant remaining data bits of the source memory registers 210 when the $DW_2/2$ data bits associated with the data sub-width $DSW_1$ and the $DW_2/4$ data bits associated with the data sub-width $DSW_2$ are not considered (and/or are ignored). Each of the other data sub-widths $DSW_i$ can comprise the $DW_2/2^i$ least significant remaining data bits of the source memory registers 210 until the one or more data bits associated with the final $P^{th}$ data sub-width $DSW_P$ are identified. Shown as comprising the most significant 2P data bit(s) of the source memory registers 210, the $2^P$ data bit(s) associated with the $P^{th}$ data sub-width $DSW_P$ include the final 2P data bit(s) of the source memory registers 210 that remain after the data bits associated with each of the other data sub-widths $DSW_i$(i=0, 1, 2, . . . , P−1) have been identified.

The data sub-widths $DSW_i$ can be distributed across the source data width $DW_1$ in any conventional arrangement (and/or manner), as desired. As illustrated in FIG. 3C, if the data sub-widths $DSW_1$, $DSW_2$, $DSW_3$, . . . , $DSW_P$ are respectively associated with a mapping index i with a value of one ("1"), two ("2"), three ("3"), . . . , and P in the manner set forth above with reference to FIG. 3A, for instance, the data sub-width $DSW_2$ can comprise the $DW_2/4$ most significant data bits of the source memory registers 210; whereas, the data sub-width $DSW_3$ can comprise the $DW_2/8$ least significant data bits of the source memory registers 210. The data sub-width $DSW_1$ is shown as comprising the $DW_2/2$ least significant remaining data bits of the source memory registers 210. In other words, the data sub-width $DSW_1$ can comprise the $DW_2/2$ least significant data bits remaining within the source memory registers 210 when the $DW_2/8$ data bits associated with the data sub-width $DSW_3$ are not considered (and/or when the $DW_2/8$ data bits associated with the data sub-width $DSW_3$ are ignored). In the manner set forth above, each of the other data sub-widths $DSW_1$ are identified, and the $2^P$ data bit(s) associated with the $P^{th}$ data sub-width $DSW_P$ include the final (and/or last) $2^P$ data bit(s) of the source memory registers 210 that remain after the data bits associated with each of the other data sub-widths $DSW_i$(i=0, 1, 2, . . . , P−1) have been identified.

Returning briefly to FIGS. 2A-B, the exemplary method 500 is shown, at 520, as mapping the source memory system 200, as partitioned, into the destination memory system 300. The exemplary method 500 of FIG. 2B, for example, can select a data sub-width DSW of the source memory system 200 and, at 520', map a relevant portion of each source memory register 210 of the source memory system 200 to the destination memory system 300. In other words, a memory sub-region $250_i$ within the source memory system 200 can be selected, and the relevant portion of each source memory register 210 of the source memory system 200 can be mapped into the destination memory system 300. The relevant portion of the source memory registers 210 preferably is associated with the selected memory sub-region $250_i$. The selected memory sub-region $250_i$ thereby can be mapped in a side-by-side manner across destination memory registers 310 of the destination memory system 300.

The exemplary method 500 can map the source memory system 200 into the destination memory system 300 at any suitable time. If associated with a hardware emulation system (not shown), for example, the exemplary method 500 advantageously used to facilitate emulation of electronic circuit (or system) designs (not shown) that include one or more source (or design) memory systems 200. While the hardware emulation system compiles the electronic circuit design, the exemplary method 500 can be applied to map the source memory registers 210 of each source memory system 200 into a destination (or emulation) memory system 300 of the hardware emulation system. The memory contents 220 associated with the source memory systems 200 can be subsequently transferred to the destination memory system 300 of the hardware emulation system at run time.

Figure 4A:
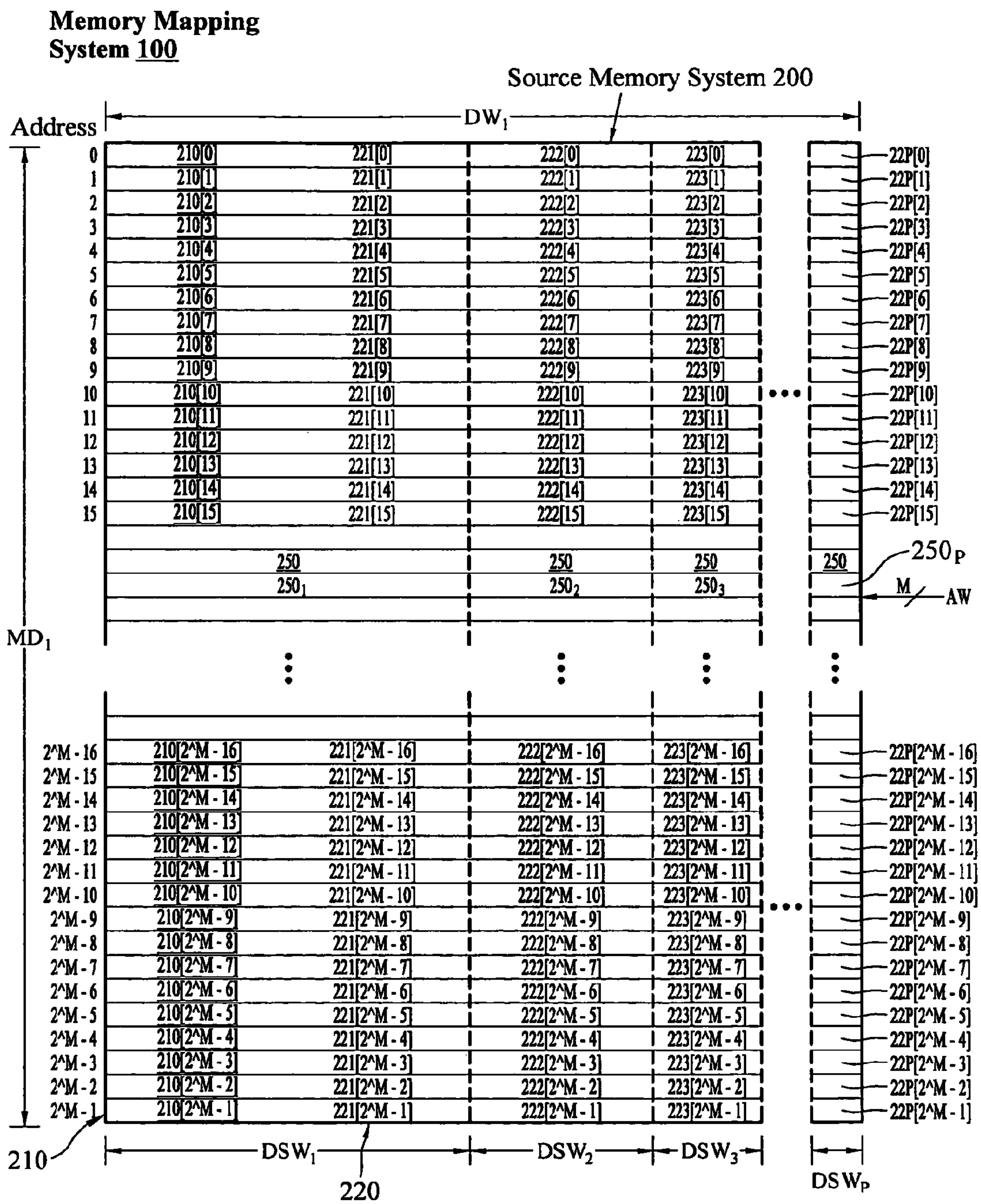
FIG. 4A is a detail drawing illustrating the memory mapping system of FIG. 3A, wherein each source memory sub-region within the source memory system is prepared for mapping into the destination memory system.

Turning to FIG. 4A, the source memory registers 210 of the source memory system 200 are shown as including respective memory contents 220. The source memory register 210 associated with a selected source memory address $A_1$ is shown as being designated as source memory register 210[$A_1$] and as storing memory contents 220[$A_1$] for purposes of illustration. For example, the source memory register 210 associated with source memory address 0 is shown as being designated as source memory register 210[0] and as storing memory contents 220[0]; whereas, the source memory register 210 associated with source memory address $2^M-7$ is shown as being designated as source memory register 210[$2^M-7$] and as storing memory contents 220[$2^M-7$]. The memory contents 220 for each source memory register 210 comprise conventional memory contents and can span the source data width $DW_1$ of the source memory register 210, partially and/or in its entirety, as desired.

The source data width $DW_1$ of the source memory system 200 is shown in FIG. 4A as being factorized in the manner set forth in more detail above with reference to FIG. 3A. More specifically, the source data width $DW_1$ is factorized into the data sub-widths $DSW_1$, $DSW_2$, $DSW_3$, . . . $DSW_P$, and the source memory system 200 is partitioned into the corresponding source memory sub-regions $\mathbf{250}_1$, $\mathbf{250}_2$, $\mathbf{250}_3$, . . . $\mathbf{250}_P$. The memory sub-regions $\mathbf{250}_1$, $\mathbf{250}_2$, $\mathbf{250}_3$, . . . $\mathbf{250}_P$ are illustrated as being respectively associated with the data sub-widths $DSW_1$, $DSW_2$, $DSW_3$, . . . $DSW_P$. A predetermined portion of the memory contents 220 of each source memory register 210 accordingly is associated with one or more of the respective memory sub-regions $\mathbf{250}_1$, $\mathbf{250}_2$, $\mathbf{250}_3$, . . . $\mathbf{250}_P$.

As illustrated in FIG. 4A, the memory contents 220 stored in a selected source memory register 210 can include a plurality of register content portions 221, 222, 223, . . . , 22P. In other words, the memory contents 220[$A_1$] stored in the source memory register 210[$A_1$] can include a first register content portion 221[$A_1$], a second register content portion 222[$A_1$], a third register content portion 223[$A_1$], . . . , and a $P^{th}$ register content portion 22P[$A_1$] for the selected source memory address $A_1$. The memory contents 220[0] of the source memory register 210[0], for example, is shown as including a first register content portion 221[0], a second register content portion 222[0], a third register content portion 223[0], . . . , and a $P^{th}$ register content portion 22P[0]. The register content portions 221, 222, 223, . . . , 22P of the selected source memory register 210 are respectively associated with the memory sub-regions $\mathbf{250}_1$, $\mathbf{250}_2$, $\mathbf{250}_3$, . . . $\mathbf{250}_P$ and/or the data sub-width $DSW_1$, $DSW_2$, $DSW_3$, . . . $DSW_P$.

FIG. 4A shows that the first register content portion 221 [$A_1$] can comprise a portion of the memory contents 220[$A_1$] that is stored in the source memory register 210[$A_1$] and that is associated with the data sub-width $DSW_1$. The second, third, . . . , and $P^{th}$ register content portions 222[$A_1$], 223[$A_1$], . . . , 22P[$A_1$] likewise can be portions of the memory contents 220[$A_1$] that are respectively associated with the data sub-widths $DSW_2$, $DSW_3$, . . . $DSW_P$. In other words, the memory sub-regions $\mathbf{250}_1$, $\mathbf{250}_2$, $\mathbf{250}_3$, . . . $\mathbf{250}_P$ are associated with the first register content portion 221[$A_1$], the second register content portion 222[$A_1$], the third register content portion 223[$A_1$], . . . , and the $P^{th}$ register content portion 22P[$A_1$], respectively, of the memory contents 220[$A_1$] stored in the source memory register 210[$A_1$] for the selected source memory address $A_1$. For example, if the data sub-widths $DSW_1$, $DSW_2$, $DSW_3$, . . . , $DSW_P$ shown in FIG. 3A are again associated with the mapping index i with a value of one ("1"), two ("2"), three ("3"), . . . , and P, for instance, the first register content portion 221[$A_1$] can comprise the $DW_2/2$ most significant data bits of the source memory register 210 [$A_1$]; whereas, the second register content portion 222[$A_1$] can comprise the $DW_2/4$ most significant remaining data bits of the source memory register 210[$A_1$]. Similarly, the third register content portion 223[$A_1$] can comprise the $DW_2/8$ most significant remaining data bits of the source memory register 210[$A_1$] and so forth.

The first source memory sub-region $\mathbf{250}_1$ thereby can comprise the first register content portion 221[0] for the source memory register 210[0], the first register content portion 221 [1] for the source memory register 210[1], the first register content portion 221[2] for the source memory register 210[2], . . . , and the first register content portion 221[$2^M-1$] for the source memory register 210[$2^M-1$] as illustrated in FIG. 4A. In a similar manner, the second source memory sub-region $\mathbf{250}_2$ can include the second register content portion 222[0] for the source memory register 210[0], the second register content portion 222[$A_1$] for the source memory register 210[1], the second register content portion 222[2] for the source memory register 210[2], . . . , and the second register content portion 222[$2^M-1$] for the source memory register 210[$2^M-1$]. The third source memory sub-region $\mathbf{250}_3$ likewise can include the third register content portions 223 from each of the source memory registers 210[0], 220[1], 220[2], . . . , 220[$2^M-1$] and so forth. Each of the source memory sub-regions $\mathbf{250}_1$, $\mathbf{250}_2$, $\mathbf{250}_3$, . . . $\mathbf{250}_P$ thereby can comprise the relevant register content portions 221, 222, 223, . . . , 22P from each of the source memory registers 210[0], 220[1], 220[2], . . . , 220[$2^M-1$]. Although shown and described as comprising a contiguous group of source memory registers 210[0], 220[1], 220[2], . . . , 220[$2^M-1$] for purposes of illustration only, the source memory registers 210 that are selected for mapping into the destination memory system 300 can comprise any predetermined source memory registers 210 within any memory address range of the source memory system 200.

The memory contents 220 associated with the source memory sub-regions $\mathbf{250}_1$, $\mathbf{250}_2$, $\mathbf{250}_3$, . . . $\mathbf{250}_P$ can be disposed within the destination memory system 300 (shown in FIG. 4B) in any conventional manner. To inhibit a loss of valuable memory space within the destination memory system 300, however, the source memory sub-regions $\mathbf{250}_1$, $\mathbf{250}_2$, $\mathbf{250}_3$, . . . $\mathbf{250}_P$ preferably are mapped into the destination memory system 300 in a side-by-side manner across the destination memory registers 310 (shown in FIG. 4B) of the destination memory system 300. For example, each source memory sub-region $\mathbf{250}_1$, $\mathbf{250}_2$, $\mathbf{250}_3$, . . . $\mathbf{250}_P$ can be mapped into the destination memory system 300 in accordance with Equations 6 and 7 below.

$$\text{Destination memory address } (A_2)=i*\text{int}(A_1/2^i)+\text{destination address offset} \quad \text{(Equation 6)}$$

$$\text{Placement Within Destination memory address } (A_2)=\text{rem}(A_1/2^i) \quad \text{(Equation 7)}$$

In words, for a selected source memory sub-region $\mathbf{250}_i$, Equation 6 provides a destination memory address $A_2$ for a destination memory register 310[$A_2$] (shown in FIG. 4B) within the destination memory system 300 into which memory contents 220 associated with a selected source memory register 210[$A_1$] with a selected source memory address $A_1$ can be mapped. The factor int($A_1/2^i$) in Equation 6 comprises a conventional integer function that operates on a quotient of the source memory address $A_1$ divided by two raised to the power of a relevant mapping index i (or $2^i$). Accordingly, the quotient is calculated by dividing the source memory address $A_1$ by $2^i$, and the integer function then is applied to the resultant quotient to provide an integer portion of the resultant quotient. The factor int($A_1/2^i$) thereby returns an integer quotient of the result resulting from dividing the source memory address $A_1$ by $2^i$.

Equation 6 likewise includes a destination address offset that identifies a predetermined address of the initial destination memory register 310 wherein the memory mapping should initiate within the destination memory system 300. The destination address offset is optional and can be set to any suitable destination memory address $A_2$ within the destination memory system 300. A uniform destination address offset preferably is applied in Equation 6 to map each source memory sub-region $\mathbf{250}_1$, $\mathbf{250}_2$, $\mathbf{250}_3$, . . . $\mathbf{250}_P$ of the source memory system 200 into the destination memory system 300. If no offset is needed for a particular memory mapping, the destination address offset can be set to zero, as desired.

Equation 7 identifies a $2^{(N-i)}$-bit destination register portion 350 (shown in FIGS. 4B-E) of the relevant destination memory register 310[$A_2$] into which the memory contents 220 associated with the selected source memory register 210 [$A_1$] can be disposed. The factor rem($A_1/2^i$) in Equation 7 comprises a conventional remainder function that operates on a quotient of the source memory address $A_1$ divided by two raised to the power of a relevant mapping index i (or $2^i$). In the manner set forth above, the quotient is calculated by dividing the source memory address $A_1$ by $2^i$, and the remainder function then is applied to the resultant quotient to provide a remainder portion of the resultant quotient. The factor rem $(A_1/2^i)$ thereby returns an integer remainder of the result from dividing the source memory address $A_1$ by $2^i$. The mapping index i used in Equations 6 and 7 is the same mapping index i set forth above, and the value of the mapping index i is associated with the selected source memory sub-region $\mathbf{250}_i$ intended to be mapped into the destination memory system 300.

Application of Equations 6 and 7 is illustrated with reference to FIGS. 4B-F. For purposes of the present illustration, the destination address offset of Equation 6 is assumed to be equal to zero. An exemplary mapping of the first source memory sub-region $\mathbf{250}_1$ of the source memory system 200 into the destination memory system 300 is shown in FIGS. 4B-F. In the manner set forth above, the first source memory sub-region $\mathbf{250}_1$ is associated with a mapping index i having a value of one ("1") and can comprise the first register content portion 221[0] for the source memory register 210[0], the first register content portion 221[1] for the source memory register 210[1], the first register content portion 221[2] for the source memory register 210[2], . . . , and the first register content portion 221[$2^M-1$] for the source memory register 210[$2^M-1$] as illustrated in FIG. 4A.

Figures 2, 4B:
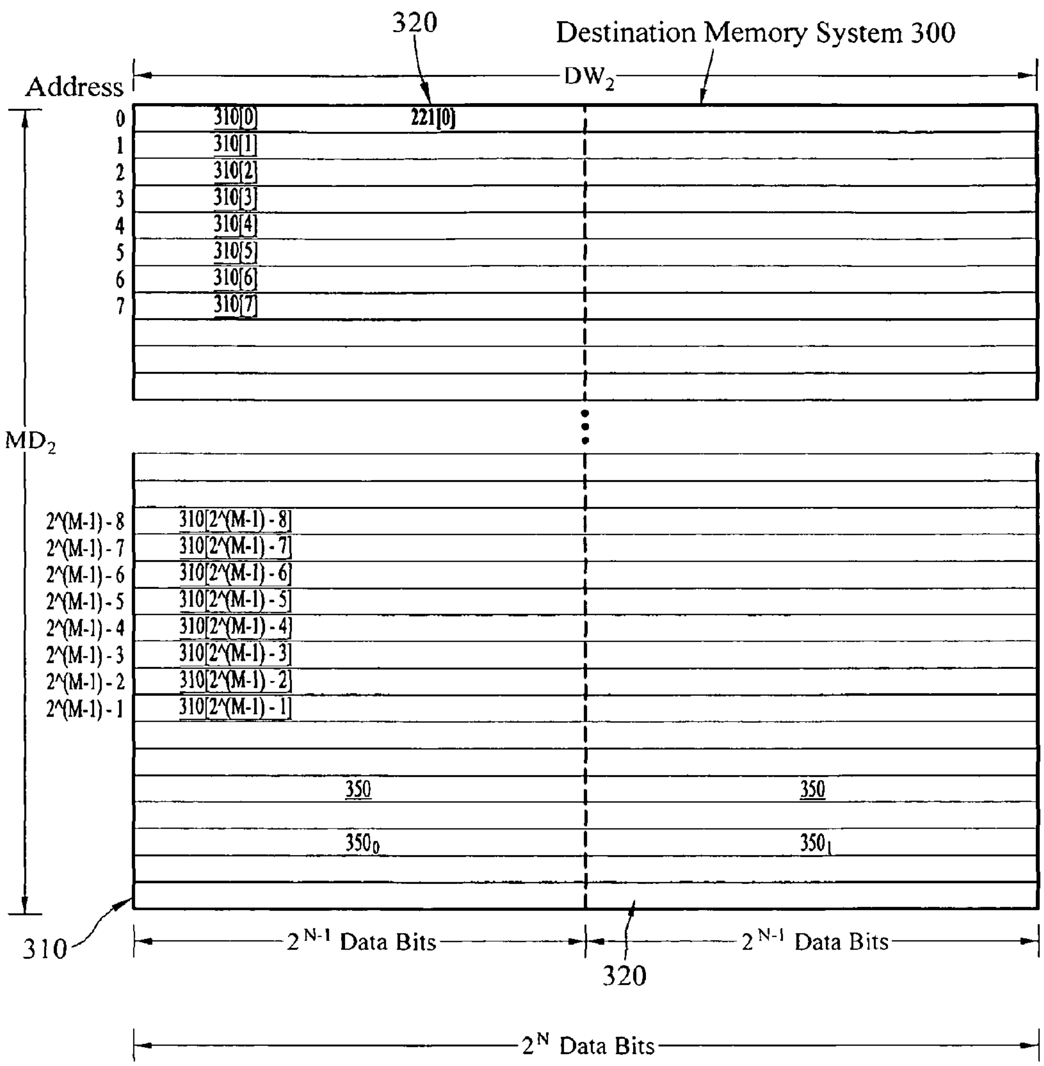
FIGS. 4B-F are detail drawings illustrating an embodiment of the memory mapping system of FIG. 4A, wherein the memory mapping system maps a selected first source memory sub-region of FIG. 4A of the source memory system into the destination memory system.

Turning to FIG. 4B, for instance, the first register content portion 221[0] of the first source memory sub-region $\mathbf{250}_1$ is shown as being associated with the source memory address $A_1$ having a value of zero ("0") and can be selected for mapping into a selected destination memory register 310 within the destination memory system 300. The first source memory sub-region $\mathbf{250}_1$ is illustrated as having a data sub-width $DSW_1$ that comprises the $DW_2/2$ most significant data bits of the source memory registers 210. Accordingly, since the destination memory system 300 includes $2^N$-bit destination memory registers 310, the data sub-width $DSW_1$ of the first source memory sub-region $\mathbf{250}_1$ includes $2^{(N-1)}$ data bits. In the manner set forth above with reference to the source memory register 210, the destination memory register 310 associated with a selected destination memory address $A_2$ is shown as being designated as destination memory register 310[$A_2$] and can store memory contents 220 associated with a selected first register content portion 221[$A_1$] provided by the source memory system 200. In accordance with Equation 6, the first register content portion 221[0] of the source memory register 210[0] can be mapped into the destination memory register 310[$A_2$] with a destination memory address $A_2$ having a value of zero ("0") as illustrated in Equation 8.

$$\text{Destination memory address } (A_2)=1*\text{int}(0/2^1)+0=0 \qquad \text{(Equation 8)}$$

As discussed above, Equation 7 can identify the $2^{(N-i)}$-bit destination register portion 350 of the destination memory register 310[0] into which the memory contents 220 associated with the selected source memory register 210[$A_1$] can be disposed. FIG. 4B shows that the $2^N$ data bits of the destination data width $DW_2$ for the destination memory system 300 can be divided (or partitioned) into $2^i$ groups of $2^{(N-i)}$ data bits. In other words, the destination memory registers 310 of the destination memory system 300 each can be associated with $2^i$ $2^{(N-i)}$-bit destination register portions 350 as shown in FIG. 4B. Since the mapping index i associated with the first source memory sub-region $\mathbf{250}_1$ has a value of one ("1"), the $2^N$-bit destination memory registers 310 each can be associated with two ($2^1$) destination register portions $\mathbf{350}_0$, $\mathbf{350}_1$, each comprising $2^{(N-1)}$ bits, as illustrated in FIG. 4B. The destination register portion $\mathbf{350}_0$ is associated with a zeroth register position within each destination memory register 310; whereas, the destination register portion $\mathbf{350}_1$ is associated with a first register position within each destination memory register 310. Equation 9 below illustrates that the first register content portion 221[0] can be positioned within the destination register portion $\mathbf{350}_0$ of the destination memory register 310[0] as illustrated in FIG. 4B.

$$\text{Placement Within Destination memory address } (A_2)=\text{rem}(0/2^1)=0 \qquad \text{(Equation 9)}$$

Figures 1, 4C:
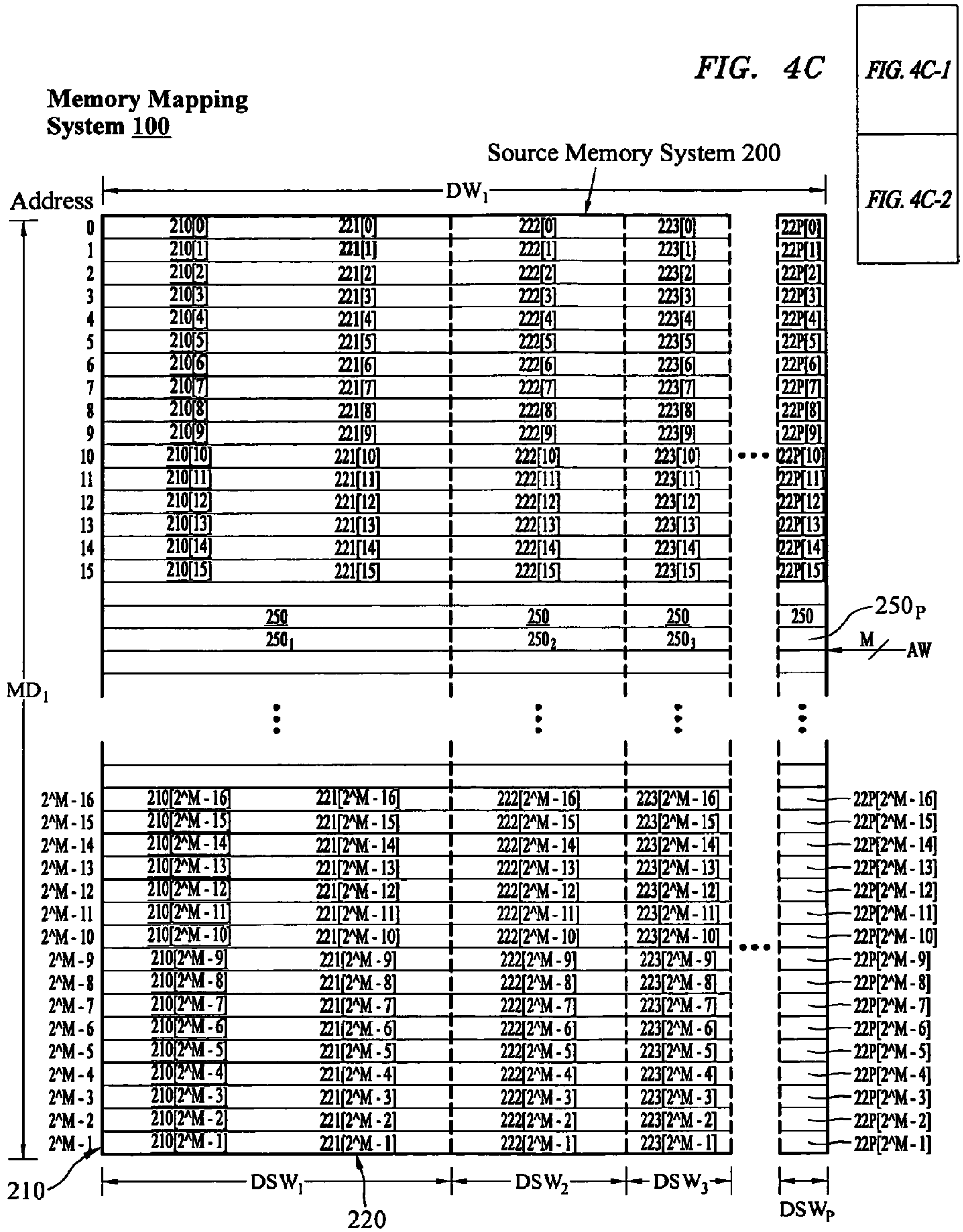
Figures 2, 4C:
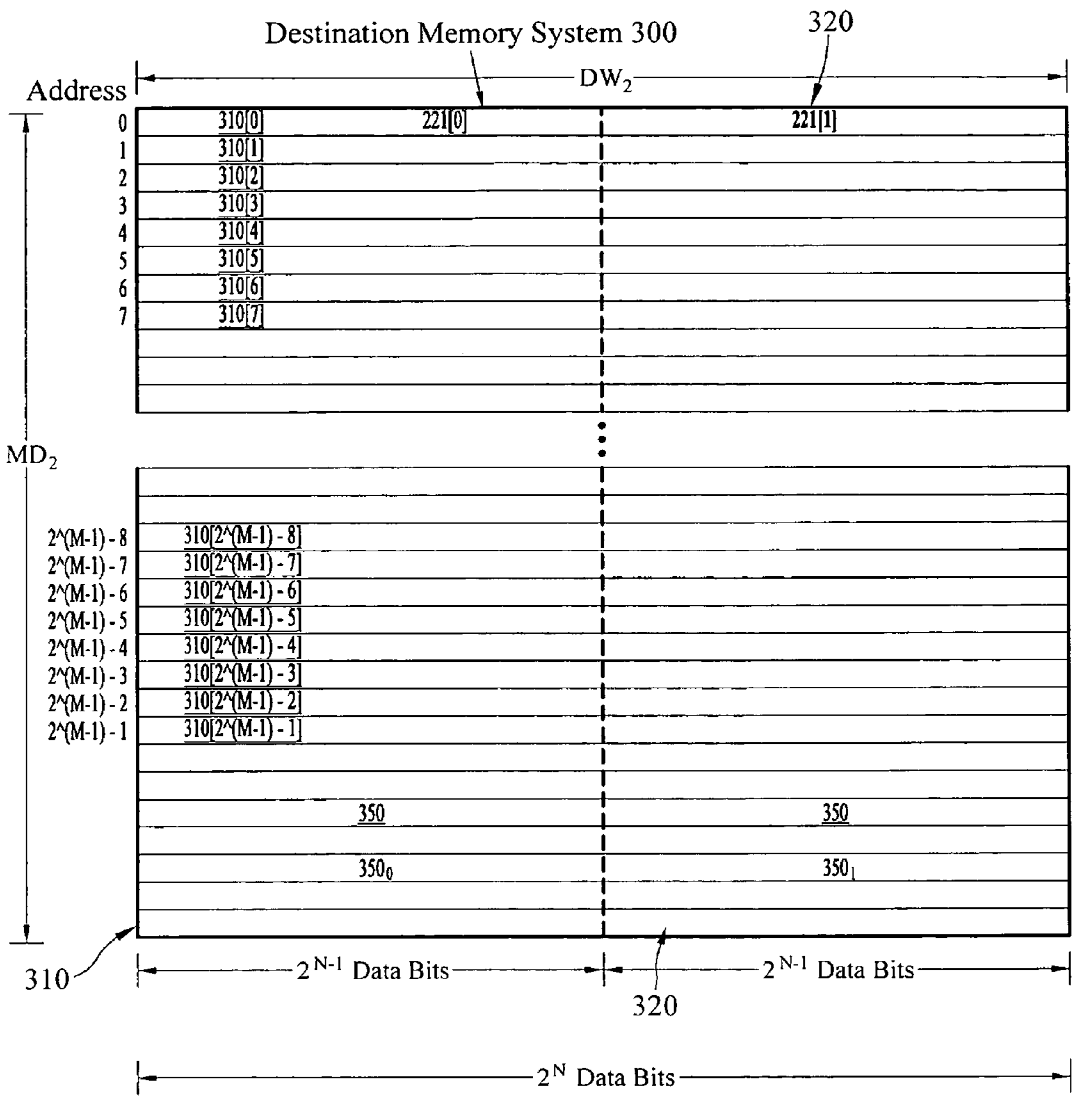

The first register content portion 221[1] of the first source memory sub-region $\mathbf{250}_1$, in turn, is shown in FIG. 4C as being associated with the source memory address $A_1$ having a value of one ("1") and likewise can be selected for mapping into a selected destination memory register 310 within the destination memory system 300. In accordance with Equation 6, the first register content portion 221[1] can be mapped into the destination memory register 310[0] as illustrated in Equation 10 below.

$$\text{Destination memory address } (A_2)=1*\text{int}(1/2^1)+0=0 \qquad \text{(Equation 10)}$$

As discussed above, the destination memory registers 310 can be associated with the two destination register portions $\mathbf{350}_0$, $\mathbf{350}_1$, each comprising $2^{(N-1)}$ bits. In accordance with Equation 7, Equation 11 below illustrates that the first register content portion 221[1] can be positioned within the destination register portion $\mathbf{350}_1$ of the destination memory register 310[0] as illustrated in FIG. 4C.

$$\text{Placement Within Destination memory address } (A_2)=\text{rem}(1/2^1)=1 \qquad \text{(Equation 11)}$$

FIG. 4C shows that the first register content portion 221[0] and the first register content portion 221[1] from the source memory system 200 each are mapped in a side-by-side manner across the destination memory register 310[0]. The destination memory register 310[0] is illustrated in FIG. 4C as comprising $2^N$ data bits; whereas, the first register content portion 221[0] and the first register content portion 221[1] each include $2^{(N-1)}$ data bits. The first register content portion 221[0] and the first register content portion 221[1] from the source memory system 200 thereby can be mapped into the destination memory register 310[0] of the destination memory system 300 without a loss of valuable memory space within the destination memory system 300.

Figures 1, 4D:
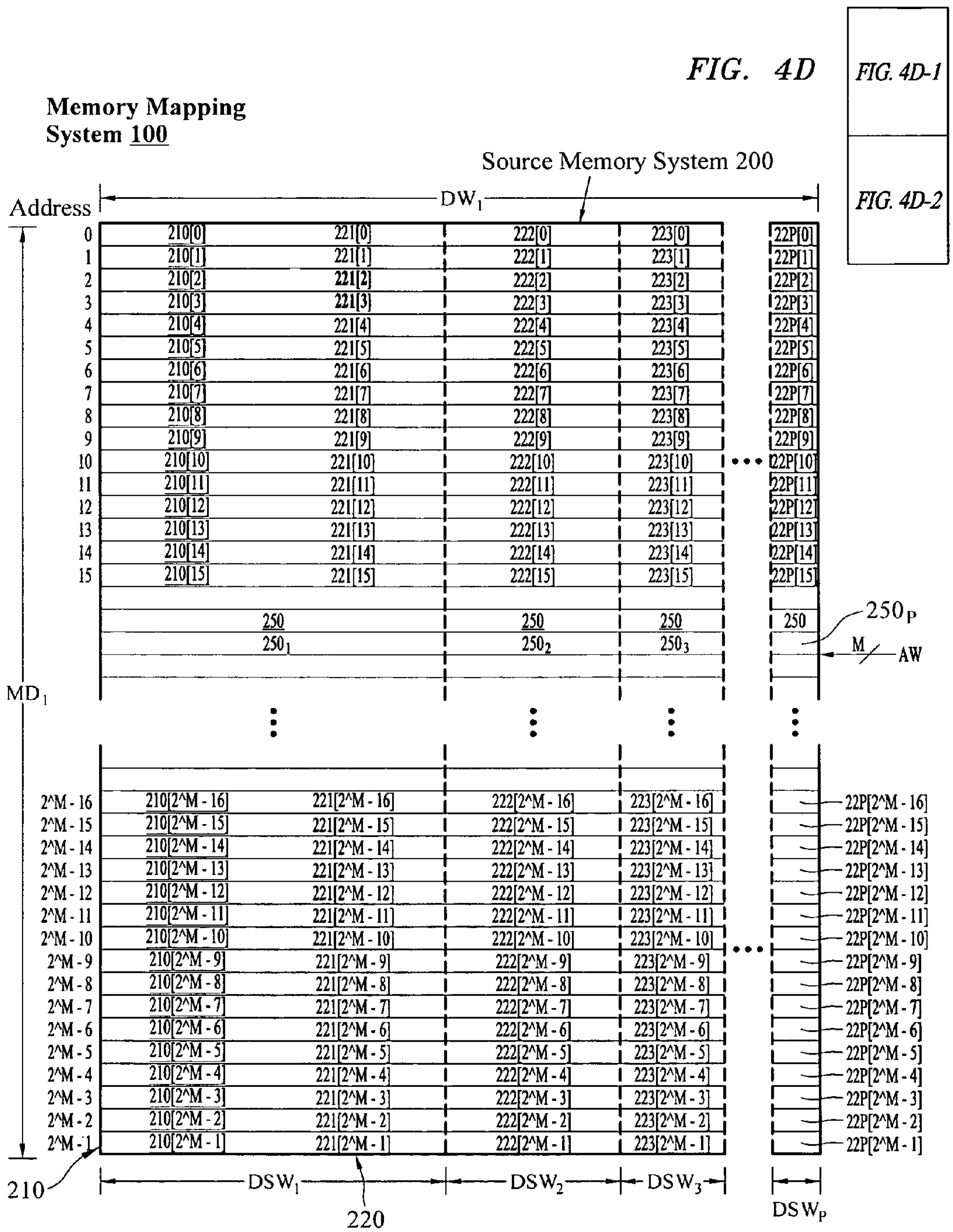
Figures 2, 4D:
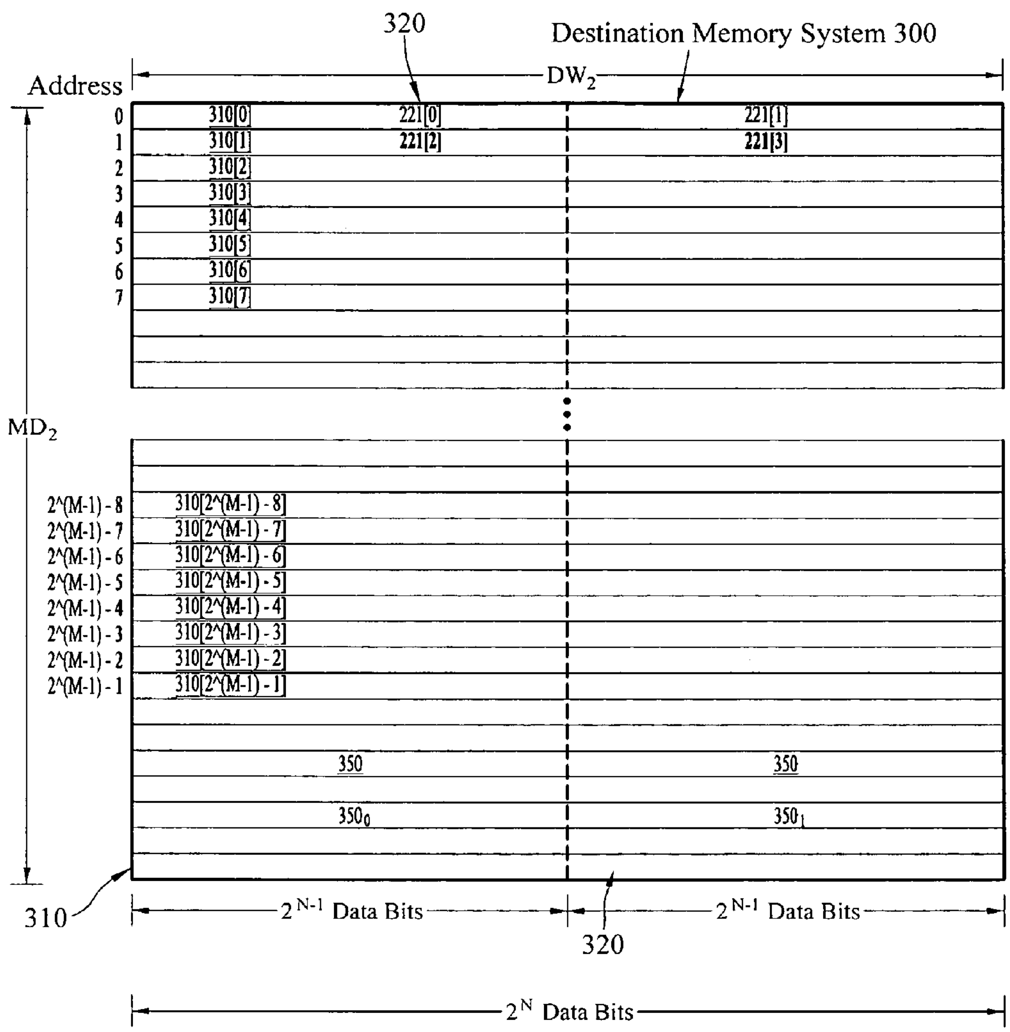

Turning to FIG. 4D, the first register content portions 221[2] and 221[3] of the first source memory sub-region $\mathbf{250}_1$ each are shown as being selected for mapping into a selected destination memory register 310 within the destination memory system 300. The first register content portion 221[2] of the first source memory sub-region $\mathbf{250}_1$ is associated with the source memory address $A_1$ having a value of two ("2"), and the first register content portion 221[3] of the first source memory sub-region $\mathbf{250}_1$ is associated with the source memory address $A_1$ having a value of three ("3"). In accordance with Equations 6 and 7, the first register content portion 221[2] can be positioned within the destination register portion $\mathbf{350}_0$ of the destination memory register 310[1]; whereas, the first register content portion 221[3] can be positioned within the destination register portion $\mathbf{350}_1$ of the destination memory register 310[1] in the manner discussed in more detail above.

FIG. 4D shows that the first register content portion 221[2] and the first register content portion 221[3] from the source memory system 200 each can be mapped in a side-by-side manner across the destination memory register 310[1]. The destination memory register 310[1] is illustrated in FIG. 4D as comprising $2^N$ data bits; whereas, the first register content portion 221[2] and the first register content portion 221[3] each include $2^{(N-1)}$ data bits. In the manner set forth above, the first register content portion 221[2] and the first register content portion 221[3] from the source memory system 200 thereby can be mapped into the destination memory register 310[0] of the destination memory system 300 without a loss of valuable memory space within the destination memory system 300.

Figure 4E:
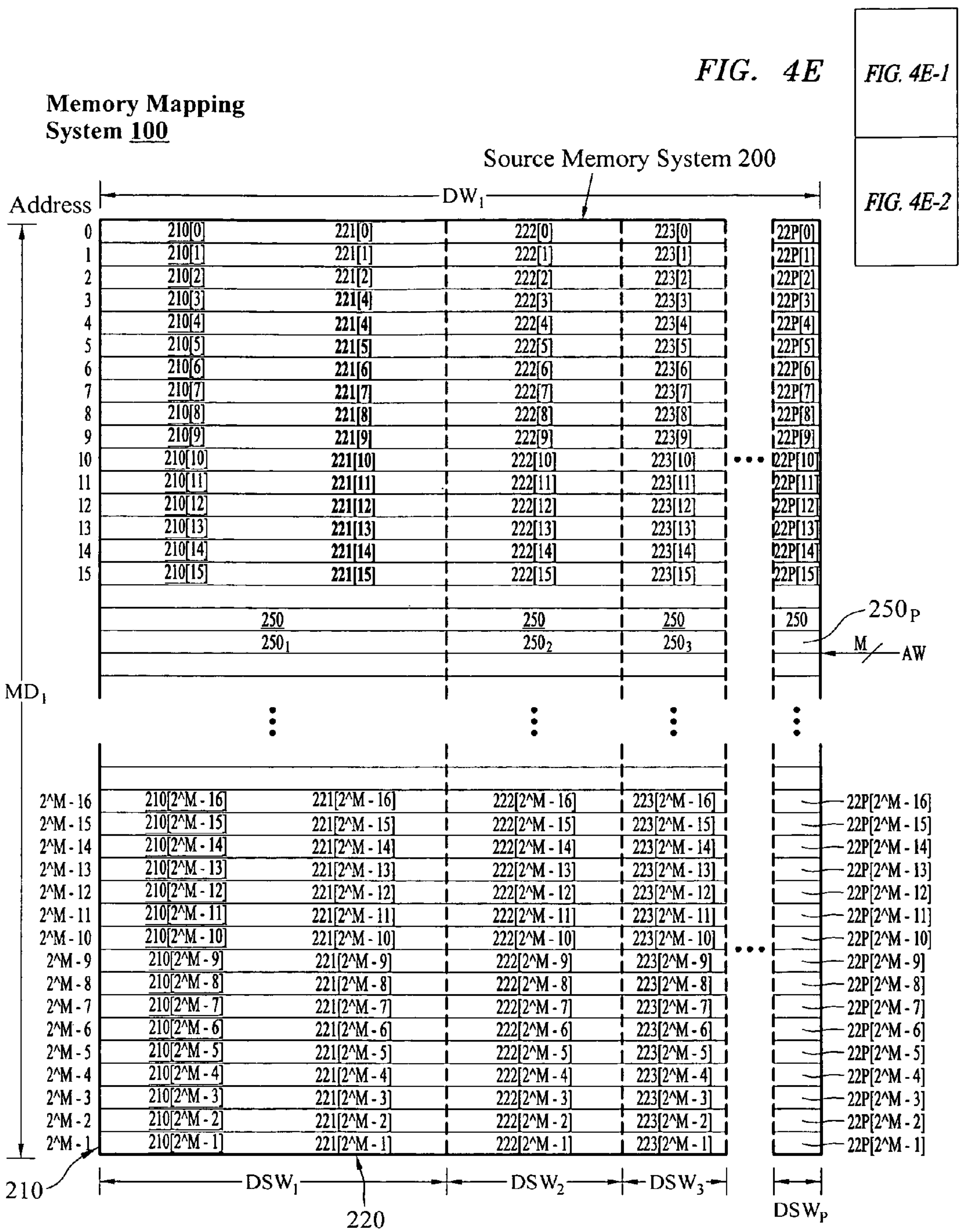
Figures 2, 4E:
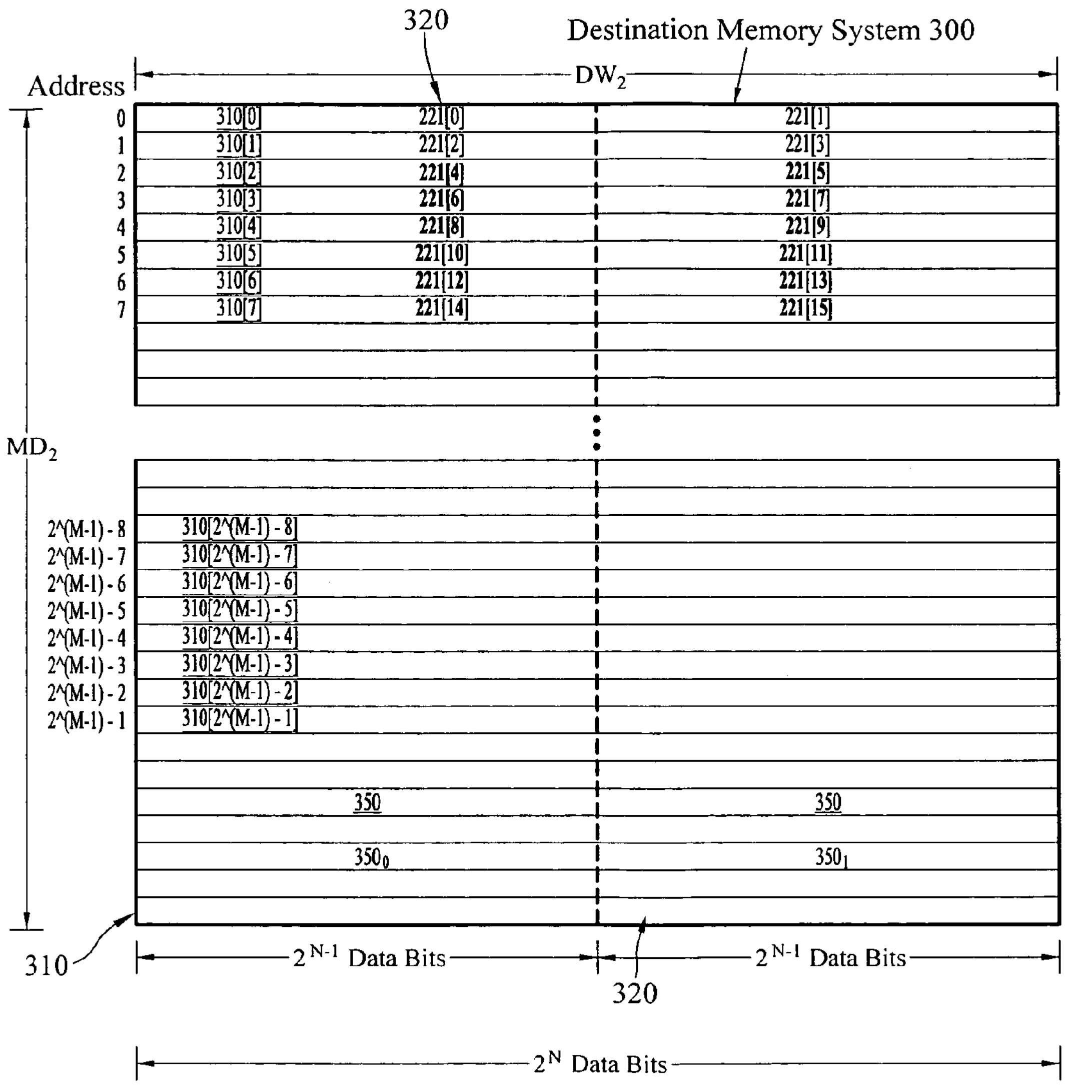

FIG. 4E shows the first register content portions 221[4], 221[5], . . . , 221[15] of the first source memory sub-region $\mathbf{250}_1$ as being selected for mapping into selected destination memory registers 310 within the destination memory system 300. The first register content portions 221[4], 221[5], . . . , 221[15] of the first source memory sub-region $\mathbf{250}_1$ are respectively associated with the source memory addresses $A_1$ having the values of four ("4"), five ("5"), . . . , and fifteen ("15"). In accordance with Equations 6 and 7, the first register content portion 221[4] can be positioned within the destination register portion $\mathbf{350}_0$ of the destination memory register 310[2], and the first register content portion 221[5] can be positioned within the destination register portion $\mathbf{350}_1$ of the destination memory register 310[2] in the manner discussed in more detail above. Similarly, the first register content portions 221[5], 221[6] can be positioned within the destination register portions $\mathbf{350}_0$, $\mathbf{350}_1$, respectively, of the destination memory register 310[3]; whereas, the first register content portions 221[7], 221[8] can be positioned within the destination register portions $\mathbf{350}_0$, $\mathbf{350}_1$, respectively, of the destination memory register 310[4] as illustrated in FIG. 4E.

In the manner set forth above, the remaining selected first register content portions 221[9], 221[10], . . . 221[15] of the first source memory sub-region $\mathbf{250}_1$ likewise can be mapped into the destination register portions $\mathbf{350}_0$, $\mathbf{350}_1$ of the destination memory registers 310[4], 310[5], 310[6], 310[7]. As illustrated in FIG. 4D, the first register content portions 221 [4], 221[5], . . . , 221[15] from the source memory system 200 each are mapped in a side-by-side manner across the respective destination memory registers 310[2], 310[3], . . . , 310[7]. The first register content portions 221[4], 221[5], . . . , 221[15] thereby can be mapped into the destination memory registers 310[2], 310[3], . . . , 310[7] of the destination memory system 300 without a loss of valuable memory space within the destination memory system 300.

Figures 1, 4F:
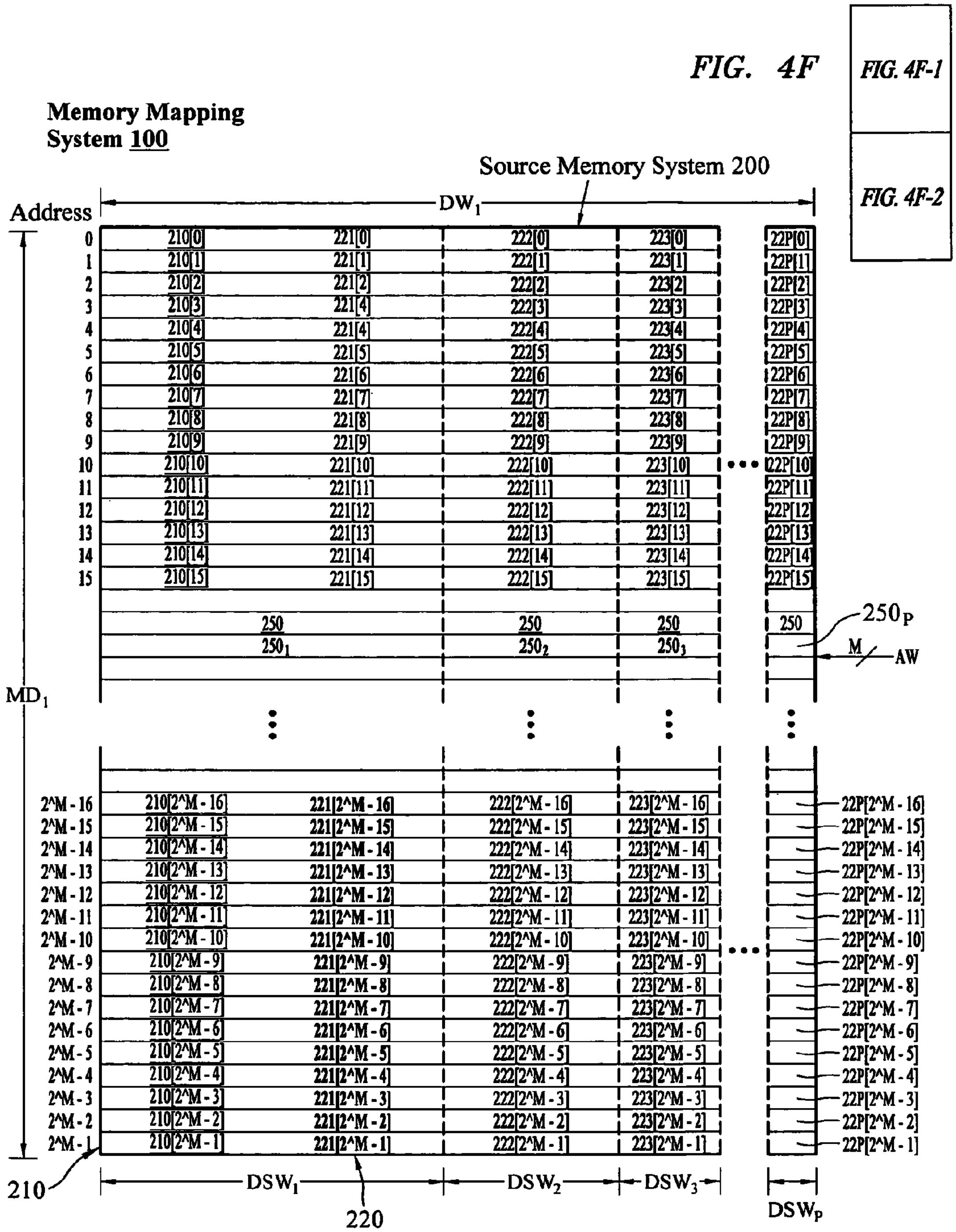
Figures 2, 4F:
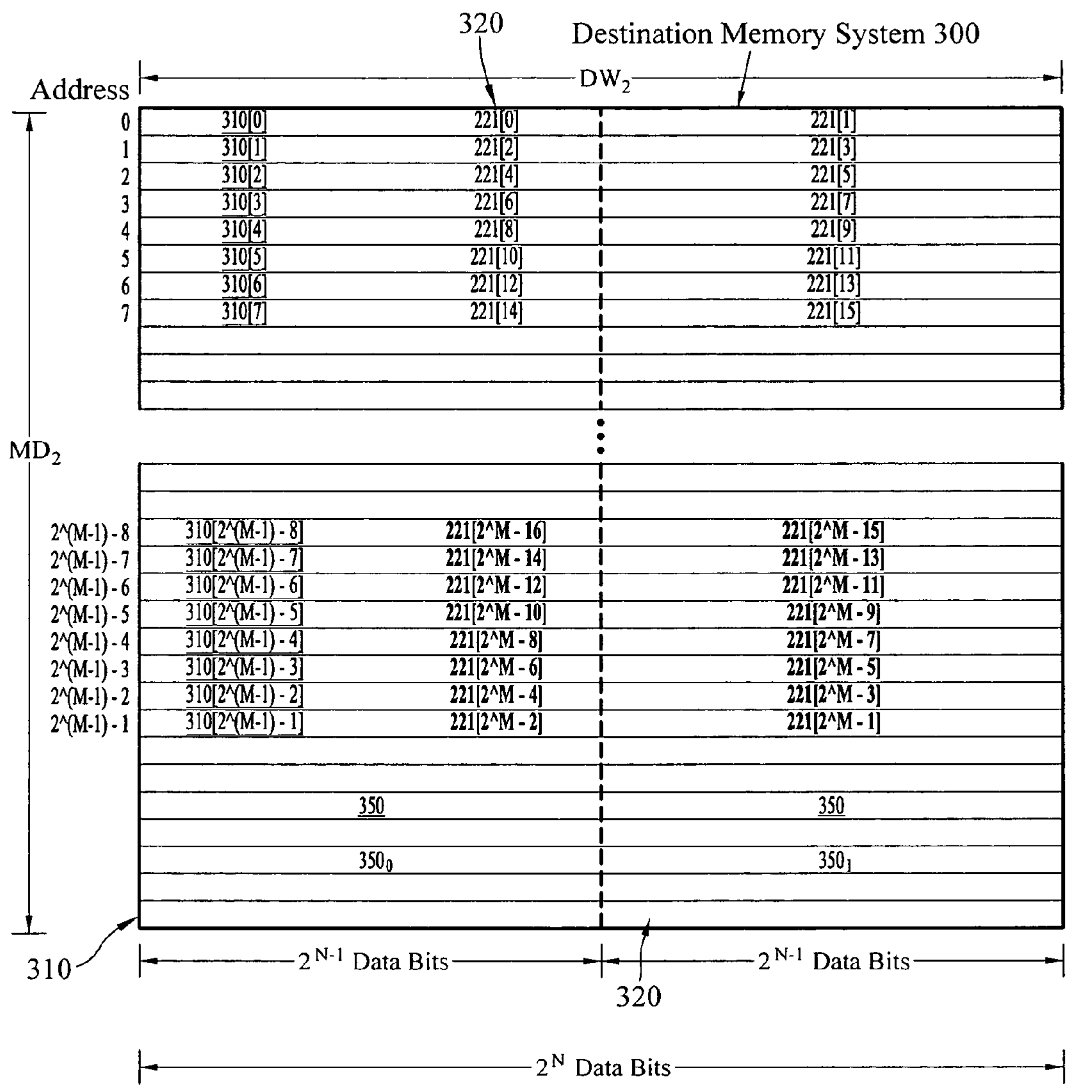

The mapping of the remaining first register content portions 221 of the first source memory sub-region $\mathbf{250}_1$ can proceed in a similar manner. FIG. 4F illustrates the first register content portions 221[$2^M$−16], 221[$2^M$−15], 221[$2^M$−14], . . . , 221[$2^M$−1] of the first source memory sub-region $\mathbf{250}_1$ being selected for mapping into a selected destination memory register 310 within the destination memory system 300. The first register content portions 221[$2^M$−16], 221[$2^M$−15], 221[$2^M$−14], . . . , 221[$2^M$−1] of the first source memory sub-region $\mathbf{250}_1$ are respectively associated with the source memory addresses $A_1$ having the values of $2^M-16$, $2^M-15$, $2^M-14$, . . . , and $2^M-1$. In the manner set forth above, the selected first register content portions 221[$2^M$−16], 221[$2^M$−15], 221[$2^M$−14], . . . , 221[$2^M$−1] of the first source memory sub-region $\mathbf{250}_1$ can be mapped into the destination register portions $\mathbf{350}_0$, $\mathbf{350}_1$ of the respective destination memory registers 310[$2^{(M-1)}$−8], 310[$2^{(M-1)}$−7], . . . , 310[$2^{(M-1)}$−1].

Figures 1, 4G:
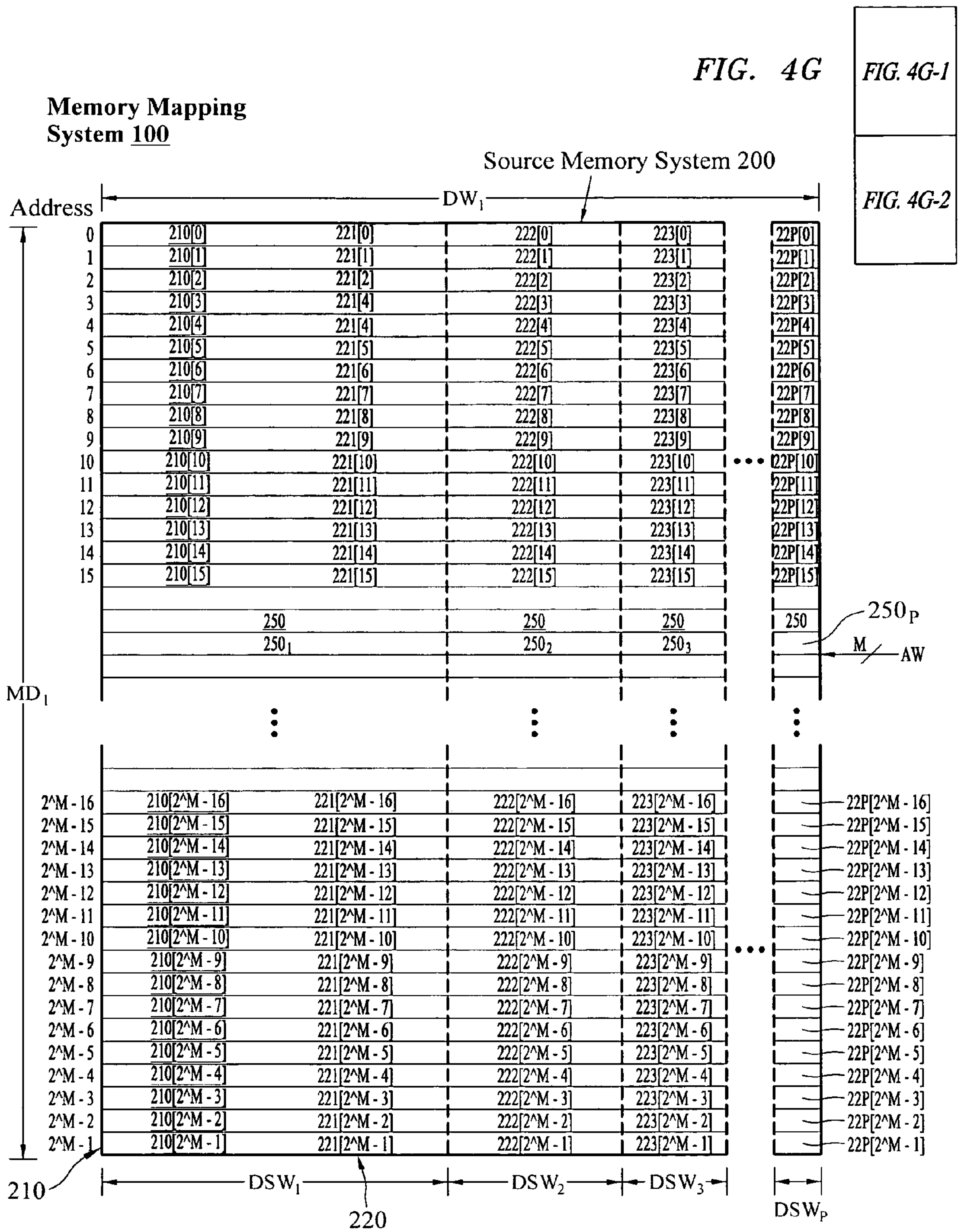
FIG. 4G is a detail drawing illustrating an alternate embodiment of the memory mapping system of FIGS. 4A-F, wherein the selected first source memory sub-region of the source memory system is mapped into the destination memory system.
Figures 2, 4G:
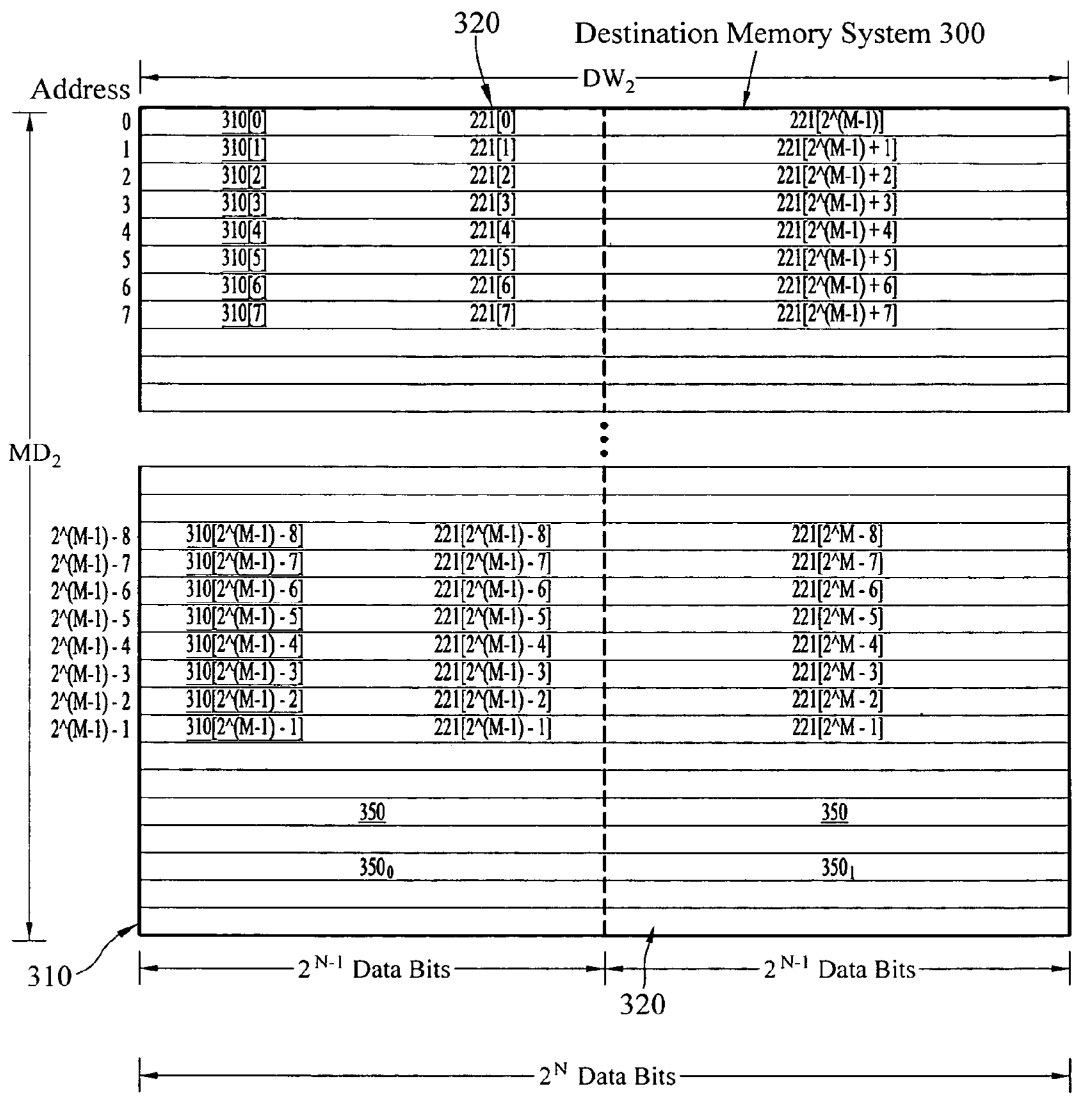

As illustrated in FIG. 4F, the first register content portions 221[$2^M$−16], 221[$2^M$−15], 221[$2^M$−14], . . . , 221[$2^M$−1] from the source memory system 200 each are mapped in a side-by-side manner across the respective destination memory registers 310[$2^{(M-1)}$−8], 310[$2^{(M-1)}$−7], . . . , 310[$2^{(M-1)}$−1]. The first register content portions 221[$2^M$−16], 221[$2^M$−15], 221[$2^M$−14], 221[$2^M$−1] thereby can be mapped into the destination memory registers 310[$2^{(M-1)}$−8], 310[$2^{(M-1)}$−7], 310 [$2^{(M-1)}$−6], . . . , 310[$2^{(M-1)}$−1] of the destination memory system 300 without a loss of valuable memory space within the destination memory system 300. Although shown and described as comprising contiguous memory registers beginning at destination memory address 0 for purposes of illustration only, the destination memory registers 310 into which the first register content portions 221 are mapped can comprise any predetermined destination memory registers 310 and can begin at any suitable destination memory address within the destination memory system 300. The source memory sub-region $\mathbf{250}_1$ likewise can be mapped into the destination memory registers 310 of the destination memory system 300 in any desired arrangement, configuration, and/or distribution without limitation. An exemplary alternative mapping of the source memory sub-region $\mathbf{250}_1$ within the destination memory system 300 is illustrated in FIG. 4G.

Figures 2, 5A:
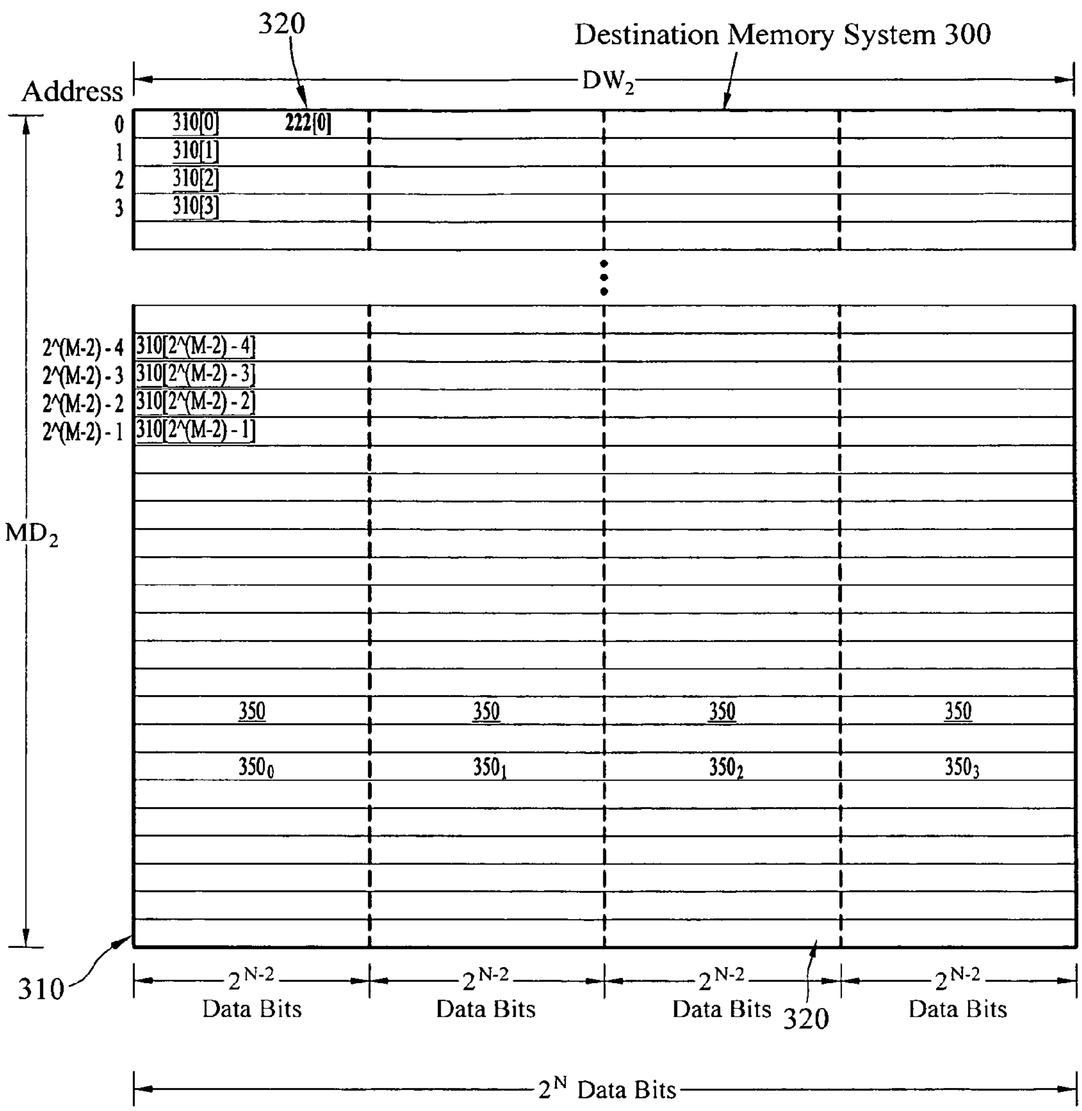
FIGS. 5A-F are detail drawings illustrating an alternative embodiment of the memory mapping system of FIG. 4A, wherein the memory mapping system maps a selected second source memory sub-region of FIG. 4A of the source memory system into the destination memory system.

An exemplary mapping of the second memory sub-region $\mathbf{250}_2$ of the source memory system 200 into the destination memory system 300 is illustrated with reference to FIGS. 5A-F. Turning to FIG. 5A, the second register content portion 222[$A_1$] is illustrated as comprising the $DW_2/4$ most significant remaining data bits of each source memory register 210. Accordingly, since the destination memory system 300 includes $2^N$-bit destination memory registers 310, the data sub-width $DSW_2$ of the second source memory sub-region $\mathbf{250}_2$ includes $2^{(N-2)}$ data bits. In the manner set forth in more detail above, the second memory sub-region $\mathbf{250}_2$ is associated with a mapping index i having a value of two ("2") and can comprise the second register content portion 222[0] for the source memory register 210[0], the second register content portion 222[1] for the source memory register 210[1], the second register content portion 222[2] for the source memory register 210[2], . . . , and the second register content portion 222[$2^M$−1] for the source memory register 210[$2^M$−1] as illustrated in FIG. 5A. Four of the second register content portions 222[$A_1$] thereby can be mapped across the destination data width $DW_2$ of the destination memory registers 310.

As shown in FIG. 5A, for instance, the second register content portion 222[0] of the second memory sub-region $\mathbf{250}_2$ is shown as being associated with the source memory address $A_1$ having a value of zero ("0") and can be selected for mapping into a selected destination memory register 310 within the destination memory system 300. In accordance with Equation 6, the second register content portion 222[0] can be mapped into the destination memory register 310[$A_2$] with a destination memory address $A_2$ having a value of zero ("0") as illustrated in Equation 12.

$$\text{Destination memory address } (A_2)=1*\text{int}(0/2^2)+0=0 \qquad \text{(Equation 12)}$$

As discussed above, Equation 7 can identify the $2^{(N-i)}$-bit destination register portion 350 within the $2^N$-bit destination data width $DW_2$ of the destination memory register 310[0] into which the selected second register content portion 222[0] can be disposed. FIG. 5A shows that the destination memory registers 310 of the destination memory system 300 each can be associated with $2^i$ $2^{(N-i)}$-bit destination register portions 350. Since the mapping index i associated with the second memory sub-region $\mathbf{250}_2$ has a value of two ("2"), the destination memory registers 310 can be associated with four ($2^2$) destination register portions $\mathbf{350}_0$, $\mathbf{350}_1$, $\mathbf{350}_2$, and $\mathbf{350}_3$, each comprising $2^{(N-2)}$ bits, as illustrated in FIG. 5A. The destination register portion $\mathbf{350}_0$ is associated with a zeroth register position within each destination memory register 310; whereas, the destination register portion $\mathbf{350}_1$ is associated with a first register position within each destination memory register 310. The destination register portions $\mathbf{350}_2$, $\mathbf{350}_3$ can be associated with second and third register positions, respectively, within each destination memory register 310. Equation 13 below illustrates that the second register content portion 222[0] can be positioned within the destination register portion $\mathbf{350}_0$ of the destination memory register 310[0] as illustrated in FIG. 5A.

$$\text{Placement Within Destination memory address } (A_2)=\text{rem}(0/2^2)=0 \quad \text{(Equation 13)}$$

Figures 2, 5B:
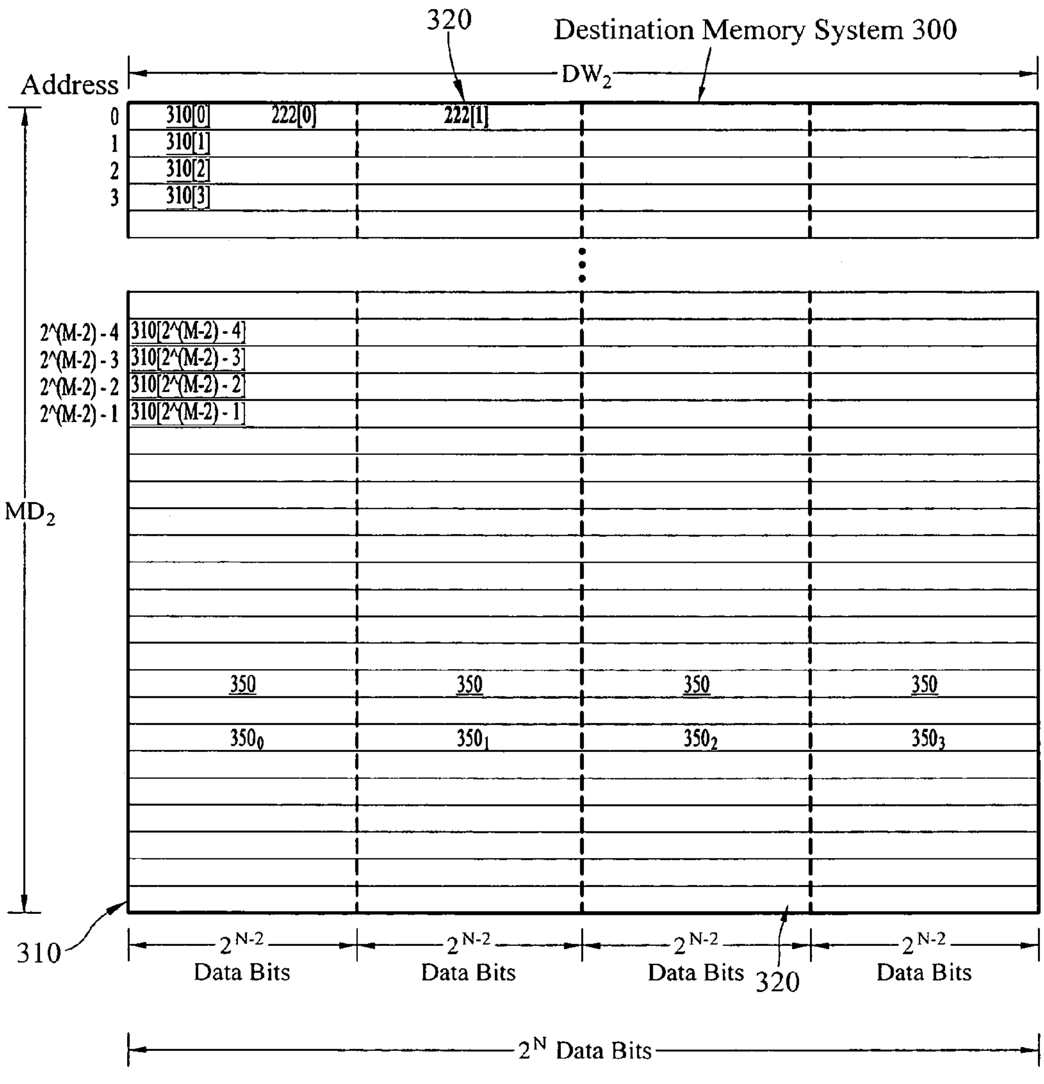

The second register content portion 222[1] of the second memory sub-region $\mathbf{250}_2$, in turn, is shown in FIG. 5B as being associated with the source memory address $A_1$ having a value of one ("1") and likewise can be selected for mapping into a selected destination memory register 310 within the destination memory system 300. In accordance with Equation 6, the second register content portion 222[1] can be mapped into the destination memory register 310[0] as illustrated in Equation 14 below.

$$\text{Destination memory address } (A_2)=1*\text{int}(1/2^2)+0=0 \quad \text{(Equation 14)}$$

As discussed above, the destination memory registers 310 can be associated with the four destination register portions $\mathbf{350}_0$, $\mathbf{350}_1$, $\mathbf{350}_2$, $\mathbf{350}_3$, each comprising $2^{(N-2)}$ bits. In accordance with Equation 7, Equation 15 below illustrates that the second register content portion 222[1] likewise can be positioned within the destination register portion $\mathbf{350}_1$ of the destination memory register 310[0] as illustrated in FIG. 5B.

$$\text{Placement Within Destination memory address } (A_2)=\text{rem}(1/2^2)=1 \quad \text{(Equation 15)}$$

Figures 1, 5C:
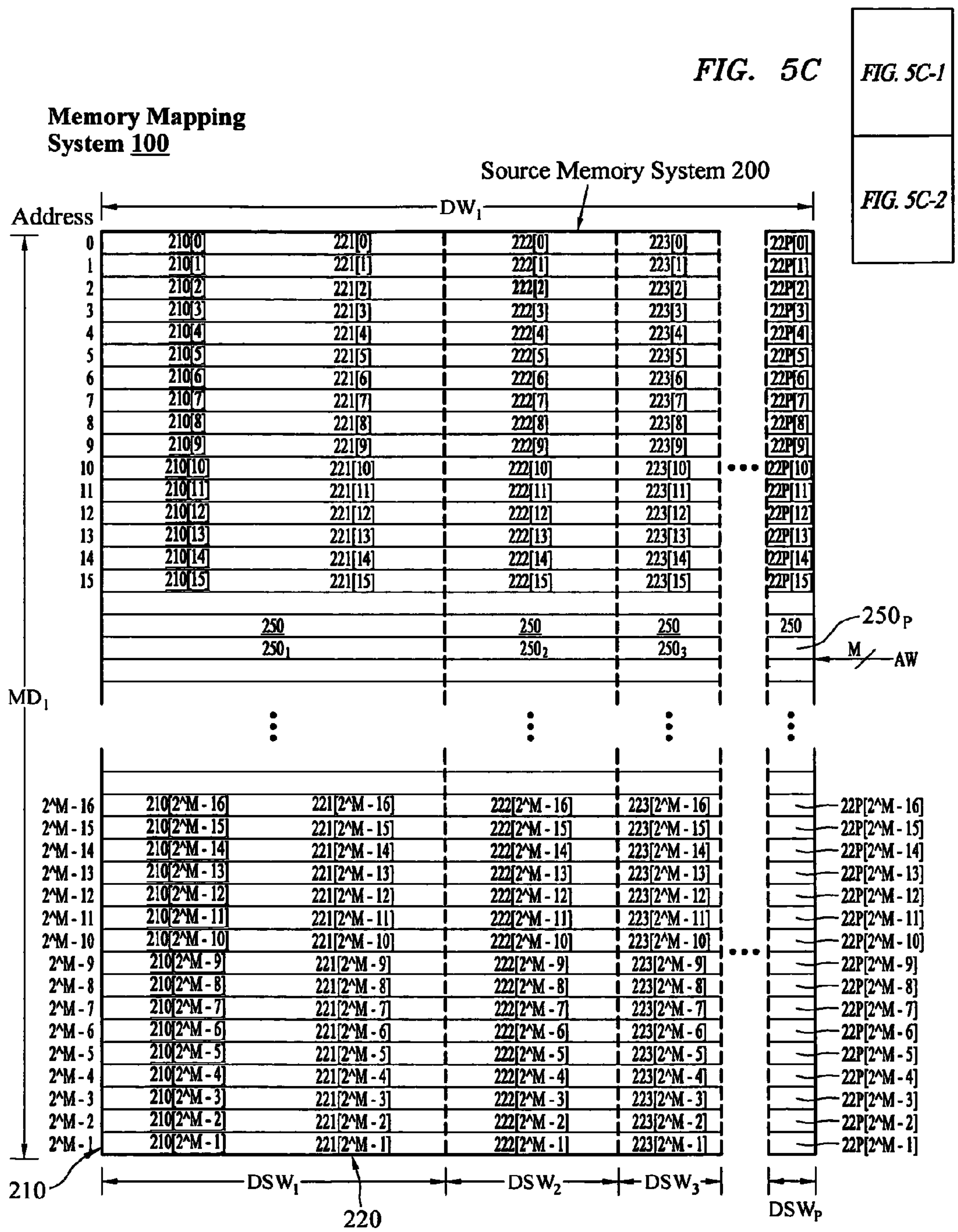
Figures 2, 5C:
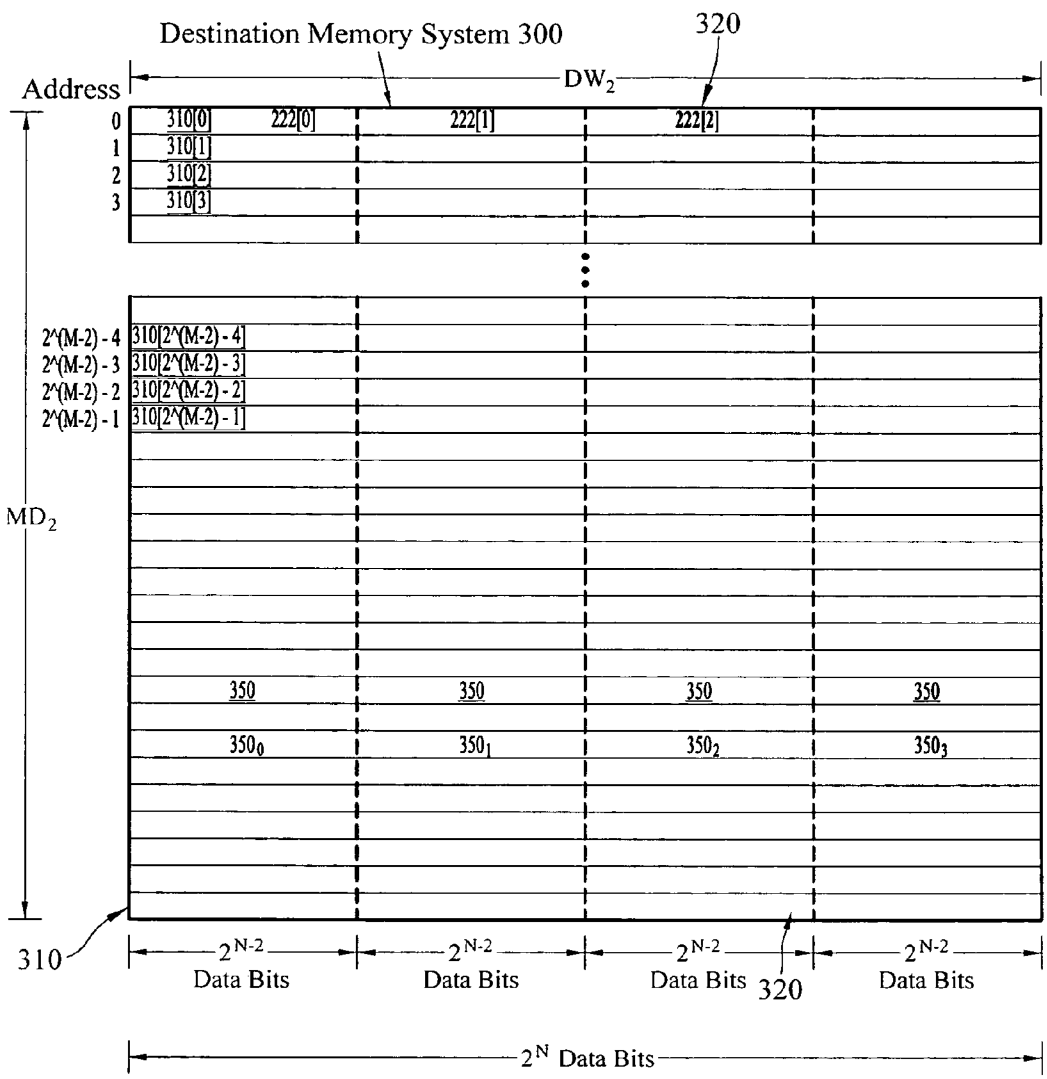

The second register content portion 222[2] of the second memory sub-region $\mathbf{250}_2$ is shown in FIG. 5C as being associated with the source memory address $A_1$ having a value of two ("2") and can be selected for mapping into a selected destination memory register 310 within the destination memory system 300 in the manner set forth above. In accordance with Equation 6, the second register content portion 222[2] can be mapped into the destination memory register 310[0] as illustrated in Equation 16 below.

$$\text{Destination memory address } (A_2)=1*\text{int}(2/2^2)+0=0 \quad \text{(Equation 16)}$$

In accordance with Equation 7, Equation 17 below illustrates that the second register content portion 222[2] can be positioned within the destination register portion $\mathbf{350}_2$ of the destination memory register 310[0] as illustrated in FIG. 5C.

$$\text{Placement Within Destination memory address } (A_2)=\text{rem}(2/2^2)=2 \quad \text{(Equation 17)}$$

Figures 1, 5D:
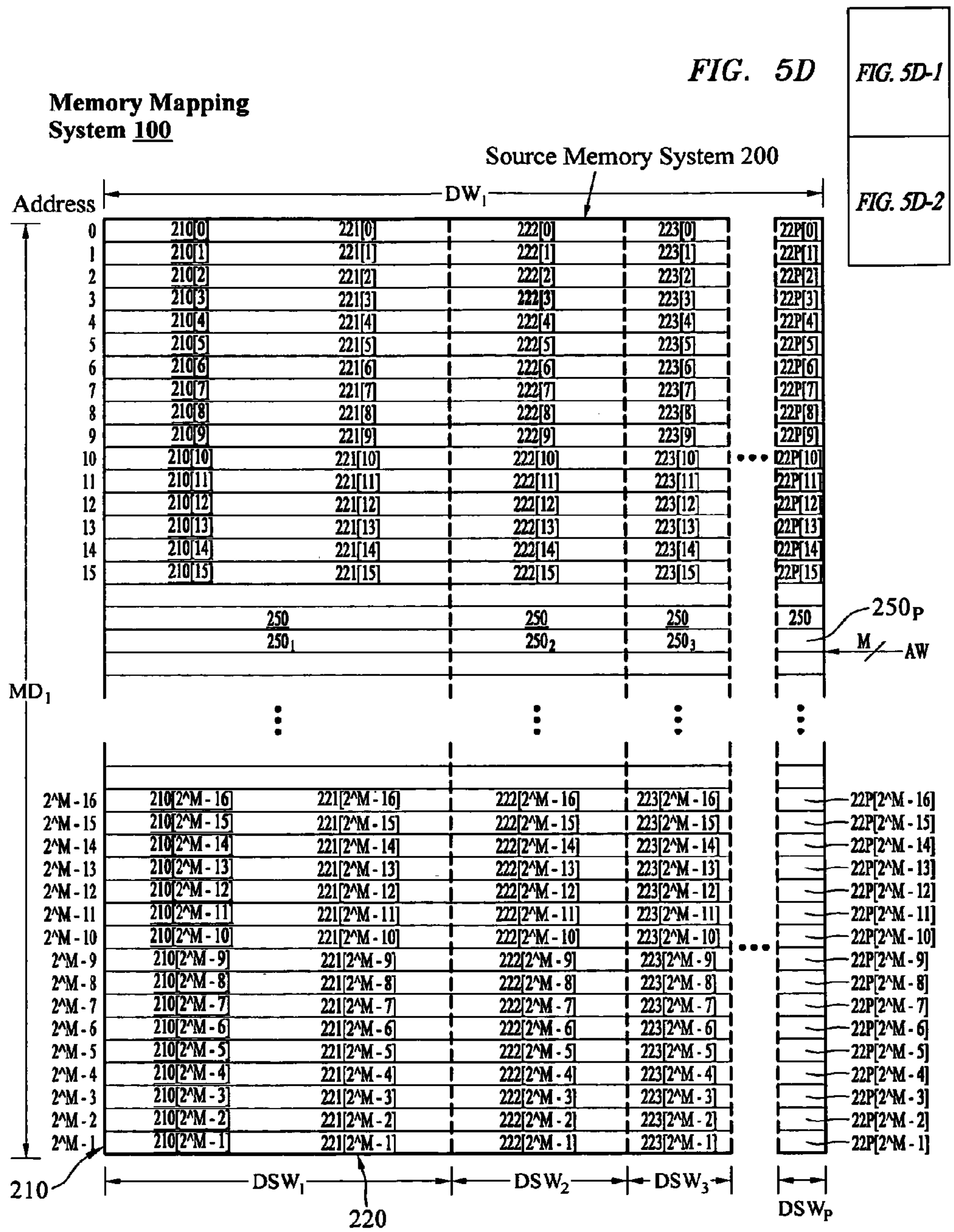
Figures 2, 5D:
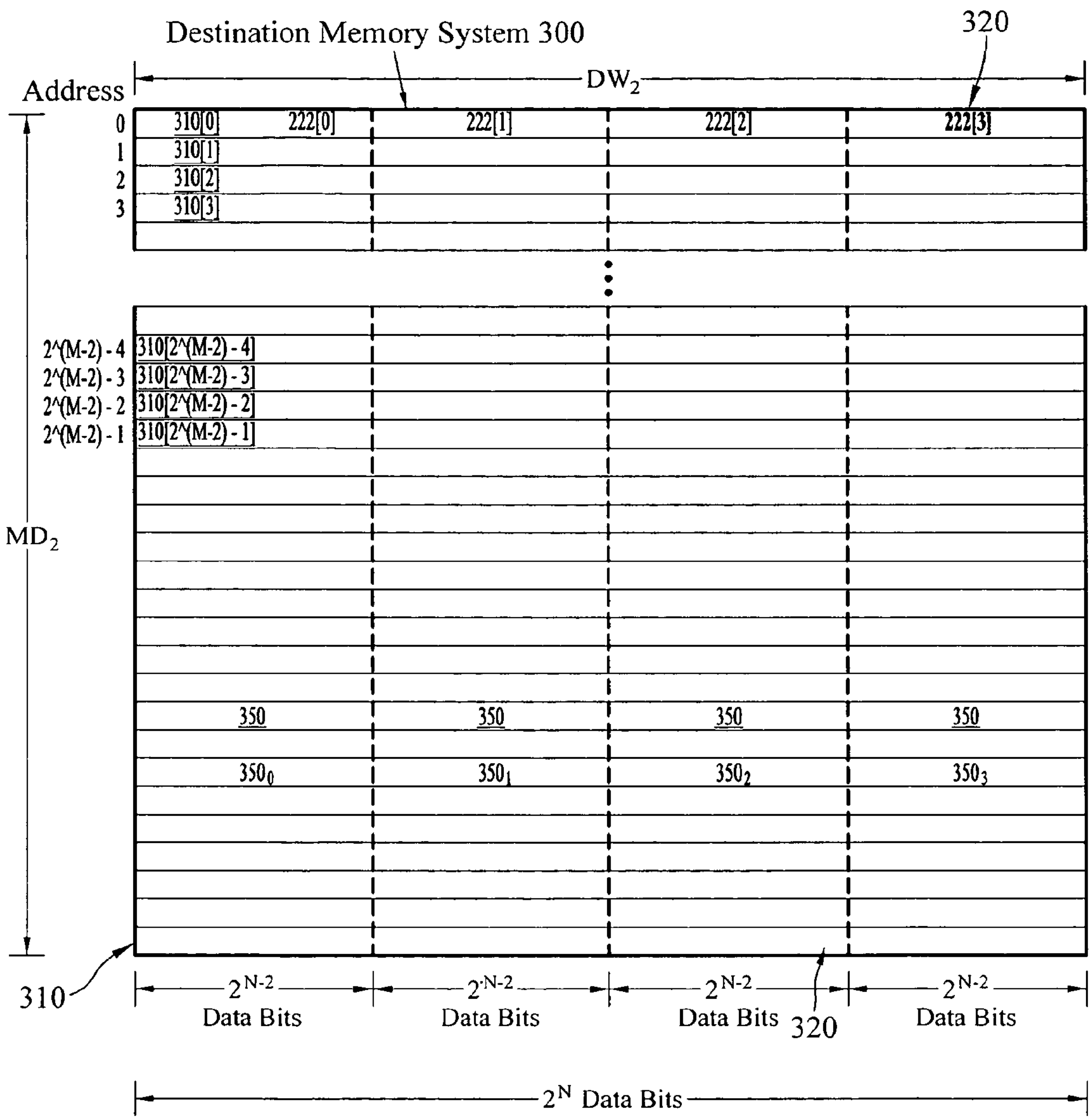

Similarly, the second register content portion 222[3] of the second memory sub-region $\mathbf{250}_2$ is shown in FIG. 5D as being associated with the source memory address $A_1$ having a value of three ("3") and can be selected for mapping into a selected destination memory register 310 within the destination memory system 300 in the manner set forth above. In accordance with Equation 6, the second register content portion 222[3] can be mapped into the destination memory register 310[0] as illustrated in Equation 18 below.

$$\text{Destination memory address } (A_2)=1*\text{int}(3/2^2)+0=0 \quad \text{(Equation 18)}$$

In accordance with Equation 7, Equation 19 below illustrates that the second register content portion 222[3] can be positioned within the destination register portion $\mathbf{350}_3$ of the destination memory register 310[0] as illustrated in FIG. 5D.

$$\text{Placement Within Destination memory address } (A_2)=\text{rem}(3/2^2)=3 \quad \text{(Equation 19)}$$

FIG. 5D shows that the second register content portions 222[0], 222[1], 222[2], 222[3] from the source memory system 200 each are mapped in a side-by-side manner across the destination memory register 310[0]. The destination memory register 310[0] is illustrated in FIG. 5D as comprising $2^N$ data bits; whereas, the second register content portions 222[0], 222[1], 222[2], 222[3] each include $2^{(N-2)}$ data bits. The second register content portions 222[0], 222[1], 222[2], 222[3] from the source memory system 200 thereby can be mapped into the destination memory register 310[0] of the destination memory system 300 without a loss of valuable memory space within the destination memory system 300.

Figures 1, 5E:
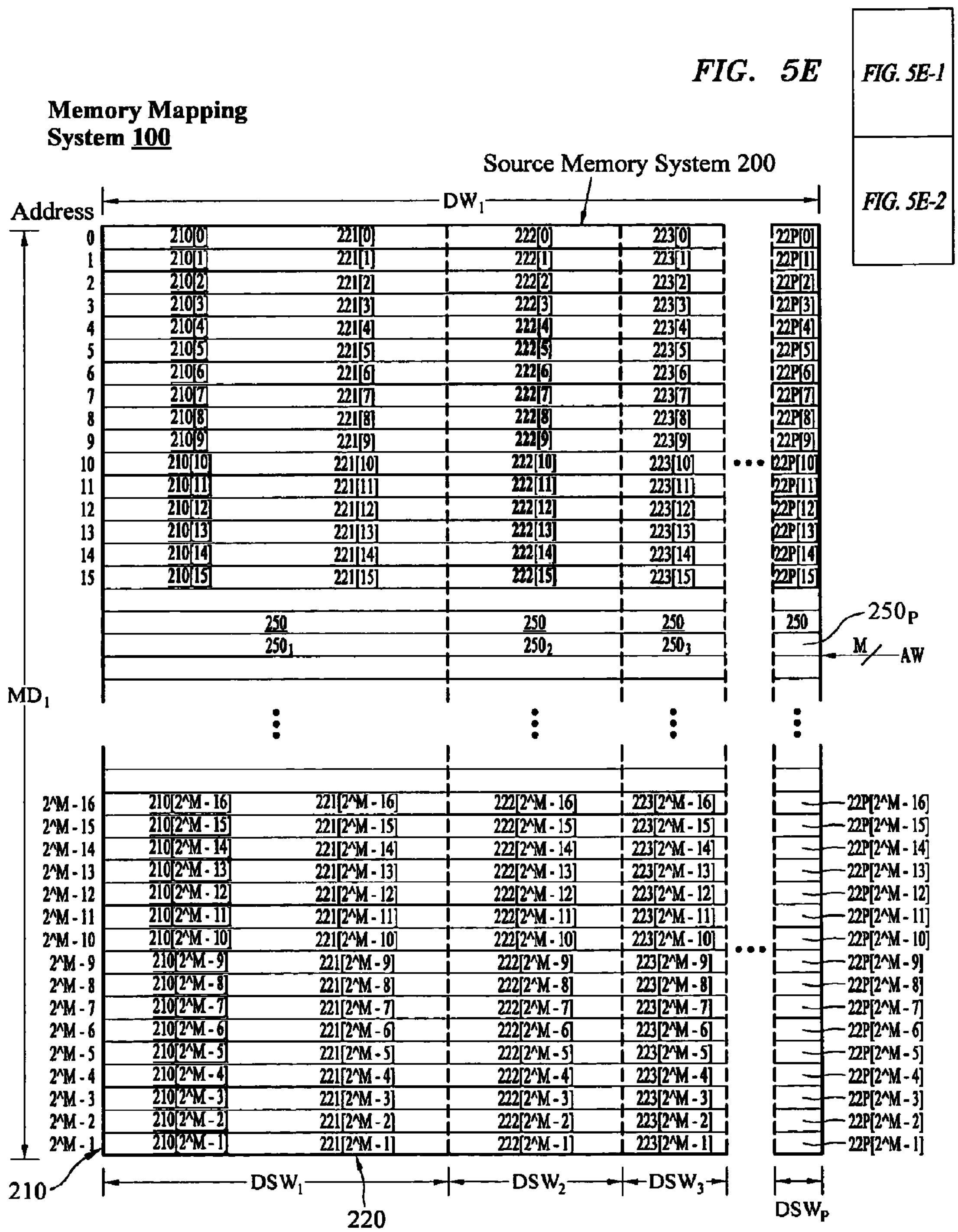
Figures 2, 5E:
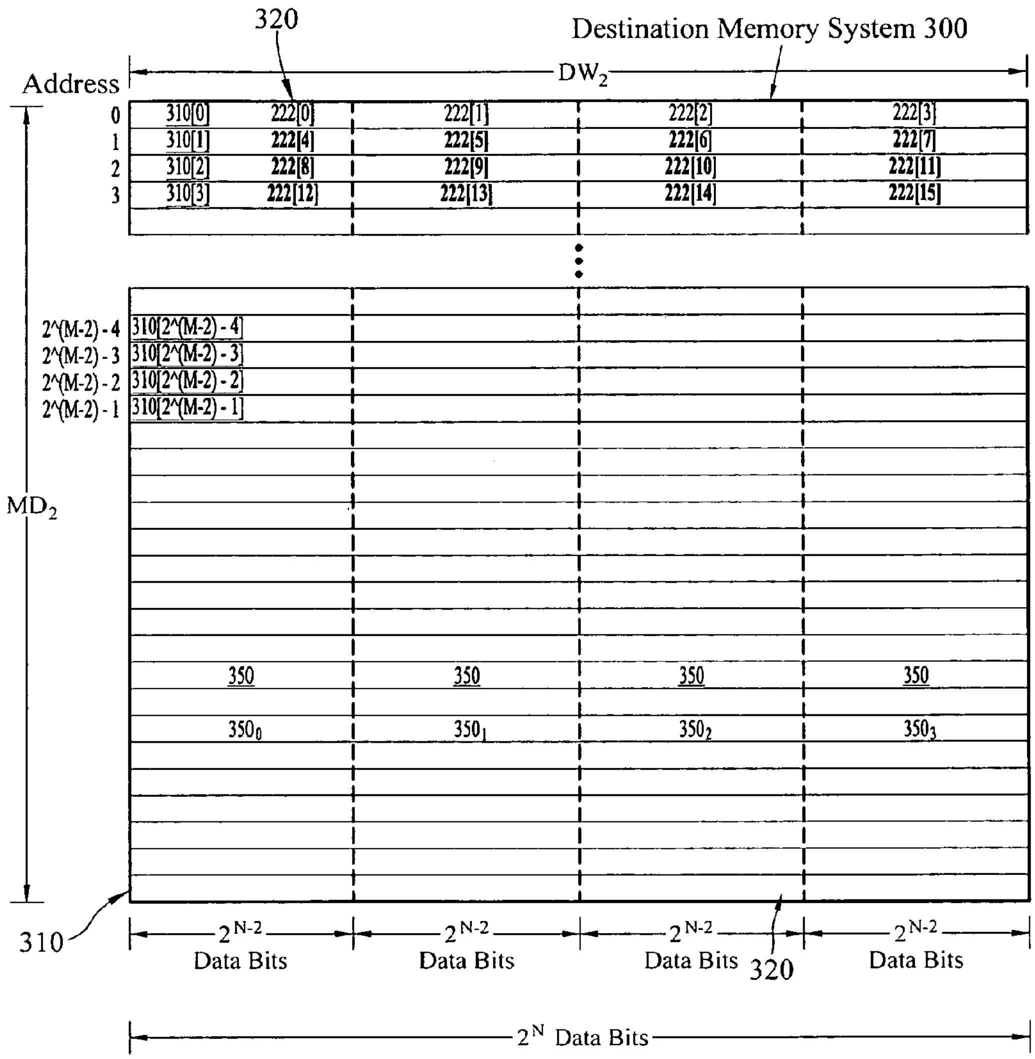

FIG. 5E shows the second register content portions 222[4], 222[5], . . . , 222[15] of the second memory sub-region $\mathbf{250}_2$ as being selected for mapping into selected destination memory registers 310 within the destination memory system 300. As set forth above, the second register content portions 222[4], 222[5], . . . , 222[15] of the second memory sub-region $\mathbf{250}_2$ are respectively associated with the source memory addresses $A_1$ having the values of four ("4"), five ("5"), . . . , and fifteen ("15"). In accordance with Equations 6 and 7, the second register content portions 222[4], 222[5], 222[6], 222[7] can be respectively positioned within the destination register portions $\mathbf{350}_0$, $\mathbf{350}_1$, $\mathbf{350}_2$, $\mathbf{350}_3$ of the destination memory register 310[1] in the manner discussed in more detail above. Similarly, the second register content portions 222[8], 222[9], 222[10], 222[11] can be respectively positioned within the destination register portions $\mathbf{350}_0$, $\mathbf{350}_1$, $\mathbf{350}_2$, $\mathbf{350}_3$ of the destination memory register 310[2], and the second register content portions 222[12], 222[13], 222[14], 222[15] can be respectively positioned within the destination register portions $\mathbf{350}_0$, $\mathbf{350}_1$, $\mathbf{350}_2$, $\mathbf{350}_3$ of the destination memory register 310[1] as illustrated in FIG. 5E.

In the manner set forth above, the selected second register content portions 222[4], 222[5], . . . , 222[15] of the second memory sub-region $\mathbf{250}_2$ can be mapped into the destination memory registers 310[1], 310[2], 310[3]. As shown in FIG. 5E, the second register content portions 222[4], 222[5], . . . , 222[15] from the source memory system 200 each are mapped in a side-by-side manner across the respective destination memory registers 310[1], 310[2], 310[3]. The second register content portions 222[4], 222[5], . . . , 222[15] thereby can be mapped into the destination memory registers 310[1], 310[2], 310[3] of the destination memory system 300 without a loss of valuable memory space within the destination memory system 300.

Figures 1, 5F:
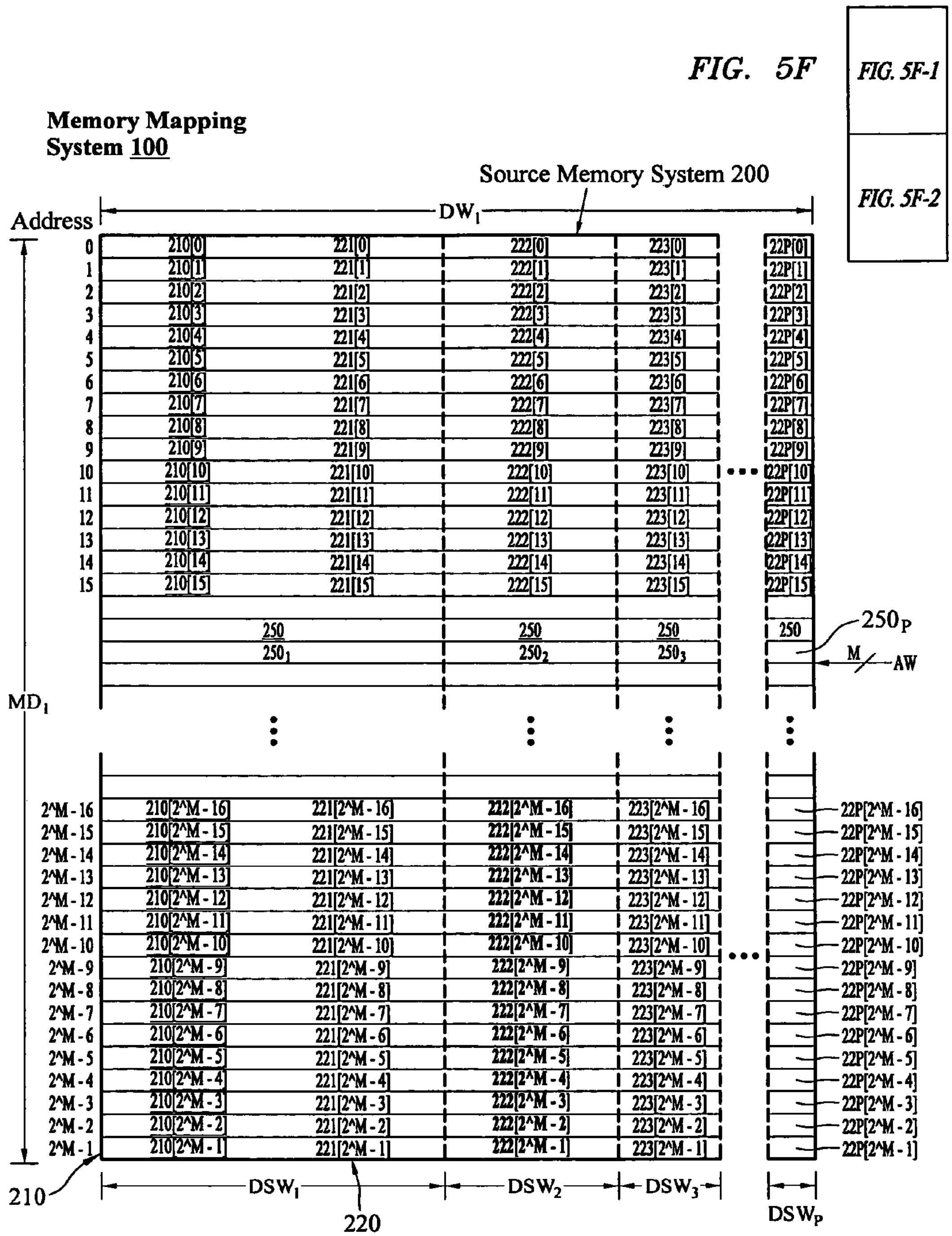
Figures 2, 5F:
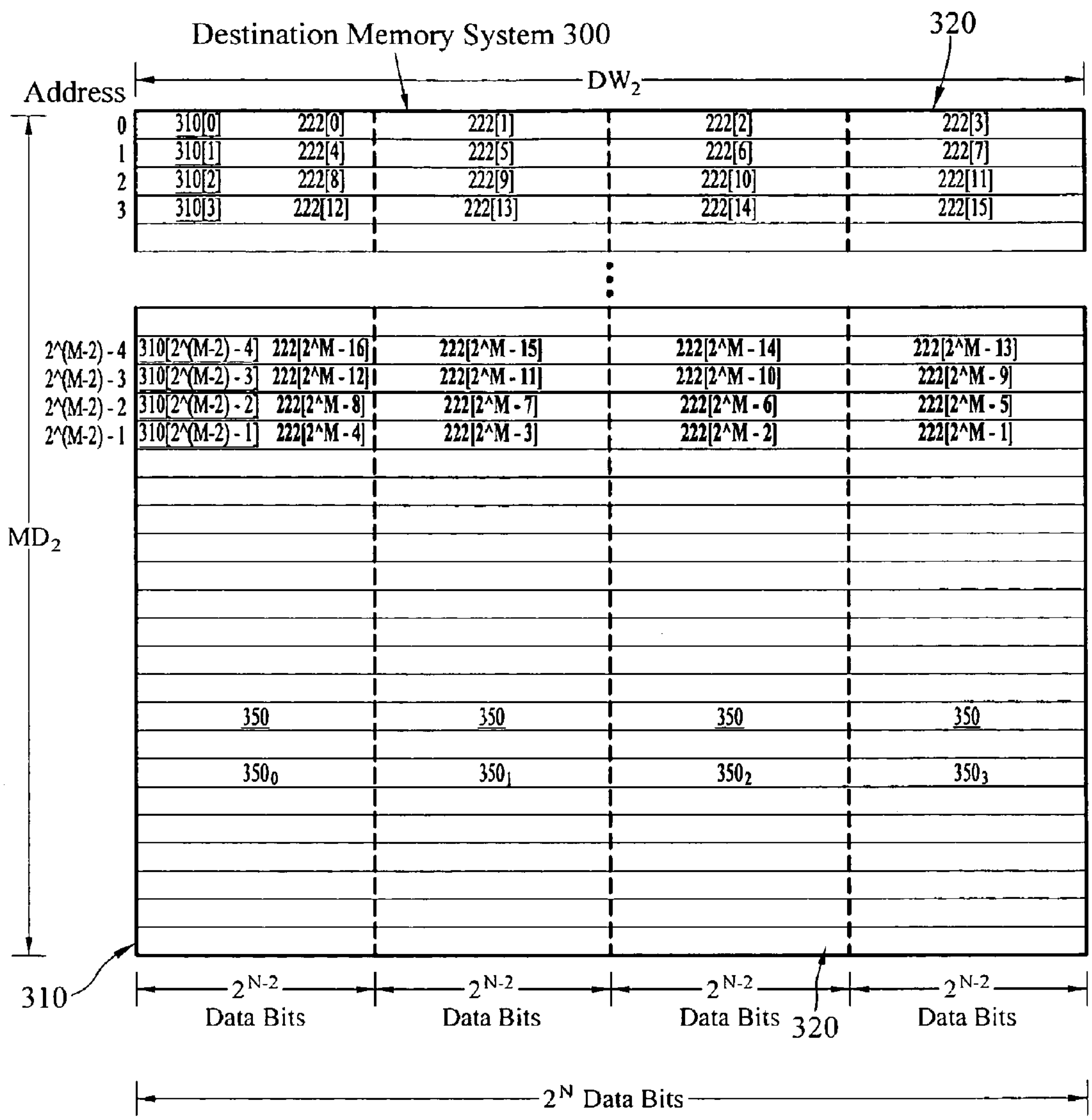

The mapping of the remaining second register content portions 222 of the second memory sub-region $\mathbf{250}_2$ can proceed in a similar manner. FIG. 5F illustrates the second register content portions 222[$2^M$−16], 222[$2^M$−15], 222[$2^M$−14], . . . , 222[$2^M$−1] of the second memory sub-region $\mathbf{250}_2$ being selected for mapping into a selected destination memory register 310 within the destination memory system 300. The second register content portions 222[$2^M$−16], 222[$2^M$−15], 222[$2^M$−14], . . . , 222[$2^M$−1] of the second memory sub-region $\mathbf{250}_2$ are respectively associated with the source memory addresses $A_1$ having the values of $2^M-16$, $2^M-15$, . . . , and $2^M-1$. In accordance with Equations 6 and 7, the second register content portions 222[$2^M$−16], 222[$2^M$−15], 222[$2^M$−14], 222[$2^M$−13] can be respectively positioned within the destination register portions $\mathbf{350}_0$, $\mathbf{350}_1$, $\mathbf{350}_2$, $\mathbf{350}_3$ of the destination memory register 310[$2^{(M-2)}$4] in the manner discussed in more detail above. Similarly, the second register content portions 222[$2^M$−12], 222[$2^M$−11], 222[$2^M$−10], 222[$2^M$−9] can be respectively positioned within the destination register portions $\mathbf{350}_0$, $\mathbf{350}_1$, $\mathbf{350}_2$, $\mathbf{350}_3$ within the destination memory register 310[$2^{(M-2)}$−3], and the second register content portions 222[$2^M$−8], 222[$2^M$−7], 222[$2^M$−6], 222[$2^M$−5] can be respectively positioned within the destination register portions $350_0$, $350_1$, $350_2$, $350_3$ within the destination memory register 310[$2^{(M-2)}$−2] as illustrated in FIG. 5F. The second register content portions 222[$2^M$−4], 222[$2^M$−3], 222 [$2^M$−2], 222[$2^M$−1] can be respectively positioned within the destination register portions $350_0$, $350_1$, $350_2$, $350_3$ within the destination memory register 310[$2^{(M-2)}$−1].

Figures 1, 5G:
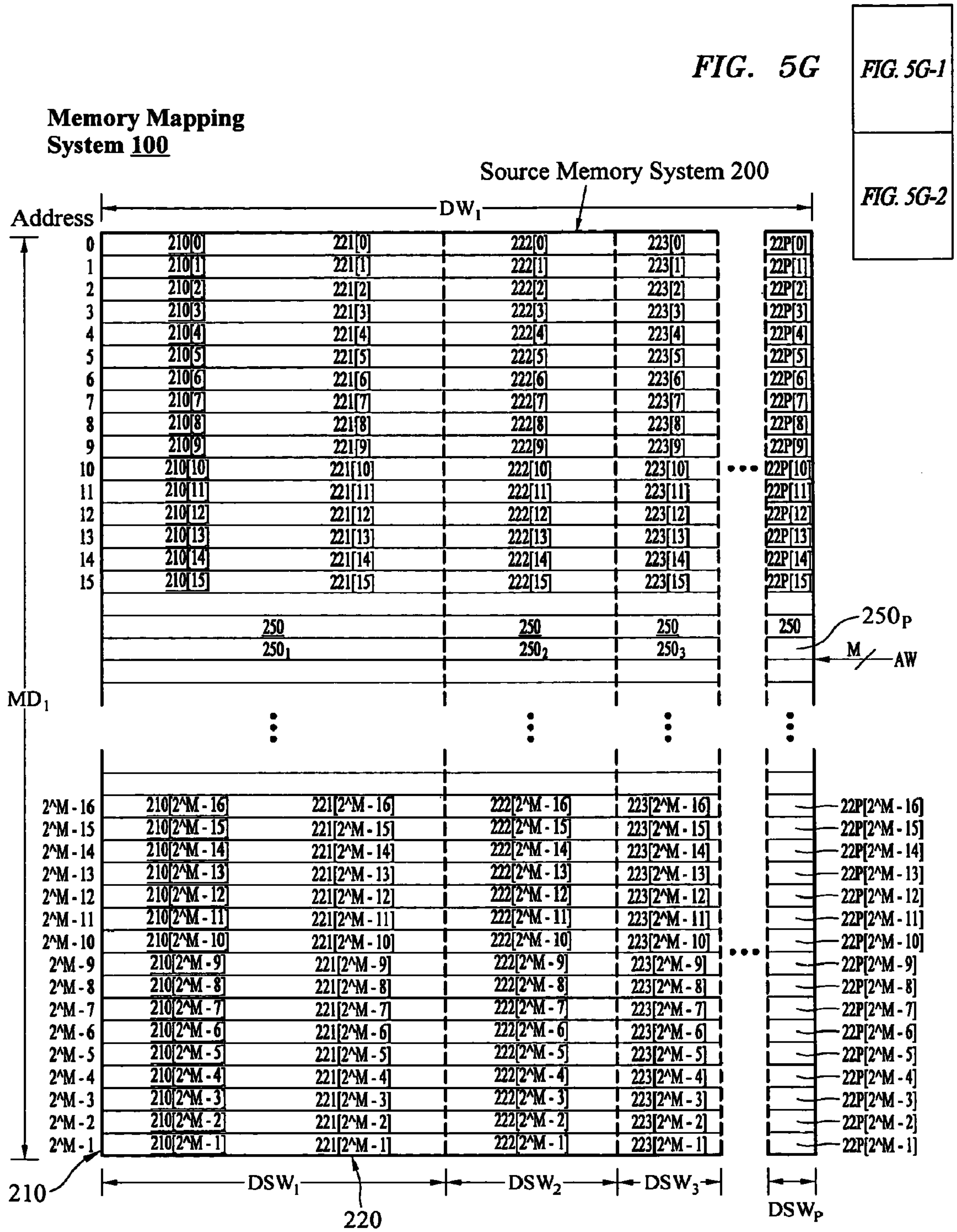
FIG. 5G is a detail drawing illustrating an alternate embodiment of the memory mapping system of FIGS. 5A-F, wherein the selected second source memory sub-region of the source memory system is mapped into the destination memory system.
Figures 2, 5G:
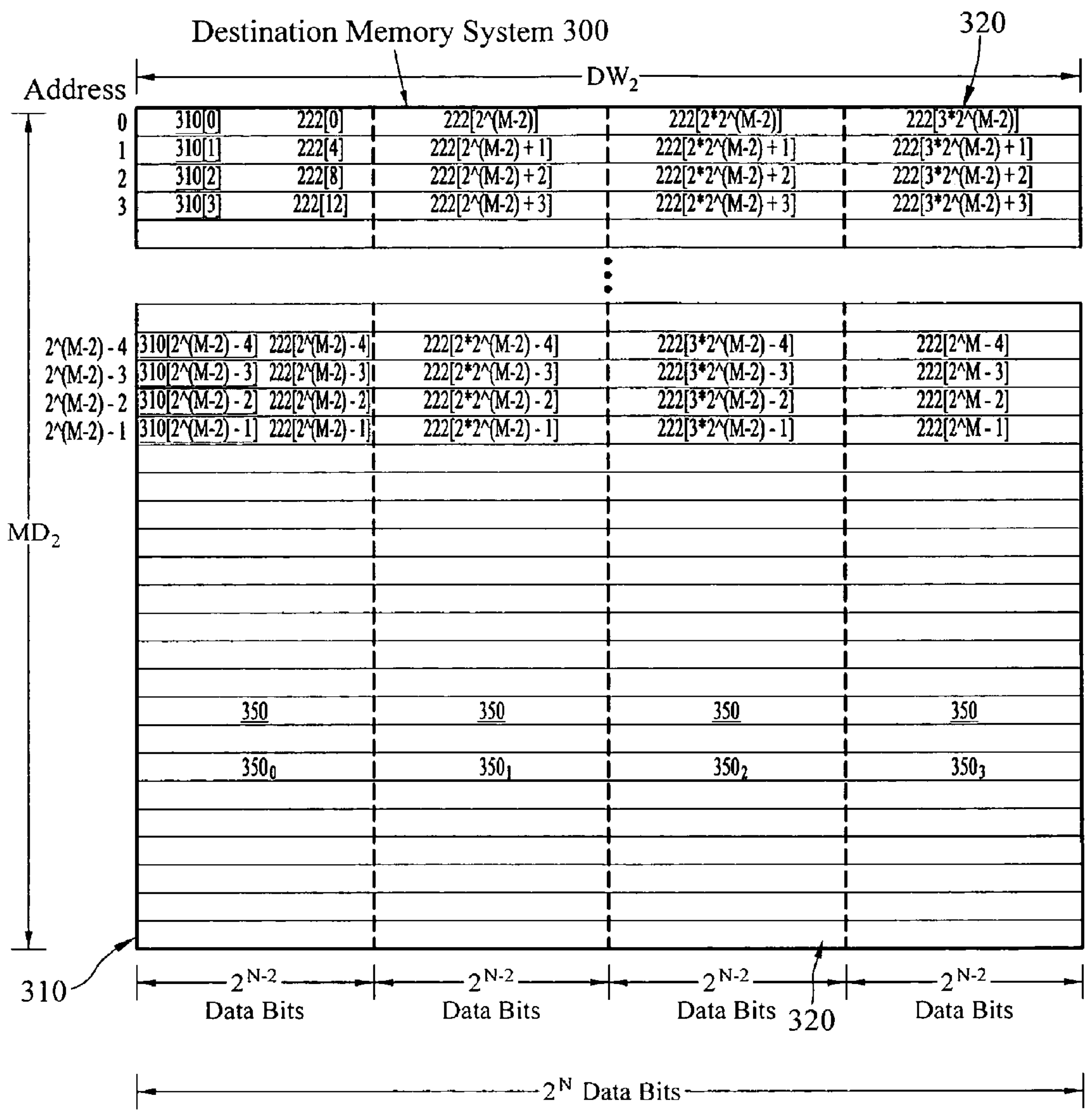

As illustrated in FIG. 5F, the selected second register content portions 222[$2^M$−16], 222[$2^M$−15], 222[$2^M$−14], . . . , 222[$2^M$−1] within the source memory system 200 can be mapped in a side-by-side manner across the respective destination memory registers 310[$2^{(M-2)}$−4], 310[$2^{(M-2)}$−3], 310[$2^{(M-2)}$−2], 310[$2^{(M-2)}$−1]. The selected second register content portions 222[$2^M$−16], 222[$2^M$−15], 222[$2^M$−4], . . . , 222[$2^M$−1] thereby can be mapped into the destination memory registers 310[$2^{(M-2)}$−4], 310[$2^{(M-2)}$−3], 310[$2^{(M-2)}$−2], 310[$2^{(M-2)}$−1] of the destination memory system 300 without a loss of valuable memory space within the destination memory system 300. Although shown and described as comprising contiguous memory registers beginning at destination memory address 0 for purposes of illustration only, the destination memory registers 310 into which the second register content portions 222 are mapped can comprise any predetermined destination memory registers 310 and can begin at any suitable destination memory address within the destination memory system 300. The source memory sub-region $250_2$ likewise can be mapped into the destination memory registers 310 of the destination memory system 300 in any desired arrangement, configuration, and/or distribution without limitation. An exemplary alternative mapping of the source memory sub-region $250_2$ within the destination memory system 300 is illustrated in FIG. 5G.

Figures 1, 6A:
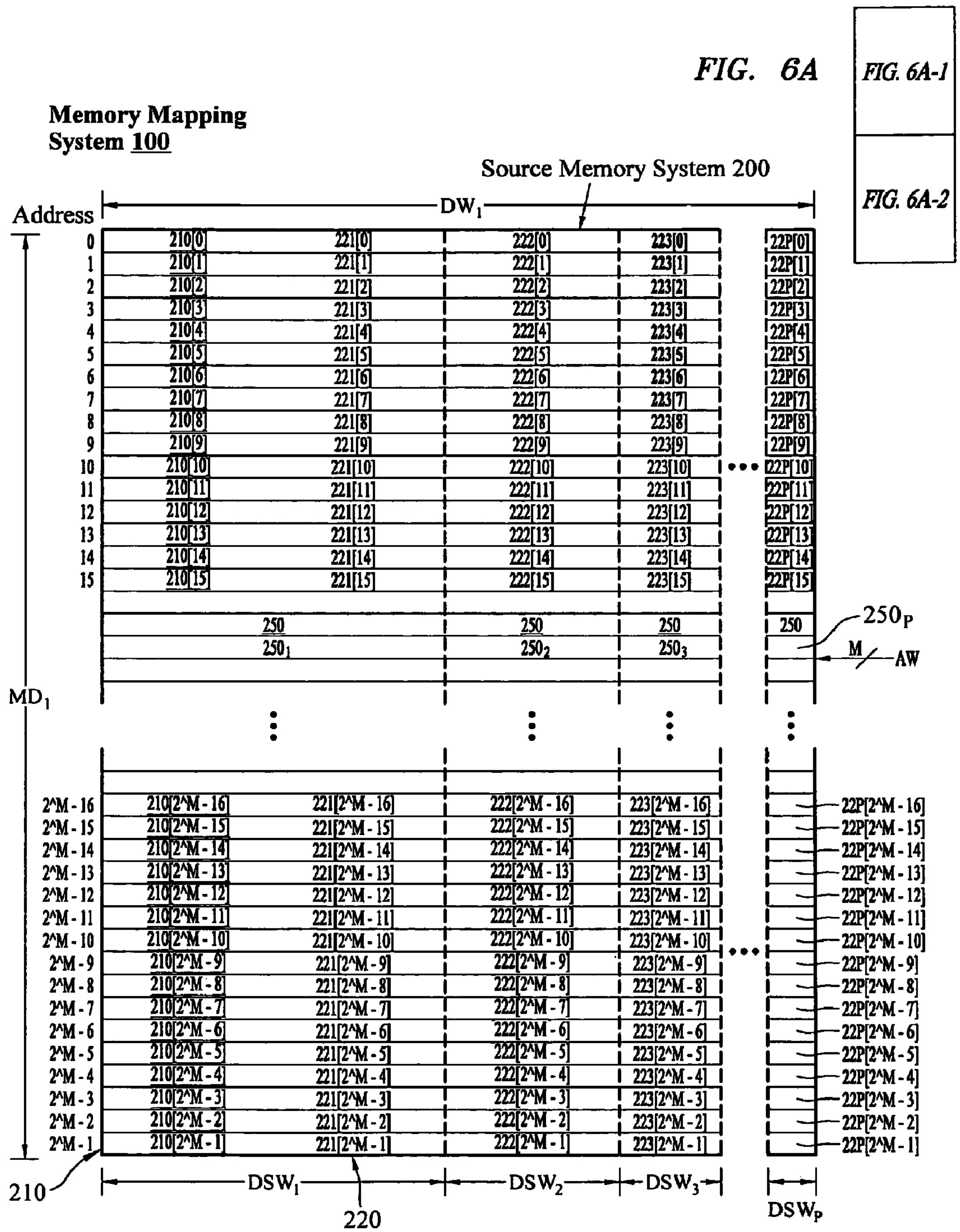
FIGS. 6A-C are detail drawings illustrating another alternative embodiment of the memory mapping system of FIG. 4A, wherein the memory mapping system maps a selected third source memory sub-region of FIG. 4A of the source memory system into the destination memory system.
Figures 2, 6A:
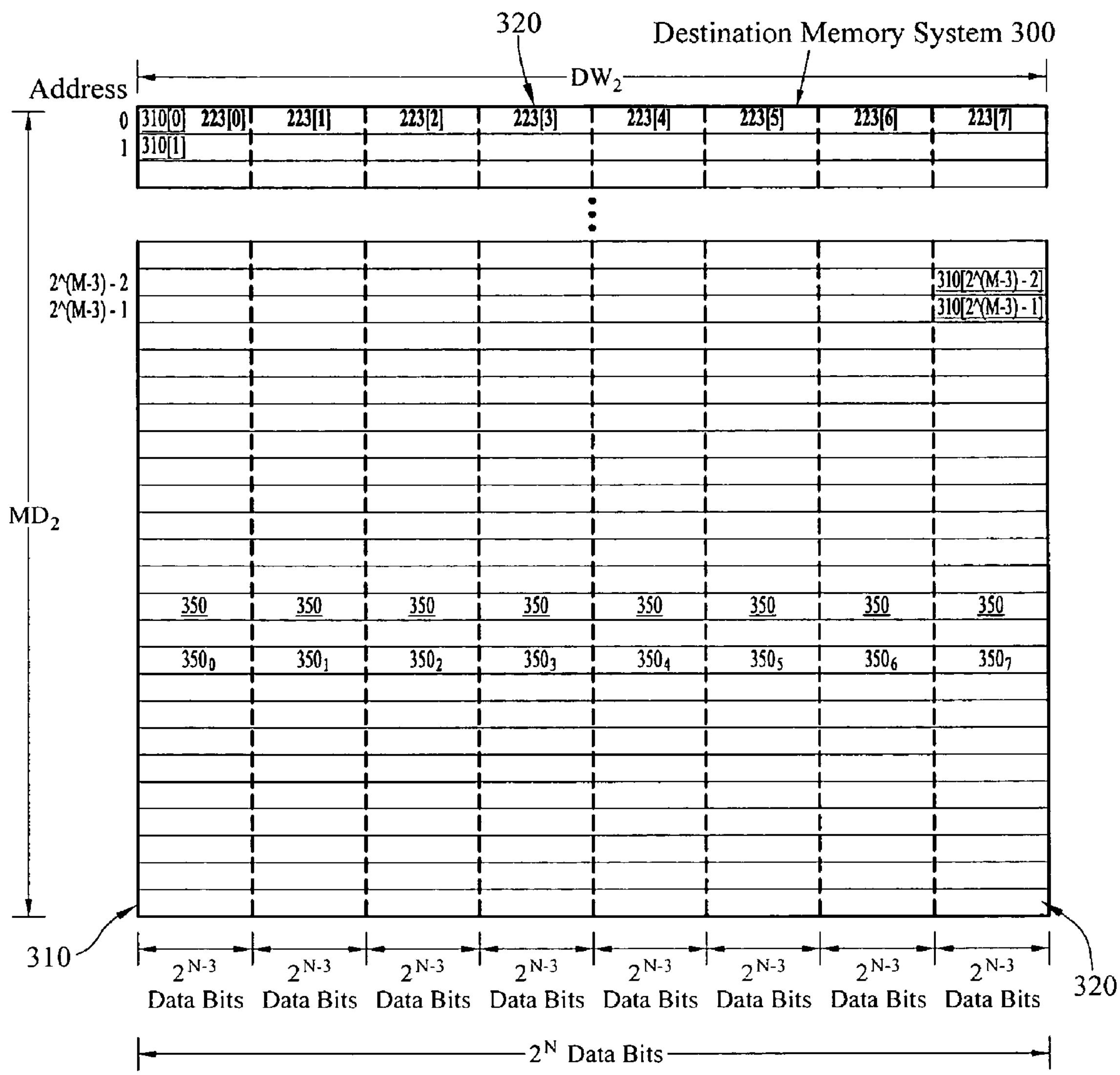
Figures 1, 6B:
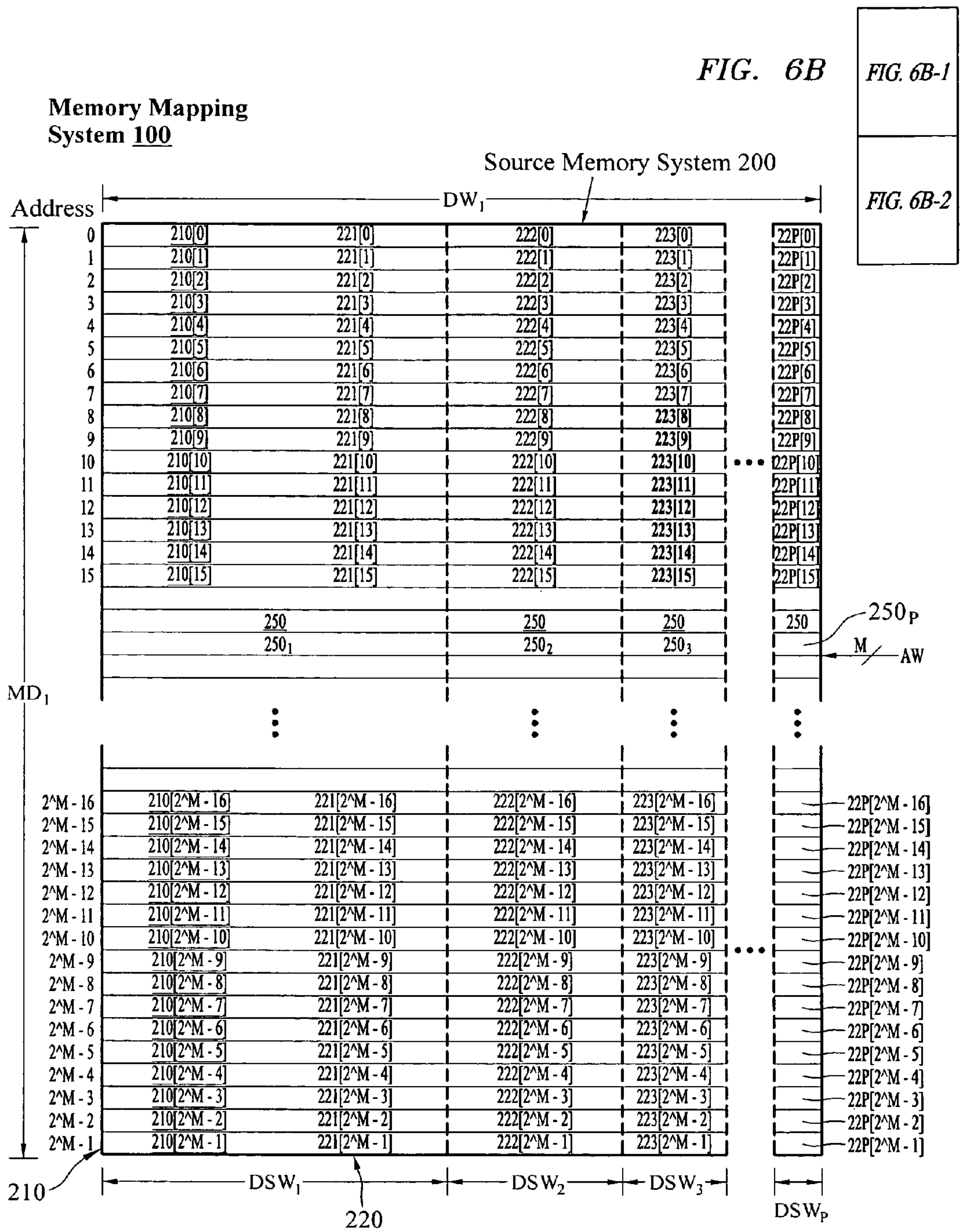
Figures 2, 6B:
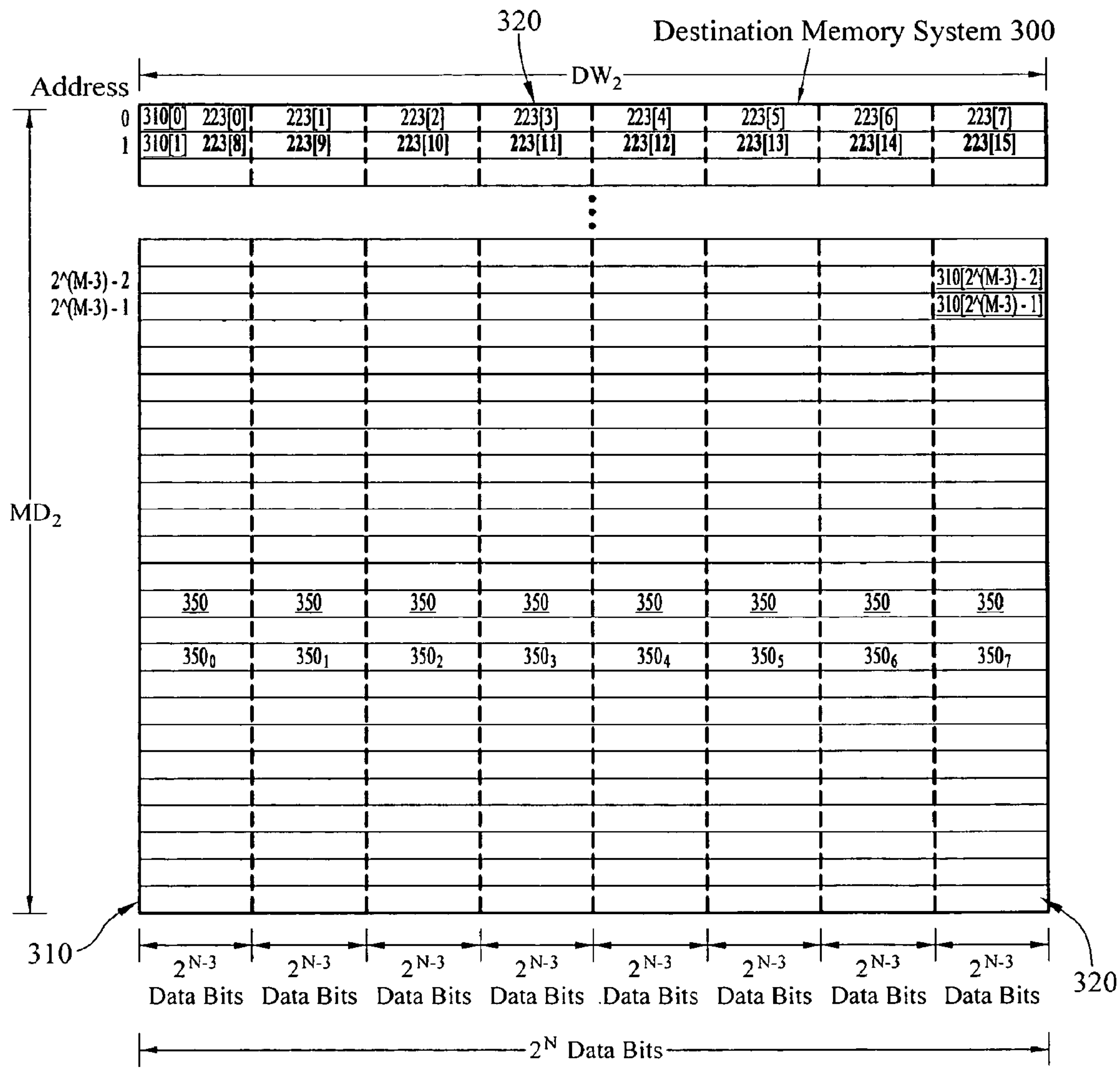
Figures 1, 6C:
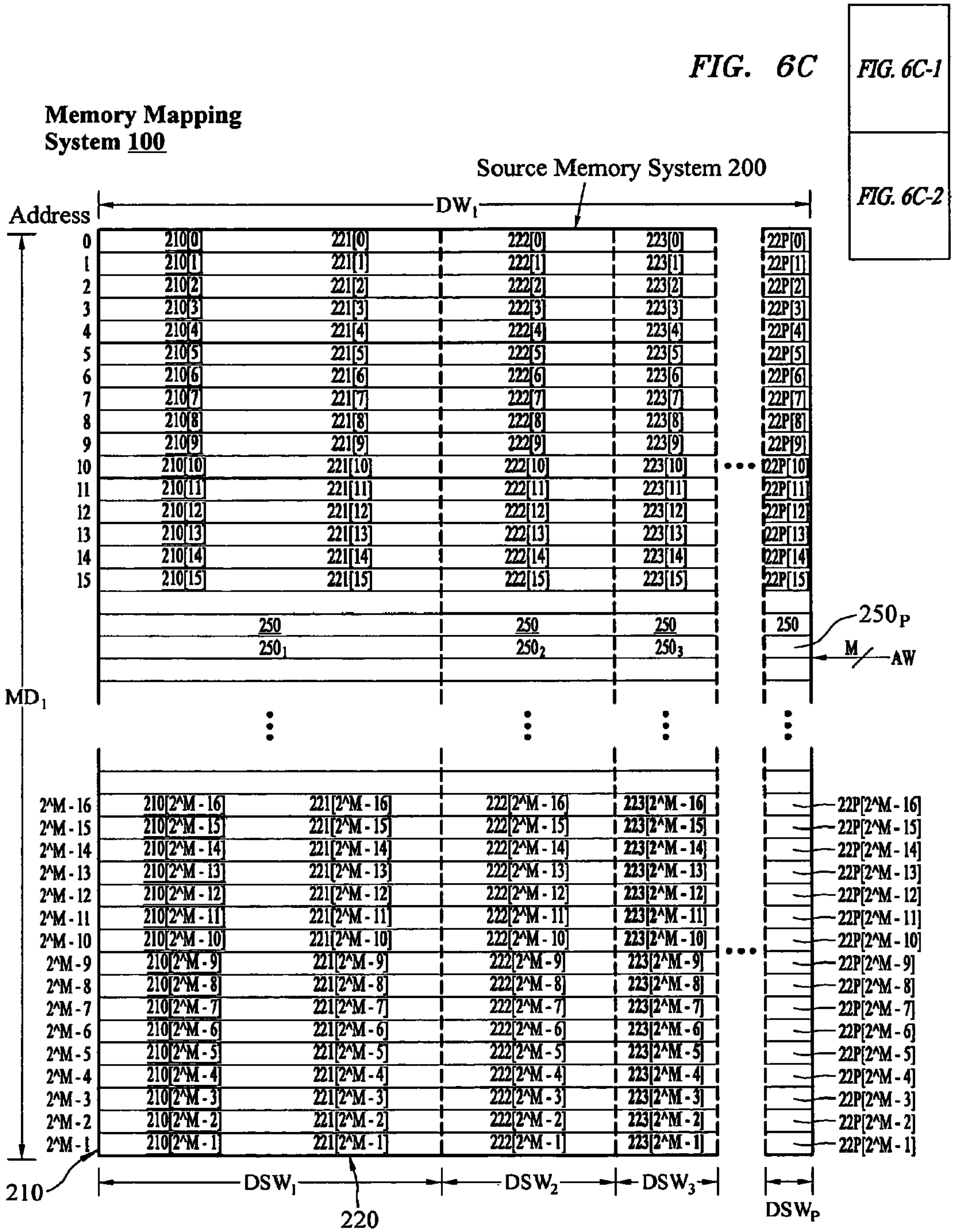
Figures 2, 6C:
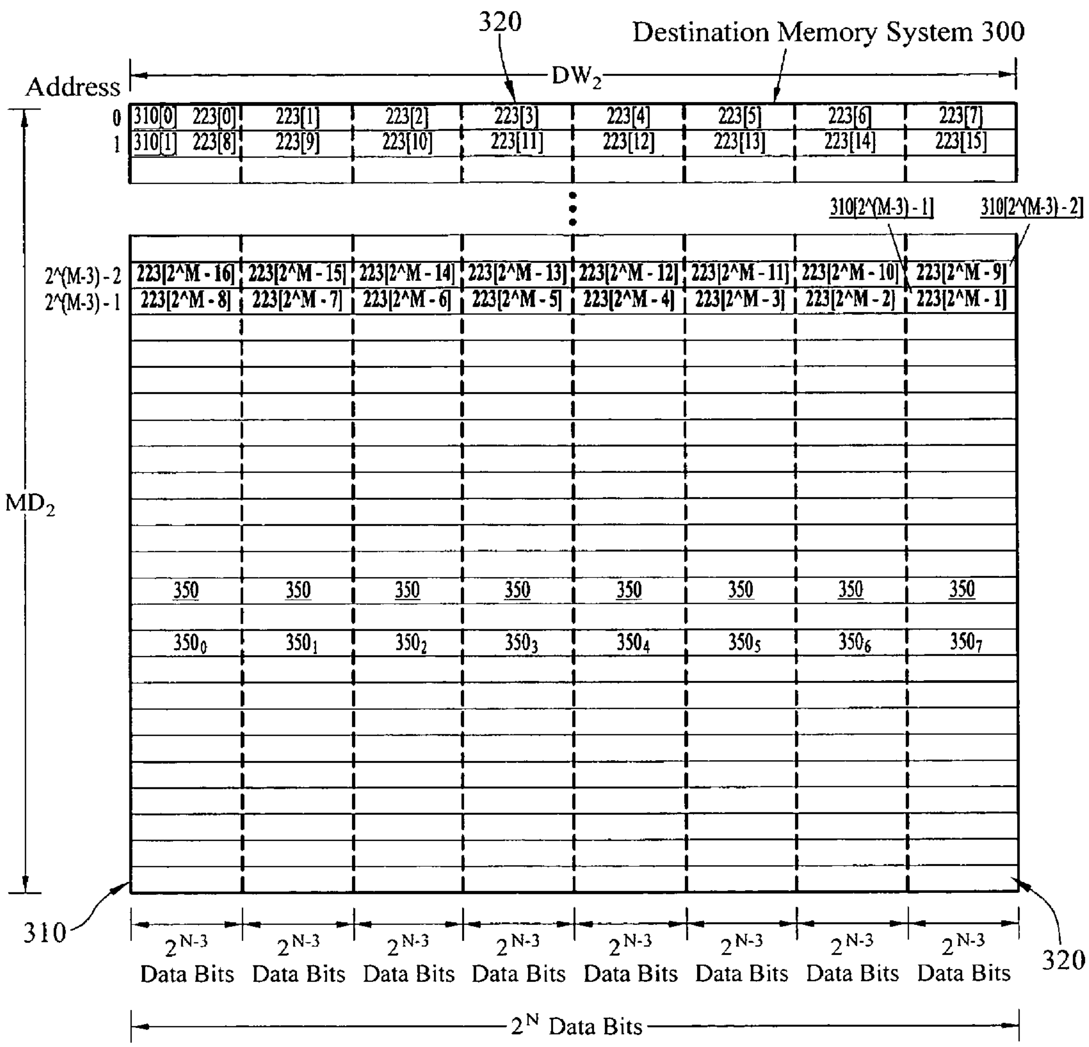

Turning to FIGS. 6A-C, an exemplary mapping of the third memory sub-region $250_3$ of the source memory system 200 into the destination memory system 300 is illustrated. In the manner set forth in more detail above, the third memory sub-region $250_3$ is associated with a mapping index i having a value of three ("3") and can comprise the third register content portion 223[0] for the source memory register 210[0], the third register content portion 223[1] for the source memory register 210[1], the third register content portion 223[2] for the source memory register 210[2], . . . , and the third register content portion 223[$2^M$−1] for the source memory register 210[$2^M$−1]. As shown in FIG. 6A, the third register content portion 223[$A_1$] is illustrated as having a data sub-width $DSW_3$ that comprises the $DW_2/8$ most significant remaining data bits of each source memory register 210. Accordingly, since the destination memory system 300 includes $2^N$-bit destination memory registers 310, the data sub-width $DSW_3$ of the third source memory sub-region $250_3$ includes $2^{(N-3)}$ data bits. Eight of the third register content portions 223[$A_1$] thereby can be mapped across the destination data width $DW_2$ of the destination memory registers 310.

As illustrated in FIG. 6A, the third register content portions 223[0], 223[1], 223[2], . . . , 223[7] of the third memory sub-region $250_3$ are shown as being respectively associated with the source memory addresses $A_1$ having values of zero ("0"), one ("1"), two ("2"), . . . , seven ("7") and can be selected for mapping into a selected destination memory register 310 within the destination memory system 300. The destination memory registers 310 each can be associated with $2^i\ 2^{(N-i)}$-bit destination register portions 350. Since the mapping index i associated with the third memory sub-region $250_3$ has a value of three ("3"), the destination memory registers 310 can be associated with eight ($2^3$) destination register portions $350_0$, $350_1$, $350_2$, $350_3$, $350_4$, $350_5$, $350_6$, and $350_7$ each comprising $2^{(N-3)}$ bits, as shown in FIG. 6A. In accordance with Equations 6 and 7, the third register content portions 223[0], 223[1], 223[2], . . . , 223[7] can be respectively positioned within the destination register portions $350_0$, $350_1$, $350_2$, $350_3$, $350_4$, $350_5$, $350_6$, $350_7$ of the destination memory register 310[1]. Accordingly, the third register content portions 223[0], 223[1], 223[2], . . . , 223[7] can be respectively positioned within the destination register portions $350_0$, $350_1$, $350_2$, . . . , $350_7$ of the destination memory register 310[0] in the manner discussed in more detail above. The third register content portions 223[0], 223[1], 223[2], . . . , 223[7] thereby can be mapped in a side-by-side manner across the destination memory register 310[0].

FIG. 6B shows the third register content portions 223[8], 223[9], . . . , 223[15] of the third memory sub-region $250_3$ as being selected for mapping into selected destination memory registers 310 within the destination memory system 300. In the manner set forth above, the second register content portions 223[8], 223[9], . . . , 223[15] of the third memory sub-region $250_3$ are respectively associated with the source memory addresses $A_1$ having the values of eight ("8"), nine ("9"), . . . , and fifteen ("15"). In accordance with Equations 6 and 7, the second register content portions 223[8], 223[9], . . . , 223[15] can be respectively positioned within the destination register portions $350_0$, $350_1$, $350_2$, . . . , $350_7$ of the destination memory register 310[1] in the manner discussed in more detail above. The mapping of the remaining third register content portions 223 within the third memory sub-region $250_3$ likewise can proceed in a similar manner.

Figures 1, 6D:
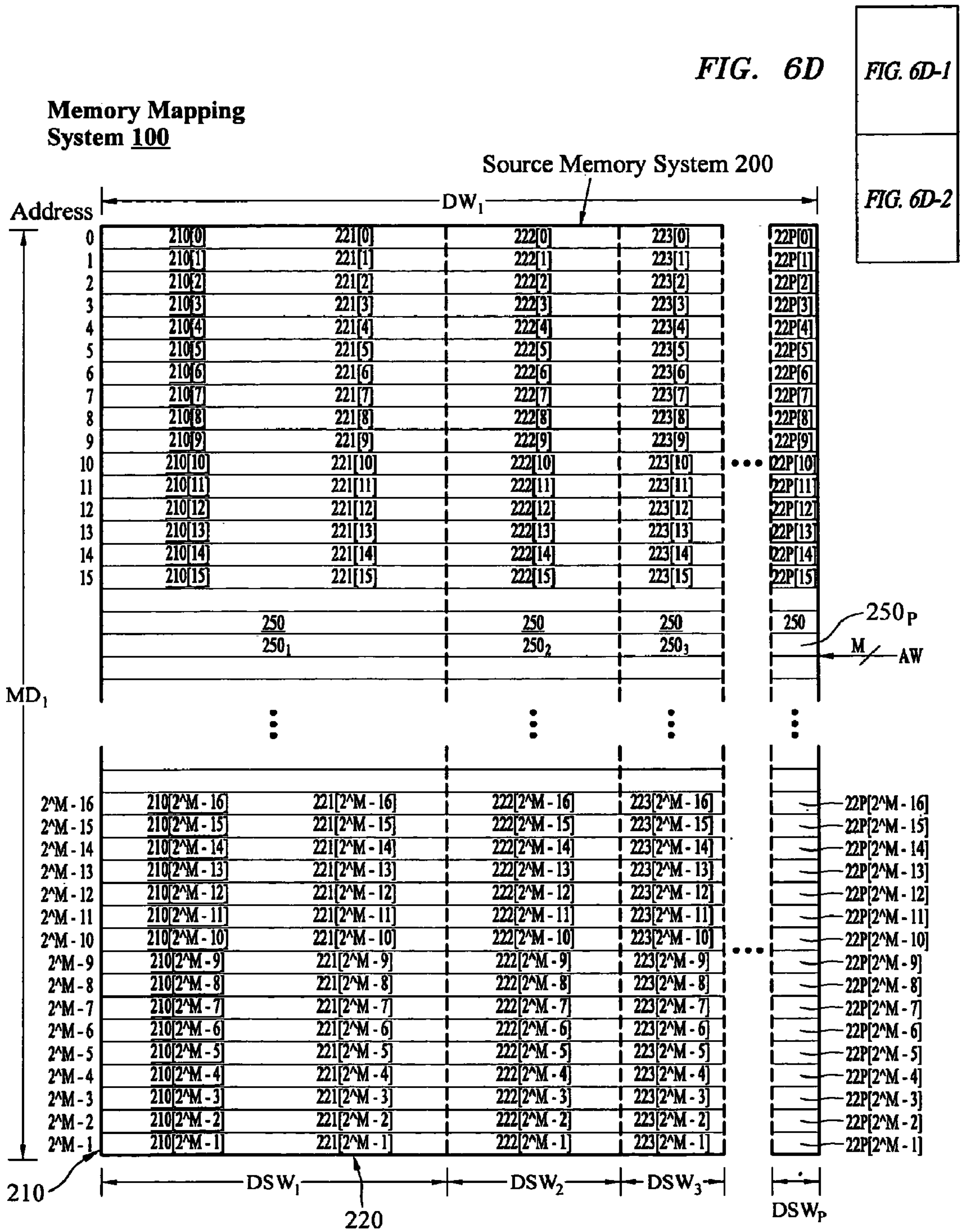
FIG. 6D is a detail drawing illustrating an alternate embodiment of the memory mapping system of FIGS. 6A-C, wherein the selected third source memory sub-region of the source memory system is mapped into the destination memory system.
Figures 2, 6D:
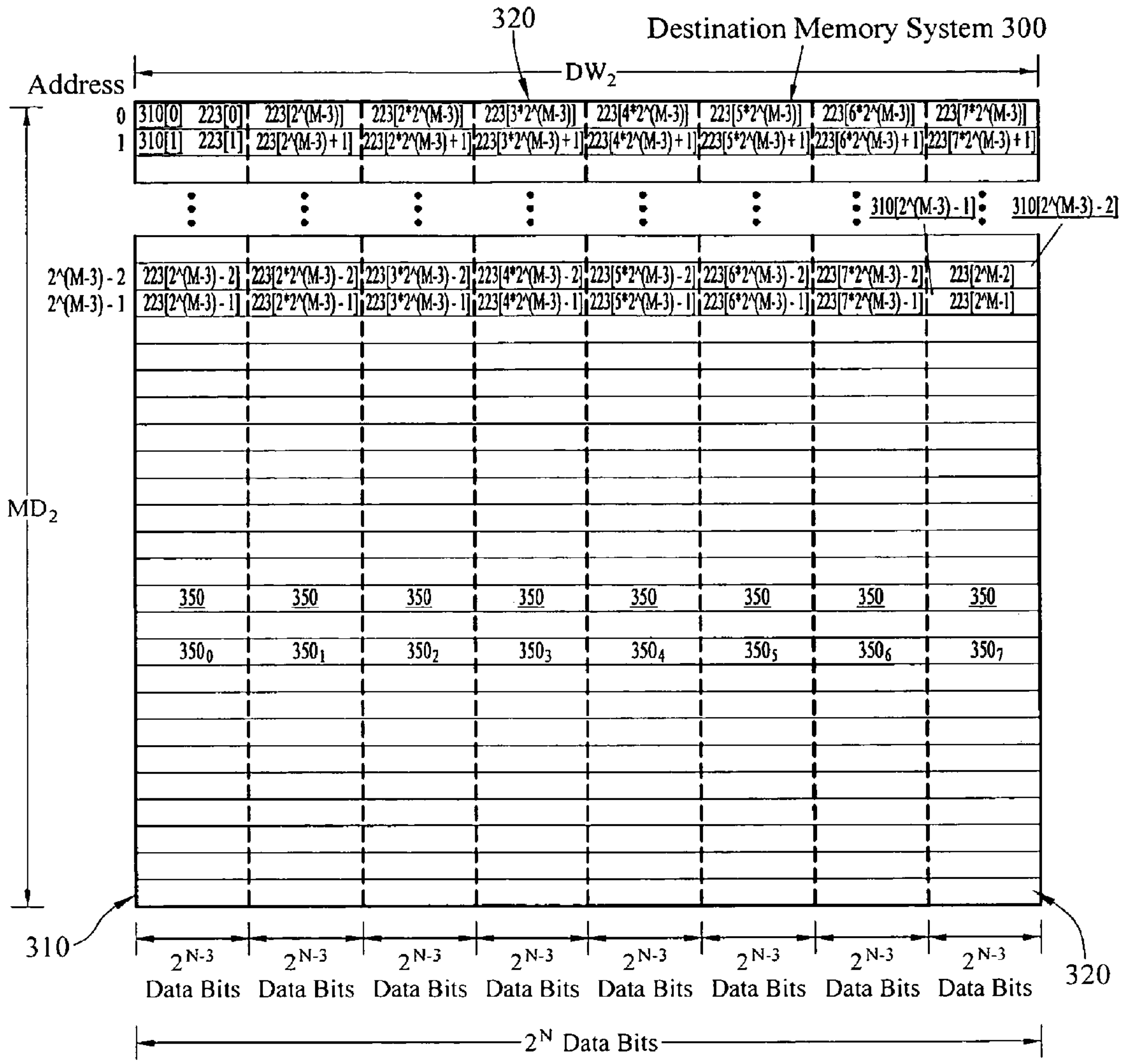

Turning to FIG. 6C, for instance, the third register content portions 223[$2^M$−16], 223[$2^M$−15], 223[$2^M$−14], . . . , 223 [$2^M$−1] of the third memory sub-region $250_3$ are shown as being selected for mapping into a selected destination memory register 310 within the destination memory system 300. The third register content portions 223[$2^M$−16], 223 [$2^M$−15], 223[$2^M$−14], . . . , 223[$2^M$−1] of the third memory sub-region $250_3$ are respectively associated with the source memory addresses $A_1$ having the values of $2^M$−16, $2^M$−15, $2^M$−14, . . . , and $2^M$−1. In the manner set forth above, the selected third register content portions 223[$2^M$−16], 223[$2^M$−15], 223[$2^M$−14], . . . , 223[$2^M$−1] of the third memory sub-region $250_3$ can be mapped into the respective destination register portions $350_0$, $350_1$, $350_2$, . . . , $350_7$ of the destination memory registers 310[$2^{(M-3)}$−2], 310[$2^{(M-3)}$−1] as illustrated in FIG. 6C. The selected third register content portions 223 thereby can be mapped in a side-by-side manner across the destination memory registers 310 and without a loss of valuable memory space within the destination memory system 300. Although shown and described as comprising contiguous memory registers beginning at destination memory address 0 for purposes of illustration only, the destination memory registers 310 into which the third register content portions 223 are mapped can comprise any predetermined destination memory registers 310 and can begin at any suitable destination memory address within the destination memory system 300. The source memory sub-region $250_3$ likewise can be mapped into the destination memory registers 310 of the destination memory system 300 in any desired arrangement, configuration, and/or distribution without limitation. An exemplary alternative mapping of the source memory sub-region $250_3$ within the destination memory system 300 is illustrated in FIG. 6D.

Figures 1, 2, 7A:
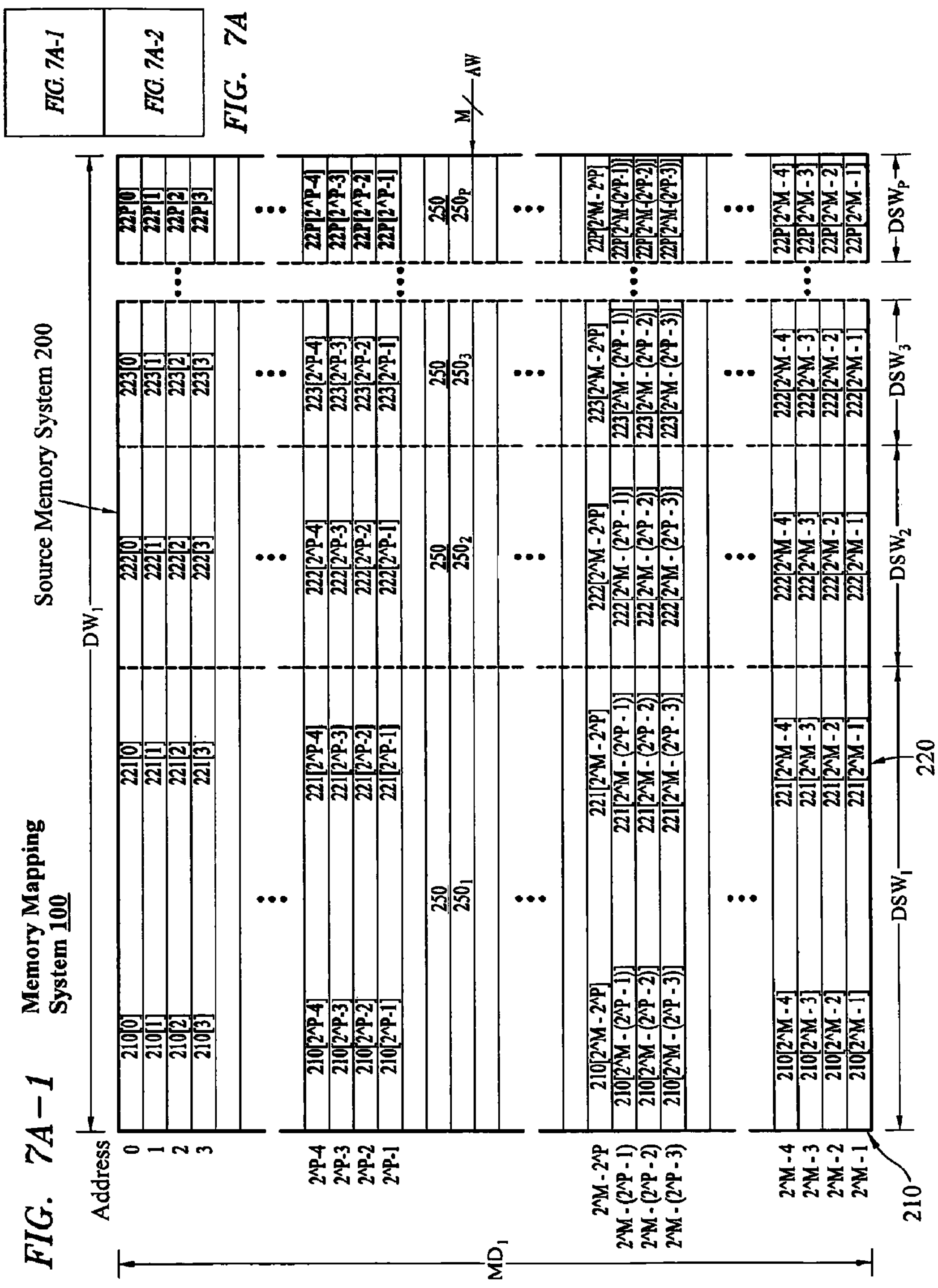
FIGS. 7A-B are detail drawings illustrating another alternative embodiment of the memory mapping system of FIG. 4A, wherein the memory mapping system maps a selected $P^{th}$ source memory sub-region of FIG. 4A of the source memory system into the destination memory system.
Figures 2, 7A:
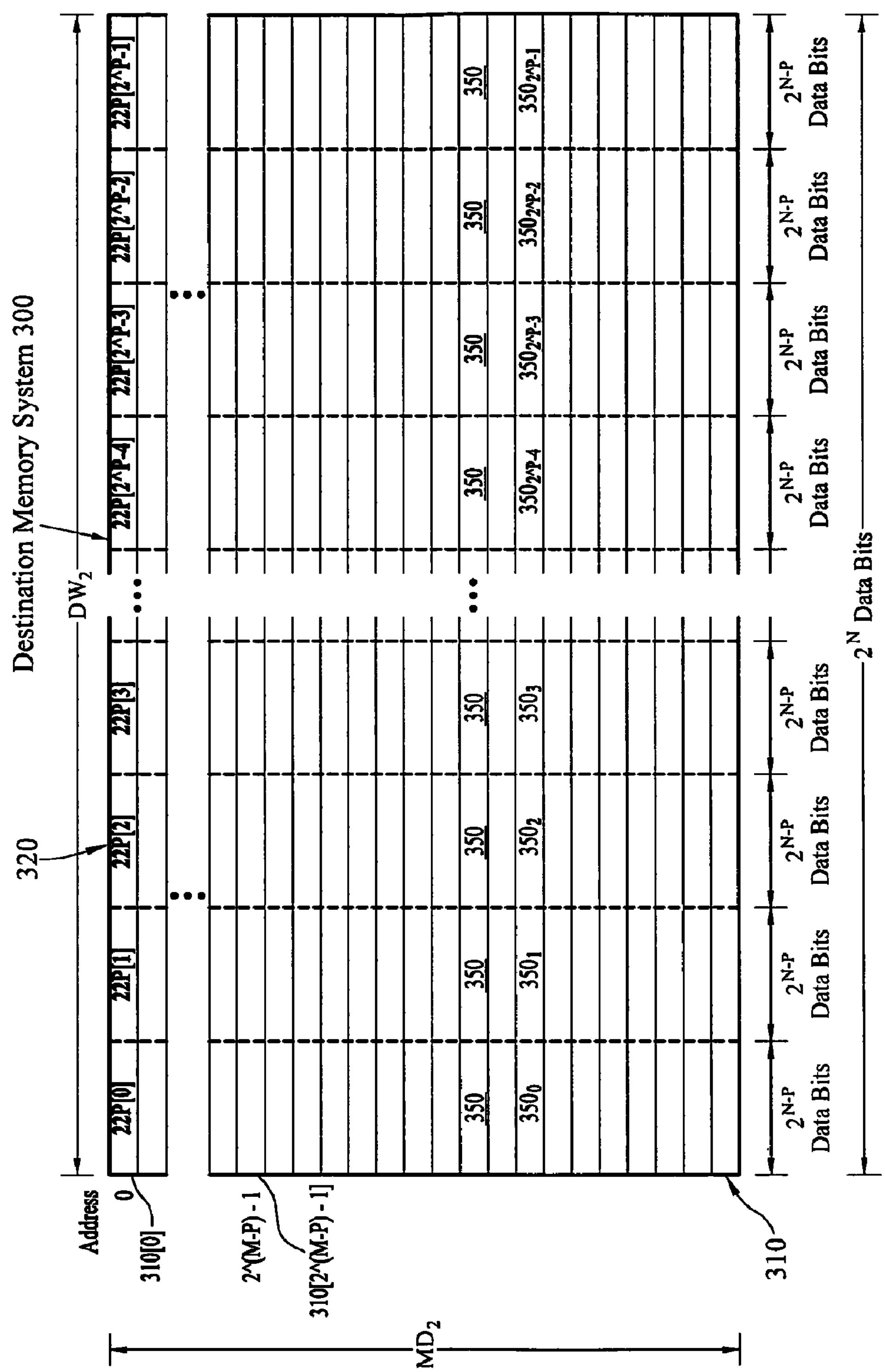
Figures 1, 7B:
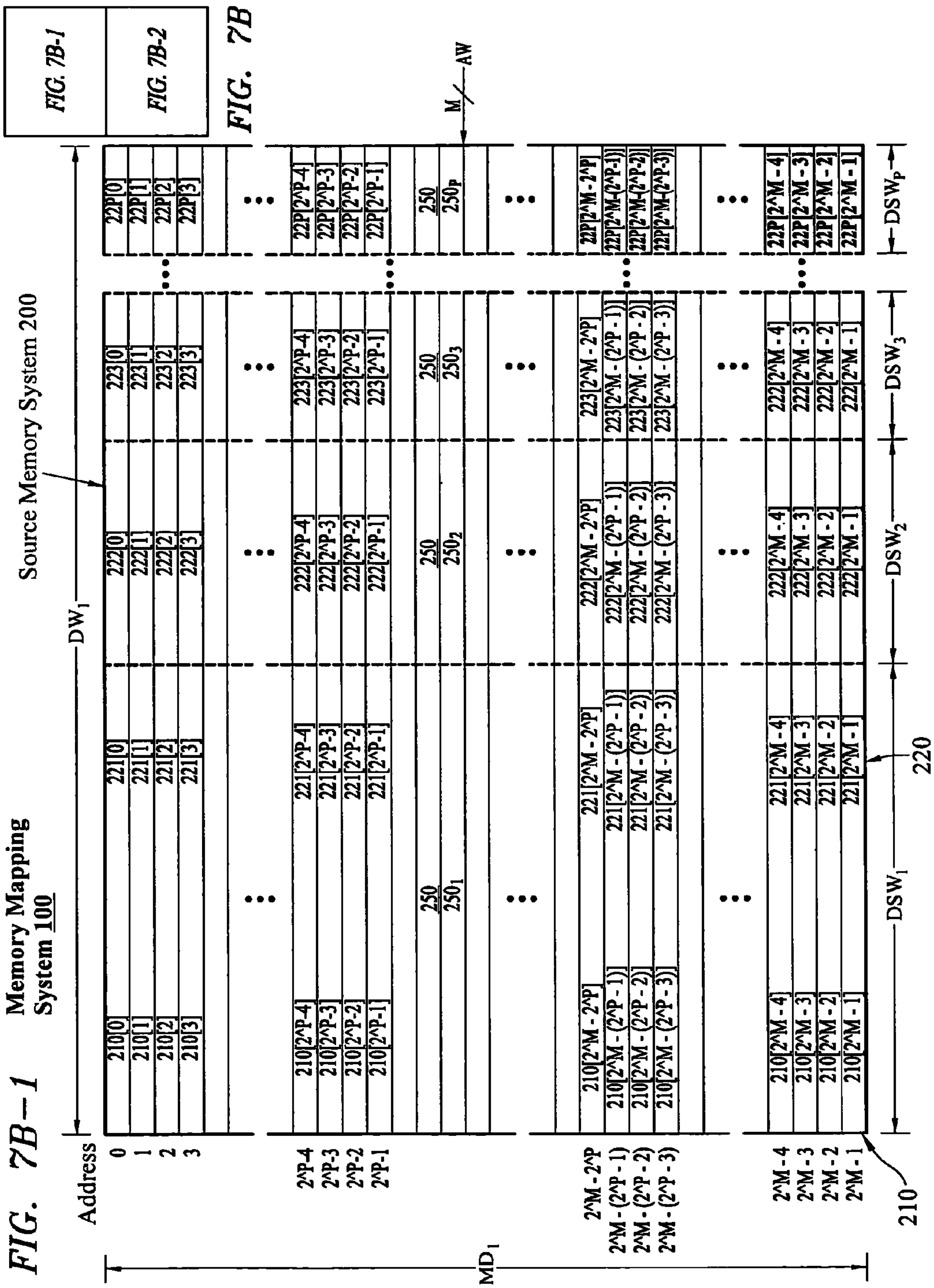
Figures 2, 7B:
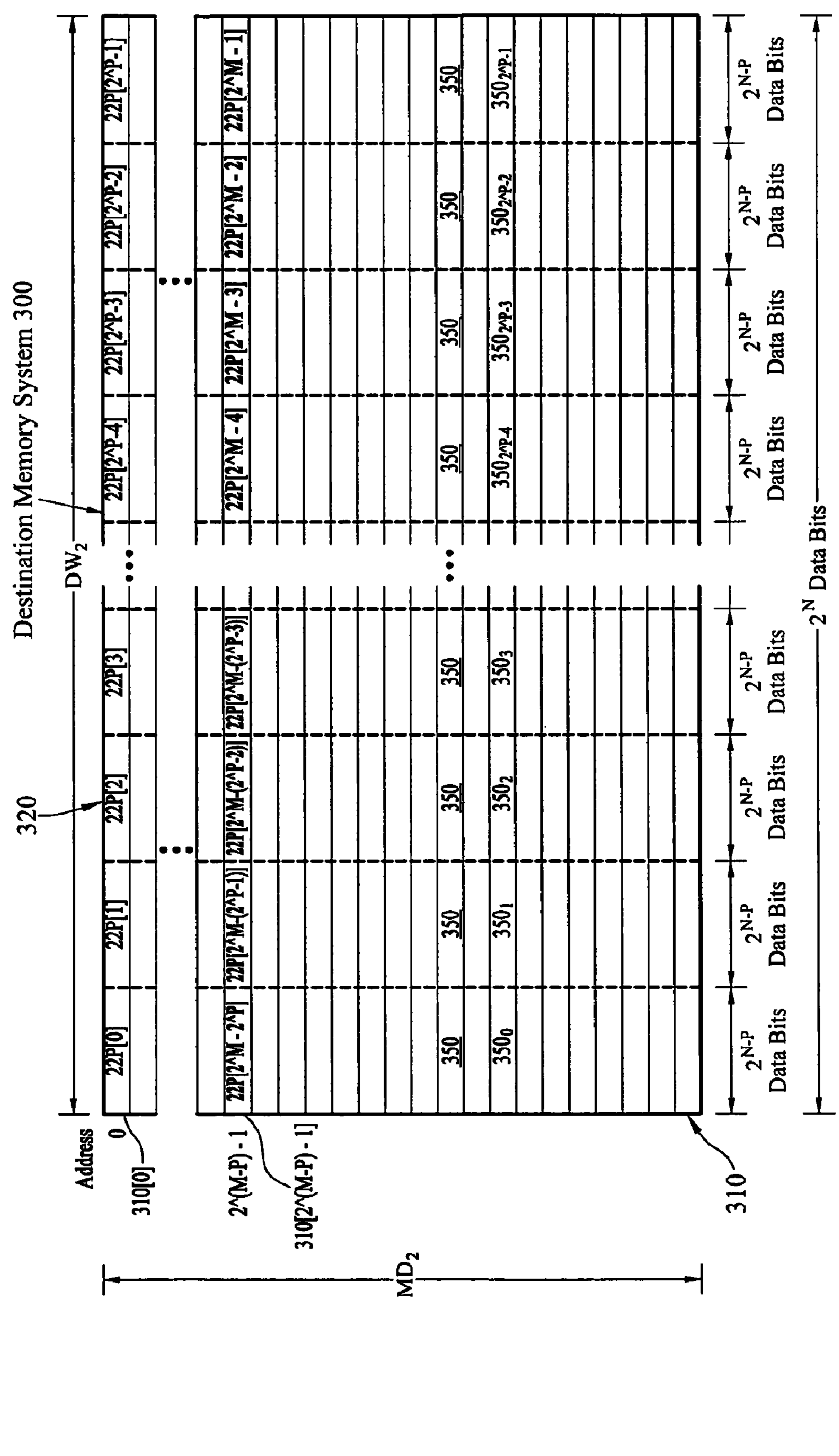

The mapping of the remaining memory sub-regions $250_i$ of the source memory system 200 into the destination memory system 300 each can proceed in a similar manner. Turning to FIGS. 7A-B, for instance, an exemplary mapping of the $P^{th}$ memory sub-region $250_P$ of the source memory system 200 into the destination memory system 300 is shown. In the manner set forth in more detail above, the $P^{th}$ memory sub-region $\mathbf{250}_P$ is associated with a mapping index i having a value of P and can comprise $P^{th}$ register content portions 22P. Illustrative $P^{th}$ register content portions 22P can include a $P^{th}$ register content portion 22P[0] for the source memory register 210[0], a $P^{th}$ register content portion 22P[1] for the source memory register 210[1], a $P^{th}$ register content portion 22P[2] for the source memory register 210[2], . . . , and a $P^{th}$ register content portion 22P[$2^M$−1] for the source memory register 210[$2^M$−1]. As shown in FIG. 7A, the $P^{th}$ register content portion 22P[$A_1$] is illustrated as having a data sub-width $DSW_P$ that comprises the $DW_2/2^P$ most significant remaining data bits of each source memory register 210. Accordingly, since the destination memory system 300 includes 2 N-bit destination memory registers 310, the data sub-width $DSW_P$ of the $P^{th}$ source memory sub-region $\mathbf{250}_P$ includes $2^{(N-P)}$ data bits. A quantity 2P of the $P^{th}$ register content portions 22P[$A_1$] thereby can be mapped across the destination data width $DW_2$ of the destination memory registers 310.

As illustrated in FIG. 7A, the $P^{th}$ register content portions 22P[0], 22P[1], 22P[2], . . . , 22P[$2^P$−1] of the $P^{th}$ memory sub-region $\mathbf{250}_P$ are shown as being respectively associated with the source memory addresses $A_1$ having values of zero ("0"), one ("1"), two ("2"), . . . , and $2^P$−1 and can be selected for mapping into a selected destination memory register 310 within the destination memory system 300. The destination memory registers 310 each can be associated with $2^i$ $2^{(N-i)}$-bit destination register portions 350. Since the mapping index i associated with the $P^{th}$ memory sub-region $\mathbf{250}_P$ has a value of P, the destination memory registers 310 can be associated with $2^P$ destination register portions $\mathbf{350}_0$, $\mathbf{350}_1$, $\mathbf{350}_2$, . . . $\mathbf{350}_{2^P-1}$ each comprising $2^{(N-P)}$ bits, as shown in FIG. 7A. In accordance with Equations 6 and 7 above, the $P^{th}$ register content portions 22P[0], 22P[1], 22P[2], . . . , 22P[$2^P$−1] can be respectively positioned within the destination memory register 310[0]. The destination memory registers 310 each can be associated with $2^i$ $2^{(N-i)}$-bit destination register portions 350. Accordingly, the $P^{th}$ register content portions 22P [0], 22P[1], 22P[2], . . . , 22P[$2^P$−1] can be respectively positioned within the destination register portions $\mathbf{350}_0$, $\mathbf{350}_1$, $\mathbf{350}_2$, . . . , $\mathbf{350}_{2^P-1}$ of the destination memory register 310[0] in the manner discussed in more detail above. The $P^{th}$ register content portions 22P[0], 22P[1], 22P[2], . . . , 22P[$2^P$−1] thereby can be mapped in a side-by-side manner across the destination memory register 310[0].

Figures 1, 7C:
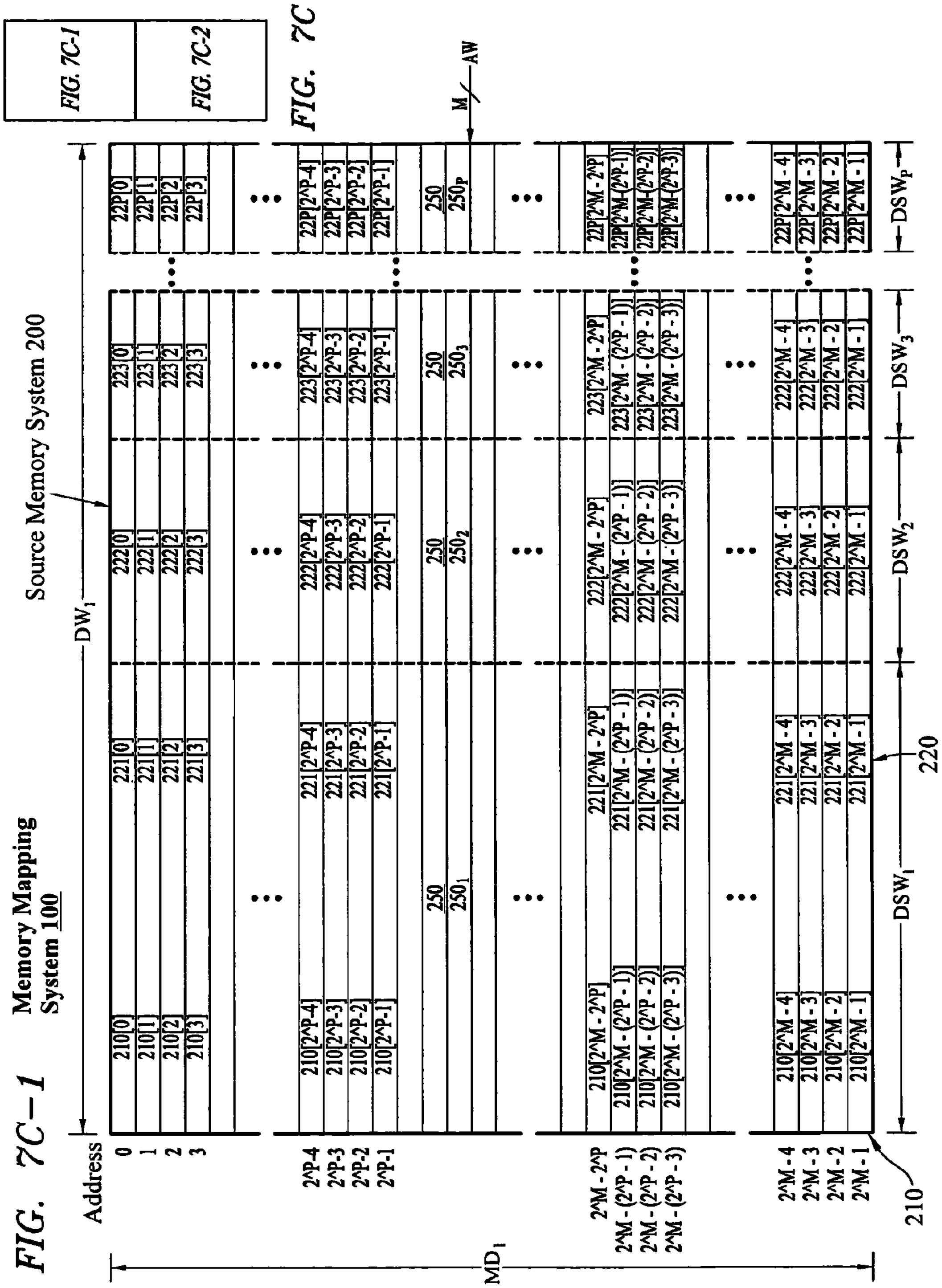
FIG. 7C is a detail drawing illustrating an alternate embodiment of the memory mapping system of FIGS. 7A-B, wherein the selected $P^{th}$ source memory sub-region of the source memory system is mapped into the destination memory system.
Figures 2, 7C:
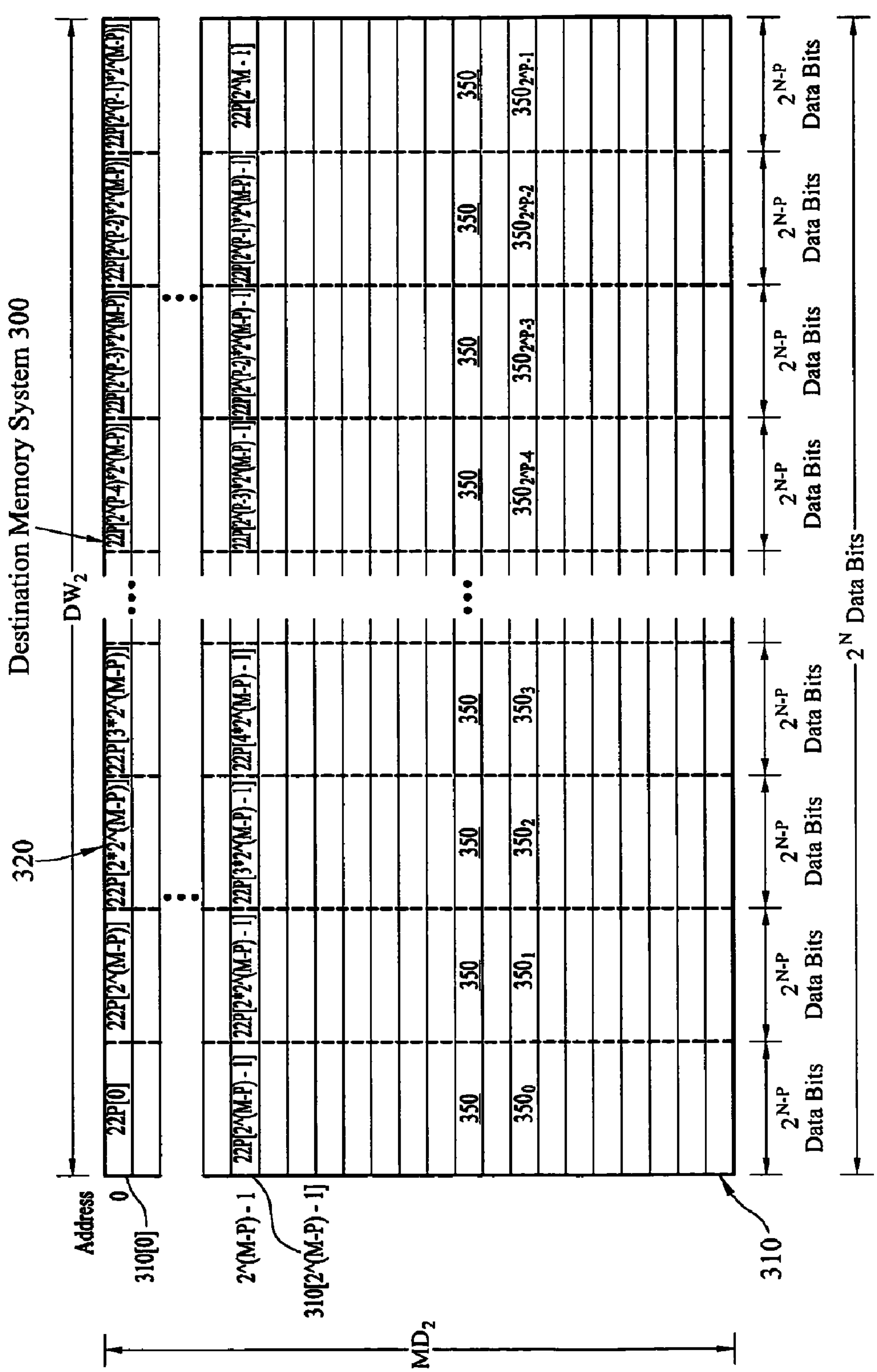

The mapping of the remaining $P^{th}$ register content portions 22P of the $P^{th}$ memory sub-region $\mathbf{250}_P$ can proceed in a similar manner. Turning to FIG. 7B, the $P^{th}$ register content portions 22P[$2^M$−$2^P$], 22P[$2^M$−($2^P$−1)], 22P[$2^M$−($2^P$−2)], . . . , 22P[$2^M$−1] of the $P^{th}$ memory sub-region $\mathbf{250}_P$ are shown as being selected for mapping into a selected destination memory register 310 within the destination memory system 300. The $P^{th}$ register content portions 22P[$2^M$−$2^P$], 22P[$2^M$−($2^P$−1)], 22P[$2^M$−($2^P$−2)], . . . , 22P[$2^M$−1] of the $P^{th}$ memory sub-region $\mathbf{250}_P$ are respectively associated with the source memory addresses $A_1$ having the values of $2^M$−$2^P$, $2^M$−($2^P$−1), $2^M$−($2^P$−2), . . . , and $2^M$−1. In the manner set forth above, the selected $P^{th}$ register content portions 22P [$2^M$−$2^P$], 22P[$2^M$−($2^P$−1)], 22P[$2^M$−($2^P$−2)], . . . , 22P[$2^M$−1] of the $P^{th}$ memory sub-region $\mathbf{250}_P$ can be mapped into the respective destination register portions $\mathbf{350}_0$, $\mathbf{350}_1$, $\mathbf{350}_2$, . . . , $\mathbf{350}_{P-1}$ of the destination memory register 310[$2^{(M-P)}$−1] as illustrated in FIG. 7B. The selected $P^{th}$ register content portions 22P thereby can be mapped in a side-by-side manner across the destination memory registers 310 and without a loss of valuable memory space within the destination memory system 300. Although shown and described as comprising contiguous memory registers beginning at destination memory address 0 for purposes of illustration only, the destination memory registers 310 into which the $P^{th}$ register content portions 22P are mapped can comprise any predetermined destination memory registers 310 and can begin at any suitable destination memory address within the destination memory system 300. The source memory sub-region $\mathbf{250}_P$ likewise can be mapped into the destination memory registers 310 of the destination memory system 300 in any desired arrangement, configuration, and/or distribution without limitation. An exemplary alternative mapping of the source memory sub-region $\mathbf{250}_P$ within the destination memory system 300 is illustrated in FIG. 7C.

Figures 1, 8A:
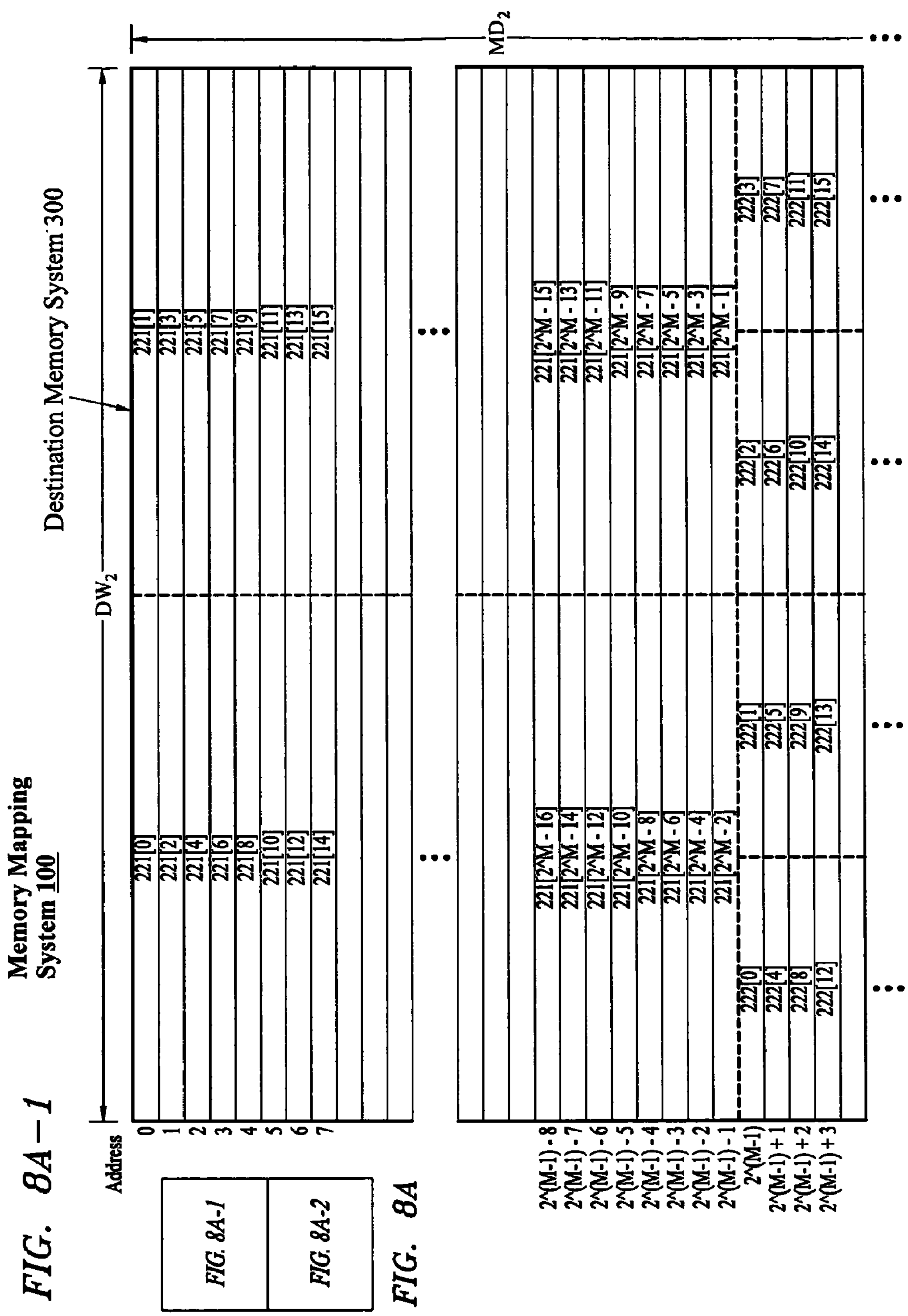
FIG. 8A is a detail drawing illustrating an embodiment of the memory mapping system of FIGS. 4-7, wherein the memory mapping system maps each memory sub-region of FIG. 4A of the source memory system into the destination memory system.
Figures 2, 8A:
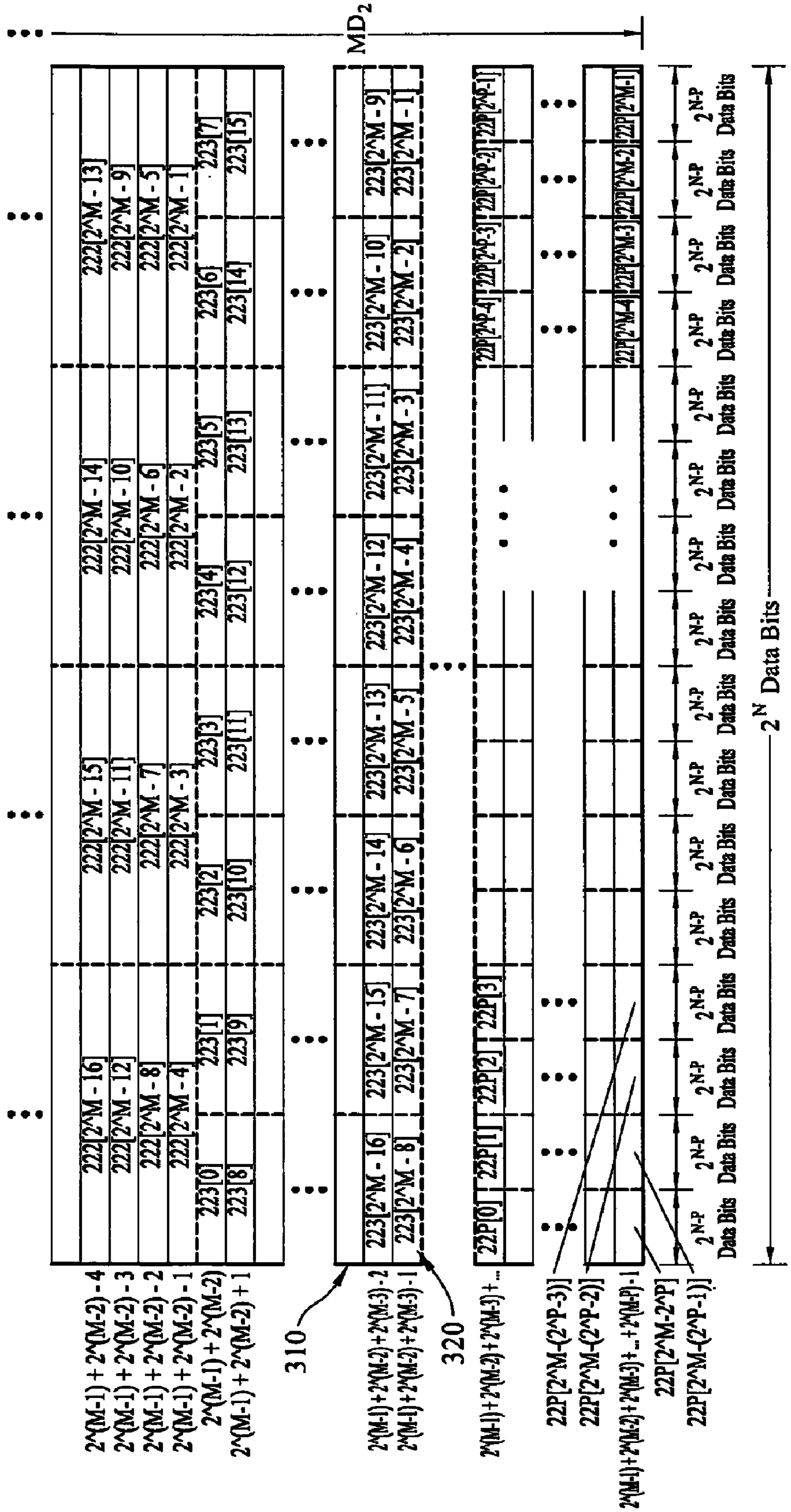
Figures 1, 8B:
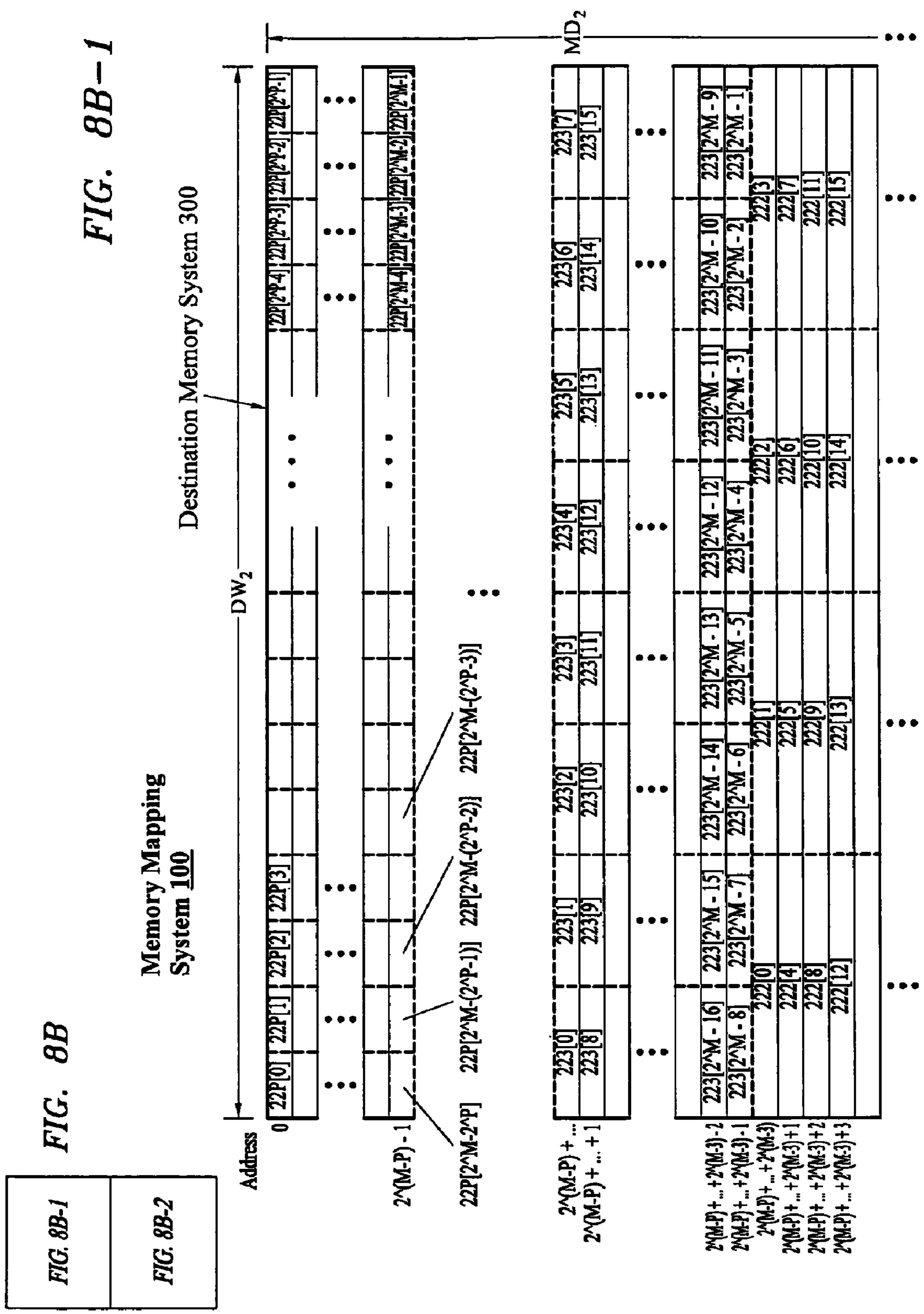
FIG. 8B is a detail drawing illustrating an alternative embodiment of the memory mapping method of FIG. 8A.
Figures 2, 8B:
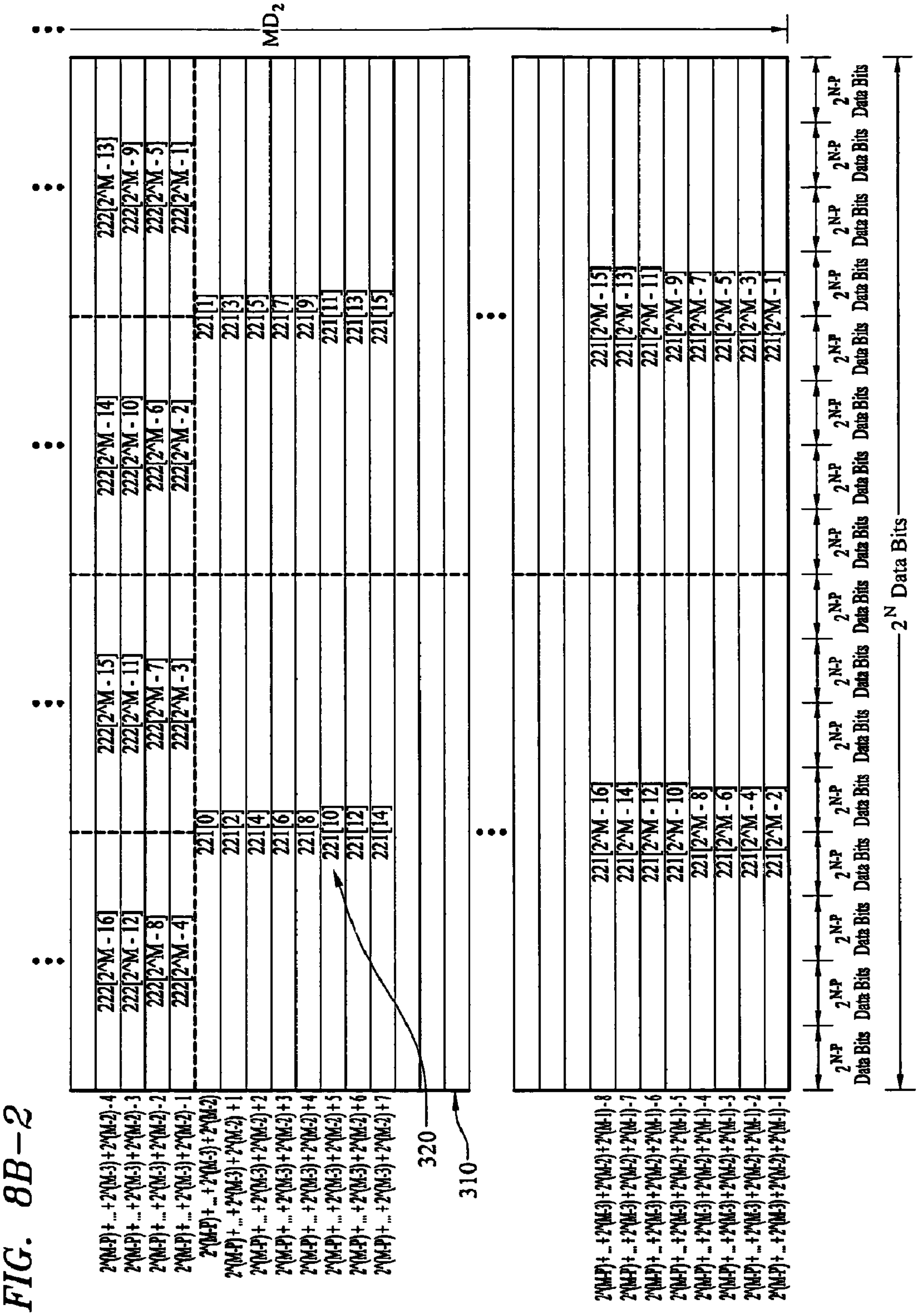
Figures 1, 8C:
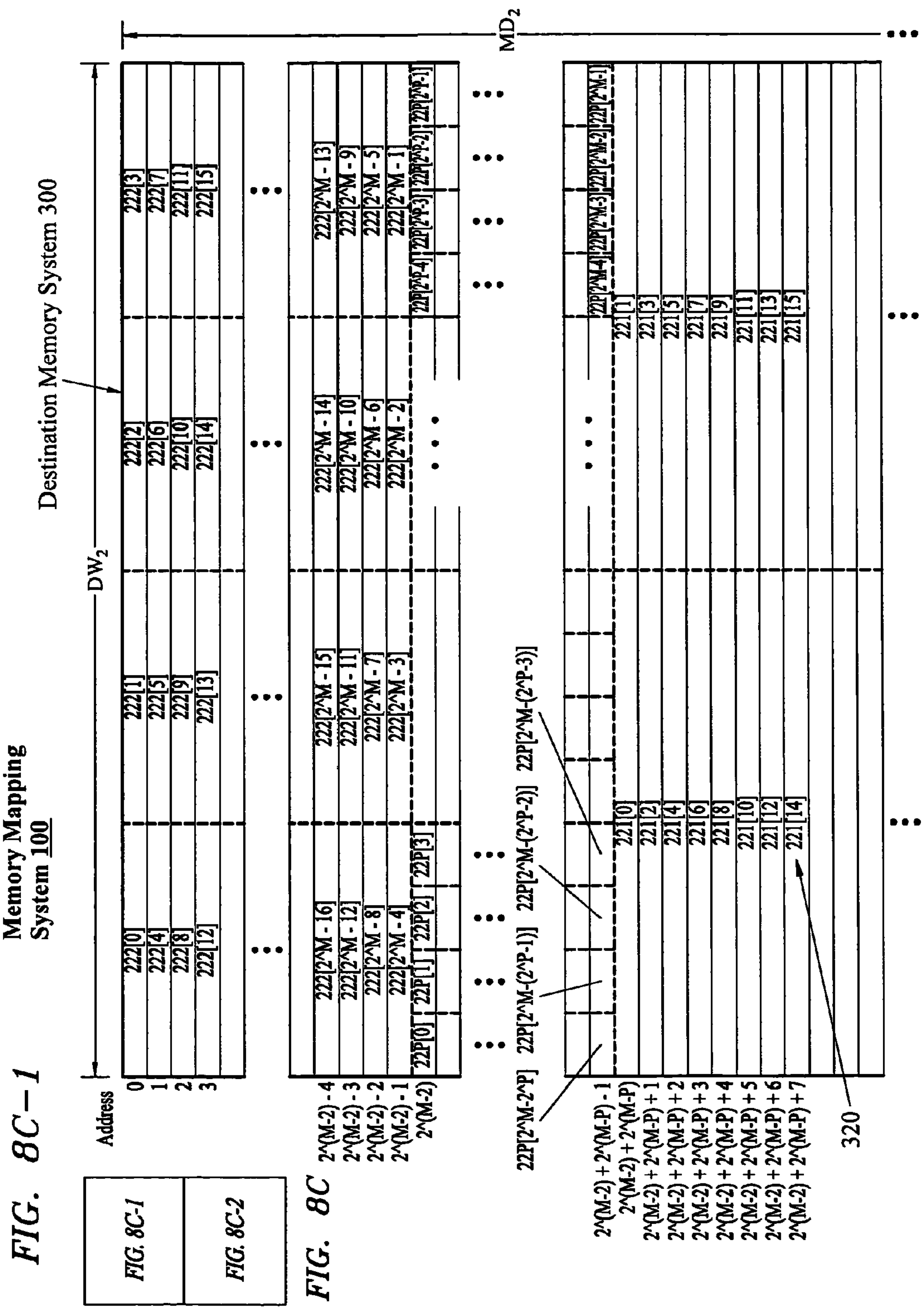
FIG. 8C is a detail drawing illustrating another alternative embodiment of the memory mapping method of FIG. 8A.
Figures 2, 8C:
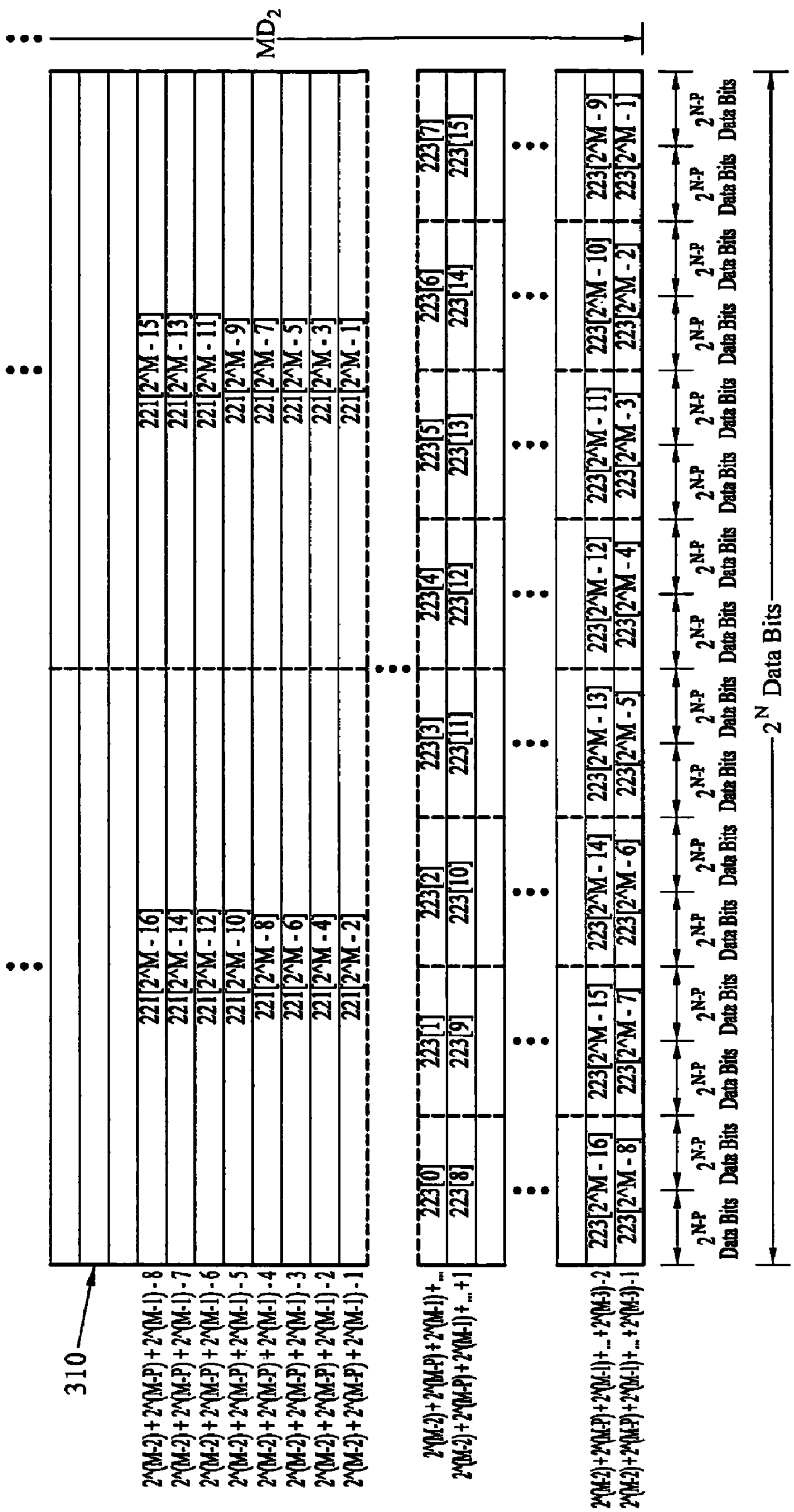

FIGS. 8A-C illustrate exemplary manners of mapping the aggregate source memory system 200 (shown in FIG. 4A) within the destination memory system 300. Turning to FIG. 8A, the register content portions 221, 222, 223, . . . , 22P from each respective memory sub-region $\mathbf{250}_1$, $\mathbf{250}_2$, $\mathbf{250}_3$, . . . , $\mathbf{250}_P$ (shown in FIG. 4A) are shown as being disposed within the destination memory system 300 in the manner set forth above with reference to FIGS. 4A-F, 5A-F, 6A-C, and 7A-B. The first register content portions 221 within the first source memory sub-region $\mathbf{250}_1$, for example, are shown as being mapped into the destination memory system 300 in the manner discussed in more detail above with reference to FIGS. 4B-F. In other words, the first register content portions 221 [0], 221 [1], 221[2], . . . , 221[$2^M$−1] can be mapped in a side-by-side manner across the destination memory registers 310[0], 310[1], 310[2], . . . , 310[$2^{(M-1)}$−1] within the destination memory system 300 as illustrated in FIG. 8A.

The second register content portions 222 within the second memory sub-region $\mathbf{250}_2$ likewise can be mapped into the destination memory system 300 in the manner set forth in more detail above with reference to FIGS. 5A-F. Here, the second register content portions 222[0], 222[1], 222[2], . . . , 222[$2^M$−1] can be disposed within destination memory registers 310 that are adjacent to the destination memory registers 310[0], 310[1], 310[2], . . . , 310[$2^{(M-1)}$−1] into which the first register content portions 221[0], 221[1], 221[2], . . . , 221[$2^M$−1] are mapped. The second register content portions 222[0], 222[1], 222[2], 222[3], for example, are illustrated as being mapped in a side-by-side manner across the destination memory register 310[$2^{(M-1)}$]; whereas, the second register content portions 222[4], 222[5], 222[6], 222[7] can be mapped in a side-by-side manner across the destination memory register 310[$2^{(M-1)}$+1]. The remaining second register content portions 222 can be disposed within the destination memory system 300 such that the second register content portions 222[$2^M$−4], 222[$2^M$−3], 222[$2^M$−2], 222[$2^M$−1] are mapped in a side-by-side manner across the destination memory register 310[$2^{(M-1)}$+$2^{(M-2)}$−1].

Similarly, the third register content portions 223 within the third memory sub-region $\mathbf{250}_3$ can be mapped into the destination memory system 300 in the manner set forth in more detail above with reference to FIGS. 6A-C. The third register content portions 223[0], 223[1], 223[2], . . . , 223[$2^M$−1] preferably are disposed within destination memory registers 310 that are adjacent to the destination memory registers 310[$2^{(M-1)}$], 310[$2^{(M-1)}$+1], 310[$2^{(M-1)}$+2], . . . , 310[$2^{(M-1)}$+$2^{(M-2)}$−1] into which the second register content portions 222[0], 222[1], 222[2], . . . , 222[$2^M$−1] are mapped. For example, the third register content portions 223[0], 223[1], 223[2], . . . , 223[7] can be mapped in a side-by-side manner across the destination memory register 310[$2^{(M-1)}$+$2^{(M-2)}$], and the second register content portions 222[$2^M$−8], 222[$2^M$−7], 222[$2^M$−6], . . . , 222[$2^M$−1] can be mapped in a side-byside manner across the destination memory register 310[$2^{(M-1)}+2^{(M-2)}+2^{(M-3)}-1$] as illustrated in FIG. 5A. The mapping of the remaining memory sub-regions 250 can proceed in a similar manner with each register content portion 221, 222, 223, . . . being mapped into adjacent destination memory registers 310 in the manner set forth in more detail above.

The $P^{th}$ register content portion 22P within the $P^{th}$ memory sub-region $\mathbf{250}_P$ can be mapped into the destination memory system 300 in the manner set forth in more detail above with reference to FIGS. 7A-B. Here, the $P^{th}$ register content portions 22P[0], 22P[1], 22P[2], . . . , 22P[$2^M-1$] can be disposed within destination memory registers 310 that are adjacent to the destination memory registers 310 into which the register content portions 221, 222, 223, . . . are mapped. The $P^{th}$ register content portions 22P[0], 22P[1], 22P[2], . . . , 223[$2^P-1$], for example, are illustrated as being mapped in a side-by-side manner across the destination memory register 310[$2^M-1)+2^{(M-2)}+2^{(M-3)}+$ . . . ]; whereas, the $P^{th}$ register content portions 22P[$2^M-2^P$], 22P[$2^M-2^P+1$], 22P[$2^M-2^P+2$], . . . , 22P[$2^M-1$] can be mapped in a side-by-side manner across the destination memory register 310[$2^{(M-1)}+2^{(M-2)}+2^{(M-3)}+\ldots+2^{(M-P)}-1$]. The ellipses within the addresses of the destination memory registers 310 represent the address range of the destination memory registers 310 associated with any intervening register content portions between the destination memory registers 310 associated with the register content portion 223 and the destination memory registers 310 associated with the register content portion 22P. The register content portions 221, 222, 223, . . . , 22P thereby can be mapped side-by-side into adjacent destination memory registers 310 of the destination memory system 300 without a loss of valuable memory space within the destination memory system 300.

Although shown and described as comprising contiguous memory registers for purposes of illustration only, the destination memory registers 310 associated with the register content portions 223 can comprise any predetermined source memory registers 210 within the source memory system 200. In other words, one or more destination memory registers 310 can be disposed between the destination memory registers 310 associated with successive register content portions 221, 222, 223, . . . , 22P. The register content portions 221, 222, 223, . . . , 22P likewise are shown and described with reference to FIG. 8A as being disposed within an exemplary arrangement of destination memory registers 310 within the destination memory system 300 for purposes of illustration only. The memory mapping system 100, however, can dispose the relevant register content portions 221, 222, 223, . . . , 22P into any suitable arrangement of the destination memory registers 310. Exemplary alternative arrangements of the register content portions 221, 222, 223, . . . , 22P within the destination memory registers 310 are illustrated in FIGS. 5B and 8C.

Turning to FIG. 5B, for instance, the register content portions 221, 222, 223, . . . , 22P from each respective memory sub-region $\mathbf{250}_1$, $\mathbf{250}_2$, $\mathbf{250}_3$, . . . , $\mathbf{250}_P$ (shown in FIG. 4A) are shown as being disposed within the destination memory system 300 in the manner set forth above with reference to FIGS. 4A-F, 5A-F, 6A-C, and 7A-B. Here, the $P^{th}$ register content portions 22P within the first source memory sub-region $\mathbf{250}_P$ are shown as being mapped into the destination memory system 300 in the manner discussed in more detail above with reference to FIGS. 7A-B. The $P^{th}$ register content portions 22P[0], 22P[1], 22P[2], . . . , 22P[$2^M-1$] thereby can be mapped in a side-by-side manner across the destination memory registers 310[0], 310[1], 310[2], . . . , 310[$2^{(M-P)}-1$] within the destination memory system 300 as illustrated in FIG. 8B. The mapping of remaining memory sub-regions 250 can proceed in a similar manner with each register content portion 221, 222, 223, . . . being mapped into adjacent destination memory registers 310 in the manner set forth in more detail above.

The third register content portions 223 within the third memory sub-region $\mathbf{250}_3$, for example, can be mapped into the destination memory system 300 in the manner set forth in more detail above with reference to FIGS. 6A-C. Here, the third register content portions 223[0], 223[1], 223[2], . . . , 223[$2^M-1$] are shown as being disposed within destination memory registers 310[$2^{(M-P)}+\ldots$], 310[$2^{(M-P)}+\ldots+1$], 310[$2^{(M-P)}+\ldots+2$], . . . , 310[$2^{(M-P)}+\ldots+2^{(M-3)}-1$] In the manner set forth above, the ellipses within the addresses of the destination memory registers 310 represent the address range of the destination memory registers 310 associated with any intervening register content portions between the destination memory registers 310 associated with the register content portion 223 and the destination memory registers 310 associated with the register content portion 22P. The third register content portions 223[0], 223[1], 223[2], . . . , 223[7], for instance, are illustrated as being mapped in a side-by-side manner across the destination memory register 310[$2^{(M-P)}+.$]; whereas, the third register content portions 223[8], 223[9], 223[10], . . . , 223[15] can be mapped in a side-by-side manner across the destination memory register 310[$2^{(M-P)}+\ldots+1$]. The remaining third register content portions 223 can be disposed within the destination memory system 300 such that the third register content portions 223[$2^M-8$], 223[$2^M-7$], 223[$2^M-6$], . . . , 223[$2^M-1$] are mapped in a side-by-side manner across the destination memory register 310[$2^{(M-P)}+\ldots+2^{(M-3)}-1$].

The second register content portions 222 within the second memory sub-region $\mathbf{250}_2$ can be mapped into the destination memory system 300 in the manner set forth in more detail above with reference to FIGS. 5A-F. The second register content portions 222[0], 222[1], 222[2], . . . , 222[$2^M-1$] preferably are disposed within destination memory registers 310 that are adjacent to the destination memory registers 310[$2^{(M-P)}+\ldots$], 310[$2^{(M-P)}+\ldots+1$], 310[$2^{(M-P)}+\ldots+2$], . . . 310[$2^{(M-P)}+\ldots+2^{(M-3)}-1$] into which the third register content portions 223[0], 223[1], 223[2], . . . , 223[$2^M-1$] are mapped. As illustrated in FIG. 8B, for example, the second register content portions 222[0], 222[1], 222[2], 222[3] can be mapped in a side-by-side manner across the destination memory register 310[$2^{(M-P)}+\ldots+2^{(M-3)}$], and the second register content portions 222[4], 222[5], 222[6], 222[7] can be mapped in a side-by-side manner across the destination memory register 310[$2^{(M-P)}+\ldots+2^{(M-3)}+1$]. The second register content portions 222[$2^M-4$], 222[$2^M-3$], 222[$2^M-2$], 222[$2^M-1$] likewise can be mapped in a side-by-side manner across the destination memory register 310[$2^{(M-P)}+\ldots+2^{(M-3)}+2^{(M-2)}1$].

The first register content portion 221 within the first memory sub-region $\mathbf{250}_P$ can be mapped into the destination memory system 300 in the manner set forth in more detail above with reference to FIGS. 4A-F. Here, the first register content portions 221[0], 221[1], 221[2], . . . , 221[$2^M-1$] are shown as being disposed within destination memory registers 310 that are adjacent to the destination memory registers 310 into which the second register content portions 222 are mapped. The first register content portions 221[0], 221[1] and the first register content portions 221[2], 221[3], for example, can be respectively mapped in a side-by-side manner across the destination memory register 310[$2^{(M-P)}+\ldots+2^{(M-3)}+2^{(M-2)}$] and the destination memory register 310[$2^{(M-P)}+\ldots+2^{(M-3)}+2^{(M-2)}+1$]; whereas, the first register content portions 221[$2^M-2$], 221[$2^M-1$] can be mapped in a side-by-side manner across the destination memory register 310[$2^{(M-P)}+\ldots+2^{(M-3)}+2^{(M-2)}+2^{(M-1)}-1$] as shown in FIG. 8B. The exemplary alternative arrangement of the register content portions 221, 222, 223, . . . , 22P thereby can be mapped side-by-side into adjacent destination memory registers 310 of the destination memory system 300 without a loss of valuable memory space within the destination memory system 300.

Another exemplary alternative arrangement for mapping the register content portions 221, 222, 223, . . . , 22P within the destination memory registers 310 is illustrated in FIG. 8C. Turning to FIG. 5C, the register content portions 221, 222, 223, . . . , 22P from each respective memory sub-region $250_1$, $250_2$, $250_3$, . . . , $250_P$ (shown in FIG. 4A) are shown as being disposed within the destination memory system 300 in the manner set forth above with reference to FIGS. 4A-F, 5A-F, 6A-C, and 7A-B. Here, the second register content portions 222[0], 222[1], 222[2], . . . , 222[$2^M-1$] can be mapped in a side-by-side manner across the destination memory registers 310[0], 310[1], 310[2], . . . , 310[$2^{(M-2)}-1$] within the destination memory system 300 as illustrated in FIG. 5C. The $P^{th}$ register content portions 22P[0], 22P[1], 22P[2], . . . , 22P[$2^M-1$] are shown as being mapped in a side-by-side manner across the destination memory registers 310[$2^{(M-2)}$], 310[$2^{(M-2)}+1$], 310[$2^{(M-2)}+2$], . . . , 310[$2^{(M-2)}+2^{(M-P)}-1$], whereas, the first register content portions 221[0], 221[1], 221[2], . . . , 221[$2^M-1$] are shown as being mapped in a side-by-side manner across the destination memory registers 310[$2^{(M-2)}+2^{(M-P)}$], 310[$2^{(M-2)}+2^{(M-P)}+1$], 310[$2^{(M-2)}+2^{(M-P)}+2$], . . . , 310[$2^{(M-2)}+2^{(M-P)}+2^{(M-1)}-1$]. The mapping of the remaining memory sub-regions 250 can proceed in a similar manner with each register content portion 221, 222, 223, . . . , 22P being mapped into adjacent destination memory registers 310 in the manner set forth in more detail above. Although shown and described as including each register content portion 221, 222, 223, . . . , 22P for purposes of illustration only, the source memory system 200 may include one or more register content portions 221, 222, 223, . . . , 22P for mapping into the destination memory system 300.

Figures 2, 9A:
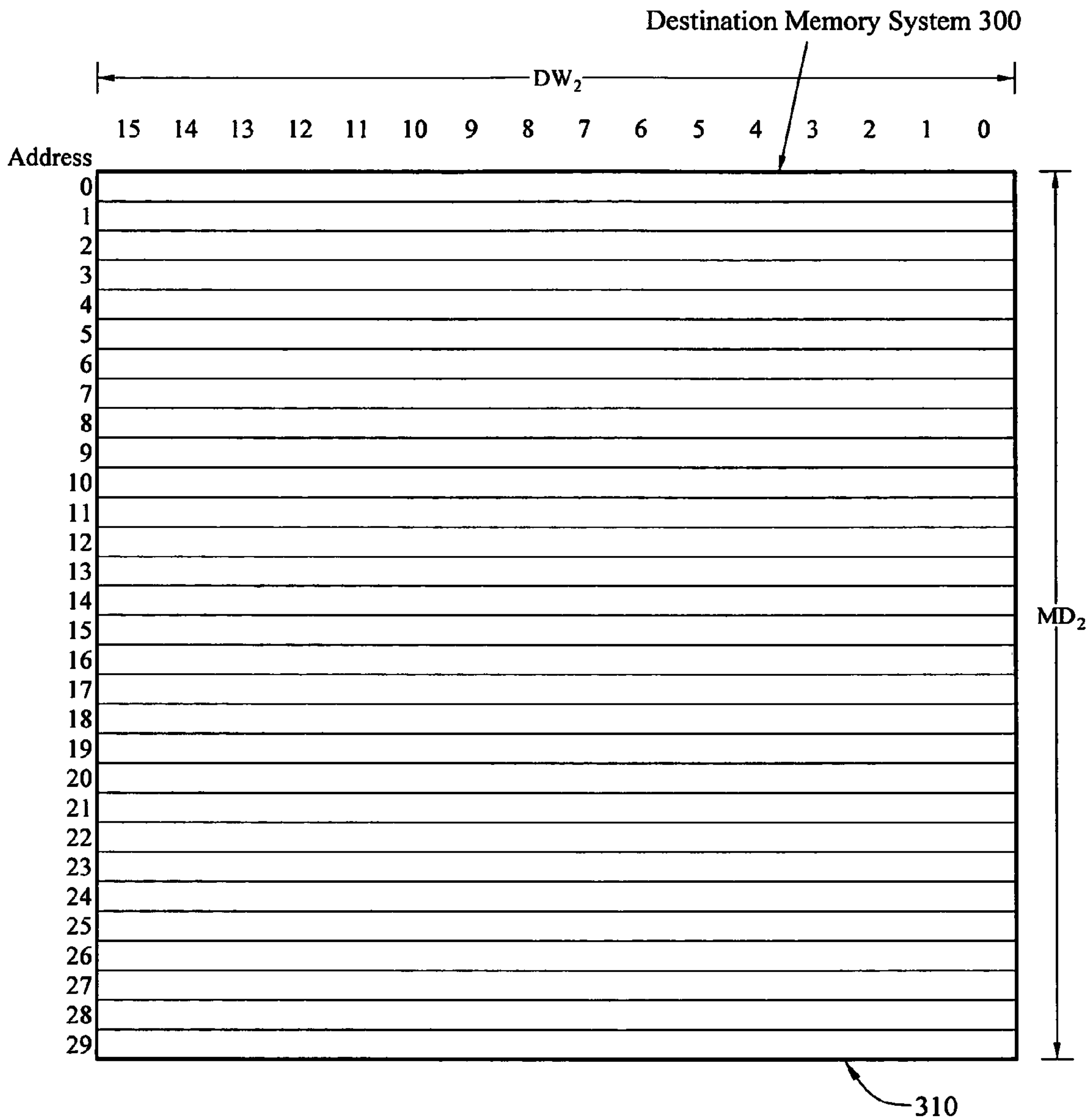

A specific example for illustrating the operation of the memory mapping system 100 will be shown and described with reference to FIGS. 9A-L. The present example is provided for purposes of illustration only and not for purposes of limitation. Turning to FIG. 9A, the source memory system 200 is shown as being provided as a 32×15 source memory system. In other words, the exemplary source memory system 200 includes a source memory depth $MD_1$ that comprises at least thirty-two source memory registers 210 each having a fifteen data bit source data width $DW_1$. The source memory system 200 thereby includes five or more address lines AW (shown in FIG. 4A). As illustrated in FIG. 9A, the source memory registers 210 are associated with source memory addresses 0 through 31, inclusive. The destination memory system 300 is shown as comprising a 30×16 destination memory system. The exemplary destination memory system 300 thereby includes a destination memory depth $MD_2$ that comprises at least thirty destination memory registers 310 each having a sixteen data bit destination data width $DW_2$. The destination memory registers 310 of FIG. 9A are associated with destination memory addresses 0 through 29, inclusive.

Here, the sixteen data bit destination data width $DW_2$ of the destination memory system 300 is greater than the fifteen data bit source data width $DW_1$ of the source memory system 200. In the manner set forth in more detail above with reference to Equation 4 and FIG. 3A, the fifteen data bit source data width $DW_1$ can be factorized in terms of the sixteen data bit destination data width $DW_2$ in accordance with Equation 20 below.

$$DW_1=f_1*8+f_2*4+f_3*2+f_4*1 \qquad \text{(Equation 20)}$$

Figures 2, 9B:
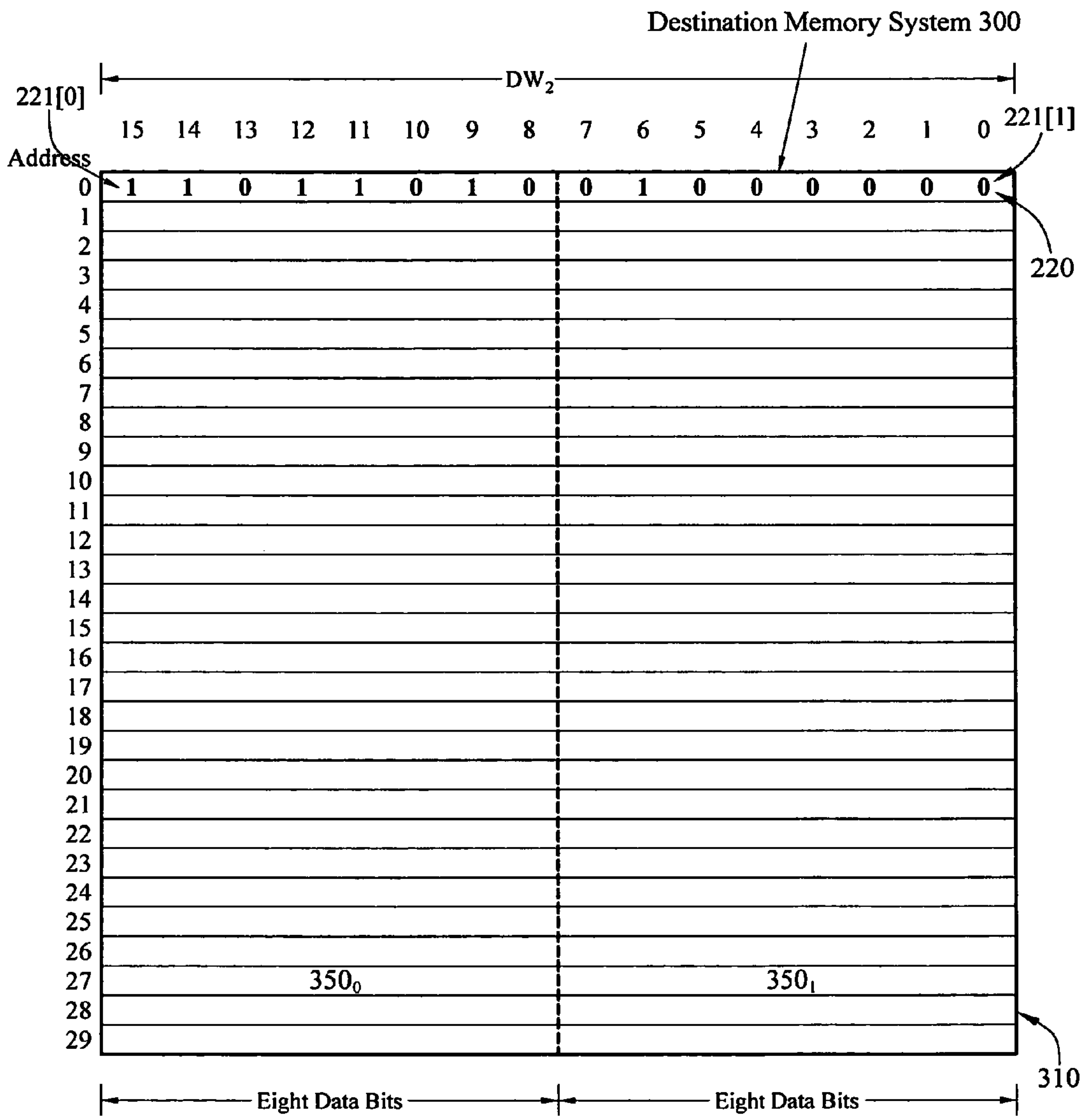

Since the exemplary source data width $DW_1$ comprises fifteen data bits, each of the factors $f_1$, $f_2$, $f_3$, and $f_4$ in Equation 20 is equal to the binary value of one ("1"). Equation 20 thereby factorizes the source data width $DW_1$ of the source memory system 200 into a summation of four data sub-widths $DSW_1$, $DSW_2$, $DSW_3$, $DSW_4$ with respective values of eight data bits, four data bits, two data bits, and one data bit. The data sub-widths $DSW_1$, $DSW_2$, $DSW_3$, $DSW_4$ are illustrated in FIG. 9B. Based upon the data sub-widths $DSW_1$, $DSW_2$, $DSW_3$, $DSW_4$, the source memory system 200 can be partitioned (and/or divided) to form four source memory sub-regions $250_1$, $250_2$, $250_3$, $250_4$ and the memory contents 220 stored in a selected source memory register 210 of the source memory system 200 can be partitioned to form four register content portions 221, 222, 223, 224 in the manner discussed in more detail above with reference to FIG. 4A.

As illustrated in FIG. 9B, the memory sub-region $250_1$ has a sub-region depth that is equal to the thirty-two register source memory depth $MD_1$ (shown in FIG. 9A) and a sub-region data width that is equal to the data sub-width $DSW_1$ of eight data bits. The register content portions 221 associated with the memory sub-region $250_1$ thereby comprise the eight most significant bits of the memory contents 220 within each source memory register 210 of the source memory system 200. In other words, data bits 14, 13, 12, . . . , 7 within each source memory register 210 form the register content portion 221.

Each of the memory sub-regions $250_2$, $250_3$, $250_4$ likewise have sub-region depths that are equal to the thirty-two register source memory depth $MD_1$. In the manner set forth above, the memory sub-region $250_2$ has a sub-region data width that is equal to the data sub-width $DSW_2$ of four data bits. The memory sub-region $250_3$ has a sub-region data width that is equal to the data sub-width $DSW_3$ of two data bits, and the memory sub-region $250_4$ has a sub-region data width that is equal to the data sub-width $DSW_4$ of one data bit. Stated somewhat differently, the register content portion 222 comprises data bits 6, 5, 4, 3 within each source memory register 210; whereas, the register content portions 223, 224 include data bits 2, 1 and data bit 0, respectively, within each source memory register 210. The register content portions 222 associated with the memory sub-region $250_2$ thereby comprise the four most significant remaining data bits of the source memory registers 210 when the eight most significant bits associated with the memory sub-region $250_1$ are not considered (and/or are ignored). Similarly, the register content portions 224 associated with the memory sub-region $250_4$ comprise the least significant data bit of each source memory register 210, and the register content portions 223 associated with the memory sub-region $250_3$ comprise the least significant remaining data bits of the source memory registers 210 when the least significant bit associated with the memory sub-region $250_4$ is not considered (and/or is ignored)

Figures 2, 9C:
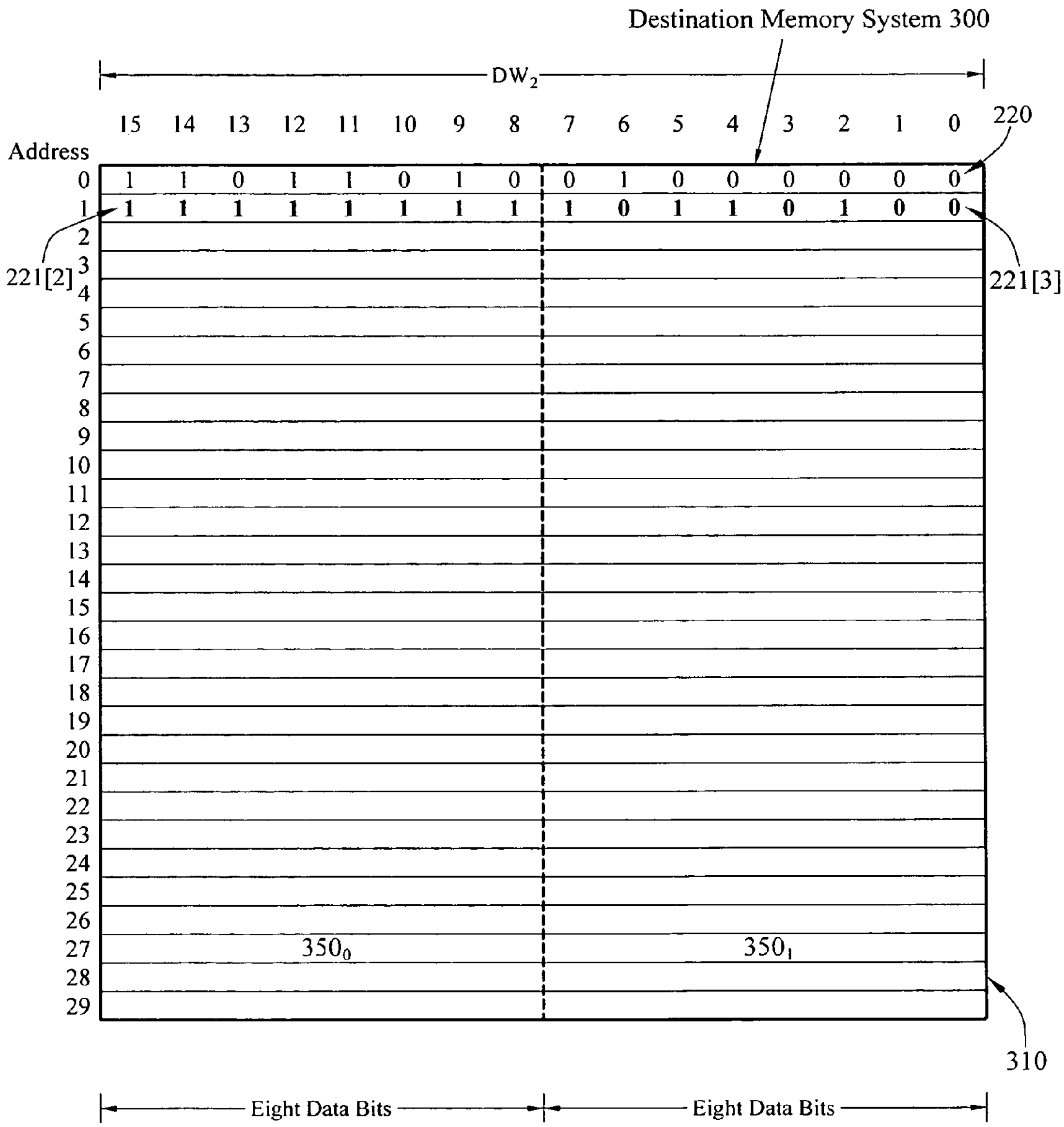

Mapping of the register content portions 221 within the memory sub-region $250_1$ is illustrated in FIGS. 9B-D. The register content portions 221 are mapped into the destination memory system 300 in the manner set forth in more detail with reference to Equations 6 and 7 and FIGS. 4A-F. FIG. 9B shows that the register content portions 221[0], 221[1] are selected for mapping into the destination memory system 300. In accordance with Equation 6, the register content portions 221[0], 221[1] each are mapped to destination memory register 310[0]. Equation 7 identifies eight-bit destination register portions $\mathbf{350}_0$, $\mathbf{350}_1$ of the destination memory register 310[0] into which the register content portions 221[0], 221[1] can be respectively disposed. In accordance with Equation 7, the register content portion 221[0] is disposed within the eight-bit destination register portion $\mathbf{350}_0$ of the destination memory register 310[0]; whereas, the register content portion 221[1] is disposed within the eight-bit destination register portion $\mathbf{350}_1$ of the destination memory register 310[0].

More specifically, the data bits 14, 13, 12, . . . , 7 within the source memory register 210[0] and the data bits 14, 13, 12, . . . , 7 within the source memory register 210[1] can be selected as shown in FIG. 9B. When mapped into the destination memory system 300, the data bit 14 of the source memory register 210[0] is disposed within the data bit 15 of the destination memory register 310[0]; whereas, the data bit 13 of the source memory register 210[0] is disposed within the data bit 14 of the destination memory register 310[0]. The data bits 14, 13, 12, . . . , 7 within the source memory register 210[0] thereby are respectively disposed within data bits 15, 14, 13, . . . , 8 within the destination memory register 310[0] as illustrated in FIG. 9B. Similarly, data bits 14, 13, 12, . . . , 7 within the source memory register 210[1] are respectively disposed within data bits 7, 6, 5, 4, . . . , 0 within the destination memory register 310[0]. The register content portions 221[0], 221[1] thereby are mapped in a side-by-side manner across the destination memory register 310[0].

The register content portions 221[2], 221[3] are selected for mapping into the destination memory system 300 in FIG. 9C. In accordance with Equations 6 and 7, the register content portion 221[2] is disposed within the eight-bit destination register portion $\mathbf{350}_0$ of the destination memory register 310[1]; whereas, the register content portion 221[3] is disposed within the eight-bit destination register portion $\mathbf{350}_1$ of the destination memory register 310[1]. More specifically, the data bits 14, 13, 12, . . . , 7 within the source memory register 210[2] and the data bits 14, 13, 12, . . . , 7 within the source memory register 210[3] are selected. As shown in FIG. 9C, the data bits 14, 13, 12, . . . , 7 within the source memory register 210[2] thereby are respectively disposed within data bits 15, 14, 13, . . . , 8 within the destination memory register 310[1], and data bits 14, 13, 12, . . . , 7 within the source memory register 210[3] are respectively disposed within data bits 7, 6, 5, 4, . . . , 0 within the destination memory register 310[1]. The register content portions 221[2], 221[3] thereby are mapped in a side-by-side manner across the destination memory register 310[1].

Turning to FIG. 9D, the remaining register content portions 221[4], 221[5], 221[6], . . . 221[31] within the memory sub-region $\mathbf{250}_1$ each are selected for mapping into the destination memory system 300. In accordance with Equations 6 and 7, for example, the register content portion 221[4] is disposed within the eight-bit destination register portion $\mathbf{350}_0$ of the destination memory register 310[2]; whereas, the register content portion 221[5] is disposed within the eight-bit destination register portion $\mathbf{350}_1$ of the destination memory register 310[2]. The mapping of the remaining register content portions 221 of the source memory sub-region $\mathbf{250}_1$ can proceed in a similar manner. The register content portion 221[30] is disposed within the eight-bit destination register portion $\mathbf{350}_0$ of the destination memory register 310[15]; whereas, the register content portion 221[31] is disposed within the eight-bit destination register portion $\mathbf{350}_1$ of the destination memory register 310[15]. Each register content portion 221 of the source memory sub-region $\mathbf{250}_1$ thereby is mapped in a side-by-side manner across the destination memory registers 310[0]-310[15] without a loss of valuable memory space in the destination memory system 300 as illustrated in FIG. 9D.

Figures 2, 9E:
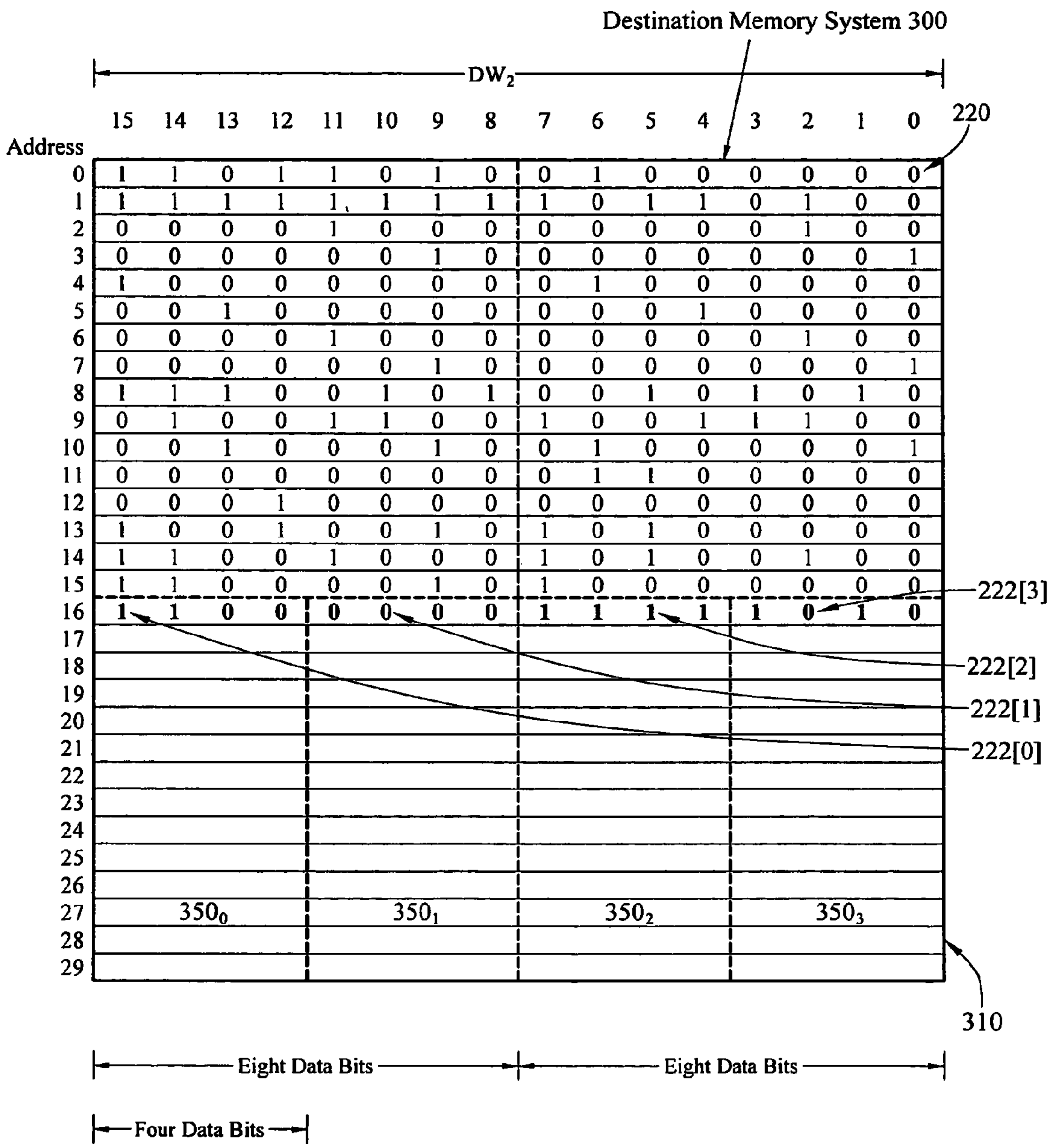
Figures 2, 9F:
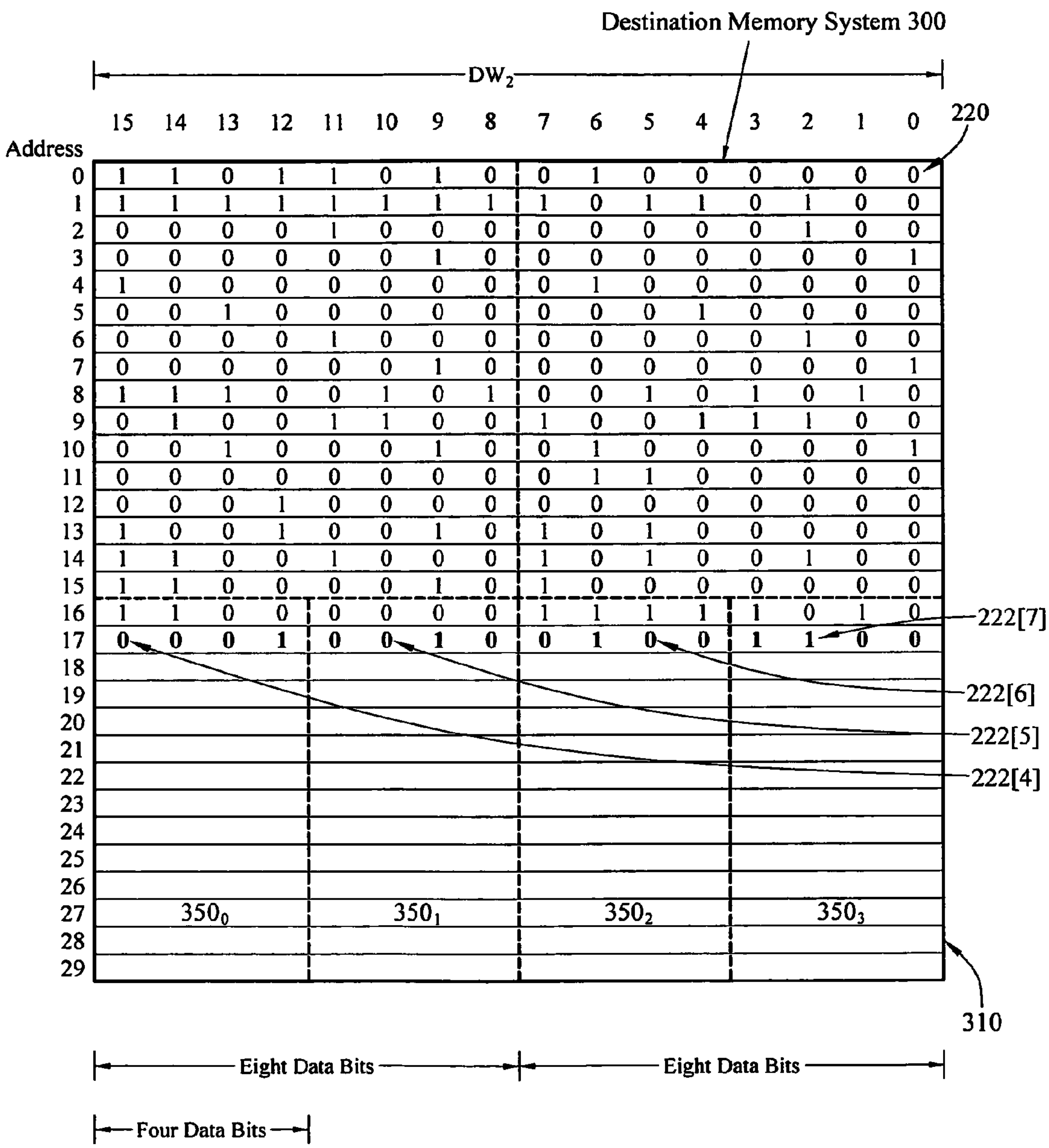

Mapping of the register content portions 222 within the memory sub-region $\mathbf{250}_2$ is illustrated in FIGS. 9E-G. The register content portions 222 are mapped into the destination memory system 300 in the manner set forth in more detail with reference to Equations 6 and 7 and FIGS. 5A-F. FIG. 9E shows that the register content portions 222[0], 222[1], 222[2], 222[3] are selected for mapping into the destination memory system 300. In accordance with Equation 6, the register content portions 222[0], 222[1], 222[2], 222[3] each can be mapped to destination memory register 310[16] when Equation 6 includes an destination address offset of sixteen to take into account destination memory registers 310[0]-310[15] into which the register content portions 221 of the source memory sub-region $\mathbf{250}_1$ are mapped. Equation 7 identifies four-bit destination register portions $\mathbf{350}_0$, $\mathbf{350}_1$, $\mathbf{350}_2$, $\mathbf{350}_3$ of the destination memory register 310[16] into which the register content portions 222[0], 222[1], 222[2], 222[3] can be respectively disposed. In accordance with Equation 7, the register content portion 222[0] is disposed within the four-bit destination register portion $\mathbf{350}_0$ of the destination memory register 310[16], and the register content portion 222[1] is disposed within the four-bit destination register portion $\mathbf{350}_1$ of the destination memory register 310[16]. Similarly, the register content portions 222[2], 222[3] are respectively disposed within the four-bit destination register portions $\mathbf{350}_2$, $\mathbf{350}_3$ of the destination memory register 310[16].

More specifically, the data bits 6, 5, 4, 3 within the source memory registers 210[0], 210[1], 210[2], 210[3] can be selected as shown in FIG. 9E. When mapped into the destination memory system 300, the data bit 6 of the source memory register 210[0] is disposed within the data bit 15 of the destination memory register 310[16]; whereas, the data bit 4 of the source memory register 210[0] is disposed within the data bit 14 of the destination memory register 310[16]. The data bits 6, 5, 4, 3 within the source memory register 210[0] thereby are respectively disposed within data bits 15, 14, 13, 12 within the destination memory register 310[16] as illustrated in FIG. 9E. Similarly, data bits 6, 5, 4, 3 within the source memory register 210[1] are respectively disposed within data bits 11, 10, 9, 8 within the destination memory register 310[16]. Data bits 6, 5, 4, 3 within the source memory register 210[2] are respectively disposed within data bits 7, 6, 5, 4 within the destination memory register 310[16]; whereas, data bits 6, 5, 4, 3 within the source memory register 210[3] are respectively disposed within data bits 3, 2, 1, 0 within the destination memory register 310[16]. The register content portions 222[0], 222[1], 222[2], 222[3] thereby are mapped in a side-by-side manner across the destination memory register 310[16].

The register content portions 222[4], 222[5], 222[6], 222[7] are selected for mapping into the destination memory system 300 in FIG. 9F. In accordance with Equations 6 and 7, the register content portion 222[4] is disposed within the four-bit destination register portion $\mathbf{350}_0$ of the destination memory register 310[17]; whereas, the register content portion 222[5] is disposed within the four-bit destination register portion $\mathbf{350}_1$ of the destination memory register 310[17]. The register content portion 222[6] likewise is disposed within the four-bit destination register portion $\mathbf{350}_2$ of the destination memory register 310[17], and the register content portion 222[7] is disposed within the four-bit destination register portion $\mathbf{350}_3$ of the destination memory register 310[17]. In other words, data bits 6, 5, 4, 3 within the source memory register 210[4] are respectively disposed within data bits 15, 14, 13, 12 within the destination memory register 310[17], and data bits 6, 5, 4, 3 within the source memory register 210[5] are respectively disposed within data bits 11, 10, 9, 8 within the destination memory register 310[17]. Similarly, data bits 6, 5, 4, 3 within the source memory register 210[6] are respectively disposed within data bits 7, 6, 5, 4 within the destination memory register 310[17], and data bits 6, 5, 4, 3 within the source memory register 210[7] are respectively disposed within data bits 3, 2, 1, 0 within the destination memory register 310[17] as shown in FIG. 9F. The register content portions 222[4], 222[5], 222[6], 222[7] thereby are mapped in a side-by-side manner across the destination memory register 310[17].

Turning to FIG. 9G, the remaining register content portions 222[8], 222[9], 222[10], . . . , 222[31] within the memory sub-region $\mathbf{250_2}$ each are selected for mapping into the destination memory system 300. In accordance with Equations 6 and 7, for example, the register content portions 222[8], 222[9], 222[10], 222[11] are respectively disposed within the four-bit destination register portions $\mathbf{350_0}$, $\mathbf{350_1}$, $\mathbf{350_2}$, $\mathbf{350_3}$ of the destination memory register 310[18]. The mapping of the remaining register content portions 222 of the source memory sub-region $\mathbf{250_2}$ can proceed in a similar manner. The register content portions 222[12], 222[13], 222[14], 222[15] are respectively disposed within the four-bit destination register portions $\mathbf{350_0}$, $\mathbf{350_1}$, $\mathbf{350_2}$, $\mathbf{350_3}$ of the destination memory register 310[23]. Each register content portion 222 of the source memory sub-region $\mathbf{250_2}$ thereby is mapped in a side-by-side manner across the destination memory registers 310[16]-310[23] without a loss of valuable memory space in the destination memory system 300 as illustrated in FIG. 9G.

Figures 2, 9J:
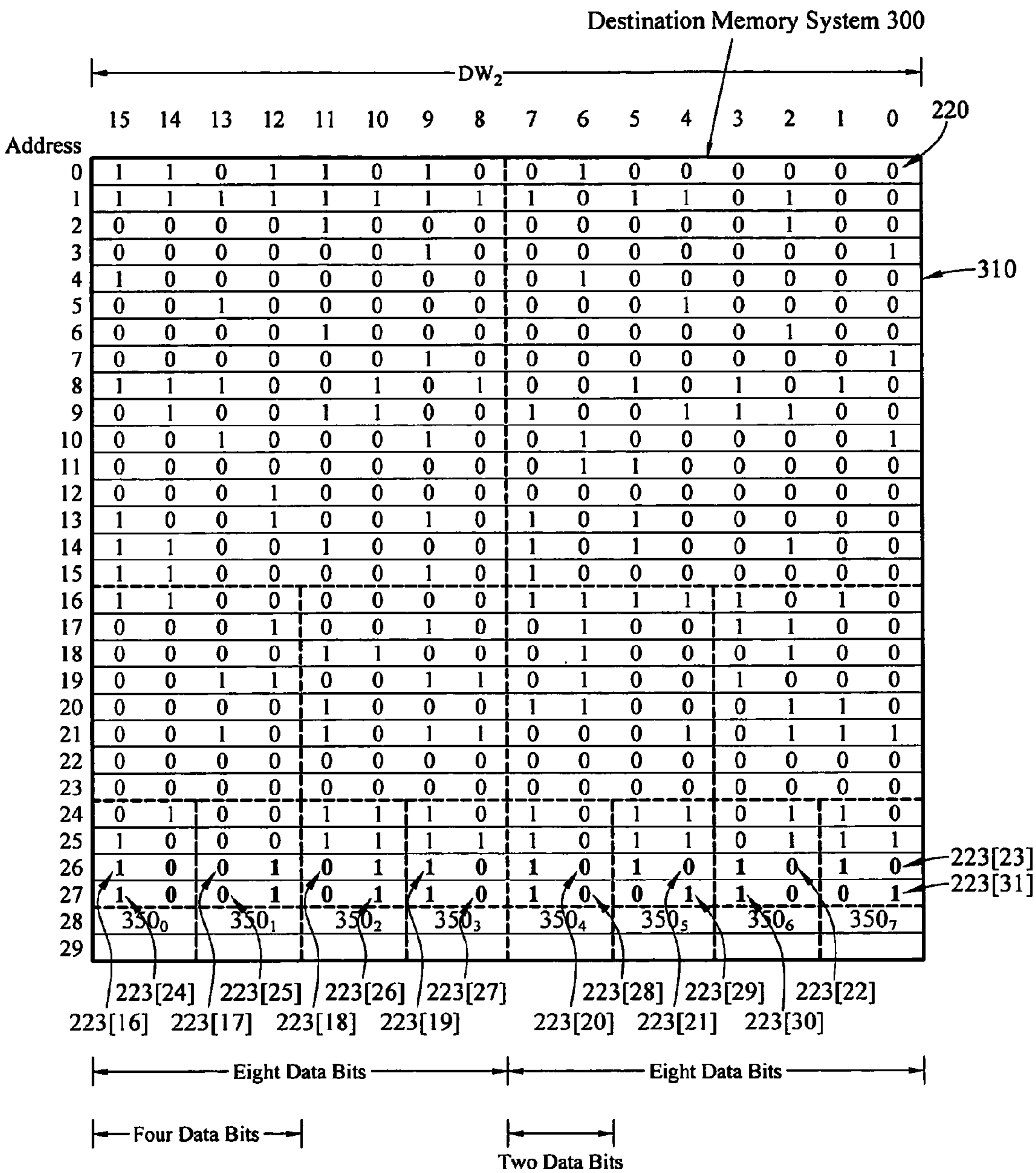

Mapping of the register content portions 223 within the memory sub-region $\mathbf{250_3}$ is illustrated in FIGS. 9H-J. The register content portions 223 are mapped into the destination memory system 300 in the manner set forth in more detail with reference to Equations 6 and 7 and FIGS. 6A-C. FIG. 9H shows that the register content portions 223[0], 223[1], 223[2], . . . , 223[7] are selected for mapping into the destination memory system 300. In accordance with Equation 6, the register content portions 223[0], 223[1], 223[2], . . . , 223[7] each can be mapped to destination memory register 310[24] when Equation 6 includes an destination address offset of twenty-four to take into account destination memory registers 310[0]-310[15] into which the register content portions 221 of the source memory sub-region $\mathbf{250_1}$ are mapped and destination memory registers 310[16]-310[23] into which the register content portions 222 of the source memory sub-region $\mathbf{250_2}$ are mapped.

Equation 7 identifies two-bit destination register portions $\mathbf{350_0}$, $\mathbf{350_1}$, $\mathbf{350_2}$, . . . , $\mathbf{350_7}$ of the destination memory register 310[24] into which the register content portions 223[0], 223[1], 223[2], . . . , 223[7] can be respectively disposed. In accordance with Equation 7, the register content portion 223[0] is disposed within the two-bit destination register portion $\mathbf{350_0}$ of the destination memory register 310[24], and the register content portion 223[1] is disposed within the two-bit destination register portion $\mathbf{350_1}$ of the destination memory register 310[24]. Similarly, the register content portions 223[2], 223[3], 223[4], . . . , 223[7] are respectively disposed within the two-bit destination register portions $\mathbf{350_2}$, $\mathbf{350_3}$, $\mathbf{350_4}$, . . . , $\mathbf{350_7}$ of the destination memory register 310[24].

More specifically, the data bits 2, 1 within the source memory registers 210[0], 210[1], 210[2], . . . , 210[7] can be selected as shown in FIG. 9H. When mapped into the destination memory system 300, the data bit 2 of the source memory register 210[0] is disposed within the data bit 15 of the destination memory register 310[24]; whereas, the data bit 1 of the source memory register 210[0] is disposed within the data bit 14 of the destination memory register 310[24]. The data bits 2, 1 within the source memory register 210[0] thereby are respectively disposed within data bits 15, 14 within the destination memory register 310[24] as illustrated in FIG. 9H. Similarly, data bits 2, 1 within the source memory register 210[1], 210[2], 210[3], . . . , 210[7] are respectively disposed within data bits 13, 12, 11, . . . , 0 within the destination memory register 310[24]. The register content portions 223[0], 223[1], 223[2], . . . , 223[7] thereby are mapped in a side-by-side manner across the destination memory register 310[24].

The register content portions 223[8], 223[9], 223[10], . . . , 223[15] are selected for mapping into the destination memory system 300 in FIG. 9I. In accordance with Equations 6 and 7, the register content portion 223[8] is disposed within the two-bit destination register portion $\mathbf{350_0}$ of the destination memory register 310[25]; whereas, the register content portion 223[9] is disposed within the two-bit destination register portion $\mathbf{350_1}$ of the destination memory register 310[25]. The register content portions 223[10], 223[11], 223[12], . . . , 223[15] likewise are disposed within the two-bit destination register portion $\mathbf{350_2}$, $\mathbf{350_3}$, $\mathbf{350_4}$, . . . , $\mathbf{350_7}$, respectively, of the destination memory register 310[25]. In other words, data bits 2, 1 within the source memory registers 210[8], 210[9], 210[10], . . . , 210[15] are respectively disposed within data bits 15, 14, 13, . . . , 0 within the destination memory register 310[25] as shown in FIG. 9I. The register content portions 223[8], 223[9], 223[10], . . . , 223[15] thereby are mapped in a side-by-side manner across the destination memory register 310[25].

Turning to FIG. 9J, the remaining register content portions 223[16], 223[17], 223[18], 223[31] within the memory sub-region $\mathbf{250_3}$ each are selected for mapping into the destination memory system 300. In accordance with Equations 6 and 7, for example, the register content portions 223[16], 223[17], 223[18], . . . , 223[23] are respectively disposed within the two-bit destination register portions $\mathbf{350_0}$, $\mathbf{350_1}$, $\mathbf{350_2}$, . . . , $\mathbf{350_7}$ of the destination memory register 310[26]. The mapping of the remaining register content portions 223 of the source memory sub-region $\mathbf{250_3}$ can proceed in a similar manner. The register content portions 223[24], 223[25], 223[26], . . . , 223[31] are respectively disposed within the two-bit destination register portions $\mathbf{350_0}$, $\mathbf{350_1}$, $\mathbf{350_2}$, . . . , $\mathbf{350_7}$ of the destination memory register 310[27]. Each register content portion 223 of the source memory sub-region $\mathbf{250_3}$ thereby is mapped in a side-by-side manner across the destination memory registers 310[24]-310[27] without a loss of valuable memory space in the destination memory system 300 as illustrated in FIG. 9J.

Mapping of the register content portions 224 within the memory sub-region $\mathbf{250_4}$ is illustrated in FIGS. 9K-L. The register content portions 224 are mapped into the destination memory system 300 in the manner set forth in more detail with reference to Equations 6 and 7 and FIGS. 7A-B. FIG. 9K shows that the register content portions 224[0], 224[1], 224[2], . . . , 224[15] are selected for mapping into the destination memory system 300. In accordance with Equation 6, the register content portions 224[0], 224[1], 224[2], . . . , 224[15] each can be mapped to destination memory register 310[28] when Equation 6 includes an destination address offset of twenty-eight to take into account destination memory registers 310[0]-310[15] into which the register content portions 221 of the source memory sub-region $\mathbf{250_1}$ are mapped, destination memory registers 310[16] 310[23] into which the register content portions 222 of the source memory sub-region $\mathbf{250_2}$ are mapped, and destination memory registers 310[24]-310[27] into which the register content portions 223 of the source memory sub-region $250_3$ are mapped.

Equation 7 identifies one-bit destination register portions $350_0$, $350_1$, $350_2$, . . . , $350_{15}$ of the destination memory register 310[28] into which the register content portions 224[0], 224[1], 224[2], . . . , 224[15] can be respectively disposed. In accordance with Equation 7, the register content portion 224[0] is disposed within the one-bit destination register portion $350_0$ of the destination memory register 310[28], and the register content portion 224[1] is disposed within the one-bit destination register portion $350_1$ of the destination memory register 310[28]. Similarly, the register content portions 224[2], 224[3], 224[4], . . . , 224[15] are respectively disposed within the one-bit destination register portions $350_2$, $350_3$, $350_4$, . . . , $350_{15}$ of the destination memory register 310[28].

More specifically, the data bit 0 within the source memory registers 210[0], 210[1], 210[2], . . . , 210[15] can be selected as shown in FIG. 9K. When mapped into the destination memory system 300, the data bit 0 of the source memory register 210[0] is disposed within the data bit 15 of the destination memory register 310[28]; whereas, the data bit 0 of the source memory register 211[1] is disposed within the data bit 14 of the destination memory register 310[28] as illustrated in FIG. 9K. Similarly, data bit 0 within the source memory register 210[2], 210[3], 210[4], . . . , 210[15] are respectively disposed within data bits 13, 12, 11, . . . , 0 within the destination memory register 310[28]. The register content portions 224[0], 224[1], 224[2], . . . , 224[15] thereby are mapped in a side-by-side manner across the destination memory register 310[28].

The mapping of the remaining register content portions 224 of the source memory sub-region $250_4$ can proceed in a similar manner. The register content portions 224[16], 224[17], 224[18], . . . , 224[31] are selected for mapping into the destination memory system 300 in FIG. 9L. In accordance with Equations 6 and 7, the register content portion 224[16] is disposed within the one-bit destination register portion $350_0$ of the destination memory register 310[29]; whereas, the register content portion 224[17] is disposed within the one-bit destination register portion $350_1$ of the destination memory register 310[29]. The register content portions 224[18], 224[19], 224[20], . . . , 224[31] likewise are disposed within the one-bit destination register portion $350_2$, $350_3$, $350_4$, . . . , $350_{15}$, respectively, of the destination memory register 310[29]. In other words, data bit 0 within the source memory registers 224[16], 224[17], 224[18], . . . , 224[31] are respectively disposed within data bits 15, 14, 13, . . . , 0 within the destination memory register 310[29] as shown in FIG. 9L. The source memory registers 210 of the source memory system 200 thereby are mapped in a side-by-side manner across the destination memory registers 310 of the destination memory system 300 without a loss of valuable memory space in the destination memory system 300.

Figures 1, 10A:
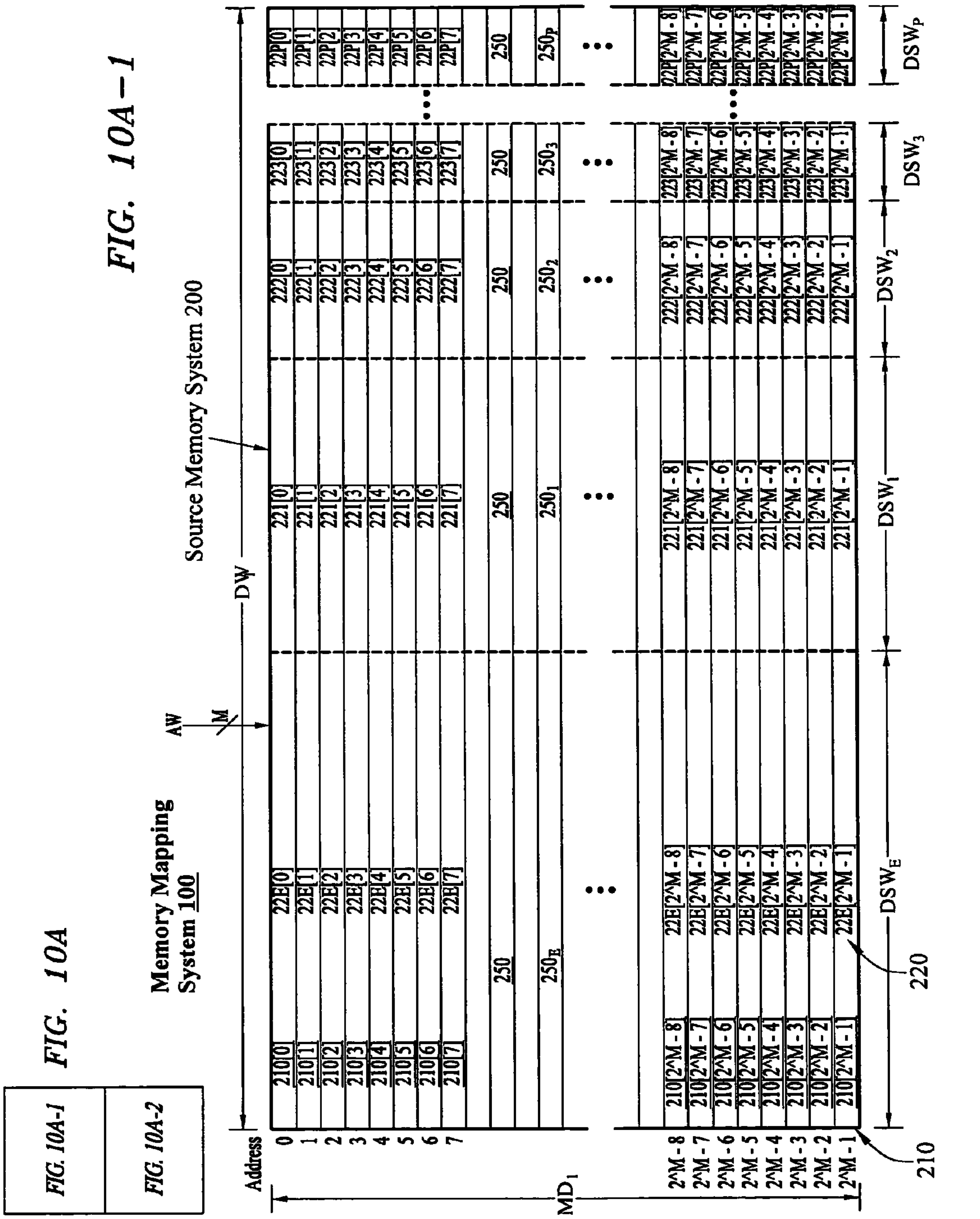
FIG. 10A is a detail drawing illustrating another alternative embodiment of the memory mapping system of FIG. 4A, wherein the source data width of the source memory system is greater than a destination data width of the destination memory system and includes at least one extended source memory sub-region with a data sub-width that is equal to a destination data width of the destination memory system.
Figures 2, 10A:
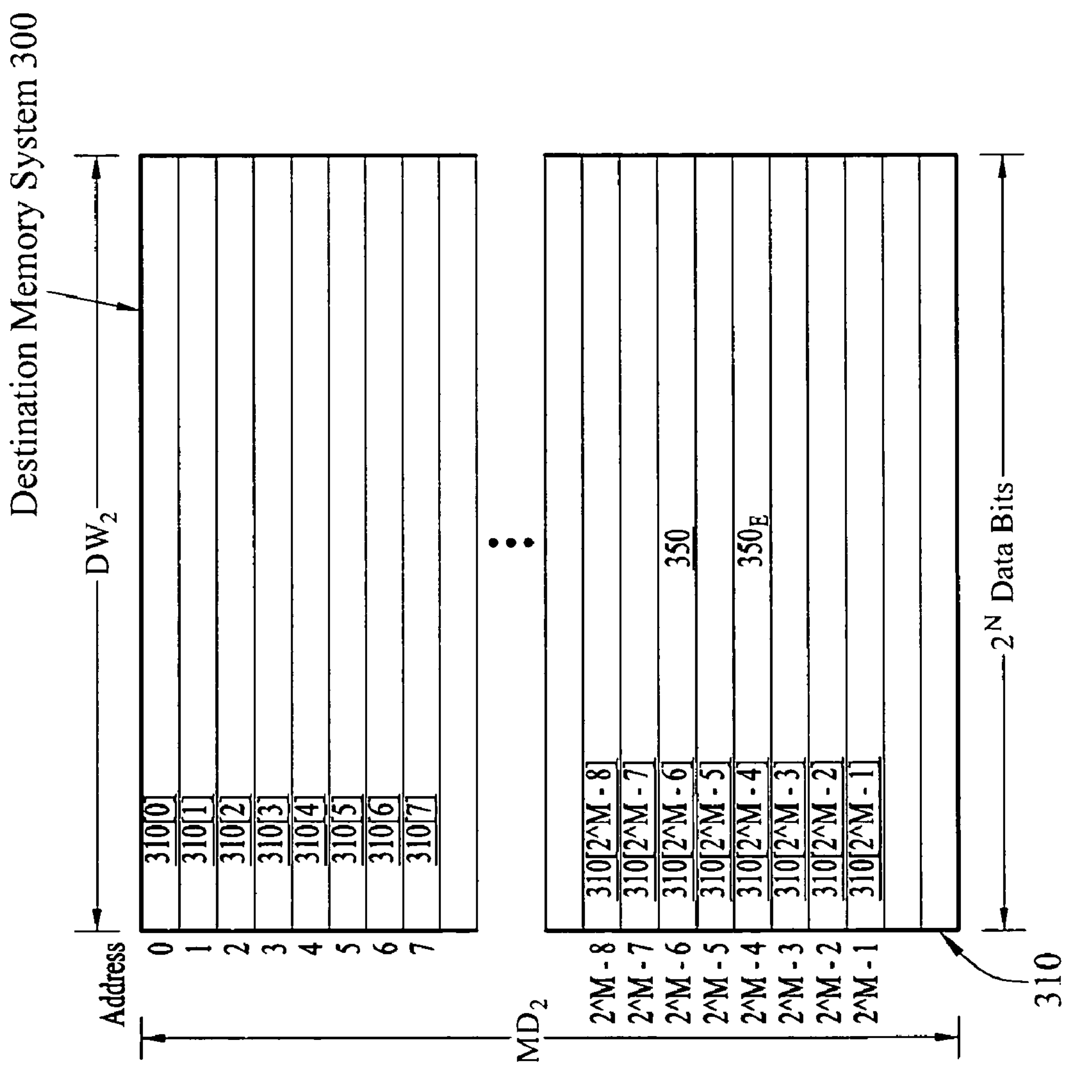

When the memory mapping system 100 partitions (and/or divides) the source memory system 200 to form the one or more source memory sub-regions 250 in the manner set forth above, the source memory sub-regions 250 can include at least one extended memory sub-region $250_E$ as illustrated in FIG. 10A. Extended memory sub-regions $250_E$ typically arise when the source data width $DW_1$ of the source memory system 200 is greater than or equal to the destination data width $DW_2$ of the destination memory system 300. If the source memory sub-regions 250 are formed in accordance with the Equation 2 above, for example, the factor $f_0$ can represent the number of extended memory sub-regions $250_E$ that are formed when the source memory system 200 is partitioned (or divided) into source memory sub-regions 250.

As shown in FIG. 10A, each extended memory sub-region $250_E$ within the source memory system 200 can have an extended sub-region depth that is equal to the source memory depth $MD_1$ and an extended sub-region data width $DSW_E$ that is equal to the destination data width $DW_2$ of the destination memory system 300. Each extended memory sub-region $250_E$ thereby includes a portion of the memory contents 220 from each of the source memory registers 210 associated with the source memory depth $MD_1$. In the manner discussed above with reference to FIG. 4A, the memory contents 220 stored in a selected source memory register 210 can include a plurality of register content portions 221, 222, 223, . . . , 22P, including an extended register content portion 22E that is associated with a selected extended memory sub-region $250_E$. In other words, the memory contents 220[$A_1$] stored in the source memory register 210[$A_1$] can include at least one extended register content portion 22E[$A_1$], a first register content portion 221[$A_1$], a second register content portion 222[$A_1$], a third register content portion 223[$A_1$], . . . , and a $P^{th}$ register content portion 22P[$A_1$] for the selected source memory address $A_1$.

The memory contents 220[0] of the source memory register 210[0], for example, is shown as including an extended register content portion 22E[0], a register content portion 221[0], a second register content portion 222[0], a third register content portion 223[0], . . . , and a $P^{th}$ register content portion 22P[0]. The extended register content portion 22E of the selected source memory register 210 can be associated with the selected extended memory sub-region $250_E$ and/or the extended sub-region data width $DSW_E$ in the manner set forth in more detail above with reference to FIG. 4A Thereby, the selected extended memory sub-region $250_E$ can comprise the extended register content portion 22E[0] for the source memory register 210[0], the extended register content portion 22E[1] for the source memory register 210[1], the extended register content portion 22E[2] for the source memory register 210[2], . . . , and the extended register content portion 22E[$2^M-1$] for the source memory register 210[$2^M-1$] as illustrated in FIG. 10A.

The extended register content portions 22E forming the selected extended memory sub-region $250_E$ can be disposed in their entirety into destination memory registers 310 within the destination memory system 300. In other words, the destination register portion 350 (shown in FIGS. 4B-E) of the destination memory registers 310 into which the extended register content portions 22E are disposed can comprise each data bit of the relevant destination memory registers 310. For example, since the extended sub-region data width $DSW_E$ of the selected extended memory sub-region $250_E$ is equal to the destination data width $DW_2$ of the destination memory system 300, the extended register content portions 22E and the destination data width $DW_2$ comprise the same number of data bits. Each of the $2^M$ extended register content portions 22E thereby can fill a predetermined destination memory register 310. The $2^M$ extended register content portions 22E thereby can be disposed within $2^M$ destination memory registers 310. Although preferably comprising contiguous destination memory registers 310, the $2^M$ destination memory registers 310 can comprise any predetermined destination memory registers 310 within the destination memory system 300.

Figures 1, 10B:
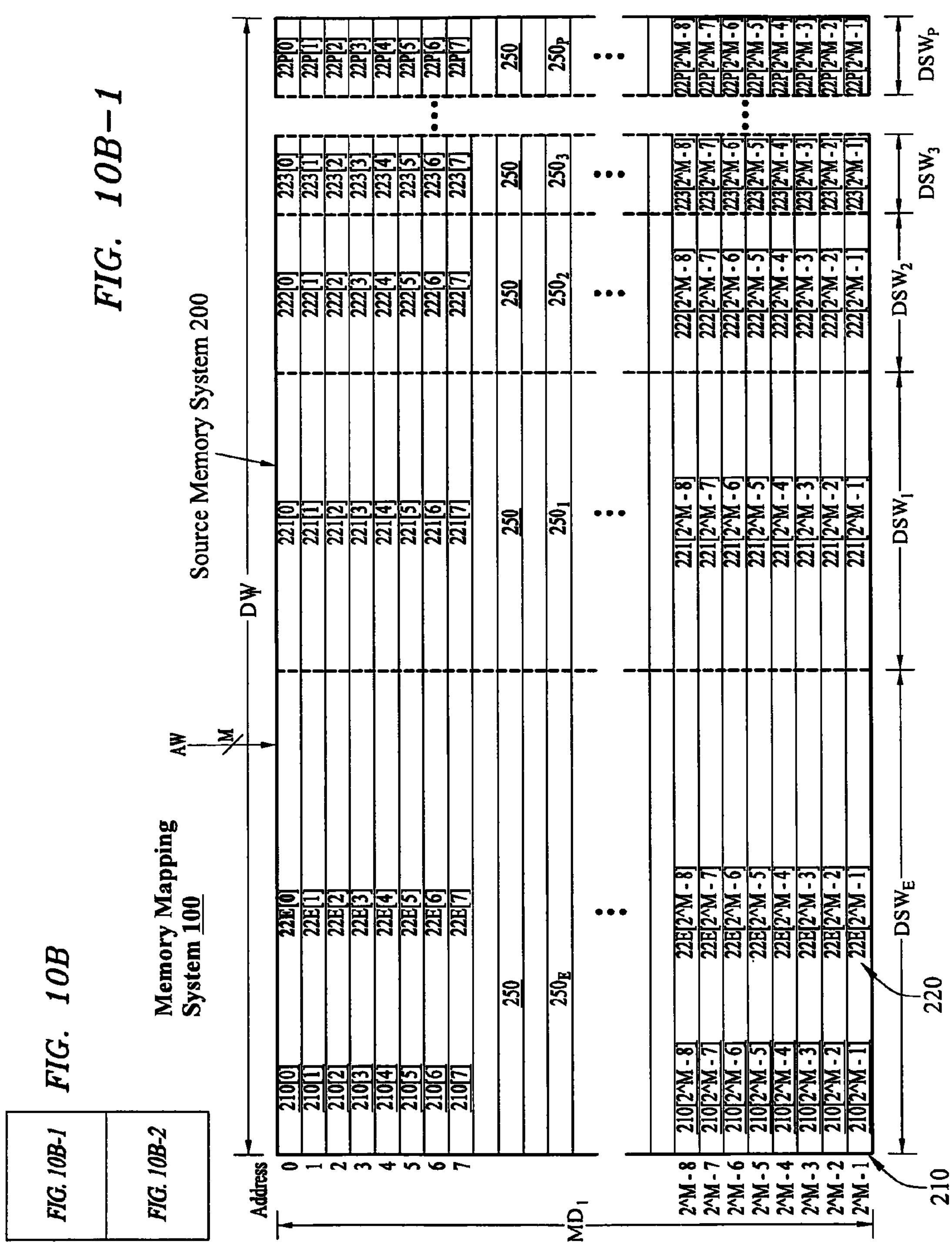
FIGS. 10B-E are detail drawings illustrating an alternative embodiment of the memory mapping system of FIG. 10A, wherein the memory mapping system maps the extended source memory sub-regions of FIG. 10A of the source memory system into the destination memory system.
Figures 2, 10B:
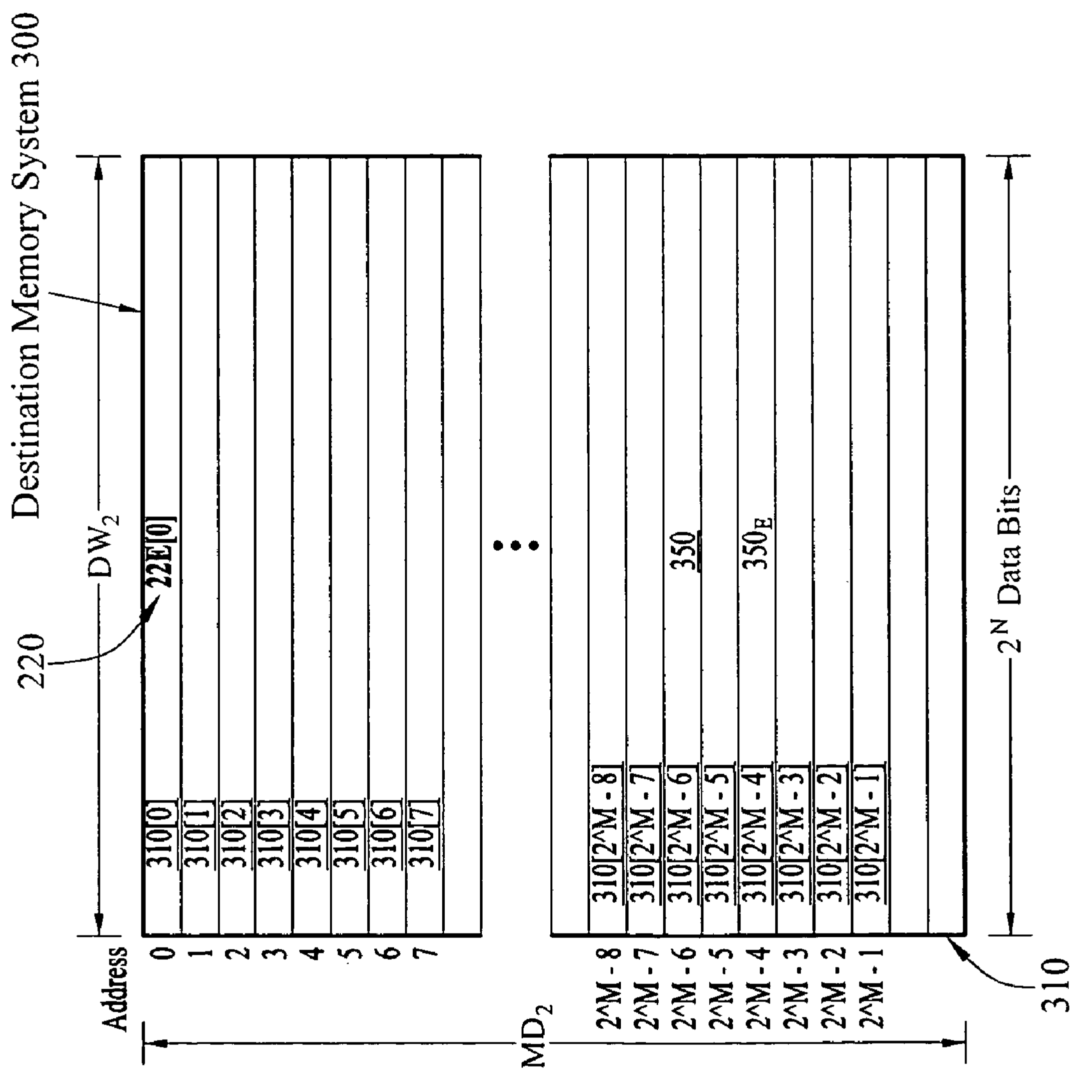

An exemplary mapping of the extended memory sub-region $250_E$ of the source memory system 200 into the destination memory system 300 is shown in FIGS. 10B-E. For purposes of the present illustration, the destination address offset is assumed to be equal to zero as discussed above with reference to FIGS. 4B-F. Turning to FIG. 10B, for instance, the extended register content portion 22E[0] of the extended memory sub-region $250_E$ is shown as being associated with the source memory address $A_1$ having a value of zero ("0") and can be selected for mapping into a selected destination memory register 310 within the destination memory system 300. In the manner set forth above with reference to the source memory register 210, the destination memory register 310 associated with a selected destination memory address $A_2$ is shown as being designated as destination memory register 310[$A_2$] and can store memory contents 220 associated with a selected extended register content portion 22E[$A_1$] provided by the source memory system 200. The extended register content portion 22E[0] of the source memory register 210[0] can be mapped in its entirety into the destination memory register 310[$A_2$] with a destination memory address $A_2$ having a value of zero ("0") as illustrated in FIG. 10B.

Figures 1, 10C:
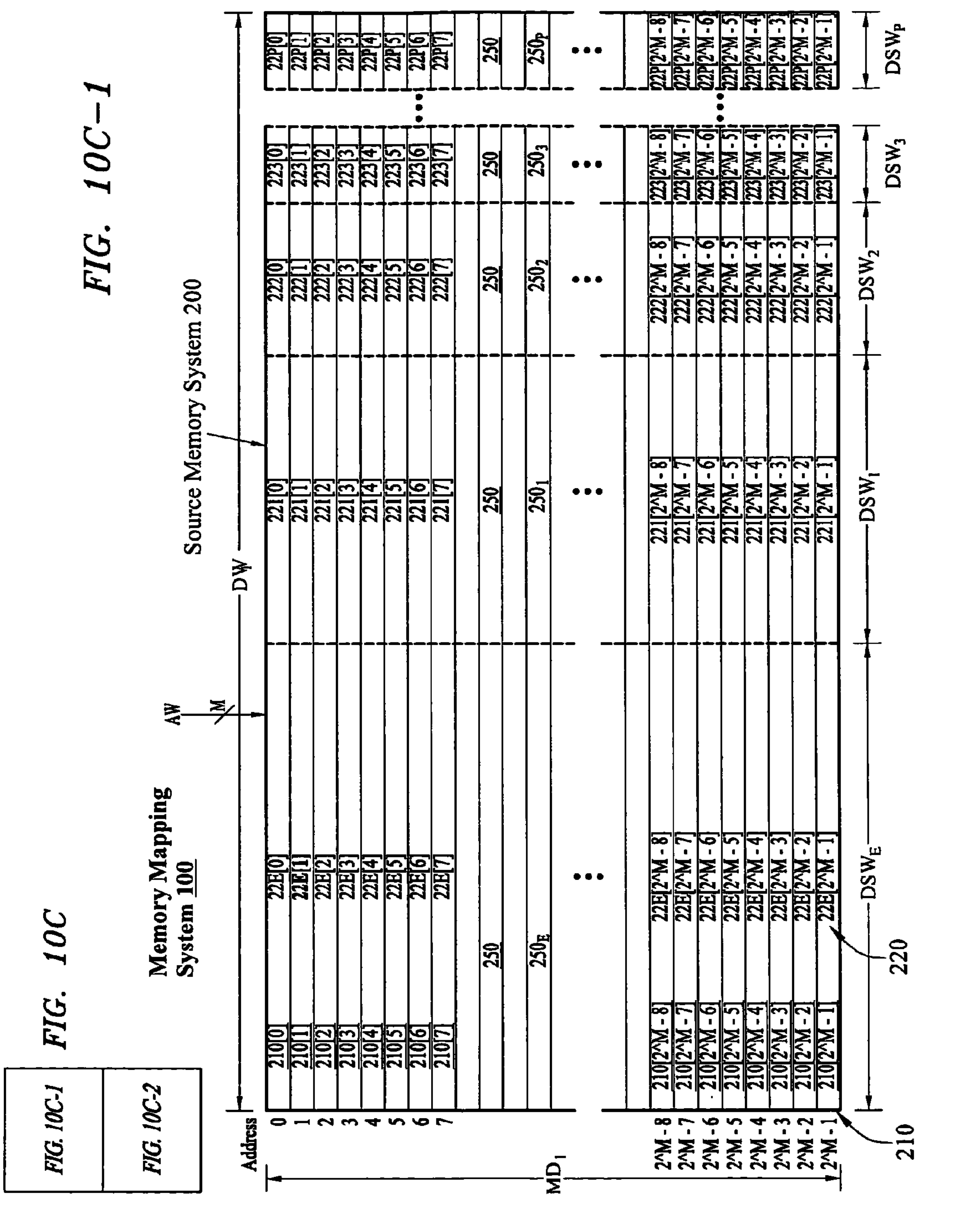
Figures 2, 10C:
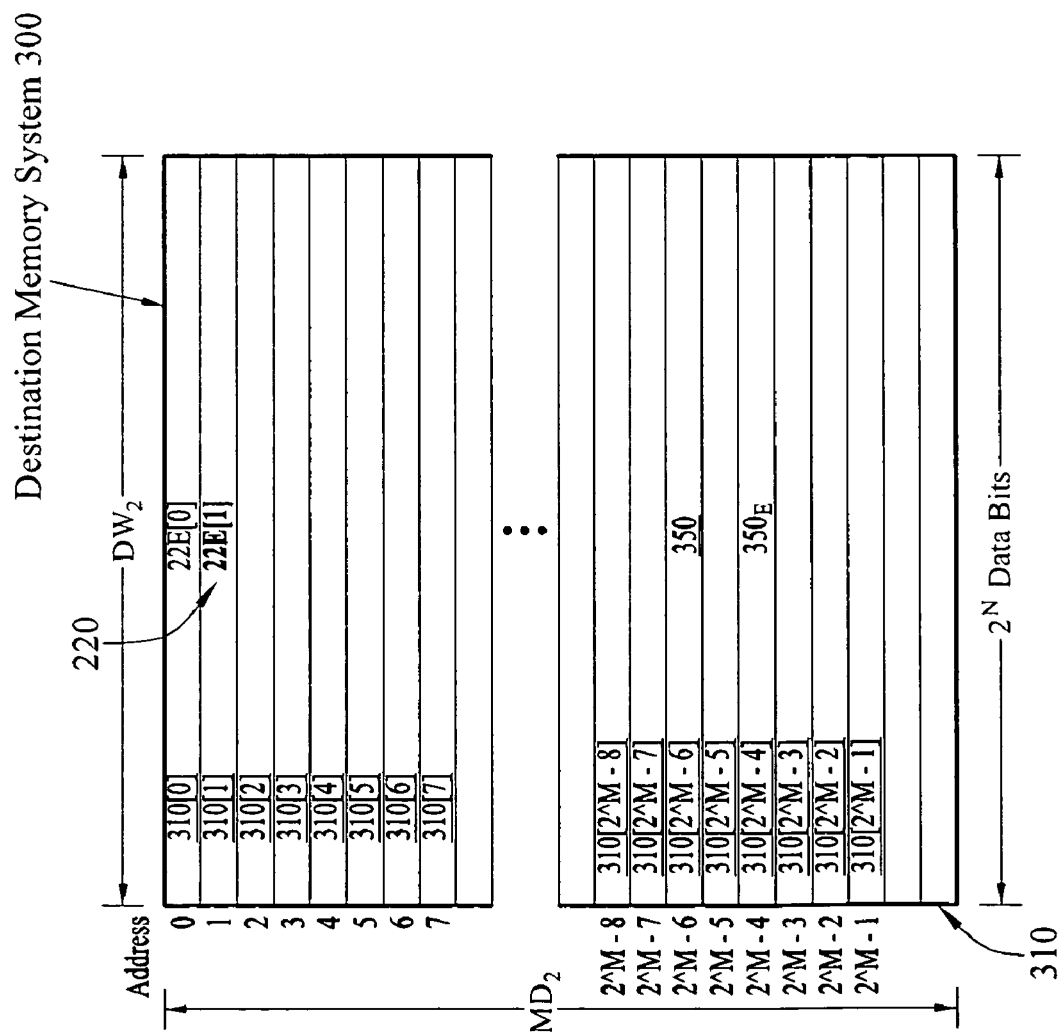
Figures 1, 10D:
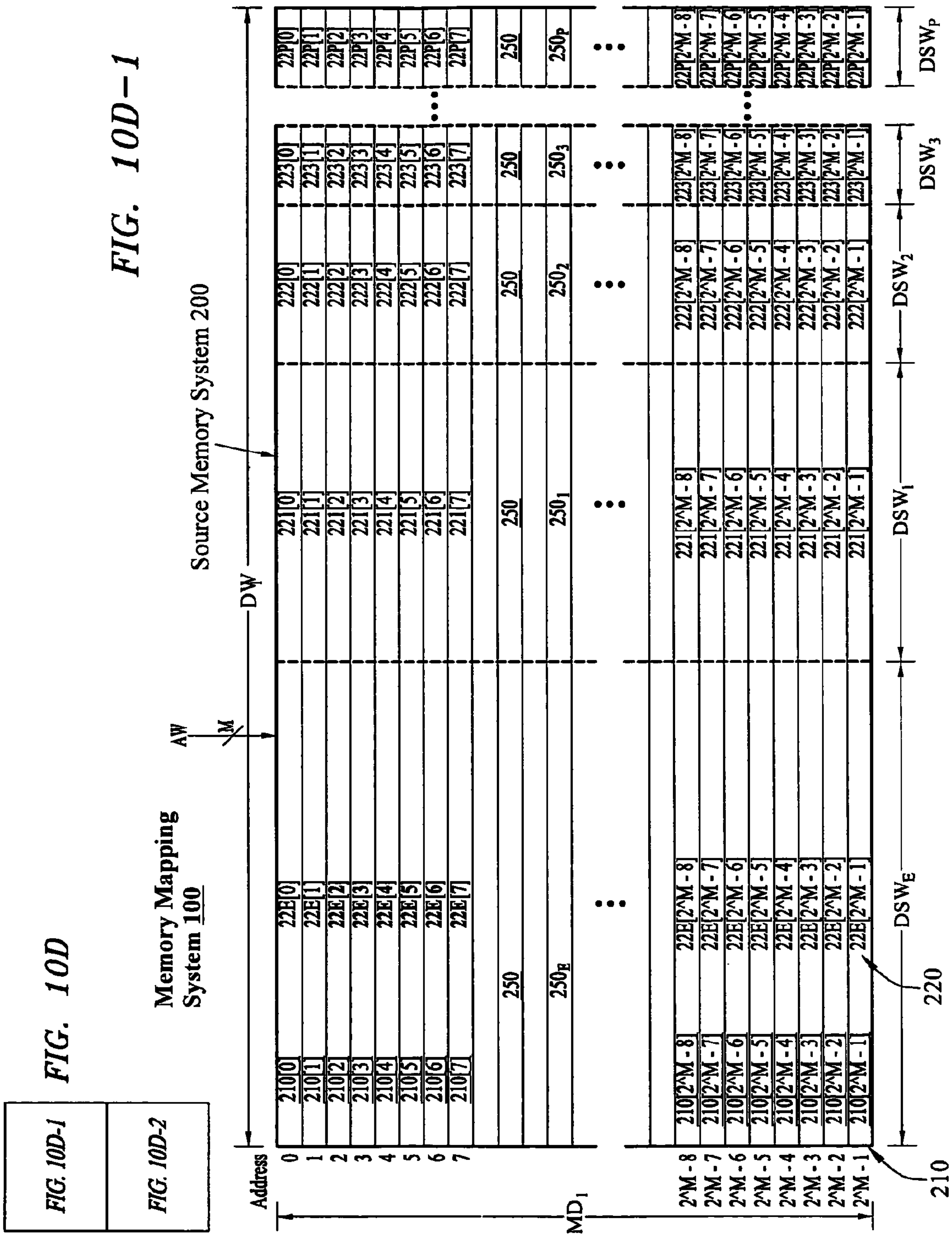
Figures 2, 10D:
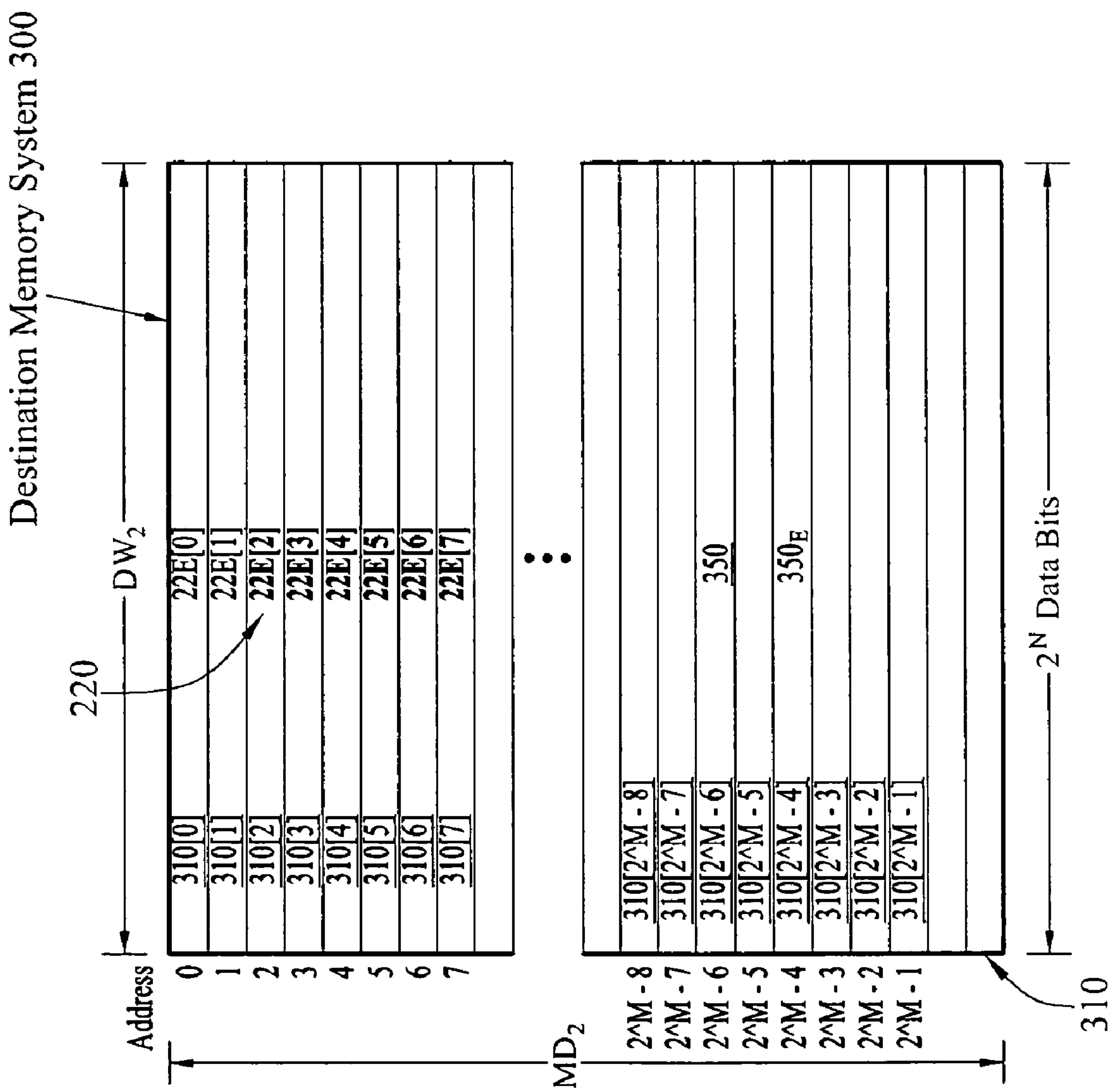

The extended register content portion 22E[1] of the extended memory sub-region $250_E$, in turn, is shown in FIG. 10C as being associated with the source memory address $A_1$ having a value of one ("1") and likewise can be selected for mapping into a preselected destination memory register 310 within the destination memory system 300. The extended register content portion 22E[1] is illustrated as being mapped in its entirety into the destination memory register 310[$A_2$] with a destination memory address $A_2$ having a value of one ("1"). Extended register content portions 22E[2], 22E[3], 22E[4], . . . , 22E[7] likewise can be selected for mapping and respectively mapped in their entireties into the destination memory registers 310[2], 310[3], 310[4], . . . , 310[7] as illustrated in FIG. 10D.

Figures 1, 10E:
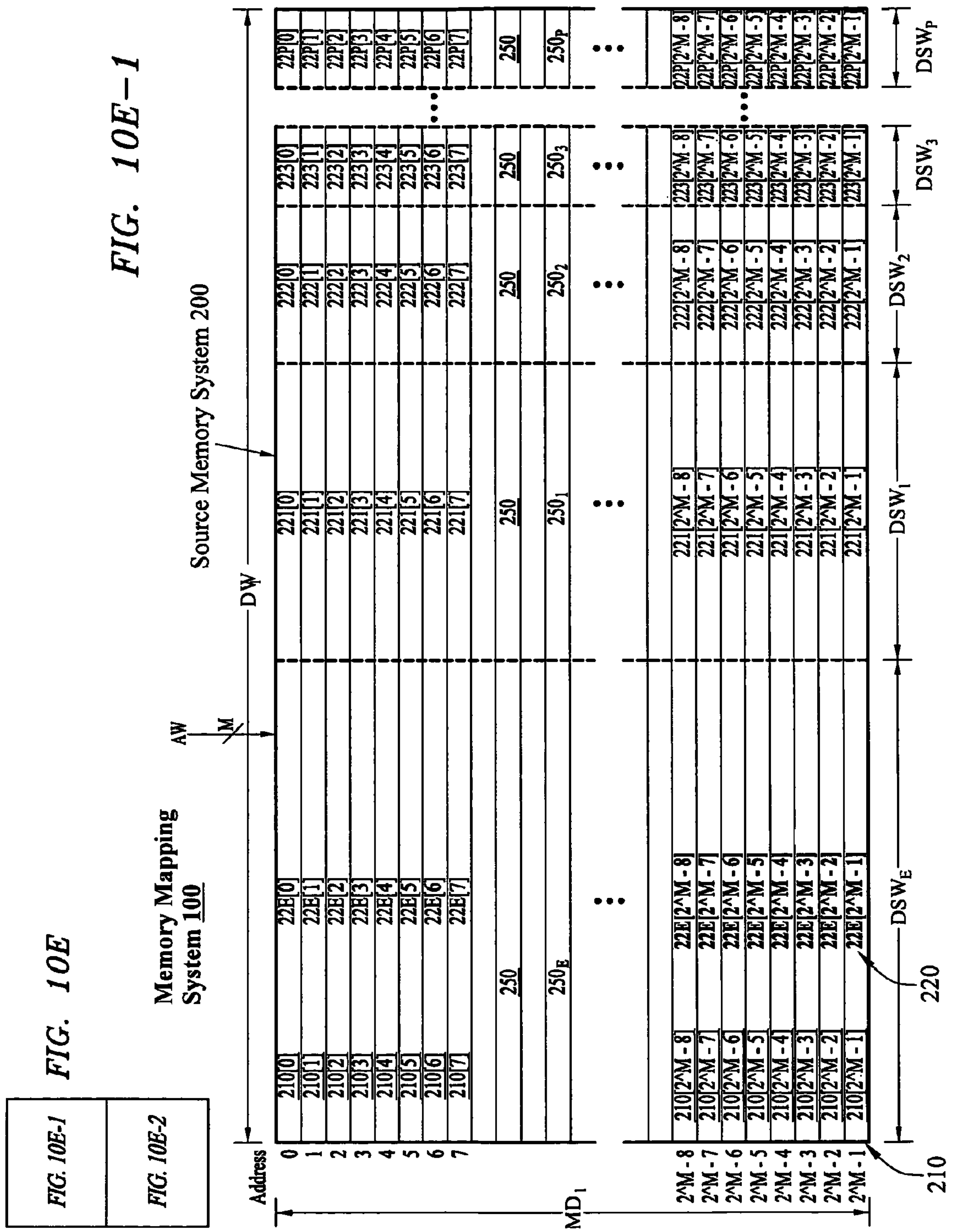
Figures 2, 10E:
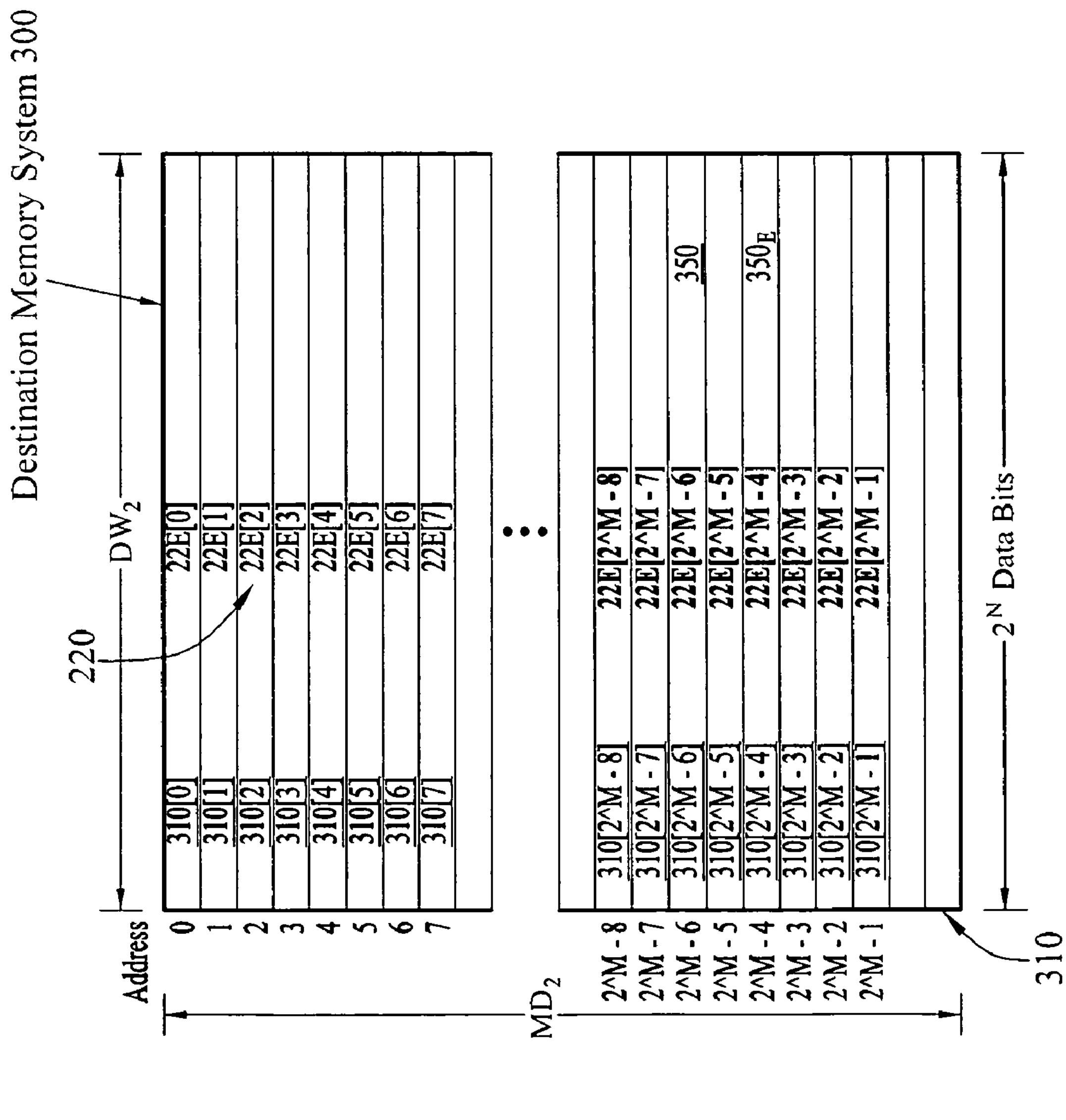

The mapping of the remaining extended register content portions 22E of the extended memory sub-region $250_E$ can proceed in a similar manner. Turning to FIG. 10E, extended register content portions 22E[$2^M$−8], 22E[$2^M$−7], 22E[$2^M$−6], . . . , 22E[$2^M$−1] are shown as being selected for mapping and as being respectively mapped in their entireties into the destination memory registers 310[$2^M$−8], 310[$2^M$−7], 310[$2^M$−6], . . . , 310[$2^M$−1]. The remaining register content portions 221, 222, 223, . . . , 22P from each respective memory sub-region $250_1$, $250_2$, $250_3$, . . . , $250_P$ can be respectively disposed within the destination memory system 300 in the manner set forth in more detail above with reference to FIGS. 4A-F, 5A-F, 6A-C, and 7A-B. Accordingly, the source memory registers 210 of the source memory system 200 can be mapped in a side-by-side manner across the destination memory registers 310 of the destination memory system 300 without a loss of valuable memory space in the destination memory system 300 even when the source data width $DW_1$ of the source memory system 200 is greater than or equal to the destination data width $DW_2$ of the destination memory system 300. Although shown and described as comprising the most significant bits of the memory contents 220 for purposes of illustration only, the exemplary extended memory sub-region $250_E$ can comprise any predetermined data bits of the memory contents 220 within each source memory register 210 of the source memory system 200.

Figure 11A:
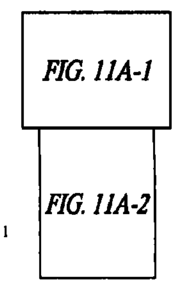
FIGS. 11A-J is a detail drawing illustrating an alternative embodiment of the memory mapping method of FIG. 2B, wherein the memory mapping method maps an exemplary 32×27 source memory system into a 53×16 destination memory system.
Figures 2, 11A:
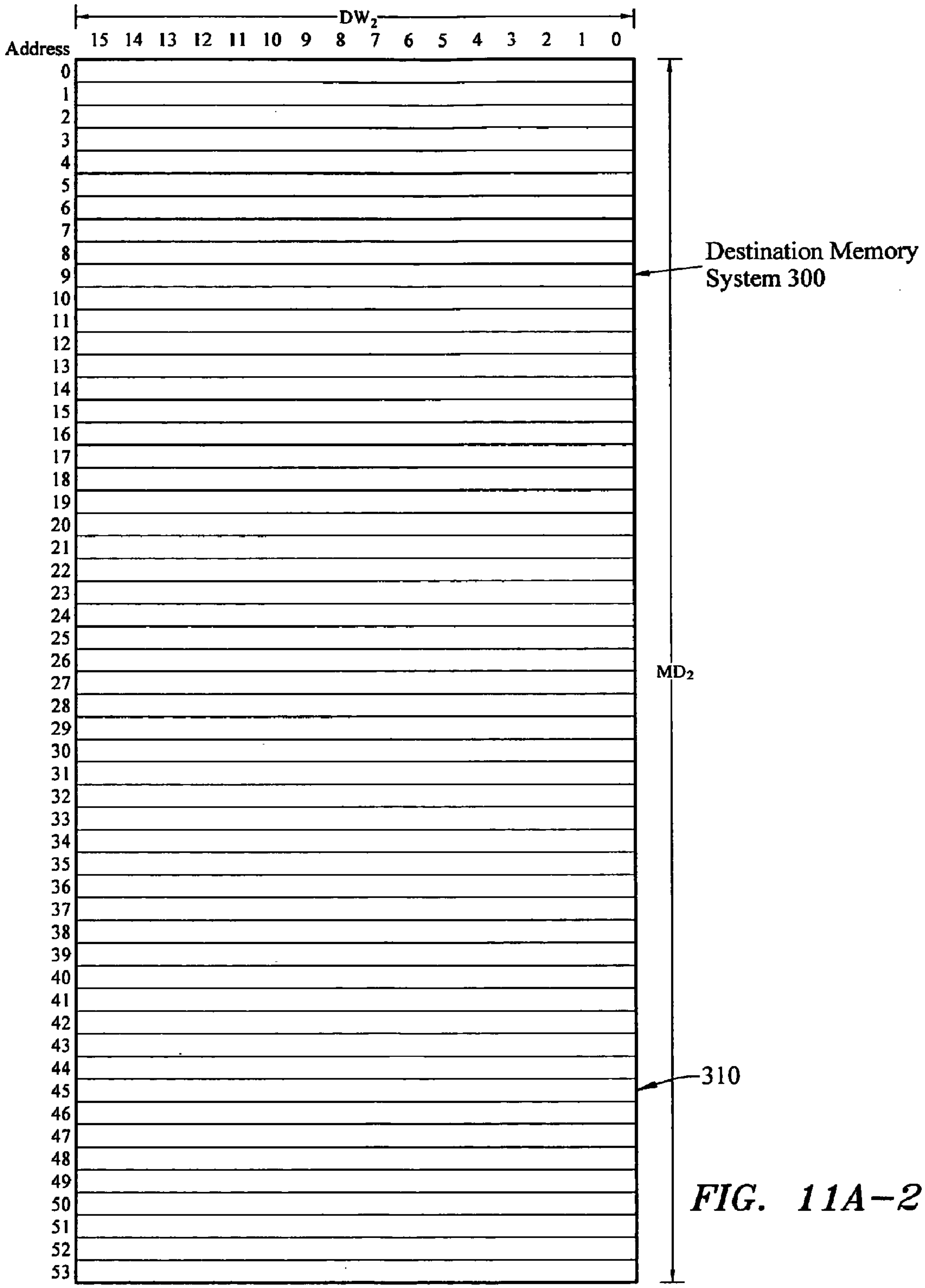

Another specific example for illustrating the operation of the memory mapping system 100 will be shown and described with reference to FIGS. 11A-J. As with the example shown and described with reference to FIGS. 9A-L, the present example is provided for purposes of illustration only and not for purposes of limitation. Turning to FIG. 11A, the source memory system 200 is shown as being provided as a 32×27 source memory system. In other words, the exemplary source memory system 200 includes a source memory depth $MD_1$ that comprises at least thirty-two source memory registers 210 each having a twenty-seven data bit source data width $DW_1$. The source memory system 200 thereby includes five or more address lines AW (shown in FIG. 4A). As illustrated in FIG. 11A, the source memory registers 210 are associated with source memory addresses 0 through 31, inclusive. The destination memory system 300 is shown as comprising a 54×16 destination memory system. The exemplary destination memory system 300 thereby includes a destination memory depth $MD_2$ that comprises at least fifty-four destination memory registers 310 each having a sixteen data bit destination data width $DW_2$. The destination memory registers 310 of FIG. 11A are associated with destination memory addresses 0 through 53, inclusive.

Here, the sixteen data bit destination data width $DW_2$ of the destination memory system 300 is less than the twenty-seven data bit source data width $DW_1$ of the source memory system 200. In the manner set forth in more detail above with reference to Equation 2 and FIG. 3A, the twenty-seven data bit source data width $DW_1$ can be factorized in terms of the sixteen data bit destination data width $DW_2$ in accordance with Equation 21 below.

$$DW_1 = f_0*16 + f_1*8 + f_2*4 + f_3*2 + f_4*1 \quad \text{(Equation 21)}$$

Figures 1, 11B:
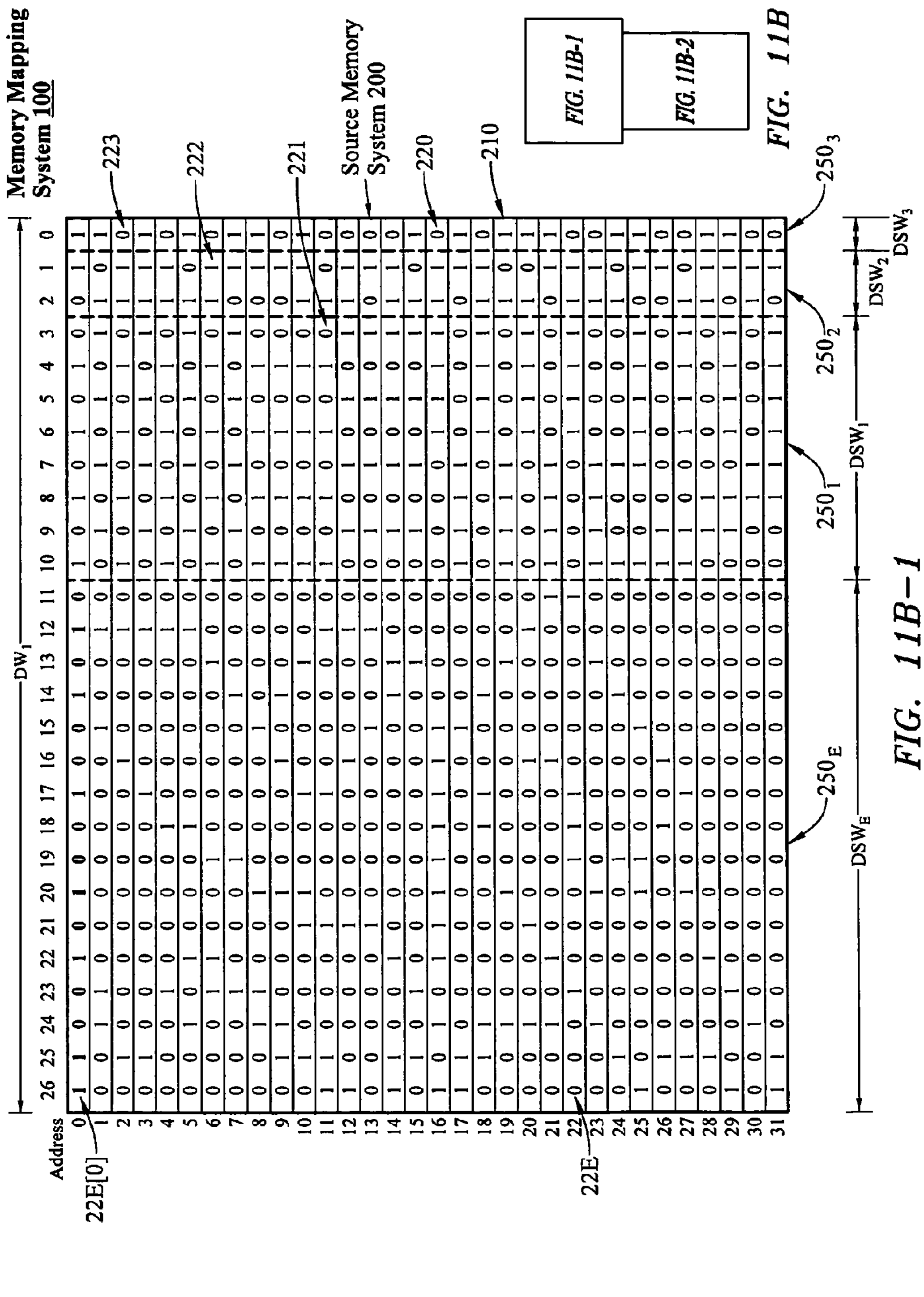
Figures 2, 11B:
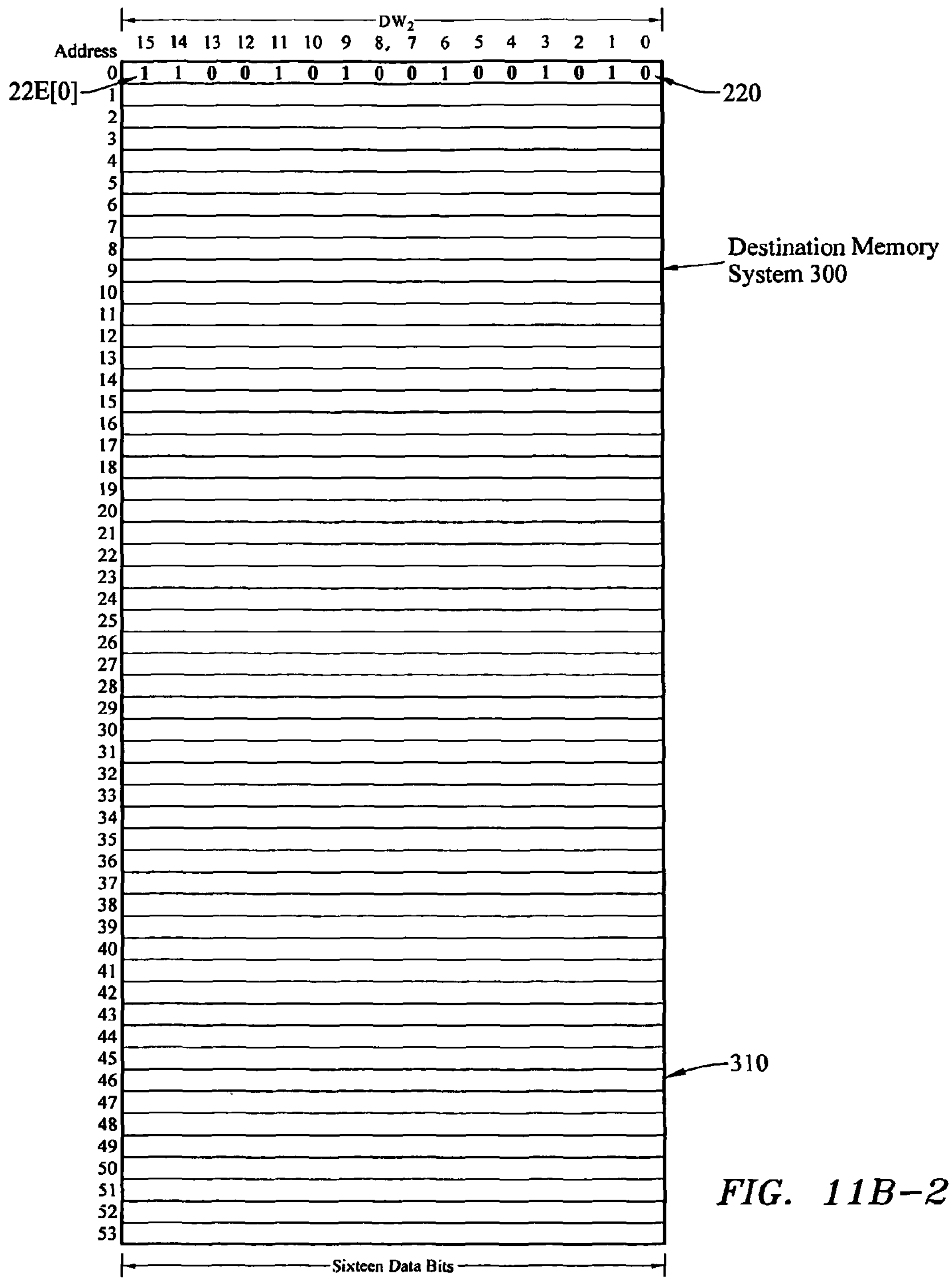

Since the exemplary source data width $DW_1$ comprises twenty-seven data bits, the factor $f_0$ is equal to a value of one ("1"). Each of the factors $f_1$, $f_3$, and $f_4$ in Equation 21 is equal to the binary value of one ("1"); whereas, the factor $f_2$ is equal to the binary value of zero ("0"). Equation 21 thereby factorizes the source data width $DW_1$ of the source memory system 200 into a summation of four data sub-widths $DSW_E$, $DSW_1$, $DSW_2$, $DSW_3$ with respective values of sixteen data bits, eight data bits, two data bits, and one data bit as illustrated in FIG. 11B. Based upon the data sub-widths $DSW_E$, $DSW_1$, $DSW_2$, $DSW_3$, the source memory system 200 can be partitioned (and/or divided) to form four source memory sub-regions $250_E$, $250_1$, $250_2$, $250_3$, and the memory contents 220 stored in a selected source memory register 210 of the source memory system 200 can be partitioned to form four register content portions 22E, 221, 222, 223 in the manner discussed in more detail above.

As illustrated in FIG. 11B, the source memory system 200 includes one memory sub-region $250_E$. The extended memory sub-region $250_E$ includes a sub-region depth that is equal to the thirty-two register source memory depth $MD_1$ (shown in FIG. 11A) and a sub-region data width that is equal to the sixteen-bit destination data width $DW_2$ of the destination memory system 300. The extended register content portions 22E associated with the extended memory sub-region $250_E$ thereby comprise the sixteen most significant bits of the memory contents 220 within each source memory register 210 of the source memory system 200. In other words, data bits 26, 25, 24, . . . , 11 within each source memory register 210 form the register content portion 22E.

Each of the memory sub-regions $250_1$, $250_2$, $250_3$ likewise have sub-region depths that are equal to the thirty-two register source memory depth $MD_1$. In the manner set forth above, the memory sub-region $250_1$ has a sub-region data width that is equal to the data sub-width $DSW_1$ of eight data bits. The memory sub-region $250_2$ has a sub-region data width that is equal to the data sub-width $DSW_2$ of two data bits, and the memory sub-region $250_3$ has a sub-region data width that is equal to the data sub-width $DSW_3$ of one data bit. Stated somewhat differently, the register content portion 221 comprises data bits 10, 9, 8, . . . , 3 within each source memory register 210; whereas, the register content portions 222, 223 include data bits 2, 1 and data bit 0, respectively, within each source memory register 210. The register content portions 221 associated with the memory sub-region $250_1$ thereby comprise the eight most significant remaining data bits of the source memory registers 210 when the sixteen most significant bits associated with the extended memory sub-region $250_E$ are not considered (and/or are ignored). Similarly, the register content portions 223 associated with the memory sub-region $250_3$ comprise the least significant data bit of the each source memory register 210, and the register content portions 222 associated with the memory sub-region $250_2$ comprise the least significant remaining data bits of the source memory registers 210 when the least significant bit associated with the memory sub-region $250_3$ is not considered (and/or is ignored)

Figure 11C:
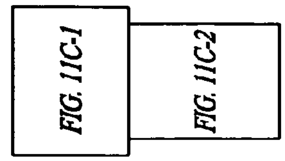
Figures 1, 11C:
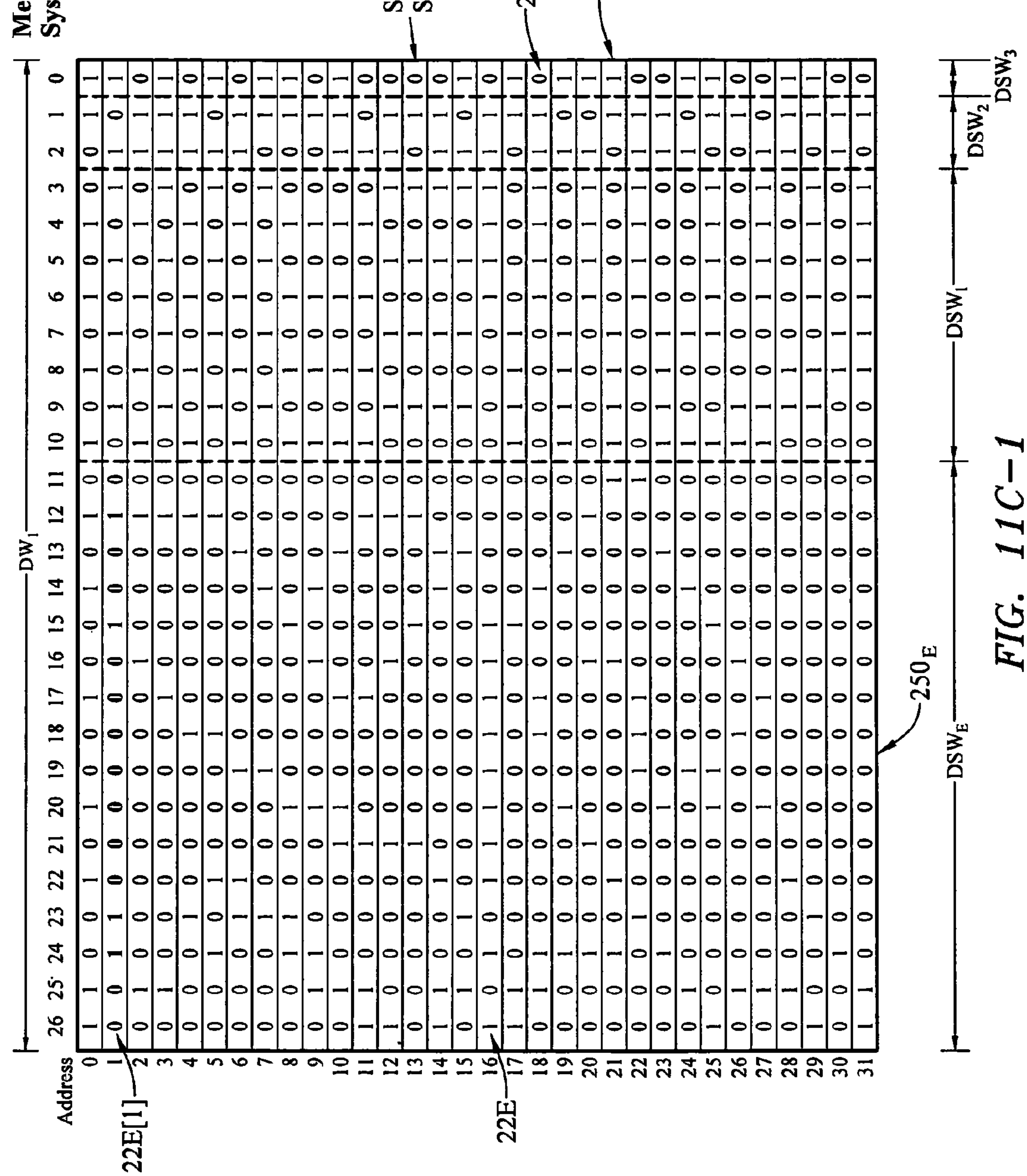
Figures 2, 11C:
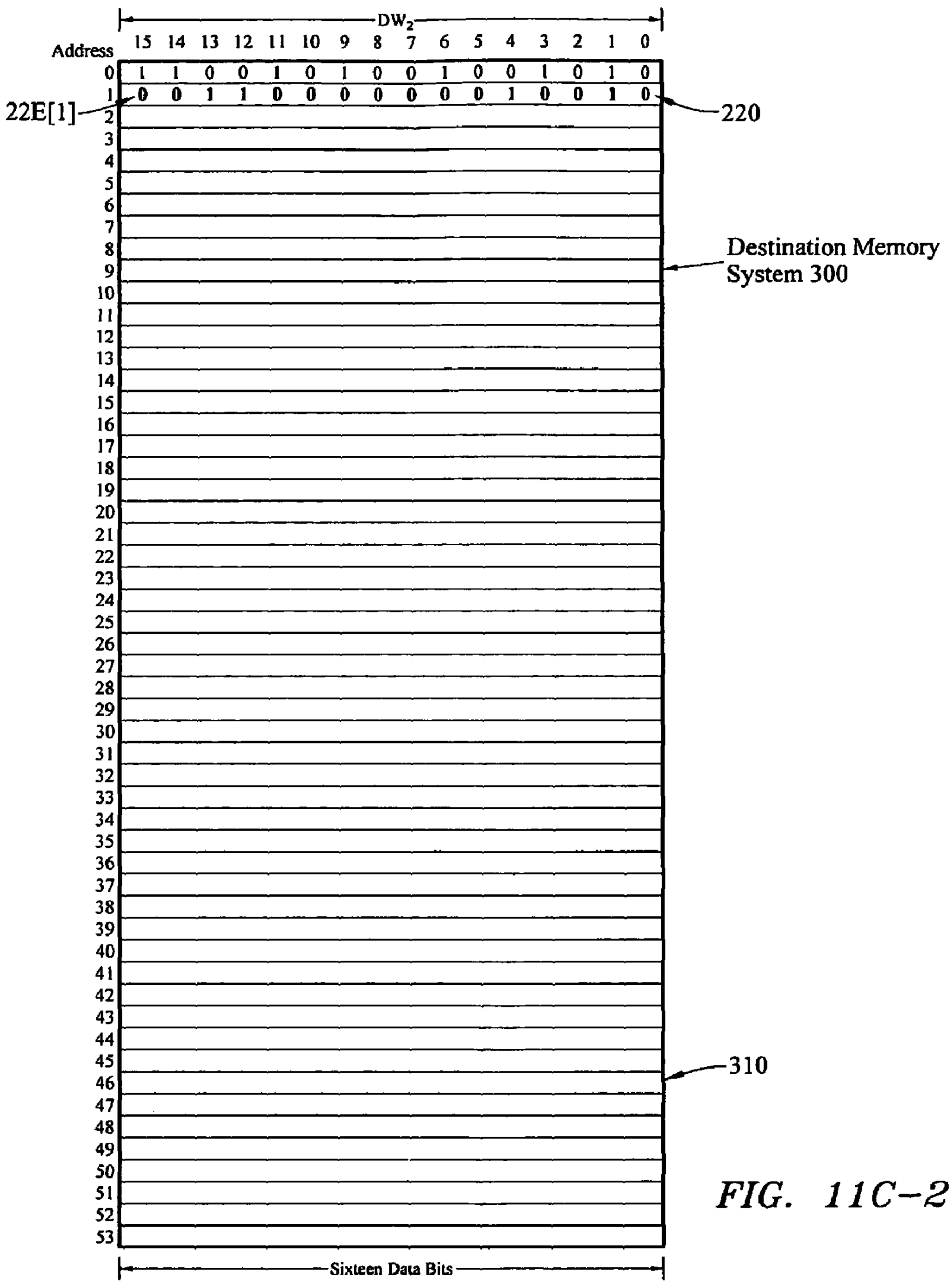
Figure 11D:
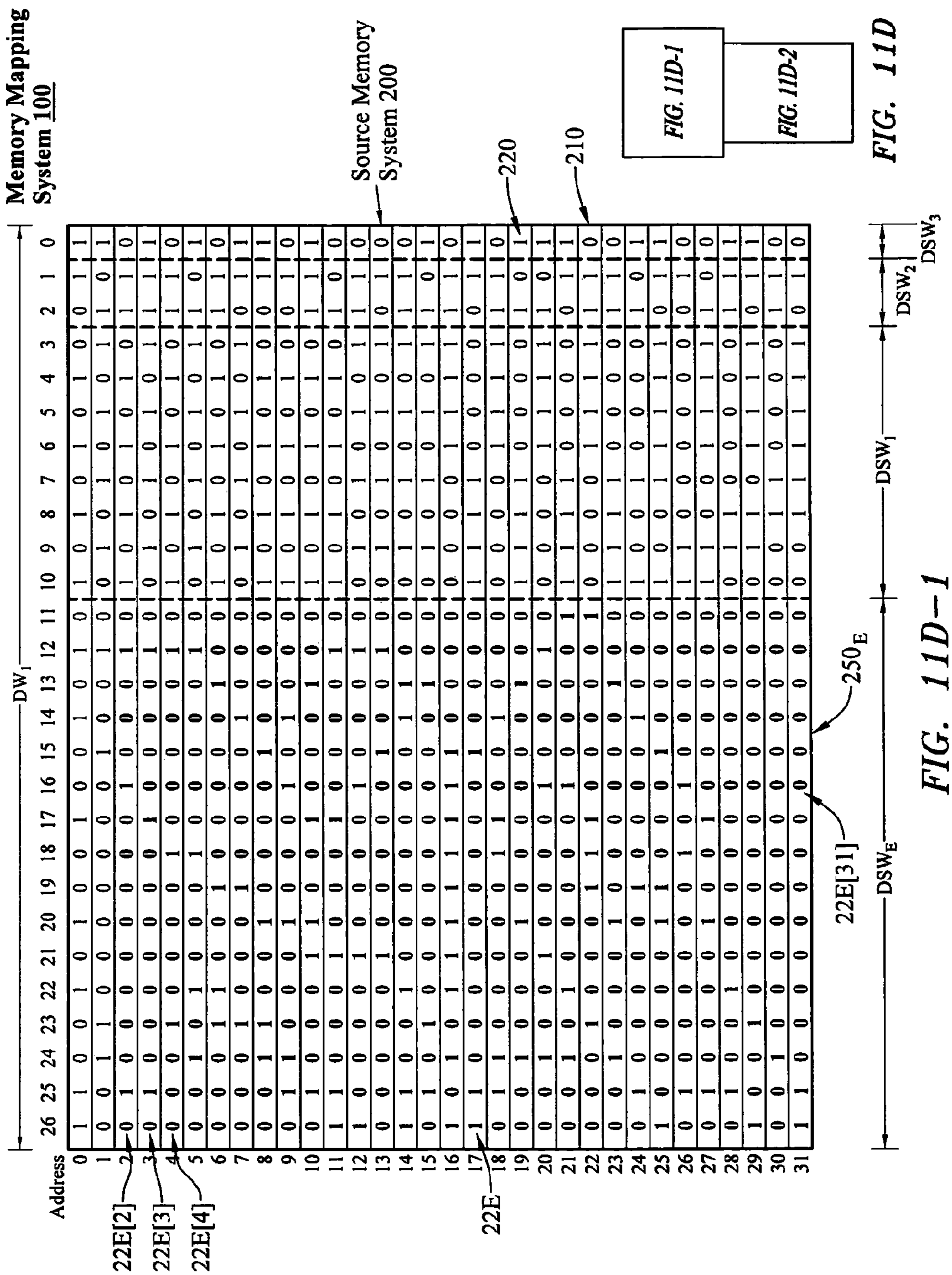

Mapping of the extended register content portions 22E within the extended memory sub-region $250_E$ is illustrated in FIGS. 11B-D. The extended register content portions 22E are mapped into the destination memory system 300 in the manner set forth in more detail with reference to FIGS. 10A-E. FIG. 11B shows that the extended register content portion 22E[0] is selected for mapping into the destination memory system 300. The extended register content portion 22E[0] is mapped in its entirety to destination memory register 310[0]. More specifically, the data bits 26, 25, 24, . . . , 11 within the source memory register 210[0] can be selected as shown in FIG. 11B. When mapped into the destination memory system 300, the data bit 26 of the source memory register 210[0] is disposed within the data bit 15 of the destination memory register 310[0]; whereas, the data bit 25 of the source memory register 210[0] is disposed within the data bit 14 of the destination memory register 310[0]. The data bits 24, 23, 22, . . . , 11 within the source memory register 210[0] likewise are respectively disposed within data bits 13, 12, 11, . . . , 0 within the destination memory register 310[0] as illustrated in FIG. 11B. The data bits 26, 25, 24, . . . , 11 within the source memory register 210[0] thereby are respectively disposed within data bits 15, 14, 13, . . . , 0 within the destination memory register 310[0] as illustrated in FIG. 9B.

The extended register content portion 22E[1] likewise can be selected for mapping into the destination memory system 300 in FIG. 11C. In the manner set forth in more detail above, the register content portion 22E[1] is disposed in its entirety within the sixteen-bit destination memory register 310[1]. More specifically, the data bits 26, 25, 24, . . . , 11 within the source memory register 210[1] are selected. As shown in FIG. 11C, the data bits 26, 25, 24, . . . , 11 within the source memory register 210[1] are respectively disposed within data bits 15, 14, 13, . . . , 0 within the destination memory register 310[1].

Turning to FIG. 11D, the remaining register content portions 22E[2], 22E[3], 22E[4], . . . , 22E[31] within the extended memory sub-region $250_E$ each are selected for mapping into the destination memory system 300. The register content portion 22E[2], for example, is disposed in its entirety within the sixteen-bit destination memory register 310[2]; whereas, the register content portion 22E[3] is disposed in its entirety within the sixteen-bit destination memory register 310[3]. The mapping of the remaining register content portions 22E of the source memory sub-region $250_E$ can proceed in a similar manner. The register content portion 22E[31] is disposed in its entirety within the sixteen-bit destination memory register 310[15]. Each register content portion 22E[0]-22E[31] of the source memory sub-region $250_E$ thereby respectively is mapped into the destination memory registers 310[0]-310[31] without a loss of valuable memory space in the destination memory system 300 as illustrated in FIG. 11D.

Figures 1, 11E:
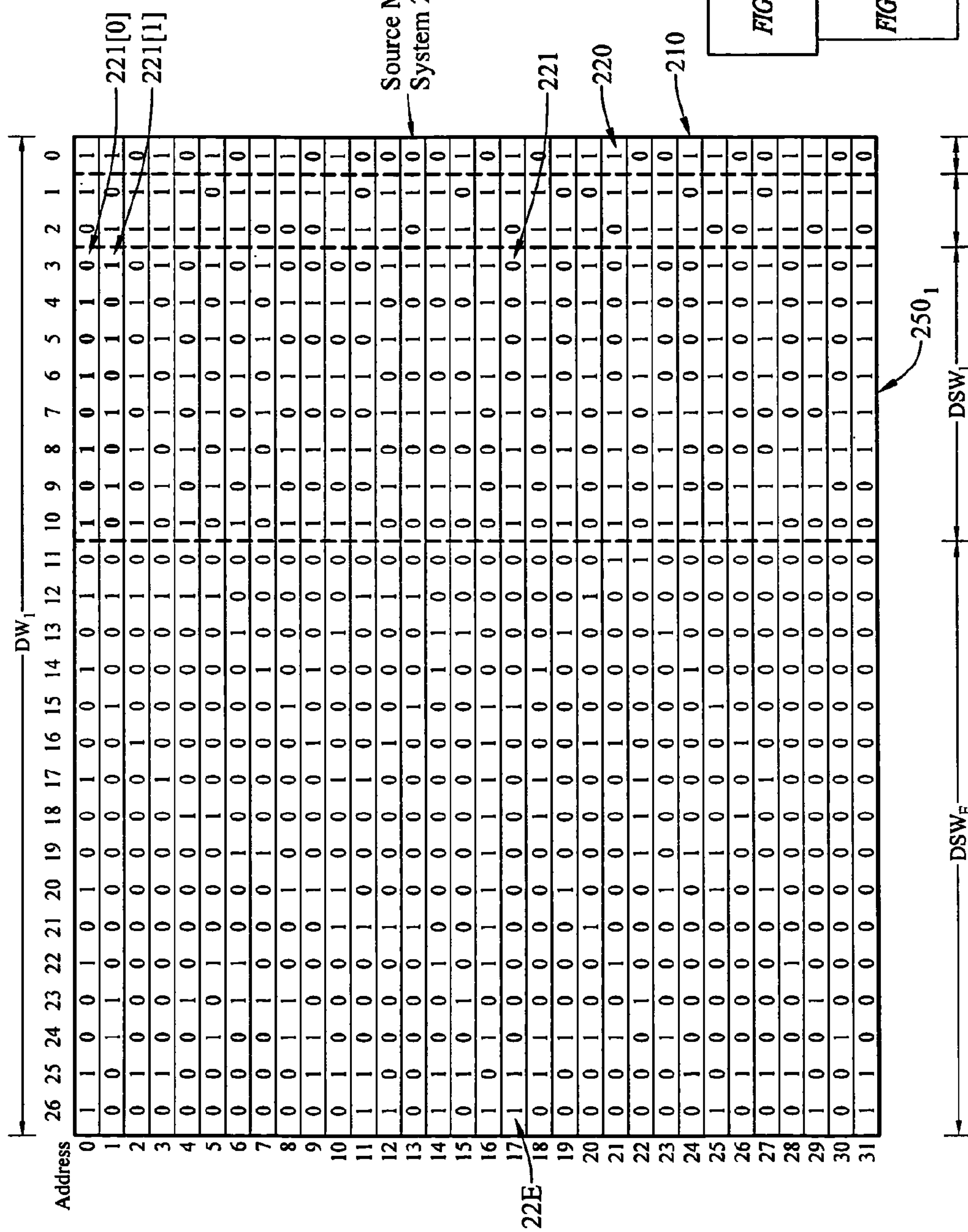
Figure 11E:
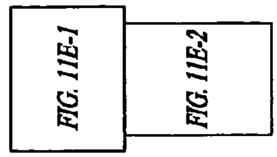
Figures 1, 11F:
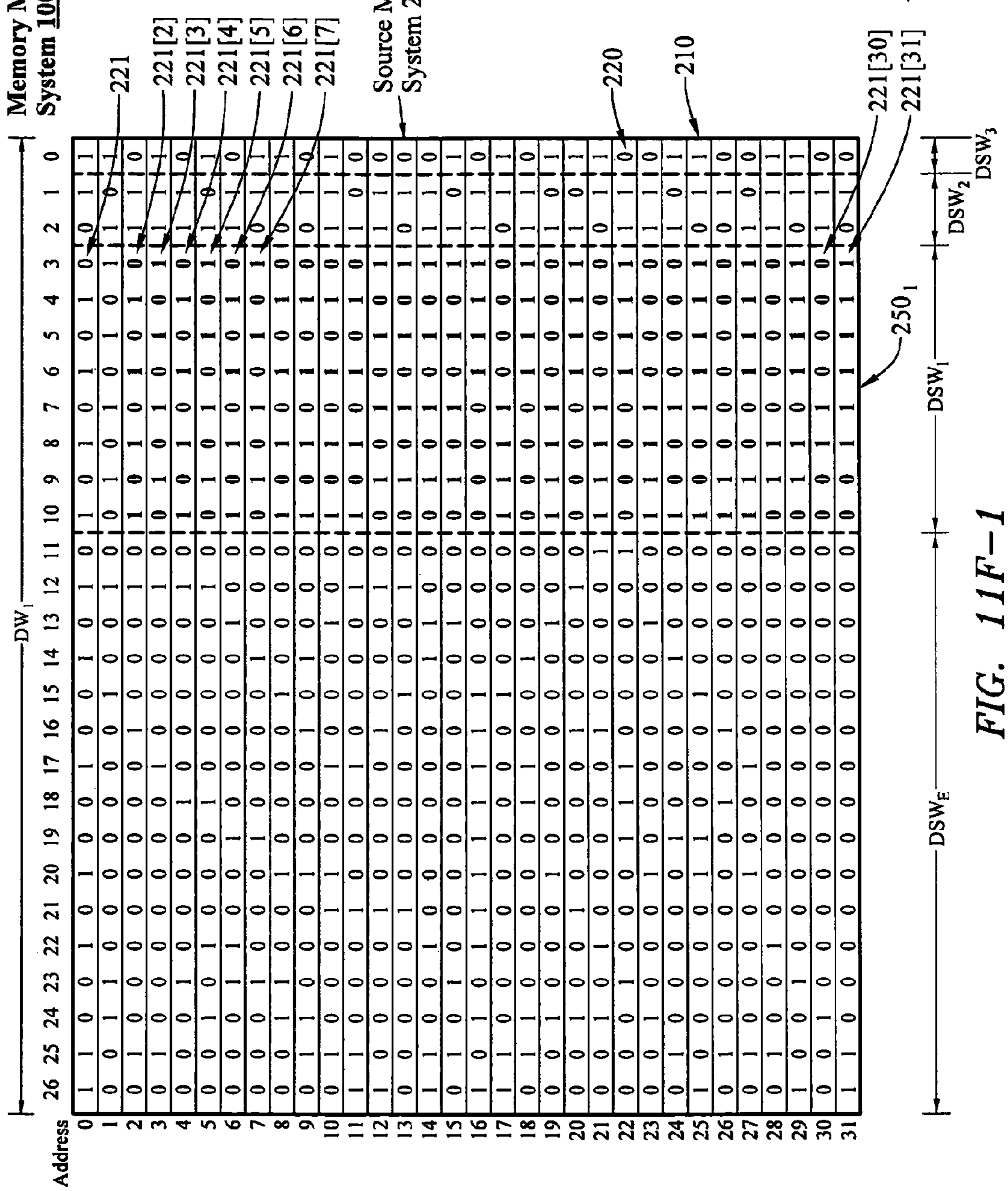
Figure 11F:
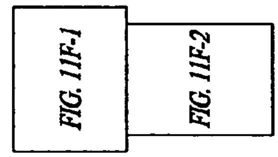

Mapping of the register content portions 221 within the memory sub-region $250_1$ is illustrated in FIGS. 11E-F. The register content portions 221 are mapped into the destination memory system 300 in the manner set forth in more detail with reference to Equations 6 and 7 and FIGS. 4A-F. FIG. 11E shows the register content portions 221[0], 221[1] as being selected for mapping into the destination memory system 300. In accordance with Equation 6, the register content portions 221[0], 221[1] each are mapped to destination memory register 310[32] when Equation 6 includes an destination address offset of thirty-two to take into account destination memory registers 310[0]-310[31] into which the register content portions 22E of the extended memory sub-region $250_E$ Equation 7 identifies eight-bit destination register portions $350_0$, $350_1$ of the destination memory register 310[32] into which the register content portions 221[0], 221[1] can be respectively disposed. In accordance with Equation 7, the register content portion 221[0] is disposed within the eight-bit destination register portion $350_0$ of the destination memory register 310[32]; whereas, the register content portion 221[1] is disposed within the eight-bit destination register portion $350_1$ of the destination memory register 310[32].

More specifically, the data bits 10, 9, 8, . . . , 3 within the source memory register 210[0] and the data bits 10, 9, 8, . . . , 3 within the source memory register 210[1] can be selected as shown in FIG. 1*l* E. When mapped into the destination memory system 300, the data bit 10 of the source memory register 210[0] is disposed within the data bit 15 of the destination memory register 310[32]; whereas, the data bit 9 of the source memory register 210[32] is disposed within the data bit 14 of the destination memory register 310[32]. The data bits 10, 9, 8, . . . , 3 within the source memory register 210[0] thereby are respectively disposed within data bits 15, 14, 13, . . . , 8 within the destination memory register 310[32] as illustrated in FIG. 1*l* E. Similarly, data bits 10, 9, 8, . . . , 3 within the source memory register 210[1] are respectively disposed within data bits 7, 6, 5, 4, . . . , 0 within the destination memory register 310[32]. The register content portions 221[0], 221[1] thereby are mapped in a side-by-side manner across the destination memory register 310[32].

Turning to FIG. 11F, the remaining register content portions 221[2], 221[3], 221[4], . . . , 221[31] within the memory sub-region $250_1$ each are selected for mapping into the destination memory system 300. The register content portions 221[2], 221[3], for example, can be selected for mapping into the destination memory system 300. In accordance with Equations 6 and 7, the register content portion 221[2] is disposed within the eight-bit destination register portion $350_0$ of the destination memory register 310[33]; whereas, the register content portion 221[3] is disposed within the eight-bit destination register portion $350_1$ of the destination memory register 310[33]. More specifically, the data bits 10, 9, 8, . . . , 3 within the source memory register 210[2] and the data bits 10, 9, 8, . . . , 3 within the source memory register 210[3] are selected. As shown in FIG. 11F, the data bits 10, 9, 8, . . . , 3 within the source memory register 210[2] thereby are respectively disposed within data bits 15, 14, 13, . . . , 8 within the destination memory register 310[33], and data bits 10, 9, 8, . . . , 3 within the source memory register 210[3] are respectively disposed within data bits 7, 6, 5, 4, . . . , 0 within the destination memory register 310[33]. The register content portions 221[2], 221[3] thereby are mapped in a side-by-side manner across the destination memory register 310[33].

In accordance with Equations 6 and 7, for example, the register content portion 221[4] likewise can be disposed within the eight-bit destination register portion $350_0$ of the destination memory register 310[34]; whereas, the register content portion 221[5] is disposed within the eight-bit destination register portion $350_1$ of the destination memory register 310[34]. The mapping of the remaining register content portions 221 of the source memory sub-region $\mathbf{250}_1$ can proceed in a similar manner. The register content portion 221[30] is disposed within the eight-bit destination register portion $\mathbf{350}_0$ of the destination memory register 310[47]; whereas, the register content portion 221[31] is disposed within the eight-bit destination register portion $\mathbf{350}_1$ of the destination memory register 310[47]. Each register content portion 221 of the source memory sub-region $\mathbf{250}_1$ thereby is mapped in a side-by-side manner across the destination memory registers 310[32]-310[47] without a loss of valuable memory space in the destination memory system 300 as illustrated in FIG. 11F.

Figure 11G:
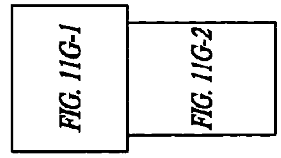
Figures 1, 11G:
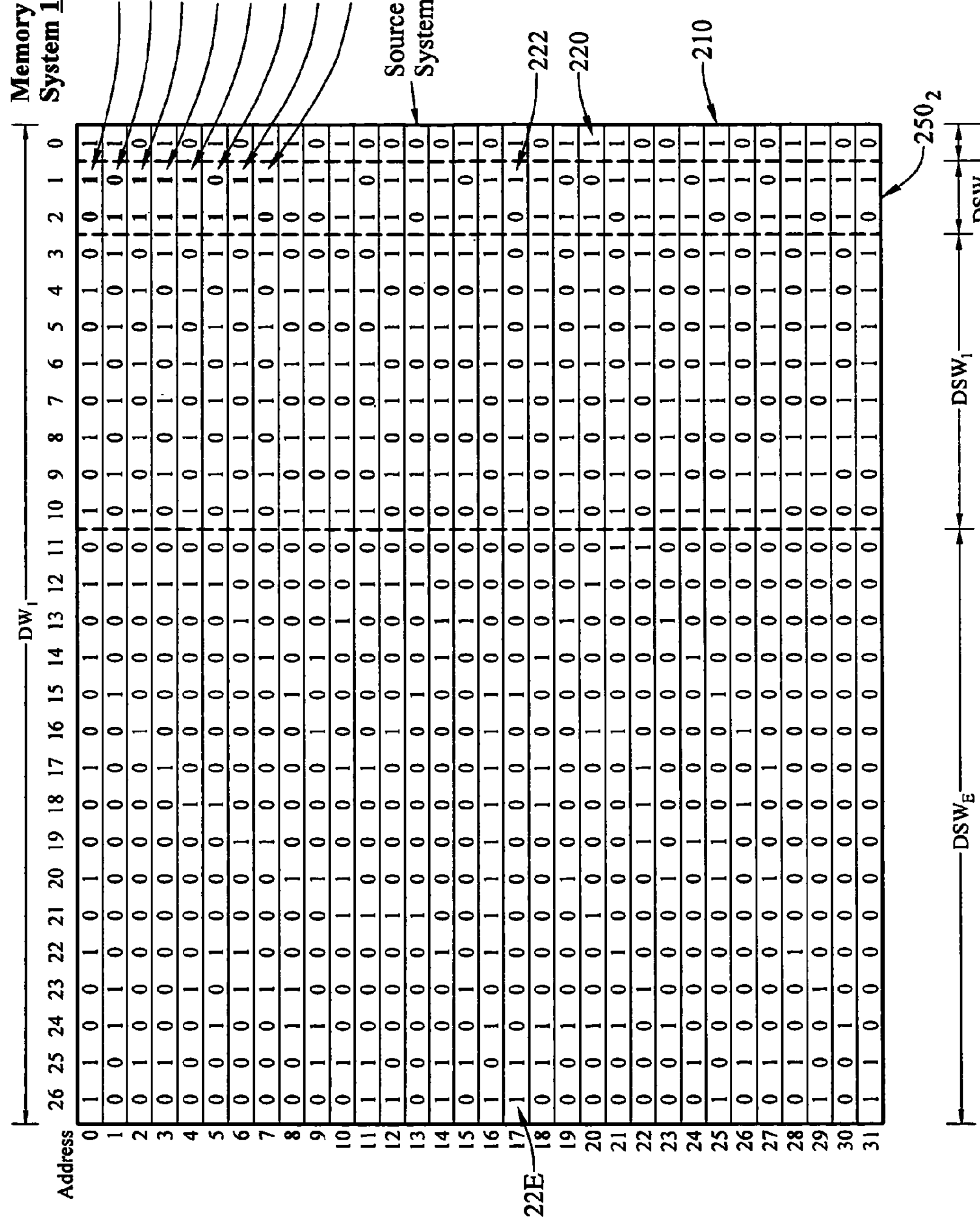
Figures 1, 11H:
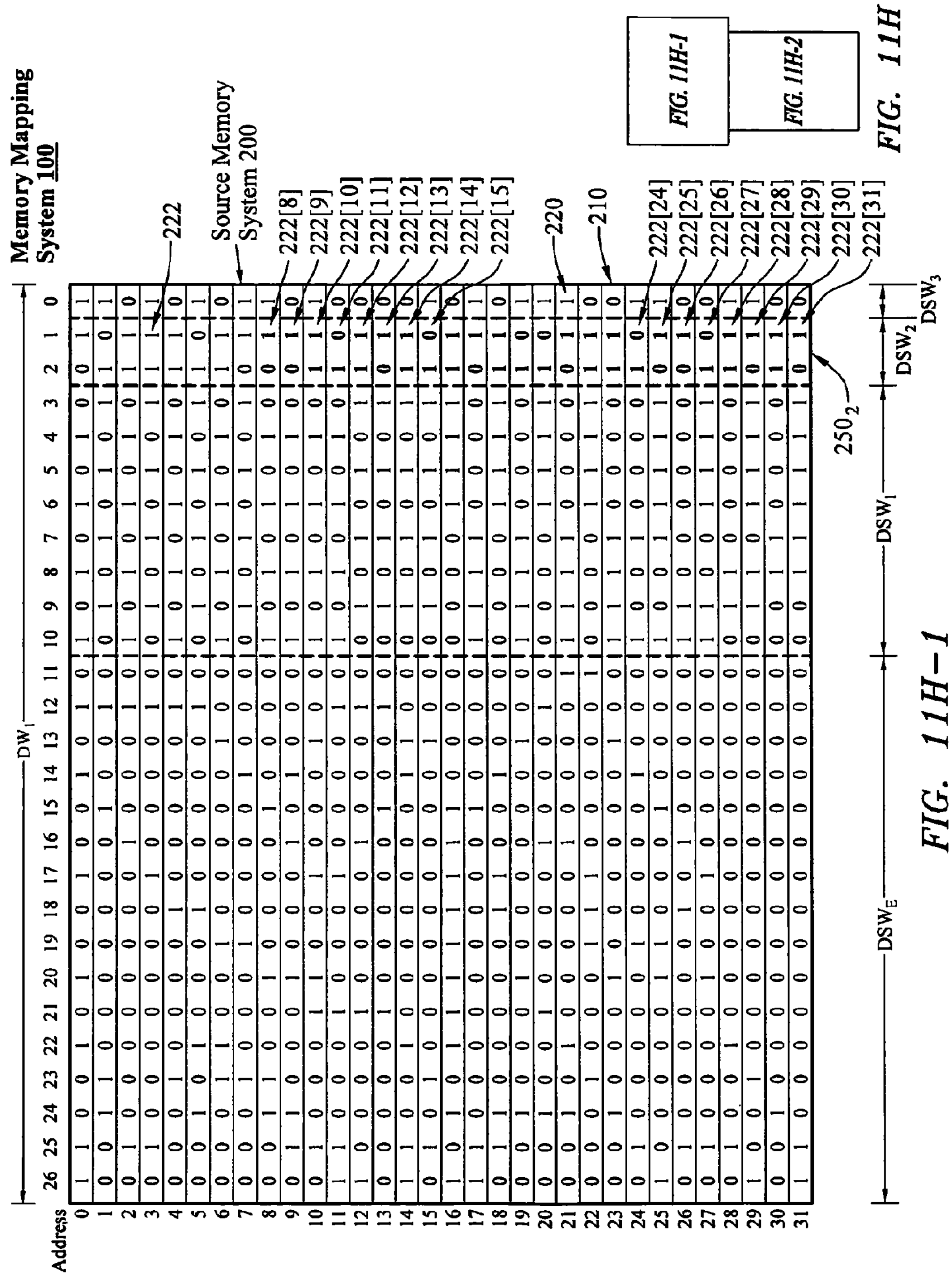
Figures 2, 11H:
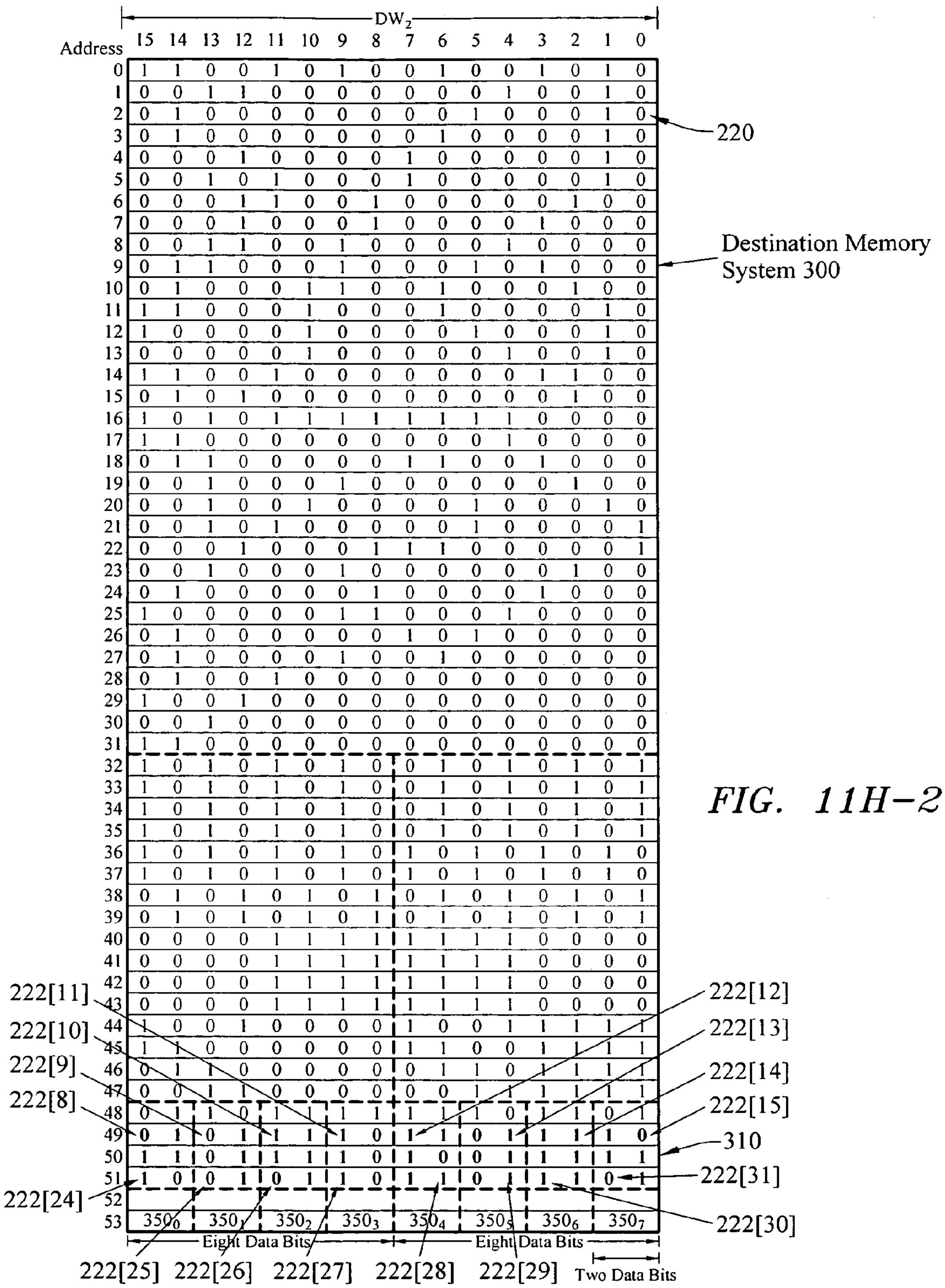

Since the factorization of the exemplary source memory system 200 of FIG. 11A did not include any four-bit data sub-widths DSW, mapping of the source memory system 200 into the destination memory system 300 can proceed with the two-bit register content portions 222 associated with the two-bit data sub-width $DSW_1$. Mapping of the register content portions 222 within the memory sub-region $\mathbf{250}_2$ is illustrated in FIGS. 11G-H. The register content portions 222 are mapped into the destination memory system 300 in the manner set forth in more detail with reference to Equations 6 and 7 and FIGS. 6A-C. FIG. 11G shows that the register content portions 222[0], 222[1], 222[2], . . . , 222[7] are selected for mapping into the destination memory system 300. In accordance with Equation 6, the register content portions 222[0], 222[1], 222[2], . . . , 222[7] each can be mapped to destination memory register 310[48] when Equation 6 includes an destination address offset of forty-eight to take into account destination memory registers 310[0]-310[31] into which the register content portions 22E of the extended memory sub-region $\mathbf{250}_E$ are mapped and destination memory registers 310[32]-310[47] into which the register content portions 221 of the source memory sub-region $\mathbf{250}_1$ are mapped.

Equation 7 identifies two-bit destination register portions $\mathbf{350}_0$, $\mathbf{350}_1$, $\mathbf{350}_2$, . . . , $\mathbf{350}_7$ of the destination memory register 310[48] into which the register content portions 222[0], 222[$A_1$], 222[2], . . . , 222[7] can be respectively disposed. In accordance with Equation 7, the register content portion 222[0] is disposed within the two-bit destination register portion $\mathbf{350}_0$ of the destination memory register 310[48], and the register content portion 222[1] is disposed within the two-bit destination register portion $\mathbf{350}_1$ of the destination memory register 310[48]. Similarly, the register content portions 222[2], 222[3], 222[4], . . . , 222[7] are respectively disposed within the two-bit destination register portions $\mathbf{350}_2$, $\mathbf{350}_3$, $\mathbf{350}_4$, . . . , $\mathbf{350}_7$ of the destination memory register 310[48].

More specifically, the data bits 2, 1 within the source memory registers 210[0], 210[1], 210[2], . . . , 210[7] can be selected as shown in FIG. 11G. When mapped into the destination memory system 300, the data bit 2 of the source memory register 210[0] is disposed within the data bit 15 of the destination memory register 310[48]; whereas, the data bit 1 of the source memory register 210[0] is disposed within the data bit 14 of the destination memory register 310[48]. The data bits 2, 1 within the source memory register 210[0] thereby are respectively disposed within data bits 15, 14 within the destination memory register 310[48] as illustrated in FIG. 11G. Similarly, data bits 2, 1 within the source memory register 210[1], 210[2], 210[3], . . . , 210[7] are respectively disposed within data bits 13, 12, 11, . . . , 0 within the destination memory register 310[48]. The register content portions 222[0], 222[2], 222[2], . . . , 222[7] thereby are mapped in a side-by-side manner across the destination memory register 310[48].

Turning to FIG. 11H, the remaining register content portions 222[8], 222[9], 222[10], . . . , 222[31] within the memory sub-region $\mathbf{250}_2$ can be selected for mapping into the destination memory system 300. In accordance with Equations 6 and 7, for example, the register content portions 222[8], 222[9], 222[10], . . . , 222[15] are respectively disposed within the two-bit destination register portions $\mathbf{350}_0$, $\mathbf{350}_1$, $\mathbf{350}_2$, . . . , $\mathbf{350}_7$ of the destination memory register 310[49]. The mapping of the remaining register content portions 222 of the source memory sub-region $\mathbf{250}_2$ can proceed in a similar manner. The register content portions 222[24], 222[25], 222[26], . . . , 222[31] are respectively disposed within the two-bit destination register portions $\mathbf{350}_0$, $\mathbf{350}_1$, $\mathbf{350}_2$, . . . , $\mathbf{350}_7$ of the destination memory register 310[51]. Each register content portion 222 of the source memory sub-region $\mathbf{250}_2$ thereby is mapped in a side-by-side manner across the destination memory registers 310[48]-310[51] without a loss of valuable memory space in the destination memory system 300 as illustrated in FIG. 11H.

Figures 1, 11I:
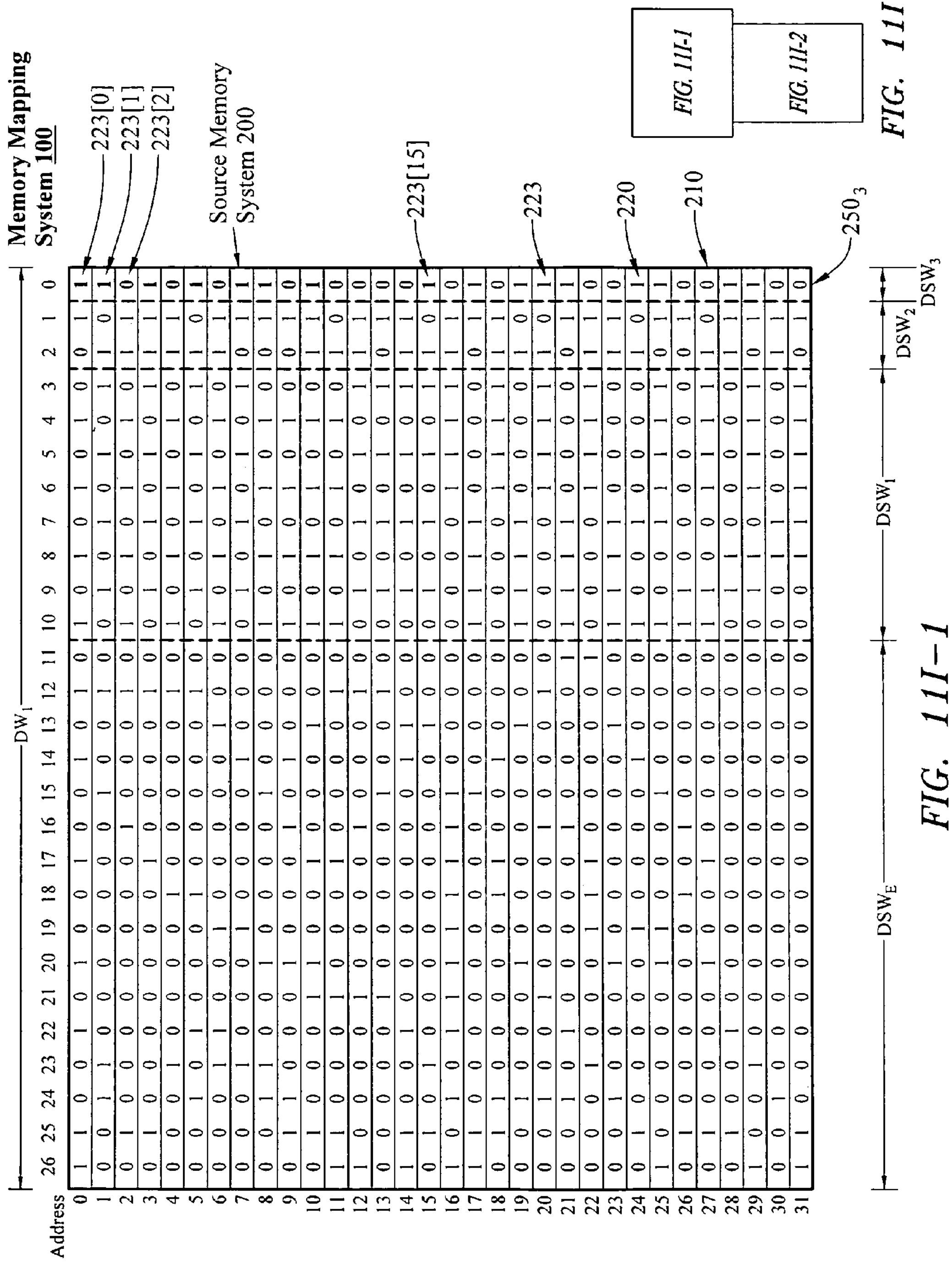
Figures 1, 11J:
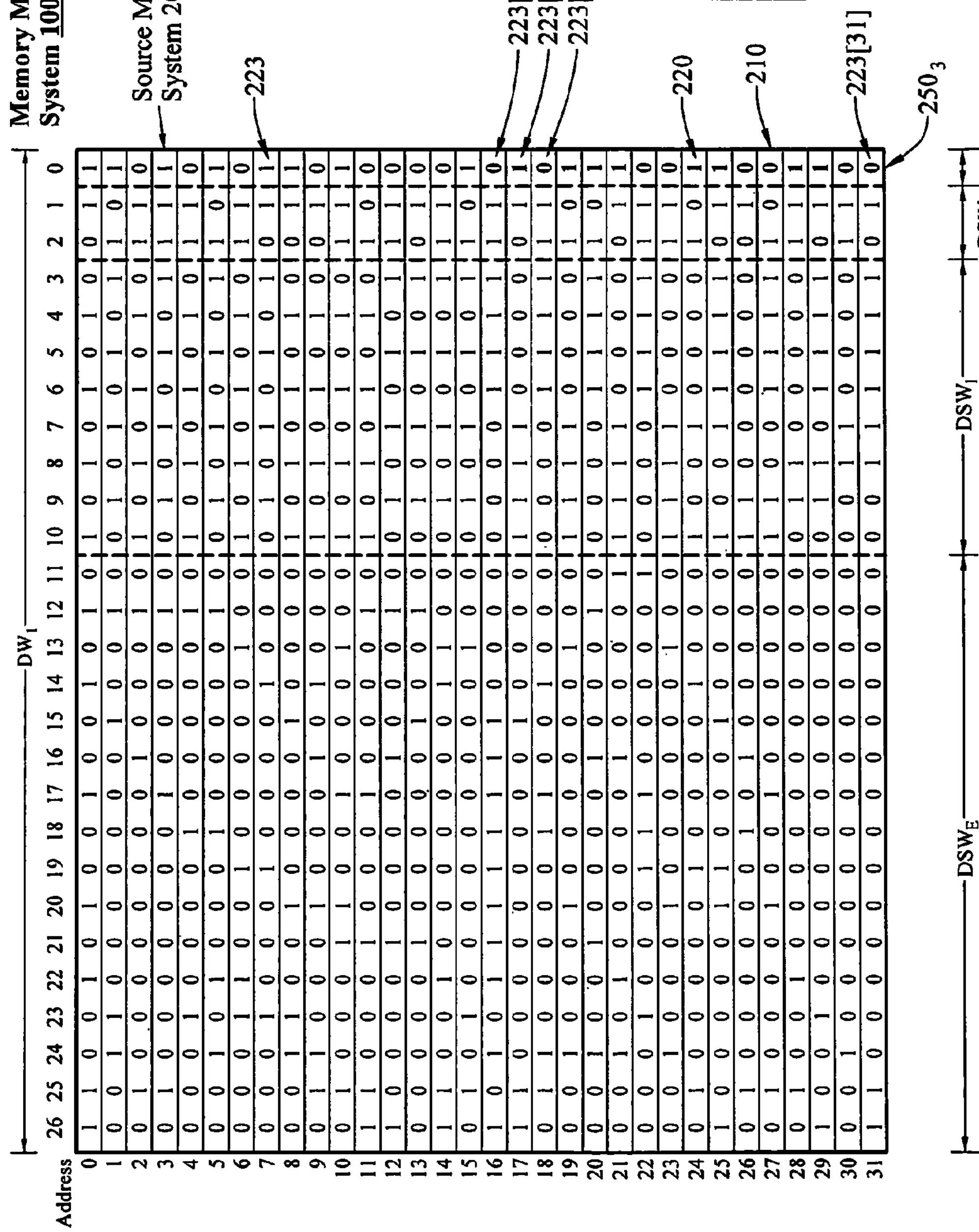
Figure 11J:
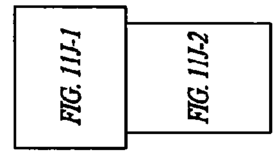

Mapping of the register content portions 223 within the memory sub-region $\mathbf{250}_3$ is illustrated in FIGS. 11I-J. The register content portions 223 are mapped into the destination memory system 300 in the manner set forth in more detail with reference to Equations 6 and 7 and FIGS. 7A-B. FIG. 11K shows that the register content portions 223[0], 223[1], 223[2], . . . , 223[15] are selected for mapping into the destination memory system 300. In accordance with Equation 6, the register content portions 223[0], 223[1], 223[2], . . . , 223[15] each can be mapped to destination memory register 310[52] when Equation 6 includes an destination address offset of fifty-two to take into account destination memory registers 310[0]-310[31] into which the register content portions 22E of the extended memory sub-region $\mathbf{250}_E$ are mapped, destination memory registers 310[32]-310[47] into which the register content portions 221 of the source memory sub-region $\mathbf{250}_1$ are mapped, and destination memory registers 310[48]-310[51] into which the register content portions 223 of the source memory sub-region $\mathbf{250}_2$ are mapped.

Equation 7 identifies one-bit destination register portions $\mathbf{350}_0$, $\mathbf{350}_1$, $\mathbf{350}_2$, . . . , $\mathbf{350}_{15}$ of the destination memory register 310[52] into which the register content portions 223[0], 223[1], 223[2], . . . , 223[15] can be respectively disposed. In accordance with Equation 7, the register content portion 223[0] is disposed within the one-bit destination register portion $\mathbf{350}_0$ of the destination memory register 310[52], and the register content portion 223[1] is disposed within the one-bit destination register portion $\mathbf{350}_1$ of the destination memory register 310[52]. Similarly, the register content portions 223[2], 223[3], 223[4], . . . , 223[15] are respectively disposed within the one-bit destination register portions $\mathbf{350}_2$, $\mathbf{350}_3$, $\mathbf{350}_4$, . . . , $\mathbf{350}_{15}$ of the destination memory register 310[52].

More specifically, the data bit 0 within the source memory registers 210[0], 210[1], 210[2], . . . , 210[15] can be selected as shown in FIG. 11I. When mapped into the destination memory system 300, the data bit 0 of the source memory register 210[0] is disposed within the data bit 15 of the destination memory register 310[52]; whereas, the data bit 0 of the source memory register 210[1] is disposed within the data bit 14 of the destination memory register 310[52] as illustrated in FIG. 11I. Similarly, data bit 0 within the source memory register 210[2], 210[3], 210[4], . . . , 210[15] are respectively disposed within data bits 13, 12, 11, . . . , 0 within the destination memory register 310[52]. The register content portions 223[0], 223[1], 223[2], . . . , 223[15] thereby are mapped in a side-by-side manner across the destination memory register 310[52].

The mapping of the remaining register content portions 223 of the source memory sub-region $\mathbf{250}_3$ can proceed in a similar manner. The register content portions 223[16], 223[17], 223[18], . . . , 223[31] are selected for mapping into the destination memory system 300 in FIG. 11J. In accordance with Equations 6 and 7, the register content portion 223[16] is disposed within the one-bit destination register portion $350_0$ of the destination memory register 310[53]; whereas, the register content portion 223[17] is disposed within the one-bit destination register portion $350_1$ of the destination memory register 310[53]. The register content portions 223[18], 223[19], 223[20], . . . , 223[31] likewise are disposed within the one-bit destination register portion $350_2$, $350_3$, $350_4$, . . . , $350_{15}$, respectively, of the destination memory register 310[53]. In other words, data bit 0 within the source memory registers 223[16], 223[17], 223[18], . . . , 223[31] are respectively disposed within data bits 15, 14, 13, . . . , 0 within the destination memory register 310[53] as shown in FIG. 11J. The source memory registers 210 of the source memory system 200 thereby are mapped in a side-by-side manner across the destination memory registers 310 of the destination memory system 300 without a loss of valuable memory space in the destination memory system 300 even when the source data width $DW_1$ of the source memory system 200 is greater than or equal to the destination data width $DW_2$ of the destination memory system 300.

Figure 12:
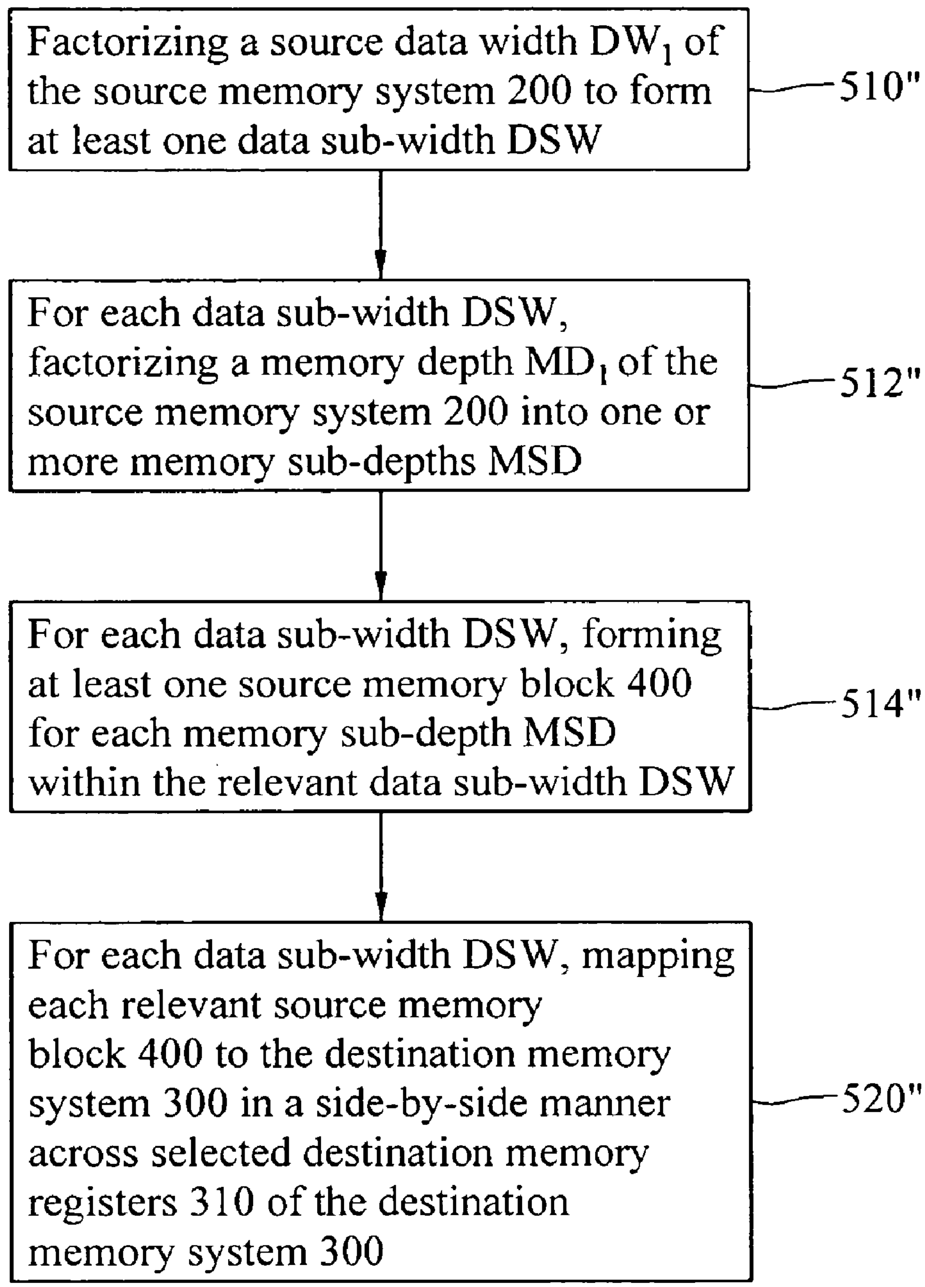
FIG. 12 is a detail drawing illustrating another alternative embodiment of the memory mapping method of FIG. 2A, wherein the memory mapping system further factorizes a memory depth of the source memory system to form source memory blocks and maps the source memory blocks into a destination memory system.

The memory contents 220 associated with each source memory sub-regions 250 of the source memory system 200 can be disposed within the destination memory system 300 in any conventional manner. In other words, although shown and described above as mapping discrete register content portions 221, 222, 223, . . . , 22P (shown in FIG. 4A) for purposes of illustration only, the memory mapping system 100 can map source memory blocks 400 (shown in FIG. 13A) into the destination memory system 300. In one preferred embodiment, the memory depth $MD_1$ of the source memory system 200 can be factorized into one or more memory sub-depths MSD. FIG. 12, for example, illustrates an alternative (or additional) embodiment of the exemplary method 500, whereby the memory mapping system 100 can map the source memory registers 210 of the source memory system 200 into the destination memory system 300.

Turning to FIG. 12, the exemplary method 500 can partition (and/or divide) the exemplary source memory system 200 by factorizing, at 510", the source data width $DW_1$ of the source memory system 200 to form one or more data sub-widths DSW in the manner set forth in more detail above with reference to the mapping methods 500 of FIGS. 2A-B. For each data sub-width DSW, the memory mapping method 500, at 512", is shown as factorizing the memory depth $MD_1$ of the source memory system 200 into one or more memory sub-depths MSD. At 514", the memory mapping method 500 can form at least one source memory block 400 for each data sub-width DSW. Each source memory block 400 is defined by the relevant data sub-width DSW and the relevant memory sub-depth MSD. In the manner set forth above, the source memory blocks 400 can be formed in any conventional manner and with any suitable dimensions (and/or size). As desired, the source memory blocks 400 can be formed with a plurality of uniform and/or non-uniform dimensions. For each data sub-width DSW, the memory mapping method 500 can, at 520", each source memory block 400 is mapped into the destination memory system 300 in a side-by-side manner across selected destination memory registers 310 of the destination memory system 300 in the manner set forth above.

Figures 1, 13A:
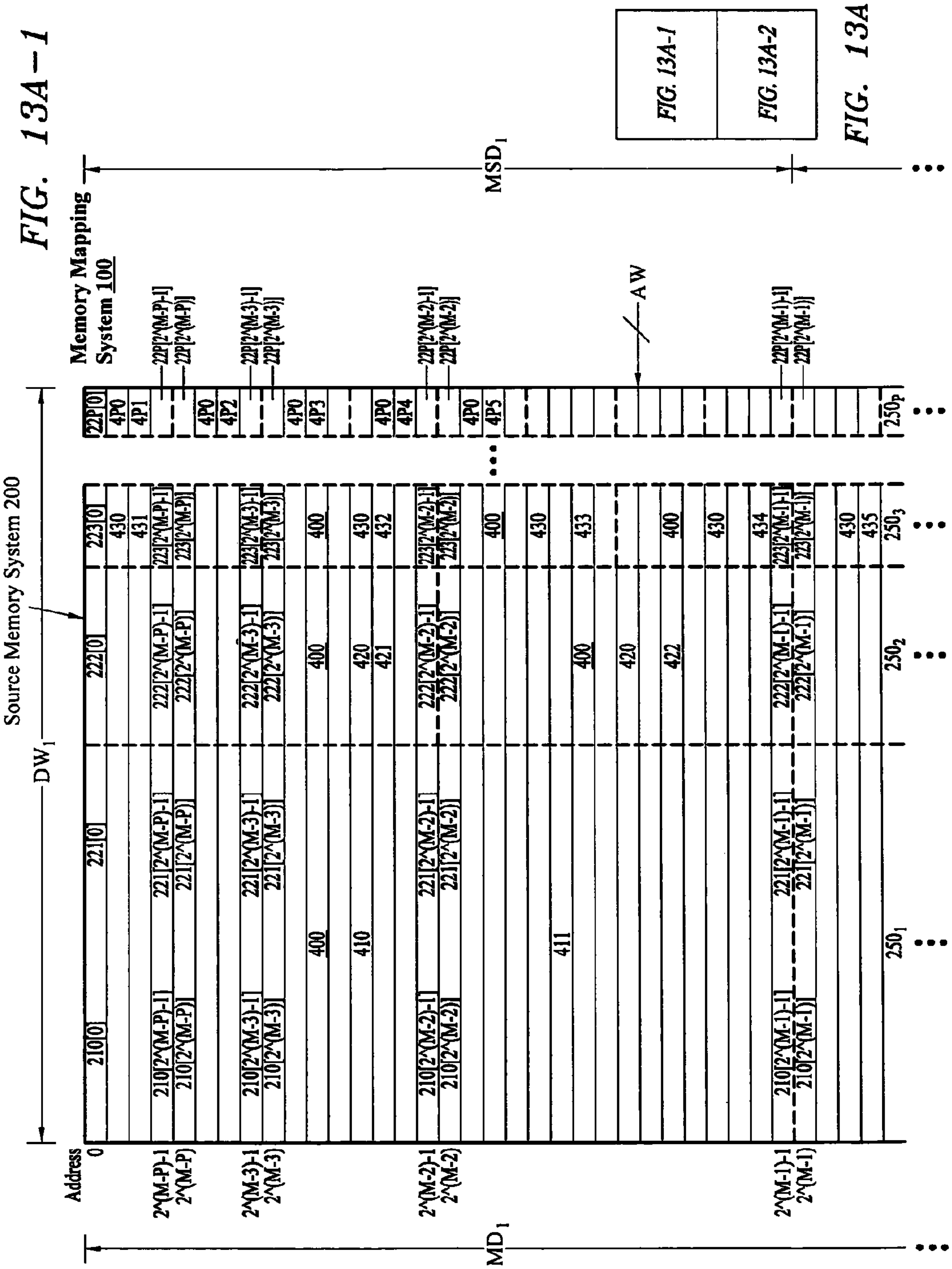
FIG. 13A is a detail drawing illustrating an alternative embodiment of the memory mapping system of FIG. 3A, wherein each source memory sub-region within the source memory system is partitioned to form one or more source memory blocks.
Figures 2, 13A:
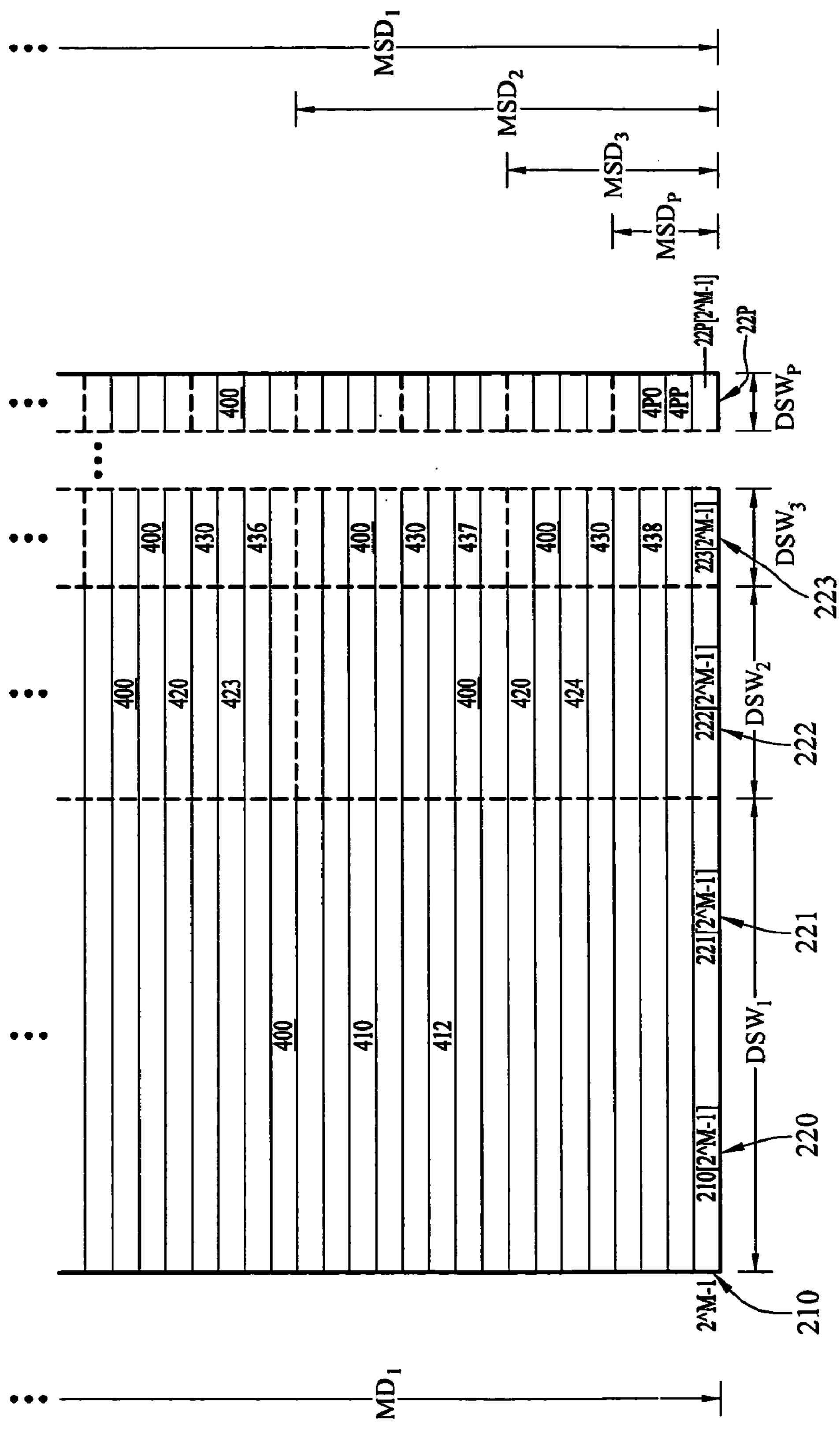

FIG. 13A illustrates the exemplary memory mapping system of FIG. 3A, wherein each source memory sub-region 250 within the source memory system 200 is partitioned to form one or more source memory blocks 400. The source data width $DW_1$ of the source memory system 200 is shown as being factorized into the data sub-width $DSW_1$, $DSW_2$, $DSW_3$, . . . $DSW_P$ in the manner discussed in more detail above with reference to FIGS. 3A-C. The source memory system 200 thereby can be partitioned (and/or divided) into the source memory sub-regions 250. The register content portions 221, 222, 223, . . . , 22P of the selected source memory register 210 are respectively associated with the memory sub-regions $250_1$, $250_2$, $250_3$, . . . $250_P$ and/or the data sub-width $DSW_1$, $DSW_2$, $DSW_3$, . . . $DSW_P$ in the manner set forth above.

The memory depth $MD_1$ of the source memory system 200 can be factorized in any conventional manner. The memory depth $MD_1$ of the source memory system 200, for instance, can be factorized into one or more power-of-two (or base-2) memory sub-depth MSD values based upon the predetermined memory depth $MD_1$ of the source memory system 200 in accordance with Equation 22.

$$MSD_i = MD_1/2^i \qquad \text{(Equation 22)}$$

In Equation 22, mapping index i is the mapping index i associated with Equation 2 above and can be associated with any non-negative integer value. The data sub-width $DSW_i$ can be partitioned (and/or divided) into one or more memory sub-depths $MSD_i$. Stated somewhat differently, the memory sub-depths $MSD_i$ that are associated with the data sub-width $DSW_1$ span the memory depth $MD_1$ of the source memory system 200 and preferably has a uniform dimension (and/or size). In accordance with Equation 22, for instance, the $i^{th}$ memory sub-depth $MSD_i$ can have a value that is equal to the memory depth $MD_1$ divided by an $i^{th}$ power of two. The values of the memory sub-depths $MSD_i$ are different among the data sub-widths $DSW_i$; whereas, the values of the memory sub-depths $MSD_i$ associated with a selected data sub-width $DSW_i$ are uniform.

Accordingly, the source memory blocks 400 associated with the source memory system 200 each can have a block data width $DW_B$ that is equal to the relevant data sub-width $DSW_i$, such as $DW_2/2^i$, and a block memory depth $MD_B$ that is equal to the relevant memory sub-depth $MSD_i$, such as $MD_1/2^i$, for each relevant value of the mapping index i. Equation 22 shows the block data width $DW_B$ and the block memory depth $MD_B$ dimensions of an source memory block 400, wherein the mapping index i has any suitable integer value that can be greater than, or equal to, zero ($i \geqq 0$).

$$DW_2/2^i \times MD_1/2^i \qquad \text{(Equation 22)}$$

As illustrated in FIG. 13A, for example, if the data sub-width $DSW_1$ is associated with a mapping index i that is equal to one ("1") in the manner set forth above with reference to FIG. 3A, the data sub-width $DSW_1$ can comprise the $DW_2/2$ most significant data bits of the source memory registers 210. Since the destination data width $DW_2$ of the destination memory system 300 is shown as including $2^N$ data bits, the $DW_2/2$ most significant data bits of the source memory registers 210 comprise the $2^N$ most significant data bits of the source memory registers 210. In accordance with Equation 21, each memory sub-depth $MSD_1$ associated with the data sub-width $DSW_1$ has a value that is equal to the memory depth $MD_1$ divided by two ($2^1$). When the source memory system 200 includes $2^M$ relevant source memory registers 210, the data sub-width $DSW_1$ has a value that is equal to $2^M/2$ (or $2^{(M-1)}$) source memory registers 210. The memory mapping system 100 thereby can form two source memory blocks 411, 412 within the memory sub-region $250_1$, each source memory block 410 comprising the $2^{(N-1)}$ most significant data bits of the $2^{(M-1)}$ source memory registers 210 associated with the relevant source memory block 410 in accordance with Equation 22. As illustrated in the source memory system 200 of FIG. 13A, the source memory block 411 comprises the $2^{(N-1)}$ most significant data bits of each of the $2^{(M-1)}$ source memory registers 210[0], 210[1], 210[2], . . . , 210[$2^{(M-1)}-1$]; whereas, the source memory block 412 comprises the $2^{(N-1)}$ most significant data bits of each of the $2^{(M-1)}$ source memory registers 210[$2^{(M-1)}$], 210[$2^{(M-1)}+1$], 210[$2^{(M-1)}+2$], . . . , 210 [$2^M-1$].

Similarly, if the data sub-width $DSW_1$ is associated with a mapping index i that is equal to two ("2"), the data sub-width $DSW_2$ can comprise the $DW_2/4$ (or $2^{(N-2)}$) most remaining significant data bits of the source memory registers 210 in the manner set forth above with reference to FIG. 3A. In accordance with Equation 21, each memory sub-depth $MSD_2$ associated with the data sub-width $DSW_2$ has a value that is equal to the memory depth $MD_1$ divided by four ($2^2$). The memory mapping system 100 thereby can form four source memory blocks 421, 422, 423, 424 within the memory sub-region 250$_2$, each source memory block 420 comprising the $2^{(N-2)}$ most significant data bits of the $MD_1/4$ (or $2^{(M-2)}$) source memory registers 210 associated with the relevant source memory block 420 in accordance with Equation 22. As illustrated in FIG. 13A, the source memory block 421 includes the $2^{(N-2)}$ most significant remaining data bits of each of the $2^{(M-2)}$ source memory registers 210[0], 210[1], 210[2], . . . , 210[$2^{(M-2)}-1$]; whereas, the source memory block 422 can include the $2^{(N-2)}$ most significant data bits of each of the $2^{(M-2)}$ source memory registers 210[$2^{(M-2)}$], 210[$2^{(M-2)}+1$], 210[$2^{(M-1)}+2$], . . . , 210[$2^{(M-1)}-1$]. The source memory block 423 likewise can comprise the $2^{(N-2)}$ most significant remaining data bits of each of the $2^{(M-2)}$ source memory registers 210[$2^{(M-1)}$], 210[$2^{(M-1)}+1$], 210[$2^{(M-1)}+2$], . . . , 210[$2^{(M-1)}+2^{(M-2)}-1$], and the source memory block 422 comprises the $2^{(N-2)}$ most significant data bits of each of the $2^{(M-2)}$ source memory registers 210[$2^{(M-1)}+2^{(M-2)}$], 210[$2^{(M-1)}+2^{(M-2)}+1$], 210[$2^{(M-1)}+2^{(M-2)}+2$], . . . , 210[$2^M-1$].

If the data sub-width $DSW_i$ is associated with a mapping index i that is equal to three ("3"), the data sub-width $DSW_3$ can comprise the $DW_2/8$ (or $2^{(N-3)}$) most remaining significant data bits of the source memory registers 210 in the manner set forth above with reference to FIG. 3A. In accordance with Equation 21, each memory sub-depth $MSD_3$ associated with the data sub-width $DSW_3$ has a value that is equal to the memory depth $MD_1$ divided by eight ($2^3$). The memory mapping system 100 thereby can form eight source memory blocks 431, 432, 433, . . . , 437 within the memory sub-region 250$_3$, each source memory block 430 comprising the $2^{(N-3)}$ most significant data bits of the $MD_1/8$ (or $2^{(M-3)}$) source memory registers 210 associated with the relevant source memory block 430 in accordance with Equation 22. The source memory blocks 431, 432, 433, . . . , 437 are illustrated in FIG. 13A.

The mapping of the remaining memory sub-regions 250$_i$ of the source memory system 200 can proceed in a similar manner. If the data sub-width $DSW_i$ is associated with a mapping index i that is equal to P, for example, the data sub-width $DSW_P$ can comprise the $DW_2/2^P$ (or $2^{(N-P)}$) most remaining significant data bits of the source memory registers 210 in the manner set forth above with reference to FIG. 3A. In accordance with Equation 21, each memory sub-depth $MSD_P$ associated with the data sub-width $DSW_P$ has a value that is equal to the memory depth $MD_1$ divided by $2^P$. The memory mapping system 100 thereby can form $2^P$ source memory blocks 4P1, 4P2, 4P3, . . . , 4PP within the memory sub-region 250$_P$, each source memory block 4P0 comprising the $2^{(N-P)}$ most significant data bits of the $MD_1/2^P$ (or $2^{(M-P)}$) source memory registers 210 associated with the relevant source memory block 4P0 in accordance with Equation 22. The source memory blocks 4P1, 4P2, 4P3, . . . , 4P7 are shown in FIG. 13A.

The memory contents 220 associated with the source memory block 410, 420, 430, . . . , 4P0 can be disposed within the destination memory system 300 (shown in FIG. 4B) in any conventional manner. To inhibit a loss of valuable memory space within the destination memory system 300, however, the memory contents 220 of the source memory block 410, 420, 430, . . . , 4P0 preferably are disposed within the destination memory system 300 in a side-by-side manner across the destination memory registers 310 (shown in FIG. 4B) of the destination memory system 300 in the manner set forth in more detail above with reference to FIGS. 4A-F, 5A-F, 6A-C, 7A-B, and 10A-E. An exemplary mapping of the source memory blocks 410, 420, 430, . . . , 4P0 is illustrated by the destination memory system 300 of FIG. 13B.

Figure 13B:
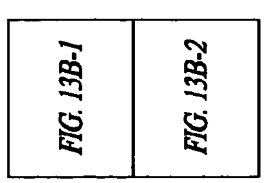
FIG. 13B is a detail drawing illustrating an embodiment of the memory mapping system of FIG. 13A, wherein the source memory blocks are disposed within the destination memory system.
Figures 1, 13B:
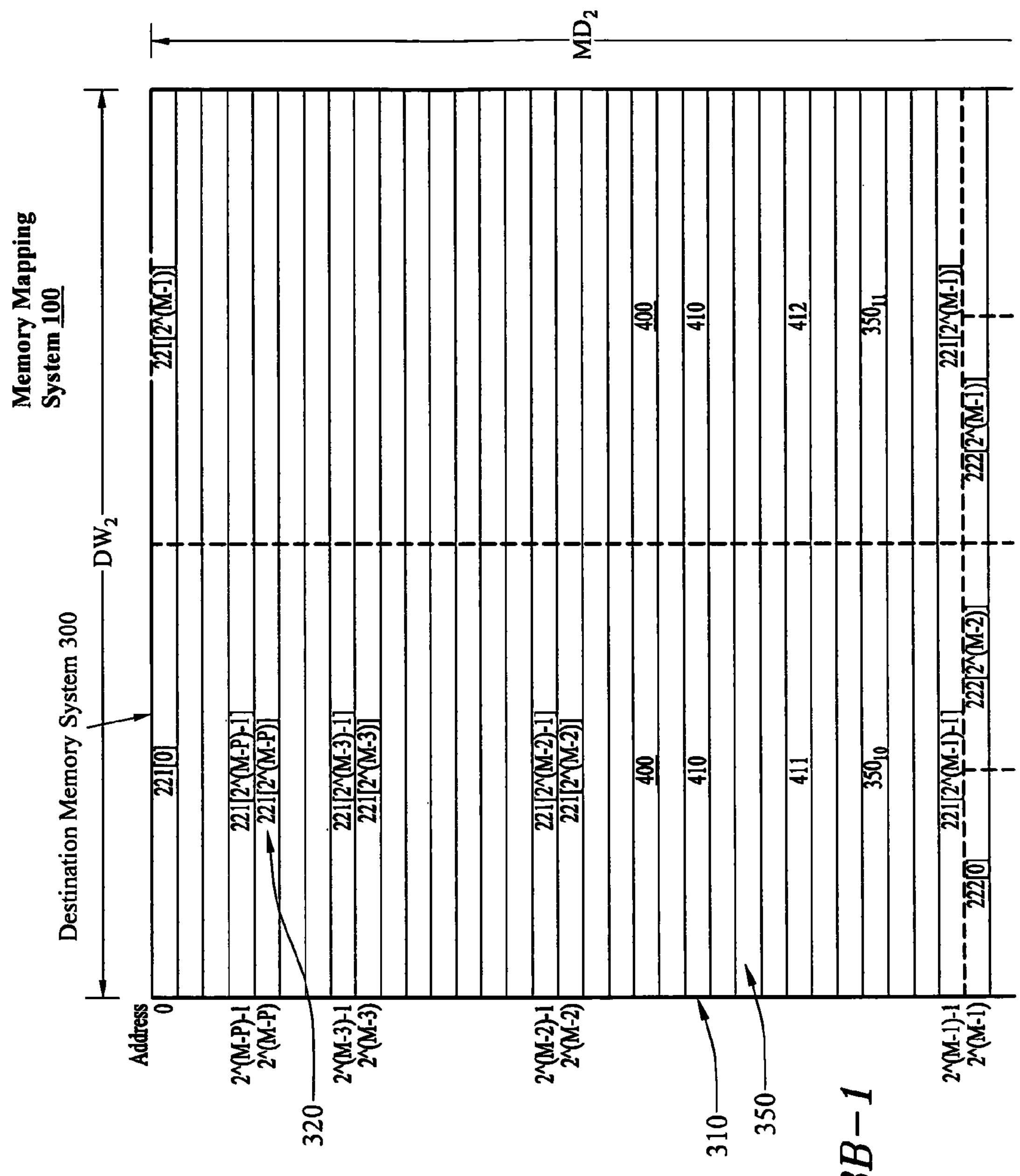
Figures 2, 13B:
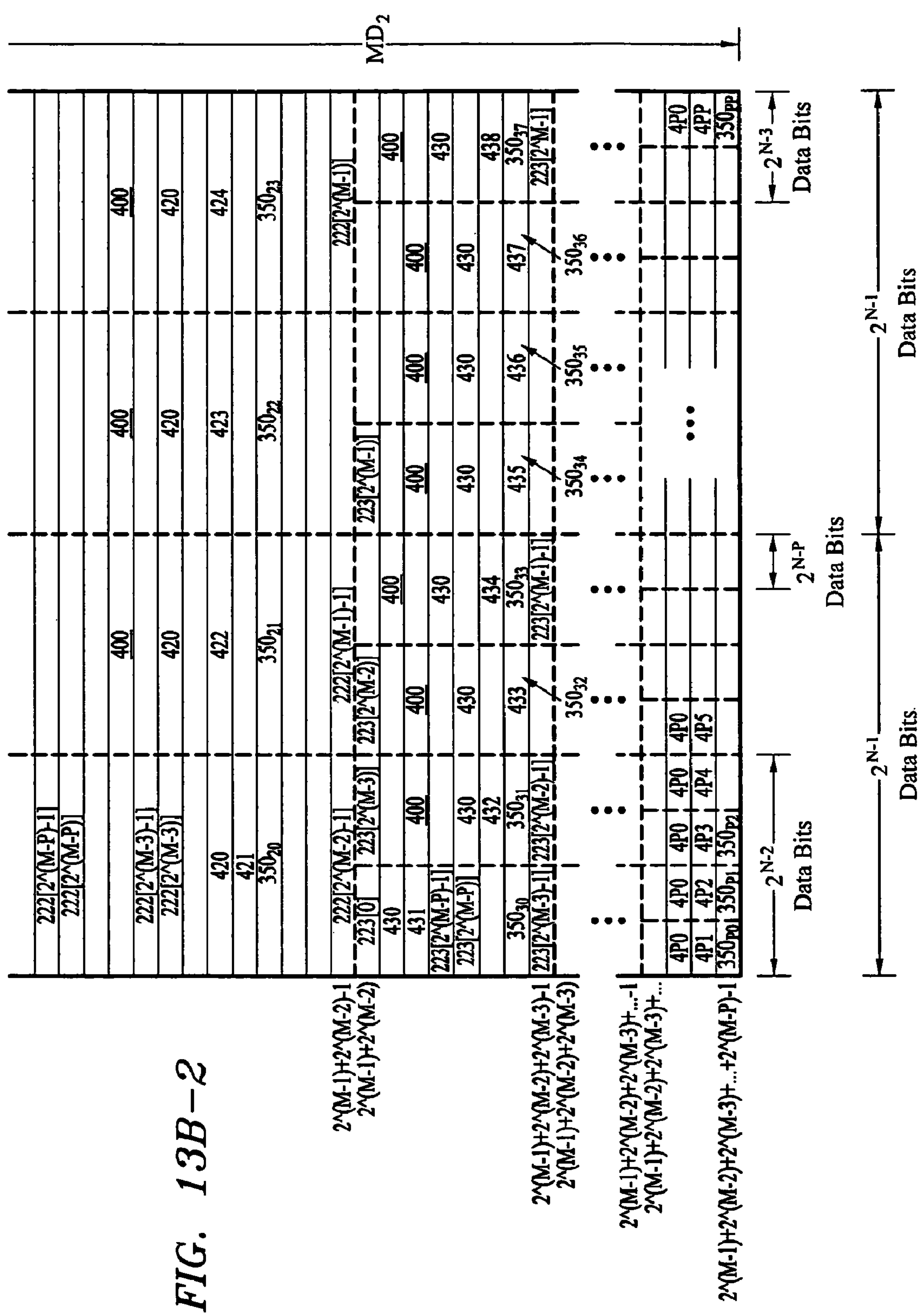

Turning to FIG. 13B, the destination memory system 300 is provided in the manner discussed above with reference to FIGS. 1 and 8A-C. One or more destination register portions 350 are shown as being identified for the destination memory system 300. As set forth above, the memory mapping system 100 can form two source memory blocks 411, 412 within the memory sub-region 250$_1$, each source memory block 410 comprising the $2^{(N-1)}$ most significant data bits of the $2^{(M-1)}$ source memory registers 210 associated with the relevant source memory block 410. The memory mapping system 100 likewise can identify $2^{(N-i)}$-bit destination register portion 350 within each of a selected number of the destination memory registers 310 into which the memory contents 220 associated with the selected source memory blocks 411, 412 can be disposed. In other words, a number of $MD_1/2^i$ (or $2^{(M-i)}$) of the destination memory registers 310 within the destination memory system 300 each can be associated with $2^i$ $2^{(N-i)}$-bit destination register portions 350 in the manner discussed above with reference to Equations 6 and 7.

Mapping of the source memory blocks 411, 412 within the memory sub-region 250$_1$ is illustrated in FIG. 13B. Since the mapping index i associated with the source memory sub-region 250$_1$ has a value of one ("1"), the memory contents 220 associated with the selected source memory blocks 411, 412 can be disposed within $MD_1/2$ (or $2^{(M-1)}$) selected destination memory registers 310. Each of the $2^{(M-1)}$ selected destination memory registers 310 likewise can be associated with two ($2^1$) destination register portions 350$_{10}$, 350$_{11}$, each comprising $2^{(N-1)}$ bits, as illustrated in FIG. 13B. The destination register portion 350$_{10}$ is associated with a zeroth register position within each of the selected destination memory registers 310; whereas, the destination register portion 350$_{11}$ is associated with a first register position within each of the selected destination memory registers 310. Stated somewhat differently, the destination register portion 350$_{10}$ can include the $2^{(N-1)}$ most significant data bits of the $2^{(M-1)}$ destination memory registers 310[0], 310[1], 310[2], . . . , 310[$2^{(M-1)}-1$]; whereas, the destination register portion 350$_{11}$ can include the $2^{(N-1)}$ most significant remaining data bits of the $2^{(M-1)}$ destination memory registers 310[0], 310[1], 310[2], . . . , 310[$2^{(M-1)}-1$].

The destination register portions 350$_{10}$, 350$_{11}$, thereby have the same dimensions (and/or size) as the source memory blocks 411, 412. Accordingly, the memory mapping system 100 can dispose each of the memory contents 220 associated with the source memory block 411 within the destination register portion 350$_{10}$. As illustrated in FIG. 13B, for example, the register content portion 221[0] of the source memory block 411 can be disposed within the destination register portion 350$_{10}$[0]; whereas, the register content portion 221[$2^{(M-P)}-1$] of the source memory block 411 can be disposed within the destination register portion $\mathbf{350}_{10}$[$2^{(M-P)}-1$]. The memory mapping system 100 likewise can dispose each of the memory contents 220 associated with the source memory block 412 within the destination register portion $\mathbf{350}_{11}$. FIG. 13B shows that the register content portion 221 [$2^{(M-1)}$] of the source memory block 412 can be disposed within the destination register portion $\mathbf{350}_{10}$[0]; whereas, the register content portion 221[$2^{M}-1$] of the source memory block 411 can be disposed within the destination register portion $\mathbf{350}_{10}$[$2^{(M-1)}-1$]. The source memory blocks 411, 412 of the source memory system 200 each are mapped in a side-by-side manner across the respective destination memory registers 310[0], 310[1], 310[2], . . . , 310[$2^{(M-1)}-1$] as illustrated in FIG. 13B.

The source memory blocks 421, 422, 423, 424 within the memory sub-region $\mathbf{250}_2$ can be disposed within the destination memory system 300 in a similar manner. Since the mapping index i associated with the source memory sub-region $\mathbf{250}_2$ has a value of two ("2"), the memory contents 220 associated with the selected source memory blocks 421, 422, 423, 424 can be disposed within $MD_1/4$ (or $2^{(M-2)}$) selected destination memory registers 310. Each of the $2^{(M-2)}$ selected destination memory registers 310 can be associated with four ($2^2$) destination register portions $\mathbf{350}_{20}$, $\mathbf{350}_{21}$, $\mathbf{350}_{22}$, $\mathbf{350}_{23}$, each comprising $2^{(N-2)}$ bits. As illustrated in FIG. 13B, the destination register portion $\mathbf{350}_{20}$ can include the $2^{(N-2)}$ most significant data bits of the $2^{(M-2)}$ destination memory registers 310[$2^{(M-1)}$], 310[$2^{(M-1)}+1$], 310[$2^{(M-1)}+2$], . . . , 310[$2^{(M-1)}+2^{(M-2)}-1$]; whereas, the destination register portion $\mathbf{350}_{21}$ can include the $2^{(N-1)}$ most significant remaining data bits of the $2^{(M-1)}$ destination memory registers 310[$2^{(M-1)}$], 310[$2^{(M-1)}+1$], 310[$2^{(M-1)}+2$], . . . , 310[$2^{(M-1)}+2^{(M-2)}-1$] when the $2^{(N-2)}$ data bits associated with the source memory block 421 is ignored (or not considered). Similarly, the destination register portion $\mathbf{350}_{22}$ can include the $2^{(N-2)}$ most significant remaining data bits of the $2^{(M-2)}$ destination memory registers 310[$2^{(M-1)}$], 310[$2^{(M-1)}+1$], 310[$2^{(M-1)}+2$], . . . , 310[$2^{(M-1)}+2^{(M-2)}-1$] when the $2^{(N-2)}$ data bits associated with each of the source memory blocks 421, 422 are ignored (or not considered), and the destination register portion $\mathbf{350}_{23}$ can include the $2^{(N-1)}$ most significant remaining data bits of the $2^{(M-1)}$ destination memory registers 310[$2^{(M-1)}$], 310[$2^{(M-1)}+1$], 310[$2^{(M-1)}+2$], . . . , 310[$2^{(M-1)}+2^{(M-2)}-1$] when the $2^{(N-2)}$ data bits associated with each of the source memory blocks 421, 422, 423 are ignored (or not considered).

The destination register portions $\mathbf{350}_{20}$, $\mathbf{350}_{21}$, $\mathbf{350}_{22}$, $\mathbf{350}_{23}$, thereby have the same dimensions (and/or size) as the source memory blocks 421, 422, 423, 424. Accordingly, the memory mapping system 100 can dispose each of the memory contents 220 associated with the source memory block 421 within the destination register portion $\mathbf{350}_{20}$. As illustrated in FIG. 13B, the register content portion 222[0] of the source memory block 421 can be disposed within the destination register portion $\mathbf{350}_{20}$[$2^{(M-1)}$]; whereas, the register content portion 222[$2^{(M-2)}1$] of the source memory block 421 can be disposed within the destination register portion $\mathbf{350}_{20}$[$2^{(M-1)}+2^{(M-2)}-1$]. The memory mapping system 100 likewise can dispose the memory contents 220 associated with the source memory blocks 422, 423, 424 within the respective destination register portions $\mathbf{350}_{21}$, $\mathbf{350}_{22}$, $\mathbf{350}_{23}$. For example, the register content portion 222[$2^{(M-2)}$] of the source memory block 422 is illustrated as being disposed within the destination register portion $\mathbf{350}_{21[2^{(M-1)}}$]; whereas, the register content portion 222[$2^{(M-1)}-1$] of the source memory block 421 can be disposed within the destination register portion $\mathbf{350}_{10}$[$2^{(M-1)}+2^{(M-2)}-1$]. FIG. 13B likewise shows that the register content portion 222[$2^{(M-1)}$] of the source memory block 422 can be disposed within the destination register portion $\mathbf{350}_{22}$[$2^{(M-1)}$]. As shown in FIG. 13B, each of the source memory blocks 421, 422, 423, 424 thereby can be mapped in a side-by-side manner across the respective destination memory registers 310[$2^{(M-1)}$], 310[$2^{(M-1)}+1$], 310 [$2^{(M-1)}+2$], . . . , 310[$2^{(M-1)}+2^{(M-2)}-1$].

Turning to the source memory blocks 431, 432, 433, . . . , 437 within the memory sub-region $\mathbf{250}_3$, the mapping index i associated with the source memory sub-region $\mathbf{250}_3$ has a value of three ("3"). The memory contents 220 associated with the selected source memory blocks 431, 432, 433, . . . , 437 thereby can be disposed within $MD_1/8$ (or $2^{(M-3)}$) selected destination memory registers 310. Each of the $2^{(M-3)}$ selected destination memory registers 310 can be associated with eight ($2^3$) destination register portions $\mathbf{350}_{30}$, $\mathbf{350}_{31}$, $\mathbf{350}_{32}$, . . . , $\mathbf{350}_{37}$, each comprising $2^{(N-3)}$ bits and, illustrated in FIG. 13B, can correspond with respective 2) data bits of the $2^{(M-3)}$ destination memory registers 310[$2^{(M-1)}+2^{(M-2)}$], 310 [$2^{(M-1)}+2^{(M-2)}+1$], 310[$2^{(M-1)}+2^{(M-2)}+2$], . . . , 310[$2^{(M-1)}+2^{(M-2)}+2^{(M-3)}-1$]. The destination register portions $\mathbf{350}_{30}$, $\mathbf{350}_{31}$, $\mathbf{350}_{32}$, . . . , $\mathbf{350}_{37}$, thereby have the same dimensions (and/or size) as the source memory blocks 431, 432, 433, . . . , 437. Accordingly, the memory mapping system 100 can dispose each of the memory contents 220 associated with the source memory blocks 431, 432, 433, . . . , 437 within the destination register portions $\mathbf{350}_{30}$, $\mathbf{350}_{31}$, $\mathbf{350}_{32}$, . . . , $\mathbf{350}_{37}$, respectively.

As illustrated in FIG. 133B, for example, the register content portion 223[0] of the source memory block 431 can be disposed within the destination register portion $\mathbf{350}_{30}$[$2^{(M-1)}+2^{(M-2)}$]; whereas, the register content portion 223[$2^{(M-3)}-1$] of the source memory block 431 can be disposed within the destination register portion $\mathbf{350}_{30}$[$2^{(M-1)}+2^{(M-2)}+2^{(M-3)}-1$]. Similarly, the register content portions 223[$2^{(M-2)}$], 223[$2^{(M-1)}-1$] are shown as being respectively disposed within the destination register portions $\mathbf{350}_{31}$[$2^{(M-1)}+2^{(M-2)}$], $\mathbf{350}_{31}$[$2^{(M-1)}+2^{(M-2)}+2^{(M-3)}-1$]. FIG. 13B likewise shows that the register content portion 223[$2^{(M-2)}$] of the source memory block 433 can be disposed within the destination register portion $\mathbf{350}_{32}$[$2^{(M-1)}+2^{(M-2)}$]. Each of the source memory blocks 431, 432, 433, . . . , 437 thereby can be mapped in a side-by-side manner across the respective destination memory registers 310[$2^{(M-1)}+2^{(M-2)}$], 310[$2^{(M-1)}+2^{(M-2)}+1$], 310[$2^{(M-1)}+2^{(M-2)}+2$], . . . , 310[$2^{(M-1)}+2^{(M-2)}+2^{(M-3)}-1$] as illustrated in FIG. 13B.

The mapping of the remaining source memory blocks 400 associated with the source memory sub-regions sub-regions $\mathbf{250}_2$, $\mathbf{250}_3$, . . . , $\mathbf{250}_P$ can proceed in a similar manner. Turning to the source memory blocks 4P1, 4P2, 4P3, . . . , 4P7 within the memory sub-region $\mathbf{250}_P$, the mapping index i associated with the source memory sub-region $\mathbf{250}_P$ has a value of P. The memory contents 220 associated with the selected source memory blocks 4P1, 4P2, 4P3, . . . , 4PP thereby can be disposed within $MD_1/2^P$ (or $2^{(M-P)}$) selected destination memory registers 310. Each of the $2^{(M-P)}$) selected destination memory registers 310 can be associated with $2^P$ destination register portions $\mathbf{350}_{P0}$, $\mathbf{350}_{P1}$, $\mathbf{350}_{P2}$, . . . , $\mathbf{350}_{PP}$, each comprising $2^{(N-P)}$ bits and, illustrated in FIG. 13B, can correspond with respective $2^{(N-P)}$ data bits of the $2^{(M-P)}$ destination memory registers 310[$2^{(M-1)}+2^{(M-2)}+2^{(M-3)}+\ldots$], 310[$2^{(M-1)}+2^{(M-2)}+2^{(M-3)}+\ldots+1$], 310 [$2^{(M-1)}+2^{(M-2)}+2^{(M-3)}+\ldots+2$], . . . , 310[$2^{(M-1)}+2^{(M-2)}+2^{(M-3)}+\ldots+2^{(M-P)}-1$]. The ellipses within the addresses of the destination memory registers 310 represent the address range of the destination memory registers 310 associated with any intervening register content portions between the destination memory registers 310 associated with the source memory sub-region 250$_3$ and the destination memory registers 310 associated with the source memory sub-region 250$_P$. The destination register portions 350$_{P0}$, 350$_{P1}$, 350$_{P2}$, . . . , 350$_{PP}$ have the same dimensions (and/or size) as the source memory blocks 4P1, 4P2, 4P3, . . . , 4PP.

Accordingly, the memory mapping system 100 can dispose each of the memory contents 220 associated with the source memory blocks 4P1, 4P2, 4P3, . . . , 4PP within the destination register portions 350$_{P0}$, 350$_{P1}$, 350$_{P2}$, . . . , 350$_{PP}$, respectively, in the manner set forth in more detail above. Each of the source memory blocks 4P1, 4P2, 4P3, . . . , 4PP thereby can be mapped in a side-by-side manner across the respective destination memory registers 310$[2^{(M-1)}+2^{(M-2)}+2^{(M-3)}+ \ldots]$, 310$[2^{(M-1)}+2^{(M-2)}+2^{(M-3)}+ \ldots +1]$, 310$[2^{(M-1)}+2^{(M-2)}+2^{(M-3)}+ \ldots +2]$, . . . , 310$[2^{(M-1)}+2^{(M-2)}+2^{(M-3)}+ \ldots +2^{(M-P)}-1]$ and without a loss of valuable memory space within the destination memory system 300 as illustrated in FIG. 13B. Although the destination memory system 300 is shown and described with reference to FIG. 13B as having an exemplary arrangement of destination register portions 350 for purposes of illustration only, the memory mapping system 100 can dispose the memory contents 220 associated with the source memory block 410, 420, 4P0, . . . , 4P0 into any suitable arrangement of the destination memory registers 310 as set forth above.

The memory mapping system 100 can prove desirable and provide a basis for a wide range of system applications. For example, memory mapping system 100 can be included as part of a hardware emulation system (not shown) in the manner set forth above. In conventional hardware emulation systems, each source (or design) memory system 200 within an electronic circuit (or system) design is mapped onto a common destination (or emulation) memory system 300. In the manner set forth in more detail above with reference to FIG. 1, the emulation memory system 300 can be provided in any conventional manner and have any suitable data width. Exemplary emulation memory systems 300 can include a 64-bit wide dynamic random access memory (DRAM) system and/or a 32-bit wide static random access memory (SRAM) system, without limitation.

Figure 14:
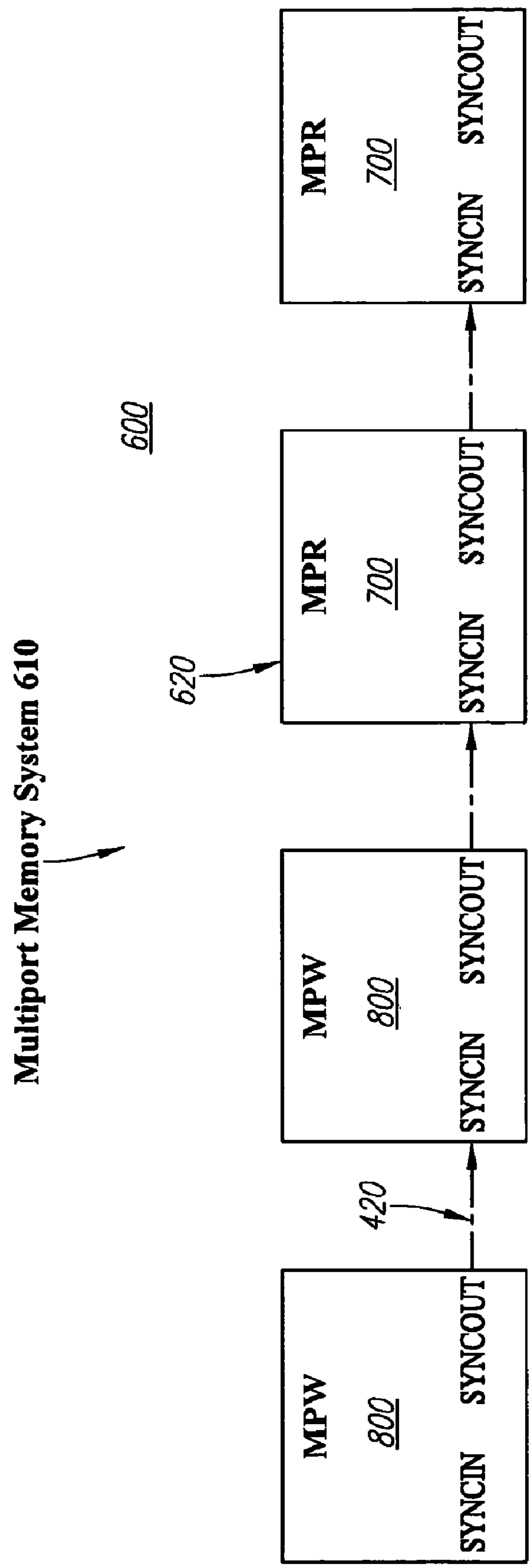
FIG. 14 is an exemplary block diagram illustrating a memory instance, wherein the memory instance is provided as a multiport memory system comprising a port chain of read ports and write ports.

The design memory system 200 can be represented by a memory instance 600 in a design database of the hardware emulation system as illustrated in FIG. 14. As desired, the memory instance 600 is shown as being provided as a multiport memory system 610. The multiport memory system 610 can comprise at least one port chain 620 of read ports 700 and/or write ports 800. Although shown and described as comprising an exemplary number and arrangement of read ports 700 and write ports 800 for purposes of illustration only, the port chain 620 can comprise any suitable number, configuration, and/or arrangement of read ports 700 and/or write ports 800.

Figure 15A:
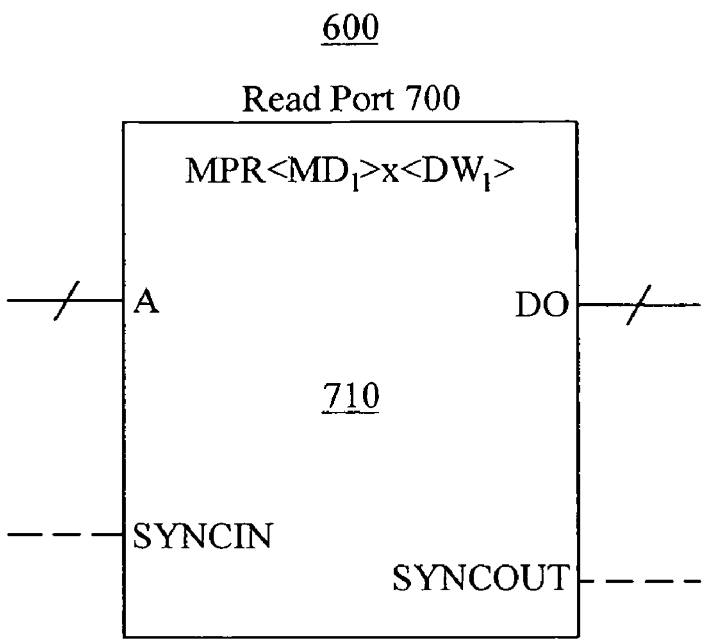
FIG. 15A is an exemplary block diagram illustrating a read port memory primitive for the read ports of FIG. 14.
Figure 15B:
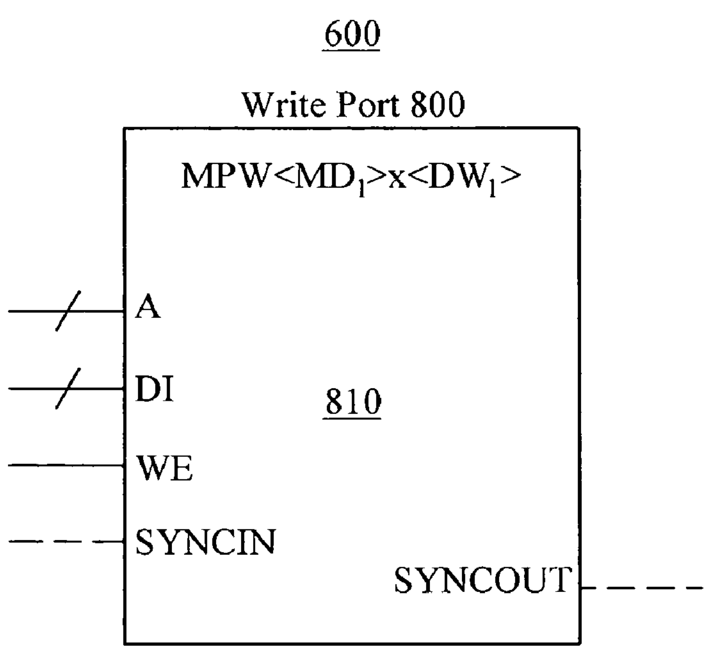
FIG. 15B is an exemplary block diagram illustrating a write port memory primitive for the write ports of FIG. 14.

Each read port 700 in the port chain 620 can be represented by a read port memory primitive (or MPR primitive) 710 as shown in FIG. 15A; whereas, each write port 800 in the port chain 620 can be represented by a write port memory primitive (or MPW primitive) 810 as shown in FIG. 15B. With reference to FIGS. 15A-B, the read port 700 is denoted as MPR<MD$_1$>X<DW$_1$>, and the write port 800 is denoted as MPW<MD$_1$>X<DW$_1$>, wherein <MD$_1$> represents the source (or design) memory depth MD$_1$ and <DW$_1$> represents the source (or design) data width DW$_1$ of the source (or design) memory system 200 in the manner set forth in more detail above. The read port memory primitive 710 is shown as having an address input port A and a data output port DO. Similarly, the write port memory primitive 810 has an address input port A, a data input port DI, and a write enable input port WE. The read port memory primitive 710 and the write port memory primitive 810 each likewise include a first communication port SYNCIN and a second communication port SYNCOUT for coupling the memory primitives 710, 810 to form the port chain 620 in the manner as illustrated in FIG. 14. The memory primitives 710, 810 thereby can be coupled together to define an order of port operation (or execution).

Figure 16A:
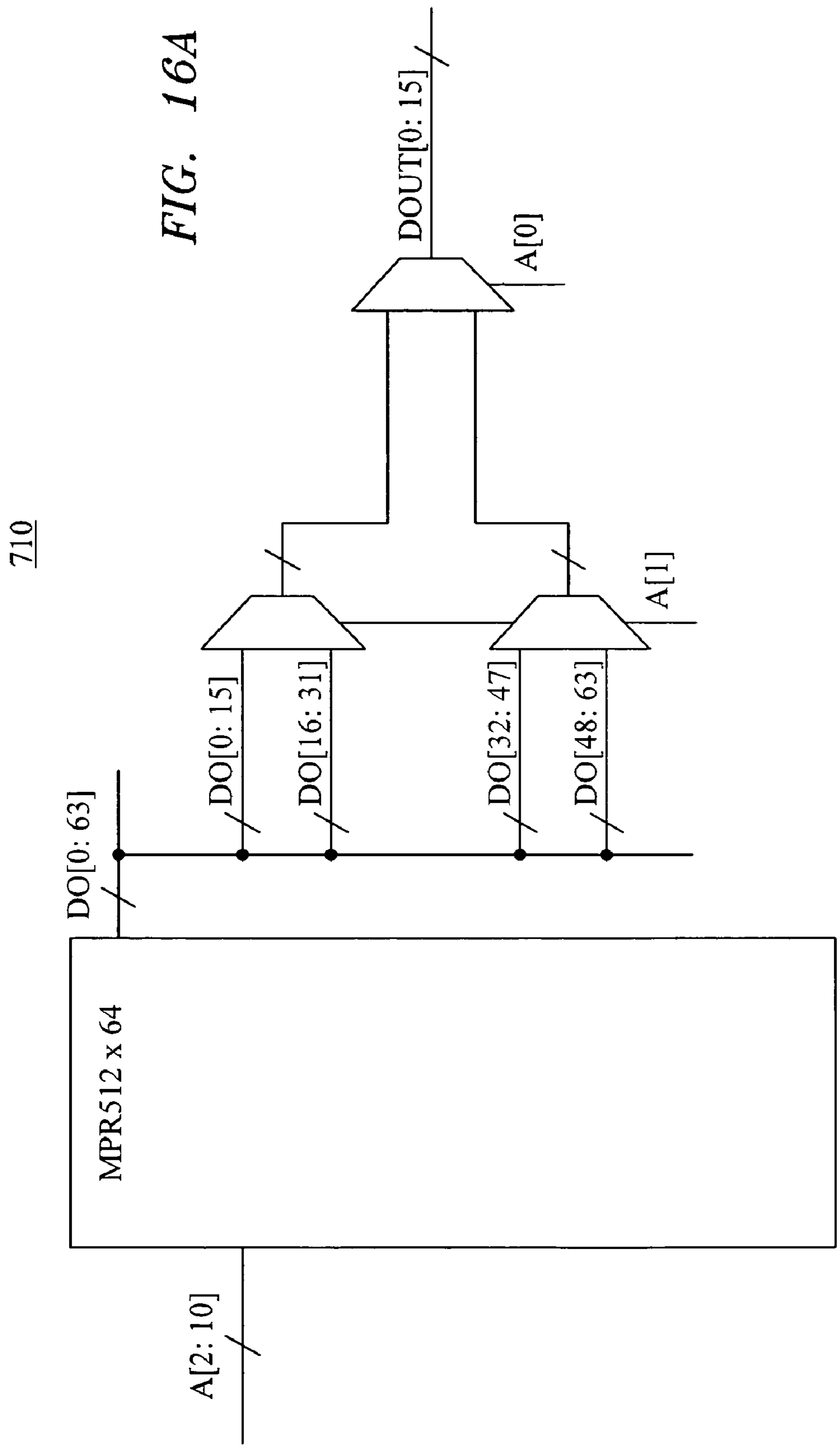
FIG. 16A is a detail drawing illustrating a circuit synthesized by the memory mapping system of FIG. 1, wherein the circuit models a 2K×16 read port memory primitive.

Each read port 700 can be synthesized by the memory mapping system 100 (shown in FIG. 1) as a primitive memory instance 600 with memory depth MD and data width DW. The read ports 700 thereby can be associated with additional logic systems to provide correct functioning (behavior) during emulation. Returning to FIG. 15A, for example, the primitive memory instance 600 is shown as being represented as 64-bit wide read port memory primitive 710 followed by k levels of multiplexers for choosing the "right" section of the word based on the less significant address bit(s). FIG. 16A shows the representation of a read port 700 of a 2K×16 read port memory primitive 710.

Figure 16B:
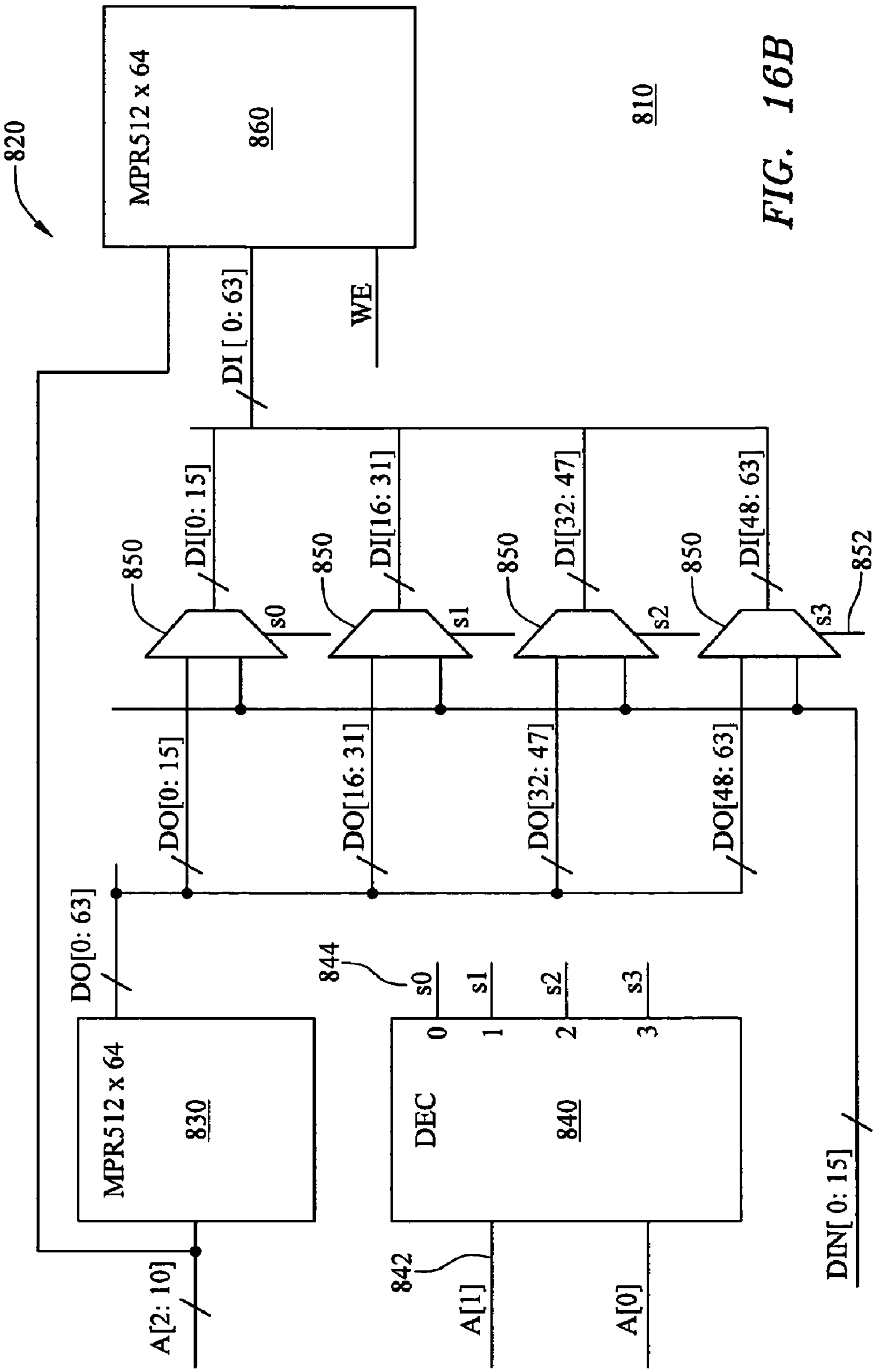
FIG. 16B is a detail drawing illustrating a circuit synthesized by the memory mapping system of FIG. 1, wherein the circuit models a 2K×16 write port memory primitive.

Each write port 800 likewise can be synthesized by the memory mapping system 100 (shown in FIG. 1) as a primitive memory instance 600 with memory depth MD and data width DW. The write ports 800 thereby can be associated with additional logic systems to provide correct functioning during emulation. Turning to FIG. 16B, for example, the write port 800 is represented as a Read-Modify-Write (RMW) circuit 820. The Read-Modify-Write circuit 820 is shown as including a 64-bit wide read port memory primitive 830 that reads the current content of M[$a^h$] ($a^h$ denotes aw-k most significant bits of the memory address a). The Read-Modify-Write circuit 820 likewise includes a decoder DEC 840 with k inputs 842 and $K=2^k$ outputs 844. The inputs 842 of the decoder DEC 840 are shown as being coupled with less significant address bits; whereas, the outputs 844 of the decoder DEC 840 can be coupled with SEL inputs 852 of a plurality of multiplexers 850. Each of the multiplexers 850 is associated with one section of 64 bit word and either updates it with new input values (just one section) or keeps it unchanged (all the other sections) based on the decoder output values. As shown in FIG. 16B, the Read-Modify-Write circuit 820 also includes a 64 bit wide write port memory primitive 860. The write port memory primitive 860 writes the modified 64 bit word back to the same address. FIG. 16B shows the representation of a write port 800 of a 2K×16 write port memory primitive 810.

Figure 17A:
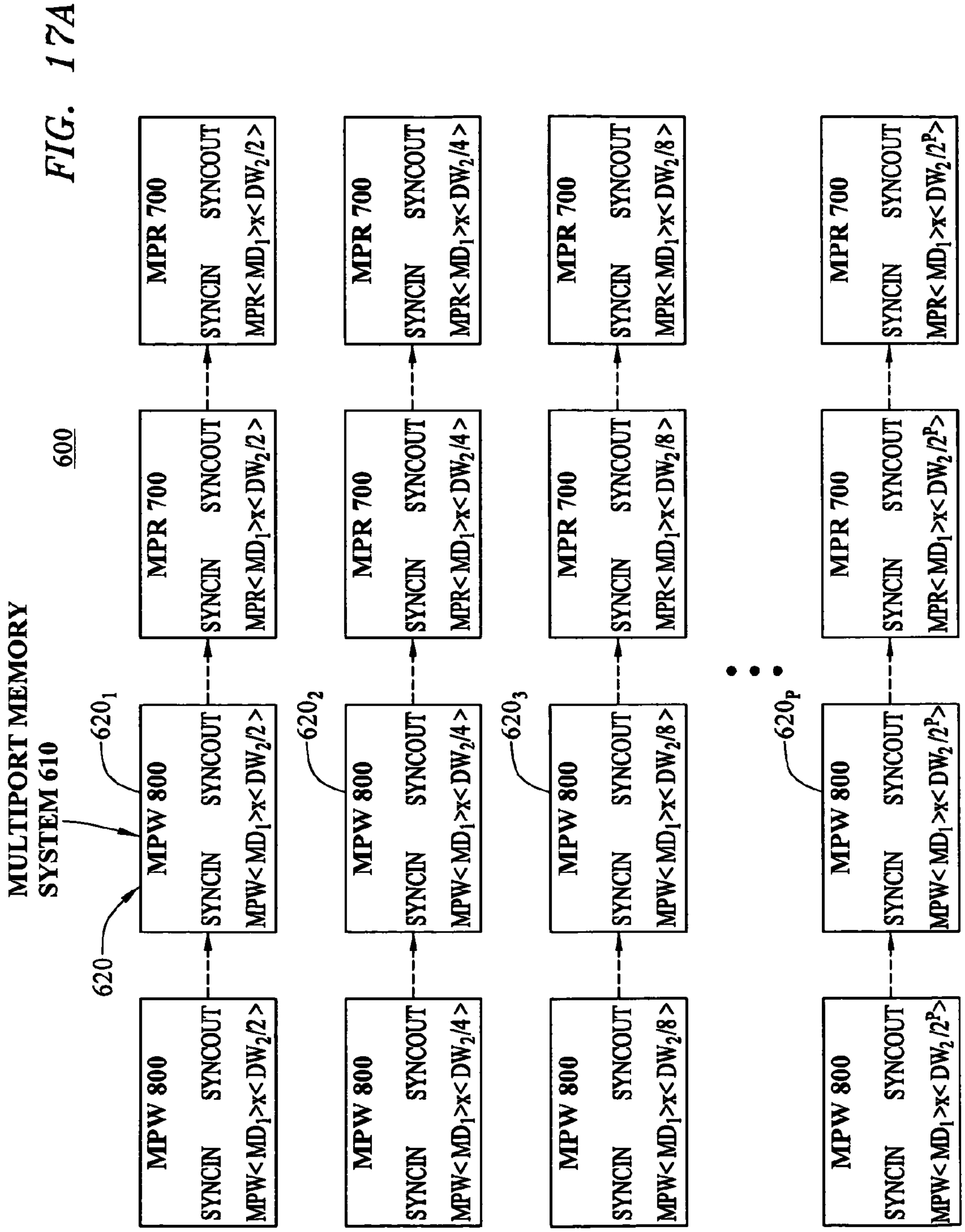
FIG. 17A is an exemplary detail drawing illustrating an alternative embodiment of the memory instance of FIG. 14, wherein the multiport memory system comprises a plurality of port chains having respective power-of-two data widths.

The design memory system 200 as represented by the memory instance 600 can be mapped into the emulation memory system 300 in the manner set forth in more detail above. As discussed above with reference to FIGS. 2A-B, for example, the source data width DW$_1$ (shown in FIGS. 3A-C) of the design memory system 200 can be factorized to form a plurality of data sub-widths DSW$_1$, DSW$_2$, DSW$_3$, . . . DSW$_P$ (shown in FIGS. 3A-C). If the memory instance 600 is provided as a multiport memory system 610 (shown in FIG. 14), the design memory system 200, when factorized, can be represented by a memory instance 600 that comprises a plurality of port chains 620$_1$, 620$_2$, 620$_3$, . . . 620$_P$, as illustrated in FIG. 17A. Each port chain 620$_1$, 620$_2$, 620$_3$, . . . 620$_P$ can be associated with a relevant data sub-width DSW$_1$, DSW$_2$, DSW$_3$, . . . DSW$_P$.

Turning to FIG. 17A, each port chain 620$_1$, 620$_2$, 620$_3$, . . . 620$_P$ is shown as comprising read ports 700 and/or write ports 800 provided in the manner set forth above in FIG. 14. Here, each read port 700 are denoted as MPR<MD$_1$>X<DW$_2$/2$^i$>, and write ports 800 are denoted as MPW<MD$_1$>X<DW$_2$/2$^i$>, wherein MD$_2$ represents the destination (or emulation) memory depth $MD_2$ of the destination (or emulation) memory system 300 (shown in FIG. 1) and i is the mapping index i in the manner set forth above. The port chain $\mathbf{620}_1$, for example, is associated with a mapping index i with a value of one ("1") and comprises read ports 700 that are denoted as MPR<$MD_1$>X<$DW_2/2$> and write ports 800 that are denoted as MPW<$MD_1$>X<$DW_2/2$>.

Similarly, the port chain $\mathbf{620}_2$ is associated with a mapping index i with a value of two ("2") and comprises read ports 700 that are denoted as MPR<$MD_1$>X<$DW_2/2^2$> and write ports 800 that are denoted as MPW<$MD_1$>X<$DW_2/2^2$>; whereas, the port chain $\mathbf{620}_3$ is associated with a mapping index i with a value of three ("3") and comprises read ports 700 that are denoted as MPR<$MD_1$>X<$DW_2/2^3$> and write ports 800 that are denoted as MPW<$MD_1$>X<$DW_2/2^3$>. Each of the other port chains $\mathbf{620}_i$ likewise can comprise read ports 700 that are denoted as MPR<$MD_1$>X<$DW_2/2^i$> and write ports 800 that are denoted as MPW<$MD_1$>X<$DW_2/2^i$> until read ports 700 and write ports 800 associated with the final (and/or last) $P^{th}$ data sub-width $DSW_P$ are denoted. As illustrated in FIG. 17A, the port chain $\mathbf{620}_P$ can be associated with a mapping index i with a value of P and can comprise read ports 700 that are denoted as MPR<$MD_1$>X<$DW_2/2^P$> and write ports 800 that are denoted as MPW<$MD_1$>X<$DW_2/2^P$>.

The memory mapping system 100 (shown in FIG. 1) can compactly map the memory portion of the design memory system 200 associated with each port chain $\mathbf{620}_1$, $\mathbf{620}_2$, $\mathbf{620}_3$, ... $\mathbf{620}_P$ into the emulation memory system 300 without a loss of valuable memory space in the emulation memory system 300 in the manner set forth above. When mapped into the emulation memory system 300, a selected read port $\mathbf{700}_i$, for instance, can be synthesized as a memory primitive of the selected read port $\mathbf{700}_i$ that is associated with a memory depth $MD_2$ that is equal to $2^M*(DSW_1/DW_2)$ and a data width $DW_2$ within the emulation memory system 300, wherein M is the predetermined number M (shown in FIGS. 3A-C) of address lines AW (shown in FIGS. 3A-C), $DSW_1$ is the relevant data sub-width $DSW_1$ (shown in FIGS. 3A-C), and $DW_2$ is the data width $DW_2$ (shown in FIG. 1) of the emulation memory system 300. Stated somewhat differently, the memory space within the design memory system 200 that is associated with the selected read port $\mathbf{700}_i$ is equal to the memory space within the emulation memory system 300 into which the memory space within the design memory system 200 is compactly mapped.

A selected write port $\mathbf{800}_i$ likewise can be synthesized as a memory primitive of the selected write port $\mathbf{800}_i$. In the manner discussed above with reference to FIG. 15B, the selected write port $\mathbf{800}_i$ can be synthesized as a Read-Modify-Write circuit 820 (shown in FIG. 15B). When mapped into the emulation memory system 300, the selected write port $\mathbf{800}_i$ can be synthesized as a memory primitive of the selected write port $\mathbf{800}_i$ that is associated with a memory depth $MD_2$ that is equal to $2^M*(DSW_1/DW_2)$ and a data width $DW_2$ within the emulation memory system 300 in the manner discussed above with reference to the selected read port $\mathbf{700}_i$. In other words, the memory space within the design memory system 200 that is associated with the selected write port $\mathbf{800}_i$ is equal to the memory space within the emulation memory system 300 into which the memory space within the design memory system 200 is compactly mapped.

Figure 17B:
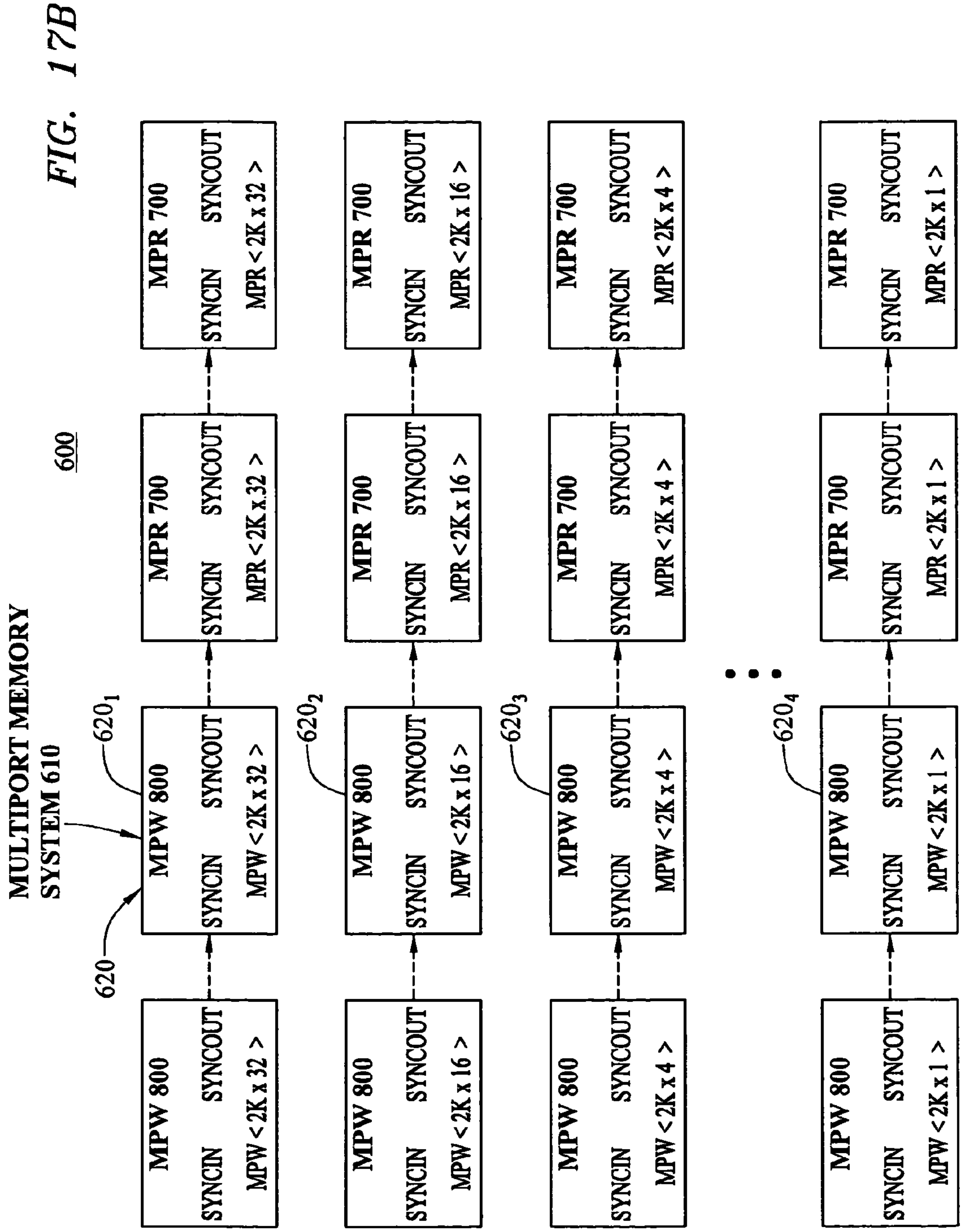
FIG. 17B is an exemplary detail drawing illustrating an alternative embodiment of the memory instance of FIG. 17A, wherein the memory mapping system maps an exemplary 2K×53 source memory system into a destination memory system with a data width of thirty-two bits such that the multiport memory system forms four port chains having data widths of thirty-two bits, sixteen bits, four bits, and one bit, respectively.

An exemplary multiport memory system 610 is illustrated in FIG. 17B. Turning to FIG. 17B, the source (or design) memory system 200 (shown in FIGS. 3A-C) comprises a 2K×53 memory system that is to be compactly mapped into a destination (or emulation) memory system 300 (shown in FIG. 1) having a destination (or emulation) data width $DW_2$ of thirty-two bits. As illustrated in FIG. 17B, the fifty-three bit data width $DW_1$ (shown in FIGS. 3A-C) of the design memory system 200 can be factorized into four data sub-widths $DSW_1$, $DSW_2$, $DSW_3$, and $DSW_4$ comprising thirty-two bits, sixteen bits, four bits, and one bit, respectively, in the manner set forth above with reference to FIGS. 3A-C. The design memory system 200, when factorized, thereby can be represented by a memory instance 600 that comprises a plurality of port chains $\mathbf{620}_1$, $\mathbf{620}_2$, $\mathbf{620}_3$, and $\mathbf{620}_P$, as shown in FIG. 17B.

In the manner set forth in more detail above with reference to FIG. 17A, the port chain $\mathbf{620}_1$ is associated with a mapping index i with a value of one ("1") and can comprise read ports 700 that are denoted as MPR<2K×32> and write ports 800 that are denoted as MPW<2K×32>. The read ports 700 and the write ports 800 of the port chain $\mathbf{620}_1$ thereby have a memory depth of two thousand and forty-eight (or 2K) memory registers each having a data width of thirty-two bits. Similarly, the port chain $\mathbf{620}_2$ is associated with a mapping index i with a value of two ("2") and can include read ports 700 that are denoted as MPR<2K×16> and write ports 800 that are denoted as MPW<2K×16>. Accordingly, the read ports 700 and the write ports 800 of the port chain $\mathbf{620}_2$ have a memory depth of two thousand and forty-eight memory registers each having a data width of sixteen bits. The port chain $\mathbf{620}_3$ and the port chain $\mathbf{620}_4$ can include read ports 700 that are denoted as MPR<2K×4> and MPR<2K×1>, respectively, and write ports 800 that are denoted as MPW<2K×4> and MPW<2K×1>, respectively. The read ports 700 and the write ports 800 of the port chain $\mathbf{620}_3$ have a memory depth of two thousand and forty-eight memory registers each having a data width of four bits; whereas, the read ports 700 and the write ports 800 of the port chain $\mathbf{620}_4$ have a memory depth of two thousand and forty-eight memory registers each having a data width of one bit.

In the manner set forth above, the memory mapping system 100 (shown in FIG. 1) can compactly map the memory portion of the design memory system 200 associated with each port chain $\mathbf{620}_1$, $\mathbf{620}_2$, $\mathbf{620}_3$, and $\mathbf{620}_4$ into the emulation memory system 300 without a loss of valuable memory space in the emulation memory system 300. When mapped into the emulation memory system 300, read ports 700 and write ports 800 can be respectively synthesized as a memory primitives of the read ports 700 and write ports 800. With reference to the port chain $\mathbf{620}_1$, for example, the read ports 700 and write ports 800 can be associated with a memory depth $MD_2$ that is equal to two thousand and forty-eight memory registers within the thirty-two bit data width $DW_2$ of the emulation memory system 300. In other words, being associated with thirty-two bits within the two thousand and forty-eight memory registers of the design memory system 200, the read ports 700 and write ports 800 of the port chain $\mathbf{620}_1$ can be compactly mapped into a memory depth of two thousand and forty-eight memory registers each having a data width of thirty-two bits within the emulation memory system 300.

Similarly, the read ports 700 and write ports 800 of the port chain $\mathbf{620}_2$ can be associated with a memory depth $MD_2$ that is equal to one thousand and twenty-four (or 1K) memory registers within the thirty-two bit data width $DW_2$ of the emulation memory system 300. Stated somewhat differently, the read ports 700 and write ports 800 of the port chain $\mathbf{620}_2$ are associated with sixteen remaining bits within the two thousand and forty-eight memory registers of the design memory system 200. The read ports 700 and write ports 800 of the port chain $\mathbf{620}_2$ thereby can be compactly mapped into a memory depth of one thousand and twenty-four memory registers each having a data width of thirty-two bits within the emulation memory system 300 in the manner set forth above.

The read ports 700 and write ports 800 of the port chain $620_3$ likewise can be associated with a memory depth $MD_2$ that is equal to two hundred and fifty-six memory registers within the thirty-two bit data width $DW_2$ of the emulation memory system 300. In the manner set forth above, the read ports 700 and write ports 800 of the port chain $620_3$ can be associated with four remaining bits within the two thousand and forty-eight memory registers of the design memory system 200. The read ports 700 and write ports 800 of the port chain $620_3$ thereby can be compactly mapped into a memory depth of two hundred and fifty-six memory registers each having a data width of thirty-two bits within the emulation memory system 300 in the manner set forth above.

Turning to the port chain $620_4$, the read ports 700 and write ports 800 can be associated with a memory depth $MD_2$ that is equal to sixty-four memory registers within the thirty-two bit data width $DW_2$ of the emulation memory system 300. In the manner set forth above, the read ports 700 and write ports 800 of the port chain $620_4$ are associated with the one remaining bit within the two thousand and forty-eight memory registers of the design memory system 200. The read ports 700 and write ports 800 of the port chain $620_4$ thereby can be compactly mapped into a memory depth of sixty-four memory registers each having a data width of thirty-two bits within the emulation memory system 300 in the manner set forth above.

The described transformation was implemented and tested in IncisiveXE3.0 as a part of et3compile process. Incisive is one tool that may be used used for compiling and debugging designs on Cadence's Palladium products. The transformation did increase the number of memory ports (MPR and MPW primitives) and create additional logic gates. If an original memory instance has R MPRs, W MPWs and its data width equals dw ($0<dw<64$), then the transformation adds, depending on the value of dw, from W MPRs (for dw=1, 2, 4, 8, 16, 32) to 6W+5R MPRs plus 5W MPWs (for dw=63). Transformation of each original MPR adds, depending on dw, from 32 (for dw=32) to 384 (for dw=63) logic gates (primitives). Transformation of each original MPW adds, depending on dw, from 66 (for dw=32) to 492 (for dw=63) logic gates. The transformation may also increase the step count, which slows down the emulation speed. The more memory instances is transformed, the higher the probability of this increase.

Accordingly, the software is trying to minimize the number of memory instances to be transformed. Its default behavior is as follows. It first compares the available size $D_H$ of the emulation memory system 300 (shown in FIG. 1) with the size $D_D$ of the emulation memory system 300 (shown in FIG. 1) required for the given design. If $D_D$ does not exceeds $D_H$, the transformation is not required. Otherwise, the implementation browses the design data base, collects all the "compactible" memory instances, for each of them finds its weight, and transforms these instances in order of decreasing weight. The transformation stops as soon as it saved enough space within the emulation memory system 300.

This behavior may be modified with the following commands (in any combination).

Define the "utilization factor" u for the emulation memory system 300 (by default, u=100). If it is defined, the implementation would compare $D_D$ with $D_H$*u/100 rather than with $D_H$. Setting u<100 would force more memory instances to be transformed; if u=0, all the "compactible" memory instances will be transformed. Setting u>100 decreases the number of memory instances to be transformed; if u exceeds some "big enough value", no memory instance would be transformed.

Force some memory instances to be transformed (specified by names).

Prevent transformation of some memory instances (specified by names).

Define the "minimum transformation depth" (i.e. force transformation of any memory instance with depth equal to or exceeding the given value).

Define the "maximum non-transformation depth" (i.e. prevent transformation of any memory instance with depth equal to or less than the given value).

Given memory data width DW (DW<64), a "memory remainder" can be defined as 64-DW. Define the "minimum transformation remainder" (i.e. force transformation of any memory instance with remainder equal to or exceeding the given value).

Define the "maximum non-transformation remainder" (i.e. prevent transformation of any memory instance with remainder equal to or less than the given value).

A transformed memory instance thereby can be represented by one or more "new" memory instances in the manner described above. Each new memory instance gets a unique name uniquely derived from the original name. The list of original names of the transformed memory instances is saved in the design data base, which allows the run time programs to correctly access the memory contents.

From the user point of view, the memory transformation is completely transparent, i.e. only the original memory instance names are used in the user interface. The MPR/MPW primitives and gates created during the transformation are invisible to the user.

Figure 18:
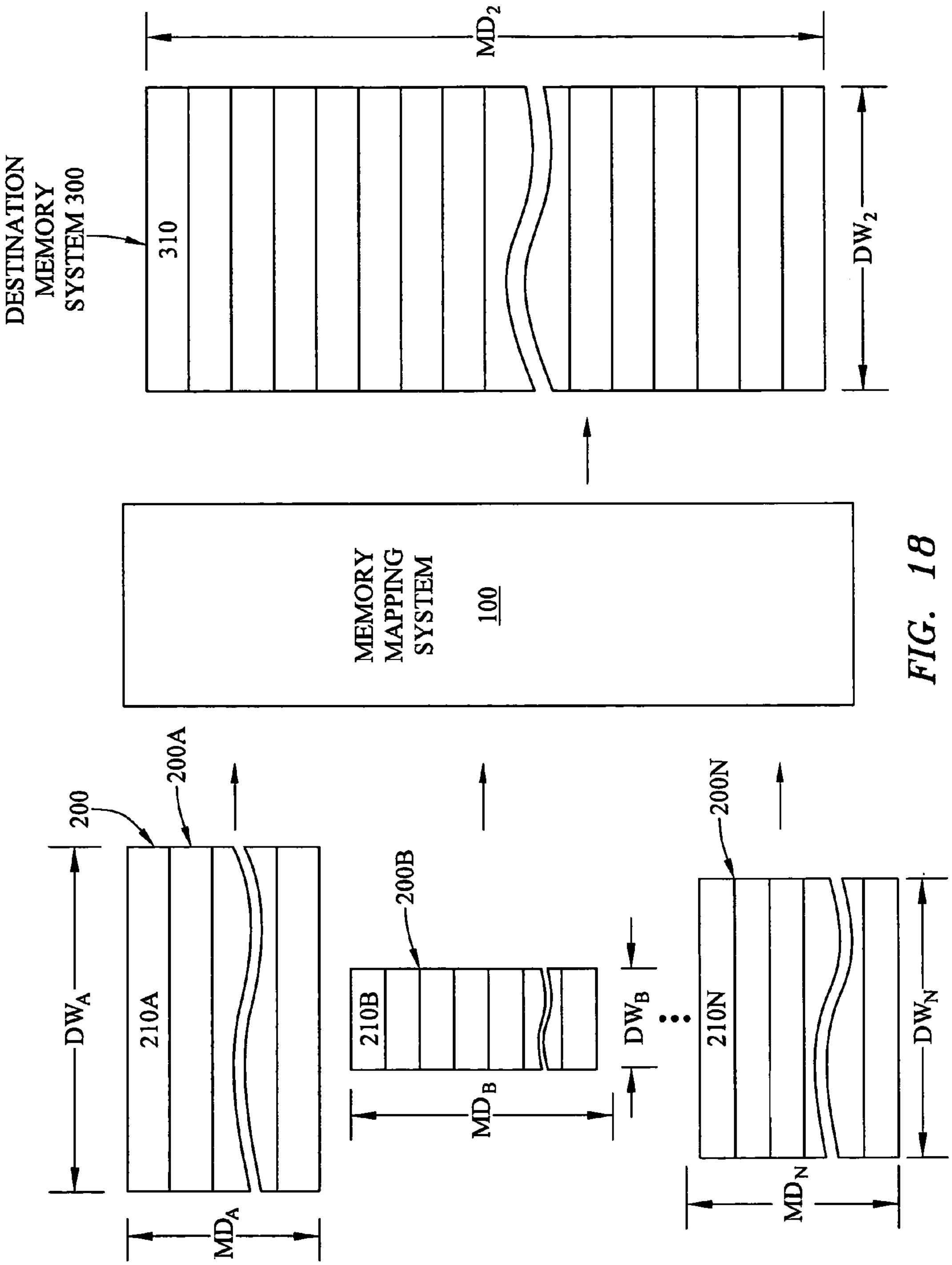
FIG. 18 is an exemplary block diagram illustrating another alternative embodiment of the memory mapping system of FIG. 1, wherein the memory mapping system is configured to compactly map a plurality of source memory systems into a common destination memory system.

Although shown and described with reference to FIG. 1 as mapping one source memory system 200 into the destination memory system 300 for purposes of illustration only, the memory mapping system 100 can compactly map contents from any preselected number N of source memory systems 200A-N into a common destination memory system 300 without a loss of memory space in the destination memory system 300 as illustrated in FIG. 18. Each of the source memory systems 200A-N can comprise a conventional memory system in the manner discussed above with reference to the source memory system 200 (shown in FIG. 1). The source memory systems 200A-N have respective source memory depths $MD_{A-N}$ each comprising a predetermined number of the source memory registers 210 and source data widths $DW_{A-N}$ that include a preselected quantity of data bits that can be stored in each of the source memory registers 210. The common destination memory system 300 likewise can be provided as a conventional memory system in the manner discussed in more detail above with reference to FIG. 1 and can have a destination memory depth $MD_2$ that comprises a predetermined number of the destination memory registers 310 and a destination data width $DW_2$ that includes a preselected quantity of data bits that can be stored in each of the destination memory registers 310.

As illustrated in FIG. 18, the source memory depths $MD_{A-N}$ of the source memory systems 200A-N can include different and/or uniform memory depths; whereas, the source data widths $DW_{A-N}$ likewise can be different and/or uniform. Each of the predetermined source data widths $DW_{A-N}$ can be provided in the manner set forth in more detail above with reference to the source data width $DW_1$ (shown in FIG. 1), and the source memory depths $MD_{A-N}$ each can be provided in the manner discussed above with reference to the source memory depth $MD_1$ (shown in FIG. 1). Each of the source memory systems 200A-N can be mapped to the destination memory system 300 in the manner set forth above.

Implementation of the memory compaction allowed to considerably reduce the hardware requirements for several designs. Three real designs are presented in Table 1.

TABLE 1

Practical Results

| | Design | | | | | |
|---|---|---|---|---|---|---|
| | N1 | | N2 | | N3 | |
| | Set | | | | | |
| | A | B | A | B | A | B |
| Original Gates, M | 2.70 | | 2.08 | | 27.75 | |
| Additional Gates, % | 0.88 | 0.13 | 9.69 | 0.12 | 7.77 | 0.01 |
| Original Nets, M | 2.72 | | 2.12 | | 28.62 | |
| Additional Nets, % | 2.05 | 0.25 | 11.84 | 0.23 | 14.3 | 0.02 |
| Original Memory Instances | 88 | | 622 | | 8468 | |
| Transformed Memory Instances | 88 | 13 | 622 | 18 | 8468 | 24 |
| Original MPR/MPW | 534 | | 2672 | | 39098 | |
| Additional MPR/MPW, % | 44 | 4.5 | 90 | 0.75 | 46.4 | 0.06 |
| Original Depth, M | 225.5 | | 145.4 | | 163.5 | |
| New Depth, M | 104.2 | 104.2 | 18.83 | 19.42 | 124.3 | 139.5 |
| Min. Step Count | 480 | 480 | 600 | 576 | — | 480 |
| Max. Step Count | 640 | 640 | 656 | 640 | — | 480 |
| et3compile Run Time, s | 954 | 943 | 818 | 669 | — | 27880 |
| Mem. Transform. Run Time, s | 3.3 | 2.3 | 10.3 | 4.3 | 187 | 75 |
| Mem. Transform. Run Time, % | 0.35 | 0.24 | 1.26 | 0.64 | — | 0.27 |

For each of these designs two sets of experiments were performed. In the first set (A), the transformation of all "compactible" memory instances was forced. In the second set (B), only a few memory instances with the biggest weights, enough to fit into the given hardware configuration were transformed. Each set consisted of at least 5 trials, so Table I contains both minimum and maximum values for Step Count. For Run Time parameters, the average values are shown.

It is worth noting that the numbers of additional gates and nets were big enough for set A and negligibly small for set B. The execution times of memory transformation were negligibly small, especially for set B. Also, the transformation of only a small, sometimes even tiny subset of memory instances, can provide for significant memory savings. No significant difference in step count occurred between sets A and B.

The disclosed embodiments are susceptible to various modifications and alternative forms, and specific examples thereof have been shown by way of example in the drawings and are herein described in detail. It should be understood, however, that the disclosed embodiments are not to be limited to the particular forms or methods disclosed, but to the contrary, the disclosed embodiments are to cover all modifications, equivalents, and alternatives.

What is claimed is:

1. A hardware emulation system for verifying electronic circuit designs including a design memory system having a design memory depth that comprises a predetermined number of design memory registers and a design data width that includes a preselected quantity of design data bits that can be stored in each of the design memory registers, comprising:

a emulation memory system having a emulation memory depth that comprises a predetermined number of emulation memory registers and a emulation data width including a preselected power-of-two quantity of emulation data bits; and a compiler system that maps the design memory system to said emulation memory system by:

factorizing the design data width of the design memory system to form a plurality of design memory sub-regions having respective sub-region memory depths that are equal to the design memory depth and respective sub-region data widths that include respective portions of the design data bits, the design data width being spanned by said sub-region data widths, said respective sub-region data widths being equal to said emulation data width divided by respective predetermined integer values;

selecting a selected design memory sub-region with a selected sub-region memory depth and a selected sub-region data width that is equal to said emulation data width divided by a selected integer value;

identifying sub-region register contents within the design memory registers, said sub-region register contents comprising memory contents within the design memory registers that are associated with the selected design memory sub-region;

dividing said selected sub-region memory depth into a plurality of sub-region memory depth groups each including the selected integer value of the design memory registers; and storing said sub-region register contents associated with each respective sub-region memory depth group in a side-by-side manner across a selected emulation memory register of said emulation memory system.

2. The hardware emulation system of claim 1, wherein said design memory system includes at least one design memory instance, and said compiler system maps each of the at least one design memory instance into said emulation memory system.

3. The hardware emulation system of claim 1, wherein the design memory system is provided as a multiport memory system comprising a port chain of at least one read port and at least one write port.

4. The hardware emulation system of claim 3, wherein at least one of the at least one read port of the multiport memory system is provided as a read port memory primitive.

5. The hardware emulation system of claim 3, wherein at least one of the at least one read port of the multiport memory system is provided as a write port memory primitive.

6. The hardware emulation system of claim 1, wherein said emulation data width of said emulation memory system is selected from a group consisting of a thirty-two bit data width and a sixty-four bit data width.

7. A method for mapping a design memory system within an electronic circuit design into an emulation memory system of a hardware emulation system, the design memory having a design memory depth that comprises a predetermined number of design memory registers and a design data width, the emulation memory system having a emulation memory depth that comprises a predetermined number of emulation memory registers and a emulation data width including a preselected power-of-two quantity of emulation data bits, said method comprising:

compiling the electronic circuit design including mapping the design memory system into the emulation memory system by:

selecting a design register portion within each of the design memory registers, each of said design register portions having a sub-region data width that is equal to the emulation data width divided by a predetermined power-of-two integer value; and mapping at least one of said design register portions in a side-by-side manner across a selected emulation memory register of the emulation memory system; and emulating the electronic circuit design including transferring memory contents associated with the design memory system into the emulation memory system in accordance with said mapping the design memory system at run time.

8. A hardware emulation system for verifying an electronic circuit design that includes a design memory system having a design memory depth that comprises a predetermined number of design memory registers and a design data width that includes a preselected quantity of design data bits that can be stored in each of the design memory registers, comprising:

a emulation memory system having a emulation memory depth that comprises a predetermined number of emulation memory registers and a emulation data width including a preselected power-of-two quantity of emulation data bits; and a compiler system that compiles the electronic circuit design and maps the design memory system into the emulation memory system by:

selecting a design register portion within each of the design memory registers, each of said design register portions having a sub-region data width that is equal to the emulation data width divided by a predetermined power-of-two integer value; and mapping at least one of said design register portions in a side-by-side manner across a selected emulation memory register of the emulation memory system, wherein the hardware emulation system emulates the electronic circuit design by transferring memory contents associated with the design memory system into the emulation memory system in accordance with said mapping the design memory system at run time.

* * * * *